US012761398B2

(12) United States Patent
Yoshinari et al.

(10) Patent No.: US 12,761,398 B2
(45) Date of Patent: Oct. 13, 2026

(54) LAMINATE, REFLECTION PREVENTION SYSTEM, AND IMAGE DISPLAY DEVICE

(71) Applicant: FUJIFILM Corporation, Tokyo (JP)

(72) Inventors: Shinichi Yoshinari, Kanagawa (JP); Naoyoshi Yamada, Kanagawa (JP); Naoya Nishimura, Kanagawa (JP); Shinya Watanabe, Kanagawa (JP); Naoya Shibata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/453,716

(22) Filed: Aug. 22, 2023

(65) Prior Publication Data

US 2024/0069264 A1 Feb. 29, 2024

Related U.S. Application Data

(63) Continuation of application No. PCT/JP2022/006135, filed on Feb. 16, 2022.

(30) Foreign Application Priority Data

Feb. 25, 2021 (JP) ................................ 2021-028719
Mar. 23, 2021 (JP) ................................ 2021-048129
Jun. 21, 2021 (JP) ................................ 2021-102277

(51) Int. Cl.
*G02B 1/08* (2006.01)
*G02B 5/30* (2006.01)
*H10K 59/80* (2023.01)

(52) U.S. Cl.
CPC ............ *G02B 1/08* (2013.01); *G02B 5/3016* (2013.01); *H10K 59/8792* (2023.02)

(58) Field of Classification Search
CPC .......... G02F 1/13363; G02F 1/133634; G02F 1/133635; G02F 1/133637;
(Continued)

(56) References Cited

U.S. PATENT DOCUMENTS

2001/0030727 A1* 10/2001 Schadt ............. G02F 1/133711 349/124
2007/0285601 A1 12/2007 Hendrix et al.
(Continued)

FOREIGN PATENT DOCUMENTS

JP 2007-193017 A 8/2007
JP 2007-323073 A 12/2007
(Continued)

OTHER PUBLICATIONS

Espacenet English machine translation of JP2020134678A (Year: 2020).*
(Continued)

*Primary Examiner* — David Y Chung
(74) *Attorney, Agent, or Firm* — Edwards Neils LLC; Jean C. Edwards, Esq.

(57) ABSTRACT

Provided is a laminate capable of reducing a change in hue of a reflected image in the surroundings (for example, window glass) from an original image, suppressing a hue shift of particularly the reflected image to redness, and suppressing the reflected image from being conspicuous, a reflection prevention system including this laminate, and an image display device including this laminate. The laminate includes a polarizer having an absorption axis in an in-plane direction, a light absorption anisotropic layer containing a liquid crystal compound and a dichroic substance, and a linear polarization conversion layer, in which an angle between a transmittance central axis of the light absorption anisotropic layer and a normal line of a layer plane of the light absorption anisotropic layer is 0° or greater and 45° or less.

6 Claims, 3 Drawing Sheets

(58) Field of Classification Search
CPC ......... G02F 1/133638; G02F 1/133528; G02F 1/133531; G02F 1/133541
See application file for complete search history.

(56) References Cited

U.S. PATENT DOCUMENTS

| | | | | |
|---|---|---|---|---|
| 2009/0153783 | A1* | 6/2009 | Umemoto | G02B 27/28 359/487.01 |
| 2010/0053509 | A1* | 3/2010 | Saitoh | G02B 5/3083 359/489.07 |
| 2018/0364405 | A1* | 12/2018 | Chen | G02F 1/1323 |
| 2019/0265522 | A1* | 8/2019 | Chen | G02F 1/13363 |
| 2019/0353958 | A1* | 11/2019 | Mitobe | G02F 1/1335 |
| 2020/0318011 | A1 | 10/2020 | Shibata et al. | |
| 2021/0333578 | A1* | 10/2021 | Chen | G02F 1/133738 |
| 2022/0155514 | A1* | 5/2022 | Matsuo | G02B 6/0068 |

FOREIGN PATENT DOCUMENTS

| | | | | | |
|---|---|---|---|---|---|
| JP | 2009-145776 | A | | 7/2009 | |
| JP | 2011257479 | A | * | 12/2011 | |
| JP | 4902516 | B2 | | 3/2012 | |
| JP | 2012-173452 | A | | 9/2012 | |
| JP | 2018-147761 | A | | 9/2018 | |
| JP | 2020134678 | A | * | 8/2020 | |
| KR | 10-2014-0113700 | A | | 9/2014 | |
| KR | 10-2020-0115083 | A | | 10/2020 | |
| KR | 10-2021-0009229 | A | | 1/2021 | |
| WO | WO-2017175721 | A1 | * | 10/2017 | C08L 67/02 |
| WO | 2018/151295 | A1 | | 8/2018 | |

OTHER PUBLICATIONS

Google Patents English machine translation of JP2011257479A (Year: 2011).*
Espacenet English machine translation of WO2017175721A1 (Year: 2017).*
International Search Report issued in PCT/JP2022/006135 on Apr. 12, 2022.
Written Opinion issued in PCT/JP2022/006135 on Apr. 12, 2022.
International Preliminary Report on Patentability completed by WIPO on Aug. 29, 2023 in connection with International Patent Application No. PCT/JP2022/006135.
Office Action, issued by the Korean Intellectual Property Office on Jun. 21, 2025, in connection with Korean Patent Application No. 10-2023-7028319.
Office Action, which was issued by the Japanese Patent Office on Oct. 7, 2025, in connection with Japanese Patent Application No. 2023-502315.
Office Action, which was issued by the Japanese Patent Office on Dec. 23, 2025, in connection with Japanese Patent Application No. 2023-502315.
Office Action, which was issued by the Korean Intellectual Property Office on Feb. 27, 2026, in connection with Korean Patent Application No. 10-2023-7028319.
Office Action, which was issued by the State Intellectual Property Office of China on Apr. 29, 2026, in connection with Chinese Patent Application No. 202280017177.5.

* cited by examiner

LAMINATE, REFLECTION PREVENTION SYSTEM, AND IMAGE DISPLAY DEVICE

CROSS-REFERENCE TO RELATED APPLICATIONS

This application is a Continuation of PCT International Application No. PCT/JP2022/006135 filed on Feb. 16, 2022, which was published under PCT Article 21(2) in Japanese, and which claims priority under 35 U.S.C. § 119(a) to Japanese Patent Application No. 2021-028719 filed on Feb. 25, 2021, Japanese Patent Application No. 2021-048129 filed on Mar. 23, 2021 and Japanese Patent Application No. 2021-102277 filed on Jun. 21, 2021. The above applications are hereby expressly incorporated by reference, in their entirety, into the present application.

BACKGROUND OF THE INVENTION

1. Field of the Invention

The present invention relates to a laminate, a reflection prevention system, and an image display device.

2. Description of the Related Art

In a case where an in-vehicle display such as a car navigation system is used, there is a problem in that light emitted upward from a display screen is reflected on a windshield or the like and interferes with driving.

For the purpose of solving the above-described problem, for example, JP4902516B discloses a viewing angle control system including a polarizer (light absorption anisotropic layer) which contains a dichroic substance and in which the angle between an absorption axis and a normal line of a film surface is in a range of 0° to 45°.

SUMMARY OF THE INVENTION

As a result of examination on the viewing angle control system described in JP4902516B, the present inventors found that reflection of an image on window glass (windshield) positioned above an in-vehicle display is reduced, but found that the hue of the reflected image that partially remains is greatly changed from the original tint to redness, greenness, blueness, or the like, and as a result, clarified that there is a problem in that the reflected image with suppressed brightness is conspicuous again. In particular, the present inventors clarified that a change of the hue to redness is not particularly preferable because the degree of conspicuousness in the human sense is large and that a change of the hue to blueness is relatively easily accepted in the human sense.

The present inventors intensively analyzed this phenomenon, and found the cause as follows.

First, a second polarizer described in JP4902516B is formed of an absorption dichroic substance and a liquid crystal compound, and the absorption dichroic substance is aligned in a specific direction by using a guest-host effect of the liquid crystal compound. The birefringence of the liquid crystal compound and the absorption dichroic substance typically used here includes wavelength dispersibility, and for this reason, light with different polarization characteristics, such as S-polarized light or P-polarized light, is emitted for each wavelength from the surface of a reflection prevention film.

Further, since S-polarized light is reflected more strongly than P-polarized light on the surface of window glass in an incidence angle region around the Brewster's angle, and as a result, the tint of the reflected image changes. For example, in a case where S-polarized light of a red color and P-polarized light of green to blue colors are emitted from the surface of the reflection prevention film, since the S-polarized light is reflected more strongly than the P-polarized light from the reflected image, a reflected image in which the hue is changed to redness is formed.

An object of the present invention is to provide a laminate capable of reducing a change in hue of a reflected image in the surroundings (for example, window glass) from an original image, suppressing a hue shift of particularly the reflected image to redness, and suppressing the reflected image from being conspicuous, a reflection prevention system including this laminate, and an image display device including this laminate.

The present inventors found that the above-described object can be achieved by employing the following configurations.

[1] A laminate comprising: a polarizer having an absorption axis in an in-plane direction; a light absorption anisotropic layer containing a liquid crystal compound and a dichroic substance; and a linear polarization conversion layer, in which an angle between a transmittance central axis of the light absorption anisotropic layer and a normal line of a layer plane of the light absorption anisotropic layer is 0° or greater and 45° or less.

[2] The laminate according to [1], in which a content of the dichroic substance is 5% by mass or greater with respect to a total solid content mass of the light absorption anisotropic layer.

[3] The laminate according to [1] or [2], in which the linear polarization conversion layer is a C-plate.

[4] The laminate according to [3], in which the C-plate is a negative C-plate.

[5] The laminate according to [1] or [2], in which the linear polarization conversion layer is λ/2 plate or a λ/4 plate.

[6] The laminate according to [1] or [2], in which the linear polarization conversion layer is a depolarization layer.

[7] The laminate according to [6], in which the depolarization layer is a randomly aligned liquid crystal layer.

[8] The laminate according to [6], in which the depolarization layer is a layer containing fine particles.

[9] The laminate according to [6], in which the depolarization layer is a layer containing a liquid crystal compound and a dichroic substance, in which the liquid crystal compound is randomly aligned.

[10] The laminate according to [1] or [2], in which the linear polarization conversion layer is a polarizer having an absorption axis in an in-plane direction, and an angle φ between a direction in which the transmittance central axis of the light absorption anisotropic layer is orthographically projected onto the layer plane of the light absorption anisotropic layer and the absorption axis of the polarizer which is the linear polarization conversion layer is in a range of 85° to 95°.

[11] The laminate according to [1] or [2], in which the linear polarization conversion layer is a retardation layer having an in-plane retardation value of 6000 nm or greater, which is measured at a wavelength of 550 nm.

[12] The laminate according to [11], in which the retardation layer is a PET film.

[13] The laminate according to any one of [1] to [12], further comprising: a B-plate between the polarizer and the light absorption anisotropic layer.

[14] A reflection prevention system comprising: the laminate according to any one of [1] to [13].

[15] An image display device comprising: the laminate according to any one of [1] to [13].

According to the present invention, it is possible to provide a laminate capable of reducing a change in hue of a reflected image in the surroundings (for example, window glass) from an original image, suppressing a hue shift of particularly the reflected image to redness, and suppressing the reflected image from being conspicuous, a reflection prevention system, and an image display device.

Further, the laminate of the present invention is useful as a reflection prevention laminate used by being laminated on an in-vehicle display and prevents a driver from making mistakes due to an image reflected on window glass, thereby contributing to safe driving of the vehicle.

DESCRIPTION OF THE PREFERRED EMBODIMENTS

Figure 1:
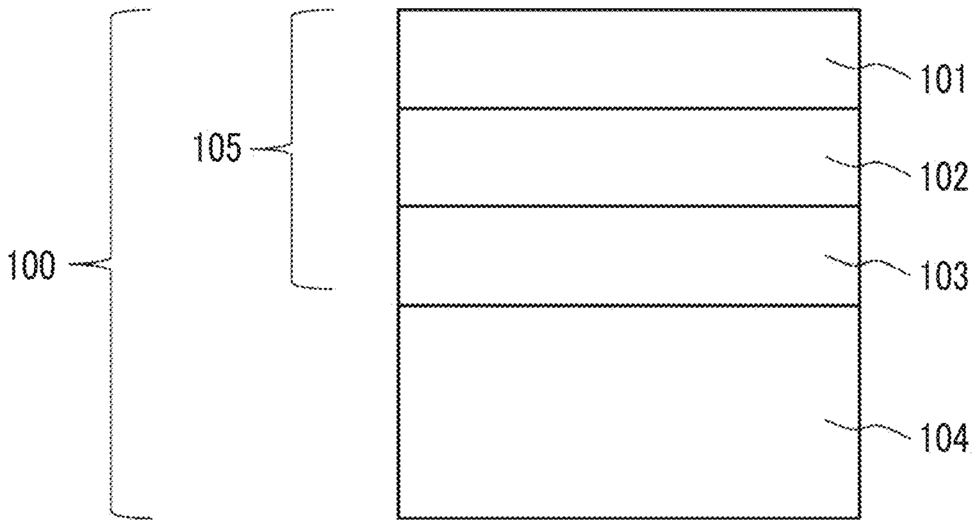
FIG. 1 is a schematic cross-sectional view illustrating an example of an embodiment of an image display device with a reflection prevention system according to the present invention.

Hereinafter, the present invention will be described in detail.

The description of configuration requirements described below may be made based on typical embodiments of the present invention, but the present invention is not limited to such embodiments.

Further, in the present specification, the numerical ranges shown using "to" indicate ranges including the numerical values described before and after "to" as the lower limits and the upper limits.

Further, in the present specification, parallel and orthogonal do not indicate parallel and orthogonal in a strict sense, but respectively indicate a range of parallel ±5° and a range of orthogonal ±5°.

Further, in the present specification, the concepts of the liquid crystal composition and the liquid crystal compound also include those that no longer exhibit liquid crystallinity due to curing or the like.

Further, in the present specification, materials corresponding to respective components may be used alone or in combination of two or more kinds thereof. Here, in a case where two or more kinds of materials corresponding to respective components are used in combination, the content of the components indicates the total content of the combined materials unless otherwise specified.

In the present specification, "(meth)acrylate" denotes "acrylate" or "methacrylate", "(meth)acryl" denotes "acryl" or "methacryl", and "(meth)acryloyl" denotes "acryloyl" or "methacryloyl".

[Substituent W]

A substituent W used in the present specification represents any of the following groups.

Examples of the substituent W include a halogen atom, an alkyl group having 1 to 20 carbon atoms, a halogenated alkyl group having 1 to 20 carbon atoms, a cycloalkyl group having 1 to 20 carbon atoms, an alkylcarbonyl group having 1 to 10 carbon atoms, an alkyloxycarbonyl group having 1 to 10 carbon atoms, an alkylcarbonyloxy group having 1 to 10 carbon atoms, an alkylamino group having 1 to 10 carbon atoms, an alkylaminocarbonyl group, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group ($—B(OH)_2$), a phosphate group ($—OPO(OH)_2$), or a sulfate group ($—OSO_3H$), and other known substituents.

The details of the substituent are described in paragraph [0023] of JP2007-234651A.

Further, the substituent W may be a group represented by Formula (W1).

*-LW-SPW-Q (W1)

In Formula (W1), LW represents a single bond or a divalent linking group, SPW represents a divalent spacer group, Q represents Q1 or Q2 in Formula (LC) described below, and * represents a bonding position.

Examples of the divalent linking group represented by LW include —O—, $—(CH_2)_g—$, $—(CF_2)_g—$, $—Si(CH_3)_2—$, $—(Si(CH_3)_2O)_g—$, $—(OSi(CH_3)_2)_g—$ (g represents an integer of 1 to 10), —N(Z)—, —C(Z)=C(Z')—, —C(Z)=N—, —N=C(Z)—, $—C(Z)_2—C(Z')_2—$, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. LW may represent a group in which two or more of these groups are combined (hereinafter, also referred to as "L-C").

Examples of the divalent spacer group represented by SPW include a linear, branched, or cyclic alkylene group having 1 to 50 carbon atoms, and a heterocyclic group having 1 to 20 carbon atoms.

The carbon atoms of the alkylene group and the heterocyclic group may be substituted with —O—, —$Si(CH_3)_2$—, —$(Si(CH_3)_2O)_g$—, —$(OSi(CH_3)_2)_g$— (g represents an integer of 1 to 10), —N(Z)—, —C(Z)=C(Z')—, —C(Z)=N—, —N=C(Z)—, —$C(Z)_2$—$C(Z')_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —C(S)—, —S(O)—, —$SO_2$—, —(O)S(O)O—, —O(O)S(O)O—, —SC(O)—, —C(O)S—, or a group obtained by combining two or more of these groups (hereinafter, also referred to as "SP-C").

Further, the hydrogen atom of the alkylene group and the hydrogen atom of the heterocyclic group may be substituted with a halogen atom, a cyano group, —$Z^H$, —OH—, —$OZ^H$, —COOH, —$C(O)Z^H$, —$C(O)OZ^H$, —$OC(O)Z^H$, —$OC(O)OZ^H$, —$NZ^HZ^{H'}$, —$NZ^HC(O)Z^{H'}$, —$NZ^HC(O)OZ^{H'}$, —$C(O)NZ^HZ^{H'}$, —$OC(O)NZ^HZ^{H'}$, —$NZ^HC(O)NZ^{H'}OZ^{H''}$, —SH, —$SZ^H$, —$C(S)Z^H$, —$C(O)SZ^H$, or —$SC(O)Z^H$ (hereinafter, also referred to as "SP-H"). Here, $Z^H$ and $Z^{H'}$ represent an alkyl group having 1 to 10 carbon atoms, a halogenated alkyl group, or -L-CL (L represents a single bond or a divalent linking group, specific examples of the divalent linking group are the same as those of LW and SPW described above, CL represents a crosslinkable group, and examples thereof include a group represented by Q1 or Q2 in Formula (LC), and a crosslinkable group represented by Formulae (P-1) to (P-30) is preferable).

[Laminate]

A laminate according to the embodiment of the present invention includes a polarizer having an absorption axis in an in-plane direction, a light absorption anisotropic layer containing a liquid crystal compound and a dichroic substance, and a linear polarization conversion layer.

Further, in the laminate according to the embodiment of the present invention, an angle between a transmittance central axis of the light absorption anisotropic layer and a normal line of a layer plane of the light absorption anisotropic layer (hereinafter, also referred to as "transmittance central axis direction (polar angle)") is 0° or greater and 45° or less.

Here, the transmittance central axis is the direction in which the highest transmittance is exhibited in a case where the transmittance is measured by changing the inclination angle (polar angle) and the inclination direction (azimuthal angle) with respect to the normal direction of the surface of the light absorption anisotropic layer.

Specifically, the Mueller matrix at a wavelength of 550 nm is measured using AxoScan OPMF-1 (manufactured by Opto Science, Inc.). More specifically, in the measurement, the azimuthal angle at which the transmittance central axis is inclined is first searched for, the Mueller matrix at a wavelength of 550 nm is measured while the polar angle which is the angle with respect to the surface of the light absorption anisotropic layer in the normal direction is changed from −70° to 70° at intervals of 1° in the surface (the plane that has the transmittance central axis and is orthogonal to the layer surface) having the normal direction of the light absorption anisotropic layer along the azimuthal angle thereof, and the transmittance of the light absorption anisotropic layer is derived. As a result, the direction at which the highest transmittance is exhibited is defined as the transmittance central axis.

Further, the transmittance central axis denotes the direction of the absorption axis (major axis direction of a molecule) of the dichroic substance contained in the light absorption anisotropic layer.

[Linear Polarization Conversion Layer]

The linear polarization conversion layer of the laminate according to the embodiment of the present invention is a layer that is provided on a viewing side (position of the viewing side in a case where the laminate according to the embodiment of the present invention is used in an image display device, the same applies hereinafter) with respect to the light absorption anisotropic layer described below and convers a part or all of linearly polarized light components emitted from the surface of the light absorption anisotropic layer on the viewing side into natural light (randomly polarized light), circularly polarized light, elliptically polarized light, linearly polarized light in which vibration directions are different from each other, linearly polarized light with low intensity, or the like.

In the relationship between the linear polarization conversion layer and the converted light, light is converted into natural light (randomly polarized light) in a case where a depolarization layer is used as the linear polarization conversion layer, light is converted into circularly polarized light or elliptically polarized light in a case where a λ/4 plate (HWP) is used as the linear polarization conversion layer, light is converted into linearly polarized light in which the vibration direction is different from the original vibration direction in a case where a λ/2 plate (HWP) is used as the linear polarization conversion layer, and light is converted into linearly polarized light in which the vibration direction is the same as the original vibration direction, but the light intensity is different from the original intensity in a case where a polarizer is used as the linear polarization conversion layer.

Here, "depolarization layer" denotes a layer having a function of converting a part or all of linearly polarized light into natural light (randomly polarized light).

Further, "λ/4 plate" denotes a retardation layer in which an in-plane retardation is approximately ¼ of the wavelength and specifically, a retardation layer in which an in-plane retardation Re (550) at a wavelength of 550 nm is in a range of 110 nm to 160 nm.

Further, "λ/2 plate" denotes a retardation layer in which an in-plane retardation is approximately ½ of the wavelength and specifically, a retardation layer in which an in-plane retardation Re (550) at a wavelength of 550 nm is in a range of 220 nm to 320 nm.

In the present invention, a so-called super birefringence film having a large retardation of several thousand nm or greater can also be used as the linear polarization conversion layer.

Examples of such a super birefringence film include a retardation layer (retardation film) having an in-plane retardation value of 6000 nm or greater which is measured at a wavelength of 550 nm, and specific suitable examples thereof include a polyethylene terephthalate (PET) film.

Further, since a polyester film having a thickness of several tens of micrometers can also be used as the super birefringence film, the polyester film can also be used as a support inside the reflection prevention system.

Here, the in-plane retardation value denotes a value measured using light having a measurement wavelength with AxoScan OPMF-1 (manufactured by Opto Science, Inc.).

Specifically, the slow axis direction (°), "Re (λ)=R0 (λ)", and "Rth (λ)=((nx+ny)/2−nz)×d" are calculated by inputting the average refractive index ((Nx+Ny+Nz)/3) and the film thickness (d(μm)) to AxoScan OPMF-1.

Further, R0 (λ) is displayed as a numerical value calculated by AxoScan OPMF-1 and denotes Re (λ).

In the present invention, a C-plate can also be used as the linear polarization conversion layer.

Here, the C-plate is classified into two kinds of C-plates, a positive C-plate and a negative C-plate. The positive C-plate satisfies the relationship of Expression (C1), and the negative C-plate satisfies the relationship of Expression (C2). Further, the Rth of the positive C-plate represents a negative value, and the Rth of the negative C-plate represents a positive value.

In a case where a negative C-plate or a positive C-plate is used as the linear polarization conversion layer, the polarization state of light emitted from a display in a front direction is not affected, and only the hue and brightness of a reflected image on window glass in an oblique direction can be changed by changing the polarization state of light emitted in an oblique direction.

$nz>nx\approx ny$ Expression (C1)

$nz<nx\approx ny$ Expression (C2)

The symbol "≈" includes not only a case where both are completely the same as each other but also a case where both are substantially the same as each other. The expression "substantially the same" denotes that "nx≈ny" includes a case where (nx−ny)×d (where d represents the thickness of the film) is in a range of 0 to 10 nm and preferably in a range of 0 to 5 nm.

Further, in the present invention, a B-plate can also be used as the linear polarization conversion layer.

In a case where a B-plate is used as the linear polarization conversion layer, the hue and the brightness of a reflected image on window glass in a specific direction with respect to a display can also be changed.

Here, the B-plate denotes a biaxial optical member in which the refractive indices nx, ny, and nz are values different from each other.

Further, in the present invention, an optically anisotropic layer that contains a liquid crystal compound and has a liquid crystal alignment pattern in which the orientation of an optical axis derived from the liquid crystal compound is changed while continuously rotating in at least one direction in the plane can be used as the linear polarization conversion layer.

In the present invention, from the viewpoint that the hue shift of the reflected image to redness can be suppressed, it is preferable that a polarizer having an absorption axis in an in-plane direction is used as the linear polarization conversion layer and that the polarizer is provided such that the angle φ between a direction in which the transmittance central axis of the light absorption anisotropic layer is orthographically projected on the layer plane of the light absorption anisotropic layer and the absorption axis of the polarizer serving as the linear polarization conversion layer is in a range of 85° to 95°.

Further, examples of the polarizer serving as the linear polarization conversion layer include the same polarizer as the polarizer (described layer) of the laminate according to the embodiment of the present invention.

In a case where a retardation layer having a birefringence is used as the linear polarization conversion layer, various retardation layers can be selected in consideration of the polarization state of light emitted from the surface of the light absorption anisotropic layer due to the influence of the birefringence and the like of the light absorption anisotropic layer, the retardation layer on a non-viewing side (position of a display element side in a case where the laminate according to the embodiment of the present invention is used as an image display device) with respect to the light absorption anisotropic layer, the alignment film, the support, and the like, the direction of window glass in which reflection is desired to be controlled, and optical properties of the surface of the window glass or the like.

Further, the linear polarization conversion layer may be used alone or in combination of a plurality of kinds thereof.

Further, as the linear polarization conversion layer, a new layer may be provided by performing coating, drying, transferring, or the like, or a support, a barrier layer, or another layer may be used as the linear polarization conversion layer by imparting a function of the linear polarization conversion layer to these layers.

<Depolarization Layer>

The depolarization layer, which is one aspect of the linear polarization conversion layer, is not limited as long as the depolarization layer has an ability to convert a part or all of linearly polarized light into natural light (randomly polarized light), and suitable examples thereof include a randomly aligned liquid crystal layer and a layer containing fine particles. Among these, from the viewpoint of easily obtaining a depolarization ability and easily obtaining a transparent layer by avoiding whitening derived from domains in the layer, a randomly aligned liquid crystal layer is preferable.

(Randomly Aligned Liquid Crystal Layer)

The randomly aligned liquid crystal layer (hereinafter, referred to as "randomly aligned liquid crystal layer") denotes a layer in which the alignment direction of the liquid crystal compound is randomly oriented in various directions in a liquid crystal state such as a nematic phase or a smectic phase. A randomly aligned liquid crystal layer in a liquid crystal state of a nematic phase is more preferable.

Figure 2:
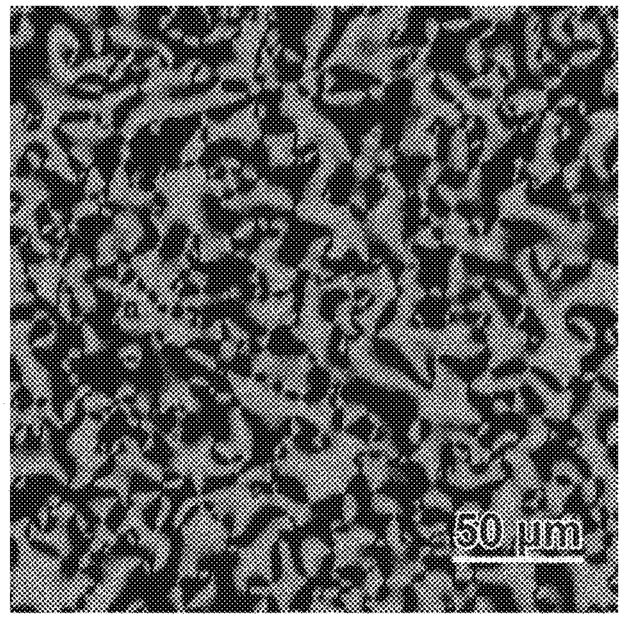
FIG. 2 is a micrograph of a conversion layer randomly aligned liquid crystal layer used as a linear polarization conversion layer according to the present invention in a case of being observed under a condition of crossed nicols of a polarization microscope.

The randomly aligned liquid crystal layer can be prepared by providing a liquid crystal layer that contains a photopolymerization initiator and a liquid crystal containing a photopolymerizable group on a support that has not been subjected to an alignment treatment such as a rubbing treatment, heating the layer as necessary so that the layer enters a liquid crystal state (such as a nematic phase or a smectic phase), exposing the layer to ultraviolet rays, and immobilizing the alignment state. FIG. 2 is a micrograph of the randomly aligned liquid crystal layer prepared by this method in a case of being observed with a polarization microscope under a condition of crossed nicols.

Examples of the randomly aligned liquid crystal layer include a layer containing a liquid crystal compound and a dichroic substance in which the liquid crystal compound is randomly aligned.

With such a layer, the vicinity of the air-side interface of the light absorption anisotropic layer can be formed as the randomly aligned liquid crystal layer simultaneously with (that is, in a continuous procedure) the formation of light absorption anisotropic layer described below.

(Layer Containing Fine Particles)

The layer containing fine particles is a layer in which depolarization occurs by generating light scattering to some extent inside the layer.

As the fine particles, for example, inorganic particles such as silica, alumina, zircon, and zirconia, or organic fine particles such as an acrylic resin, a melamine resin, and a polyamide resin can be used.

As the size of the fine particles, fine particles having various sizes, for example, fine particles having a diameter of approximately 0.1 to 3 μm, can be used.

Further, various shapes, such as a spherical shape, a rod shape, and a fibrous shape, can be used as the shape of the fine particles. Further, the degree of depolarization can also be adjusted by using the above-described aspects in combination.

OTHER EXAMPLES

Other examples of the depolarization layer, which is an aspect of the linear polarization conversion layer, includes a depolarization layer prepared by adding a plurality of kinds of incompatible optically anisotropic substances and performing phase separation on each of the substances.

[Light Absorption Anisotropic Layer]

The light absorption anisotropic layer of the laminate according to the embodiment of the present invention is a light absorption anisotropic layer containing a liquid crystal compound and a dichroic substance.

Various compounds such as low-molecular-weight liquid crystal compounds and polymer liquid crystal compounds can be used as the liquid crystal compound, and it is preferable that the light absorption anisotropic layer contains at least some polymer liquid crystals in order to obtain a satisfactory alignment state of the dichroic substance in the light absorption anisotropic layer. Further, it is preferable that the polymer liquid crystal is used from the viewpoint that a difference in the tilt angle between the liquid crystal compounds at the air-side interface and the support-side interface of the light absorption anisotropic layer can be suppressed to be relatively small and satisfactory viewing angle characteristics are obtained.

In order to control the light transmission direction of the light absorption anisotropic layer, an aspect in which the dichroic substance having absorption in a visible region is aligned in a desired direction is preferable, and an aspect in which the dichroic substance is aligned by using the alignment of the liquid crystal compound is more preferable. Examples of the aspect of the light absorption anisotropic layer include a light absorption anisotropic layer in which at least one kind of dichroic substance is aligned vertically or obliquely to the normal direction of the film.

In a case where the alignment direction of the light absorption anisotropic layer used in the present invention is controlled, an alignment film adjacent to the light absorption anisotropic layer can also be used. The dichroic substance in the light absorption anisotropic layer can also be aligned by irradiating a photo-alignment layer typified by an azobenzene coloring agent or polyvinyl cinnamate with ultraviolet rays in an oblique direction with respect to the normal direction of the photo-alignment layer, generating anisotropy with an inclination with respect to the normal direction of the photo-alignment layer, and aligning the light absorption anisotropic layer thereon.

Further, in order to control the alignment direction of the light absorption anisotropic layer in place of the photo-alignment layer, a liquid crystal layer in which a liquid crystal compound is hybrid-aligned can also be used as the alignment film. Hereinafter, in the present invention, such a liquid crystal layer will be referred to as "inclined liquid crystal alignment film". A method of determining the azimuthal angle of the alignment of the inclined liquid crystal alignment film is not particularly limited, and the alignment direction of the inclined liquid crystal alignment film can be controlled by providing a polyvinyl alcohol layer subjected to a rubbing treatment, a polyimide layer subjected to a rubbing treatment, a photo-alignment film, or the like adjacent to a side of the alignment layer opposite to the light absorption anisotropic layer.

As the technique of aligning the dichroic substance in a desired direction, a technique of preparing a polarizer formed of a dichroic substance or a technique of preparing a guest-host liquid crystal cell can be referred to.

For example, techniques used in the method of preparing a dichroic polarizer described in JP1999-305036A (JP-H11-305036A) or JP2002-90526A and the method of preparing a guest-host type liquid crystal display device described in JP2002-99388A or JP2016-27387A can be used for preparation of the light absorption anisotropic layer used in the present invention.

For example, molecules of the dichroic substance can be desirably aligned as described above in association with the alignment of host liquid crystals using the technique of the guest-host type liquid crystal cell.

Figure 4:
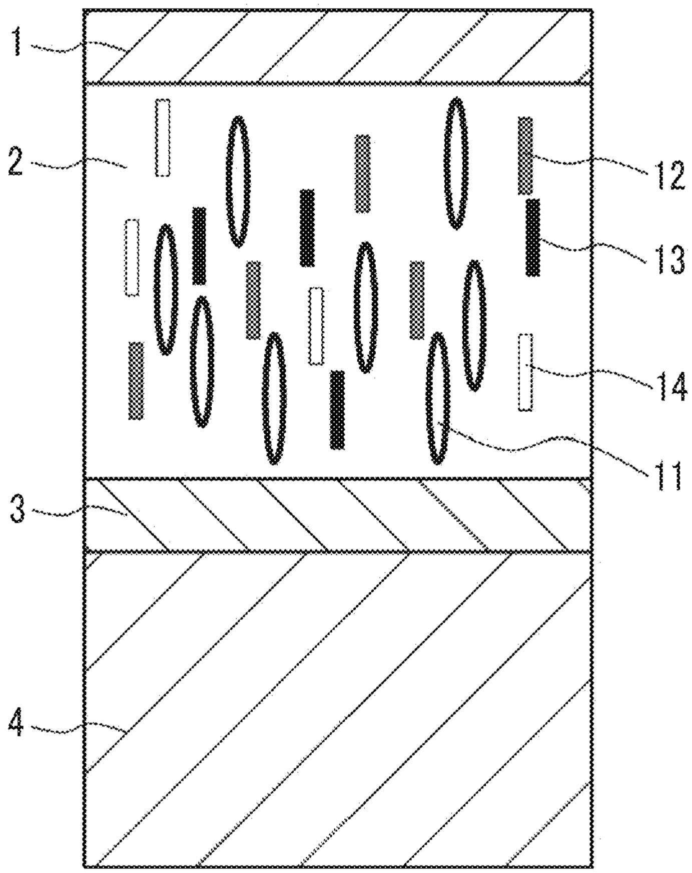
FIG. 4 is a cross-sectional view schematically illustrating a light absorption anisotropic film that is a part of an embodiment of the present invention.

Specifically, the light absorption anisotropic layer used in the present invention can be prepared by mixing a dichroic substance serving as a guest and a rod-like liquid crystal compound serving as a host liquid crystal, aligning the host liquid crystal, aligning molecules of the dichroic substance along the alignment of the liquid crystal molecules, and fixing the alignment state. FIG. 4 is a cross-sectional view schematically illustrating a light absorption anisotropic film (reference numeral 1: barrier layer, reference numeral 2: light absorption anisotropic layer, reference numeral 3: PVA alignment film also serving as barrier layer, reference numeral 4: TAC support) including a light absorption anisotropic layer in which dichroic substances (reference numeral 12: dichroic dye D-1, reference numeral 13: dichroic dye D-2, and reference numeral 14: dichroic dye D-3) are vertically aligned due to a guest-host effect of a liquid crystal molecule 11.

In order to prevent fluctuation in the light absorption characteristics of the light absorption anisotropic layer used in the present invention due to the usage environment, it is preferable that the alignment of the dichroic substance is fixed by forming a chemical bond. For example, the alignment can be fixed by promoting the polymerization of the host liquid crystal, the dichroic substance, and the polymerizable component to be added as desired.

Further, the guest-host type liquid crystal cell having a liquid crystal layer that contains at least a dichroic substance and a host liquid crystal on a pair of substrates may be used as the light absorption anisotropic layer used in the present invention. The alignment of the host liquid crystal (the alignment of the dichroic substance molecules in association of the alignment of the host liquid crystal) can be controlled by the alignment film formed on the inner surface of the substrate, the alignment state thereof is maintained as long as an external stimulus such as an electric field is not applied, and the light absorption characteristics of the light absorption anisotropic layer used in the present invention can be set to be constant.

In the light absorption anisotropic layer used in the present invention, the transmittance at an angle inclined by 30° from the transmittance central axis (also referred to as the transmittance at a wavelength of 550 nm, the same applies hereinafter) is preferably 60% or less, more preferably 50% or less, and still more preferably 45% or less. In this manner, the contrast of the illuminance between the direction of the transmittance central axis and the direction deviated from the transmittance central axis can be increased, and thus the viewing angle can be sufficiently narrowed.

In the light absorption anisotropic layer used in the present invention, the transmittance of the transmittance central axis is preferably 65% or greater, more preferably 75% or greater, and still more preferably 85% or greater. In this manner, the illuminance at the center of the viewing angle of the image display device can be increased to enhance the visibility.

Further, from the viewpoint of making the tint in the front direction neutral, the alignment degree of the light absorption anisotropic layer at a wavelength of 420 nm is preferably 0.93 or greater.

Here, the tint of the light absorption anisotropic layer containing a dichroic substance is typically controlled by adjusting the addition amount of the dichroic substance contained in the light absorption anisotropic layer. However, it was found that the tint both in the front direction and an oblique direction cannot be made neutral only by adjusting the addition amount of the dichroic substance. The reason why the tint thereof both in the front direction and an oblique direction cannot be made neutral is found to be that the alignment degree at 420 nm is low, and the tint thereof both in the front direction and an oblique direction can be made neutral by increasing the alignment degree at 420 nm.

In addition, the light absorption anisotropic layer used in the present invention may be obtained by laminating a plurality of light absorption anisotropic layers with different transmittance central axes or laminating retardation layers such that the transmittance at an angle inclined by 30° from the transmittance central axis and the transmittance of the transmittance central axis are satisfied.

The width of a region where the transmittance is high can be adjusted by laminating a plurality of light absorption anisotropic layers with different transmittance central axes.

In the present invention, it is preferable that the light absorption anisotropic layer is a light absorption anisotropic layer formed of a composition for forming a light absorption anisotropic layer containing a liquid crystal compound and a dichroic substance (hereinafter, also referred to as "composition for forming a light absorption anisotropic layer").

In addition, the composition for forming a light absorption anisotropic layer may contain a solvent, a polymerization initiator, a polymerizable compound, an interface improver, and other additives.

Hereinafter, each component will be described.

<Liquid Crystal Compound>

The composition for forming a light absorption anisotropic layer contains a liquid crystal compound.

The liquid crystal compound can be typically classified into a rod-like type compound and a disk-like type compound depending on the shape thereof.

Further, a liquid crystal compound that does not exhibit dichroism in a visible region is preferable as the liquid crystal compound.

In the following description, the expression "the alignment degree of the light absorption anisotropic layer to be formed is further increased" is also referred to as "the effects of the present invention are more excellent".

As the liquid crystal compound, any of a low-molecular-weight liquid crystal compound or a polymer liquid crystal compound can be used.

Here, "low-molecular-weight liquid crystal compound" indicates a liquid crystal compound having no repeating units in the chemical structure.

Here, "polymer liquid crystal compound" indicates a liquid crystal compound having a repeating unit in the chemical structure.

Examples of the low-molecular-weight liquid crystal compound include liquid crystal compounds described in JP2013-228706A.

Examples of the polymer liquid crystal compound include thermotropic liquid crystal polymers described in JP2011-237513A. Further, the polymer liquid crystal compound may contain a crosslinkable group (such as an acryloyl group or a methacryloyl group) at a terminal.

From the viewpoint of easily realizing the effects of the present invention, the liquid crystal compound is preferably a rod-like liquid crystal compound and more preferably a polymer liquid crystal compound.

The liquid crystal compound may be used alone or in combination of two or more kinds thereof.

From the viewpoint that the effects of the present invention are more excellent, the liquid crystal compound includes preferably a polymer liquid crystal compound and particularly preferably both a polymer liquid crystal compound and a low-molecular-weight liquid crystal compound.

It is preferable that the liquid crystal compound contains, as the liquid crystal compound, a liquid crystal compound represented by Formula (LC) or a polymer thereof. The liquid crystal compound represented by Formula (LC) or a polymer thereof is a compound exhibiting liquid crystallinity. The liquid crystallinity may be a nematic phase or a smectic phase, and may exhibit both a nematic phase and a smectic phase and preferably at least a nematic phase. The smectic phase may be a high-order smectic phase. The high-order smectic phase here denotes a smectic B phase, a smectic D phase, a smectic E phase, a smectic F phase, a smectic G phase, a smectic H phase, a smectic I phase, a smectic J phase, a smectic K phase, or a smectic L phase. Among these, a smectic B phase, a smectic F phase, or a smectic I phase is preferable. It is preferable that the smectic liquid crystal phase exhibited by the liquid crystal compound is any of these high-order smectic liquid crystal phases from the viewpoint that an optically anisotropic layer with a higher alignment degree order can be prepared. Further, the optically anisotropic layer prepared from such a high-order smectic liquid crystal phase with a high alignment degree order is a layer in which a Bragg peak derived from a high-order structure such as a hexatic phase or a crystal phase in X-ray diffraction measurement is obtained. The Bragg peak is a peak derived from a plane periodic structure of molecular alignment, and according to the composition for forming a light absorption anisotropic layer of the present invention, an optically anisotropic layer having a periodic interval of 3.0 to 5.0 Å can be obtained.

Q1-S1-MG-S2-Q2 (LC)

In Formula (LC), Q1 and Q2 each independently represent a hydrogen atom, a halogen atom, a linear, branched, or cyclic alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group ($-B(OH)_2$), a phosphate group ($-OPO(OH)_2$), a sulfate group ($-OSO_3H$), or a crosslinkable group represented by any of Formulae (P-1) to (P-30), and it is preferable that at least one of Q1 or Q2 represents a crosslinkable group represented by any of the following formulae.

(P-1)

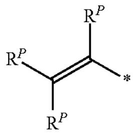

(P-2)

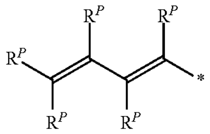

(P-3)

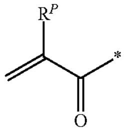

(P-4)

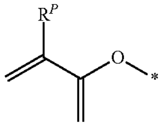

(P-5)

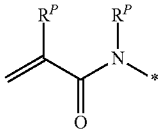

(P-6)

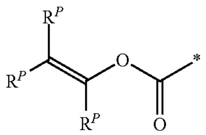

(P-7)

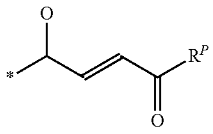

-continued (P-8)

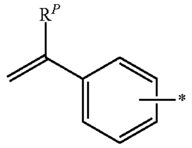

(P-9)

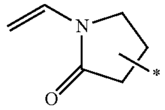

(P-10)

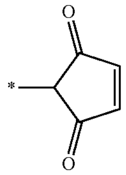

(P-11)

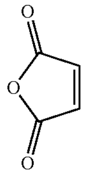

(P-12)

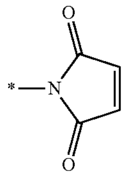

(P-13)

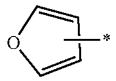

(P-14)

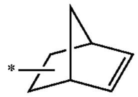

(P-15)

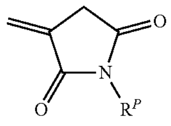

(P-16)

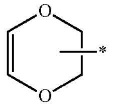

(P-17)

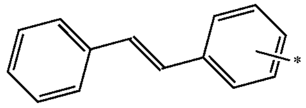

(P-18)

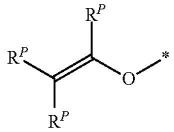

-continued (P-19)

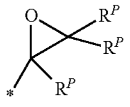

(P-20)

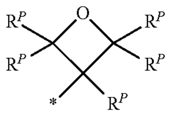

(P-21)

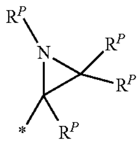

(P-22)

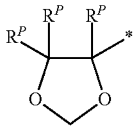

(P-23)

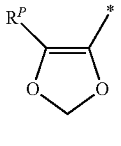

(P-24)

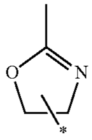

(P-25)

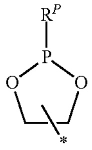

(P-26)

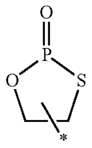

(P-27)

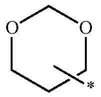

(P-28)

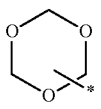

(P-29)

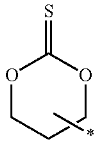

-continued (P-30)

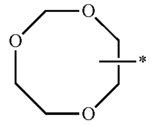

In Formulae (P-1) to (P-30), $R^P$ represents a hydrogen atom, a halogen atom, a linear, branched, or cyclic alkylene group having 1 to 10 carbon atoms, a halogenated alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group ($—B(OH)_2$), a phosphate group ($—OPO(OH)_2$), or a sulfate group ($—OSO_3H$), and a plurality of $R^P$'s may be the same as or different from each other.

Preferred embodiments of the crosslinkable group include a radically polymerizable group and a cationically polymerizable group. As the radically polymerizable group, a vinyl group represented by Formula (P-1), a butadiene group represented by Formula (P-2), a (meth)acryl group represented by Formula (P-4), a (meth)acrylamide group represented by Formula (P-5), a vinyl acetate group represented by Formula (P-6), a fumaric acid ester group represented by Formula (P-7), a styryl group represented by Formula (P-8), a vinylpyrrolidone group represented by Formula (P-9), a maleic acid anhydride represented by Formula (P-11), or a maleimide group represented by Formula (P-12) is preferable. As the cationically polymerizable group, a vinyl ether group represented by Formula (P-18), an epoxy group represented by Formula (P-19), or an oxetanyl group represented by Formula (P-20) is preferable.

In Formula (LC), S1 and S2 each independently represent a divalent spacer group, and preferred embodiments of S1 and S2 include the same structures as those for SPW in Formula (W1), and thus the description thereof will not be repeated.

In Formula (LC), MG represents a mesogen group described below. The mesogen group represented by MG is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited, and for example, particularly description on pages 7 to 16 of "Flussige Kristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystal Handbook Editing Committee can be referred to. The mesogen group represented by MG has preferably 2 to 10 cyclic structures and more preferably 3 to 7 cyclic structures. Specific examples of the cyclic structure include an aromatic hydrocarbon group, a heterocyclic group, and an alicyclic group.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group represented by MG, a group represented by Formula (MG-A) or Formula (MG-B) is preferable, and a group represented by Formula (MG-B) is more preferable.

(MG-A)

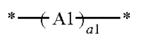

(MG-B)

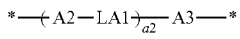

In Formula (MG-A), A1 represents a divalent group selected from the group consisting of an aromatic hydrocarbon group, a heterocyclic group, and an alicyclic group. These groups may be substituted with a substituent such as the substituent W described below. It is preferable that the divalent group represented by A1 is a 4- to 15-membered ring. Further, the divalent group represented by A1 may be a monocycle or a fused ring.

Further, * represents a bonding position with respect to S1 or S2.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable.

The divalent heterocyclic group represented by A1 may be any of aromatic or non-aromatic, but a divalent aromatic heterocyclic group is preferable as the divalent heterocyclic group from the viewpoint of further improving the alignment degree. The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other. Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, a thienooxazole-diyl group, and the following structures (II-1) to (II-4).

(II-1)

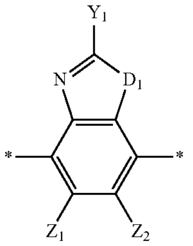

(II-2)

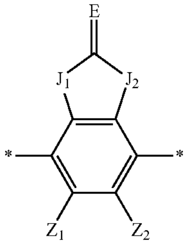

(II-3)

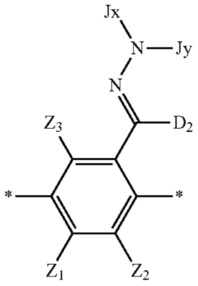

(II-4)

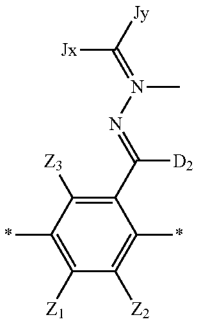

In Formulae (II-1) to (II-4), $D_1$ represents —S—, —O—, or $NR^{11}$—, $R^{11}$ represents a hydrogen atom or an alkyl group having 1 to 6 carbon atoms, $Y_1$ represents an aromatic hydrocarbon group having 6 to 12 carbon atoms or an aromatic heterocyclic group having 3 to 12 carbon atoms, $Z_1$, $Z_2$, and $Z_3$ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, —$NR^{12}R^{13}$, or —$SR^{12}$, $Z_1$ and $Z_2$ may be bonded to each other to form an aromatic ring or an aromatic heterocyclic ring, $R^{12}$ and $R^{13}$ each independently represent a hydrogen atom or an alkyl group having 1 to 6 carbon atoms, $J_1$ and $J_2$ each independently represent a group selected from the group consisting of —O—, —$NR^{21}$— ($R^{21}$ represents a hydrogen atom or substituent), —S—, and —C(O)—, E represents a hydrogen atom or a non-metal atom of a Group 14 to a Group 16 to which a substituent may be bonded, Jx represents an organic group having 2 to 30 carbon atoms, which has at least one aromatic ring selected from the group consisting of an aromatic hydrocarbon ring and an aromatic heterocyclic ring, Jy represents a hydrogen atom, an alkyl group having 1 to 6 carbon atoms which may have a substituent, or an organic group having 2 to 30 carbon atoms which has at least one aromatic ring selected from the group consisting of an aromatic hydrocarbon ring and an aromatic heterocyclic ring, the aromatic ring of Jx and Jy may have a substituent, Jx and Jy may be bonded to each other to form a ring, and $D_2$ represents a hydrogen atom or an alkyl group having 1 to 6 carbon atoms which may have a substituent.

In Formula (II-2), in a case where $Y_1$ represents an aromatic hydrocarbon group having 6 to 12 carbon atoms, the aromatic hydrocarbon group may be monocyclic or polycyclic. In a case where $Y_1$ represents an aromatic heterocyclic group having 3 to 12 carbon atoms, the aromatic heterocyclic group may be monocyclic or polycyclic. In Formula (II-2), in a case where $J_1$ and $J_2$ represent —$NR^{21}$—, as the substituent represented by $R^{21}$, for example, paragraphs 0035 to 0045 of JP2008-107767A can be referred to, and the content thereof is incorporated in the present specification. In Formula (II-2), in a case where E represents a non-metal atom of a Group 14 to a Group 16 to which a substituent may be bonded, ═O, ═S, ═NR', or ═C(R')R' is preferable. R' represents a substituent, and as the substituent, for example, the description in paragraphs [0035] to [0045] of JP2008-107767A can be referred to, and —$NZ^{A1}Z^{A2}$ ($Z^{A1}$ and $Z^{A2}$ each independently represent a hydrogen atom, an alkyl group, or an aryl group) is preferable.

Specific examples of the divalent alicyclic group represented by A1 include a cyclopentylene group and a cyclohexylene group, and the carbon atoms thereof may be substituted with —O—, —$Si(CH_3)_2$—, —N(Z)— (Z represents a hydrogen atom, an alkyl group having 1 to 4 carbon atoms, a cycloalkyl group, an aryl group, a cyano group, or a halogen atom), —C(O)—, —S—, —C(S)—, —S(O)—, —$SO_2$—, or a group obtained by combining two or more of these groups.

In Formula (MG-A), a1 represents an integer of 2 to 10. The plurality of A1's may be the same as or different from each other.

In Formula (MG-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (MG-A), and thus description thereof will not be repeated. In Formula (MG-B), a2 represents an integer of 1 to 10, a plurality of A2's may be the same as or different from each other, and a plurality of LA1's may be the same as or different from each other. From the viewpoint that the effects of the present invention are more excellent, it is more preferable that a2 represents 2 or greater. In Formula (MG-B), LA1 represents a single bond or divalent linking group. Here, LA1 represents a divalent linking group in a case where a2 represents 1, and at least one of the plurality of LA1's represents a divalent linking group in a case where a2 represents 2 or greater. In Formula (MG-B), examples of the divalent linking group represented by LA1 are the same as those for LW, and thus the description thereof will not be repeated.

Specific examples of MG include the following structures, the hydrogen atoms on the aromatic hydrocarbon group, the heterocyclic group, and the alicyclic group in the following structures may be substituted with the substituent W described above.

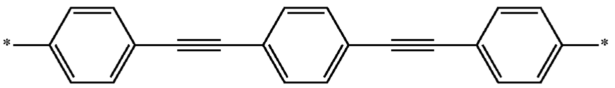

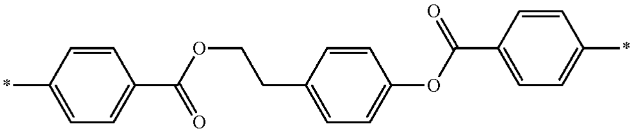

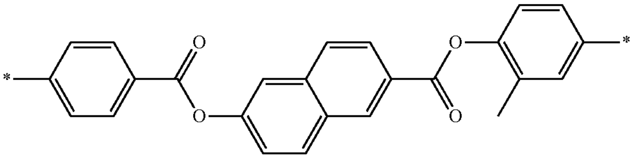

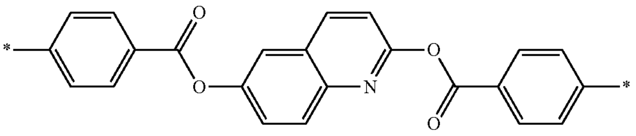

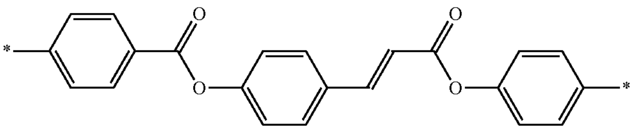

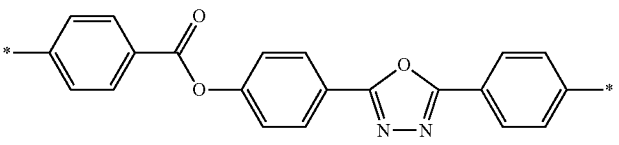

-continued
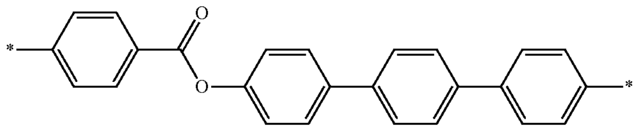
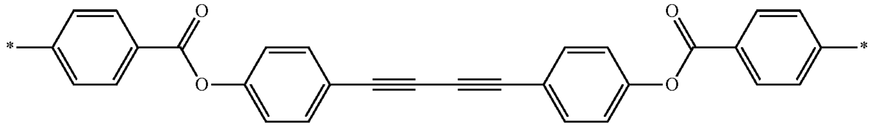
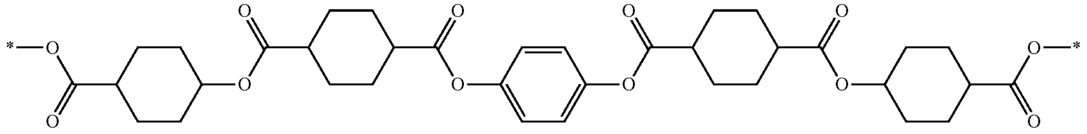
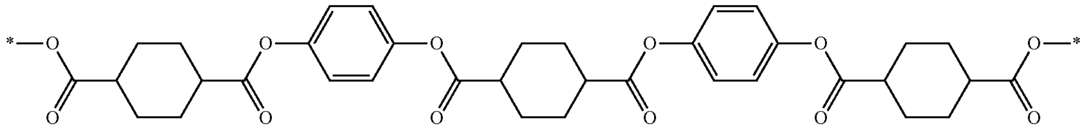
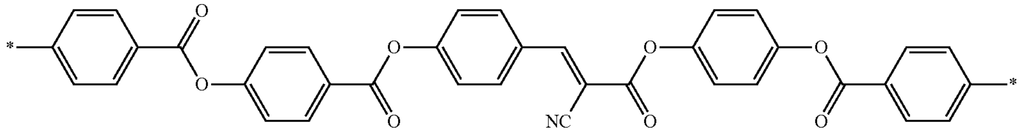
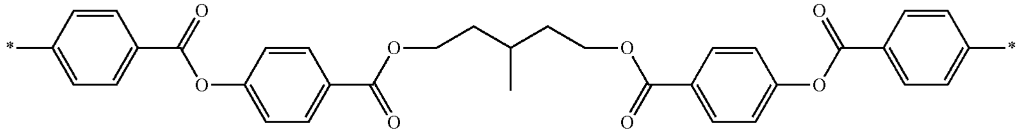
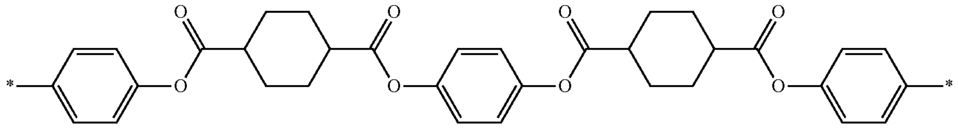
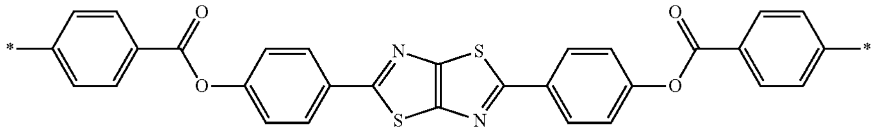
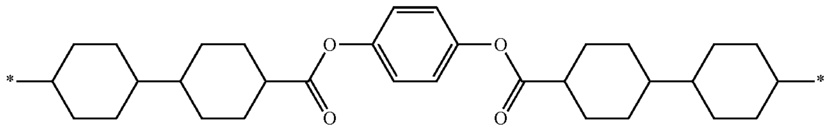
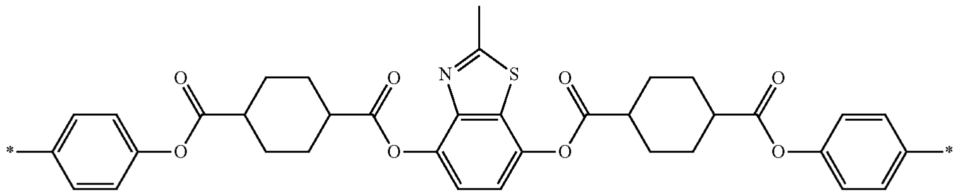
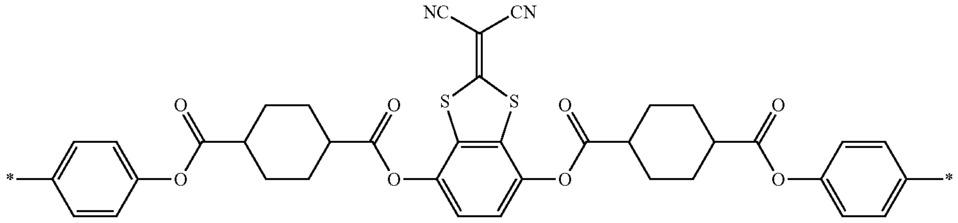

-continued
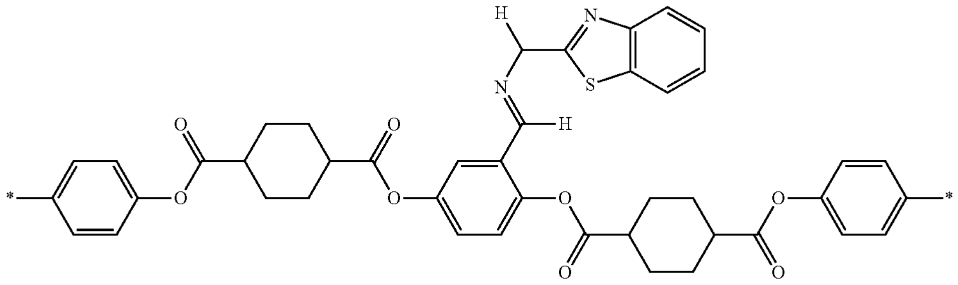
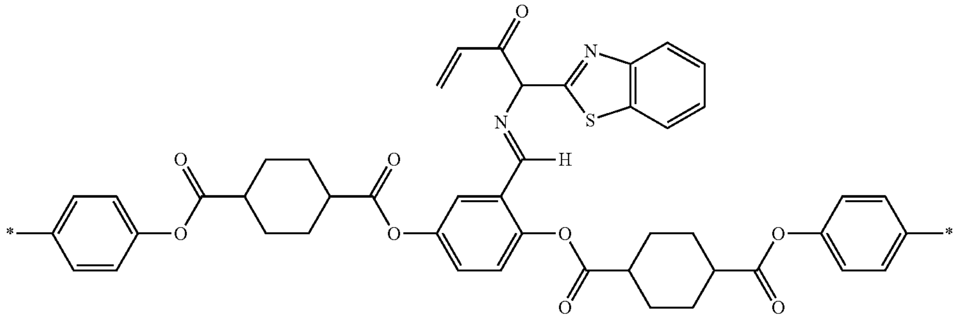
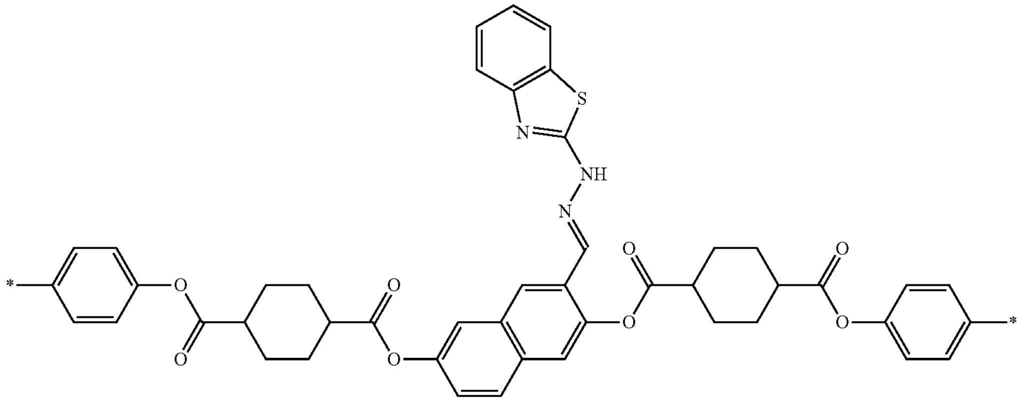
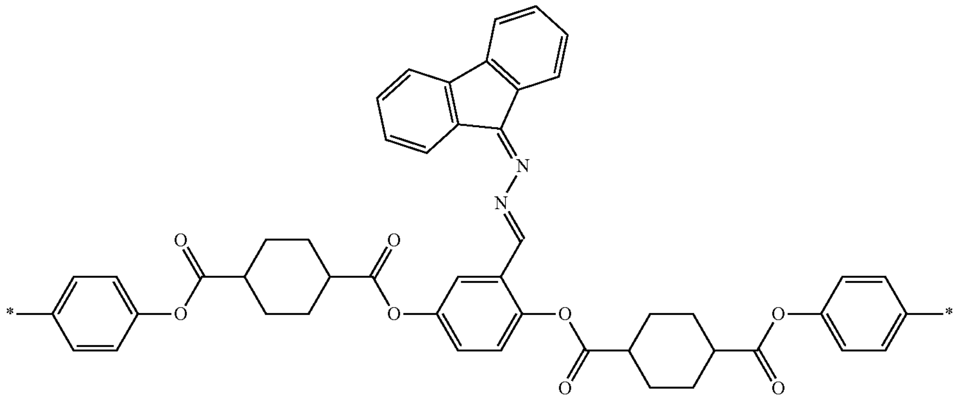
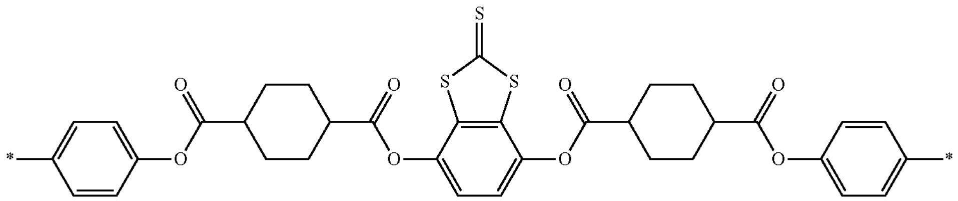

-continued
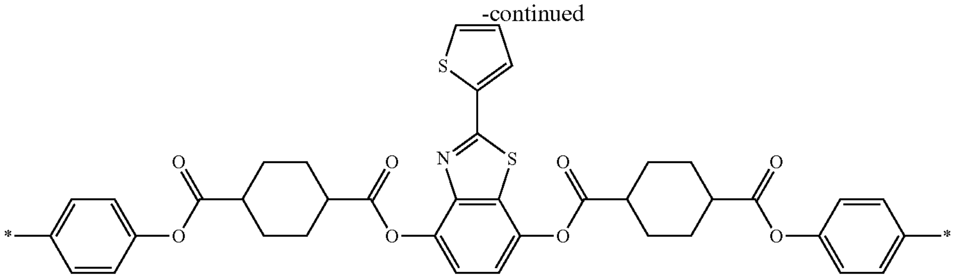
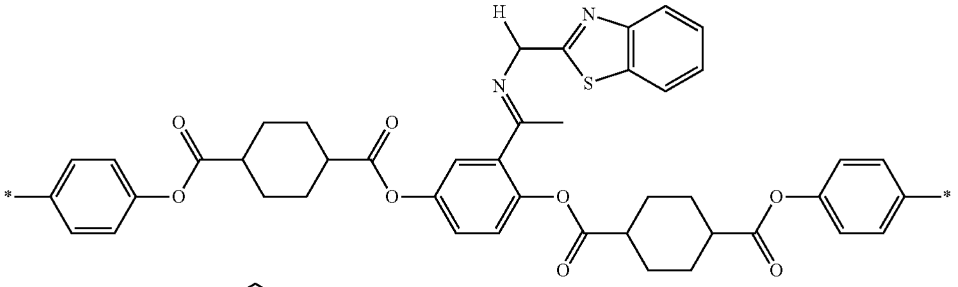
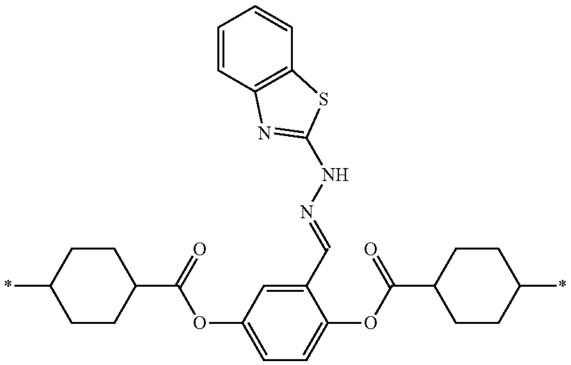
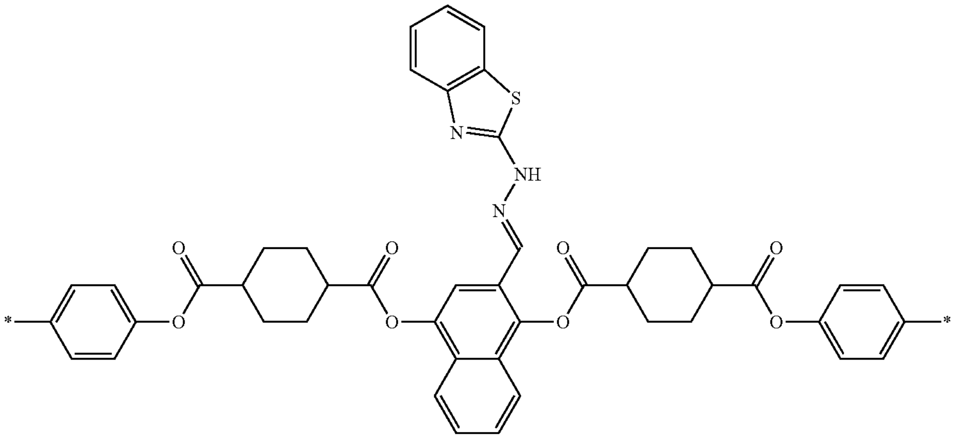
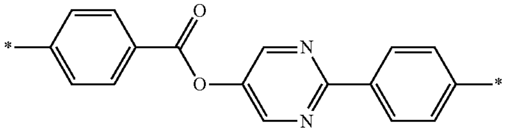
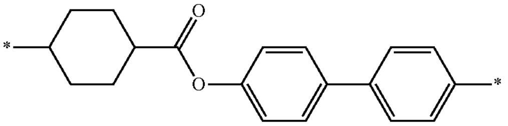
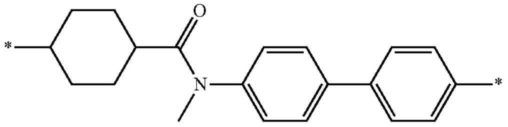
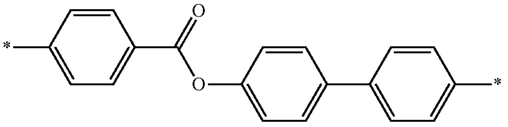
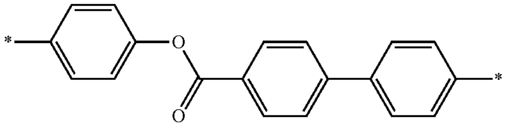
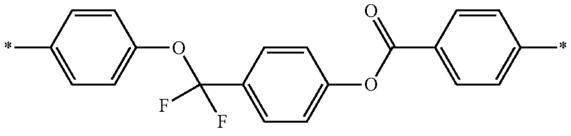

-continued
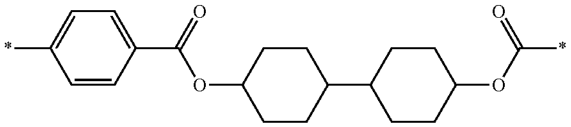
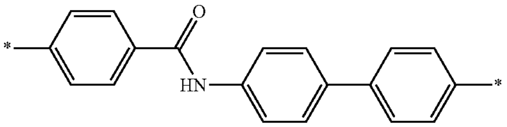
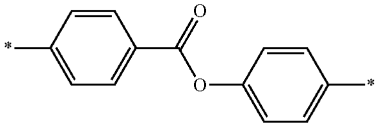
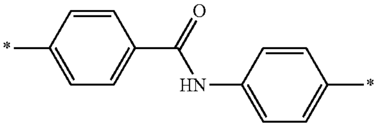
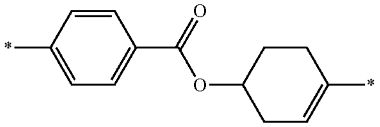
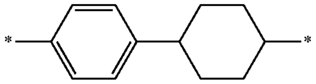
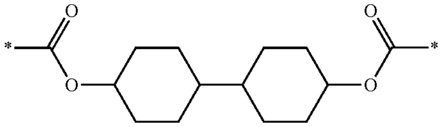
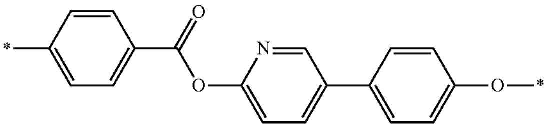
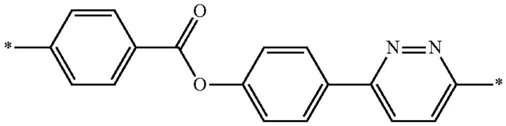
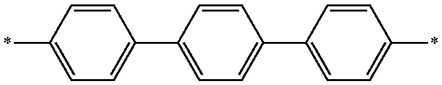
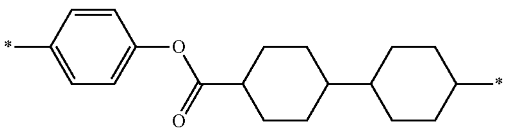
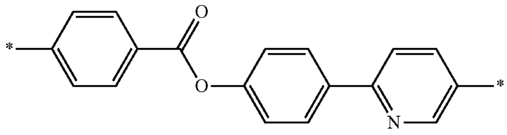
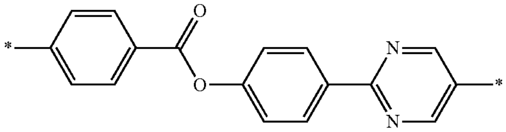
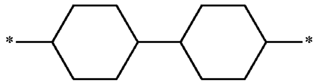
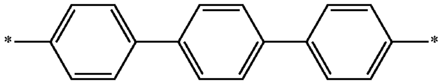
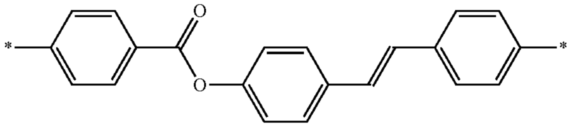
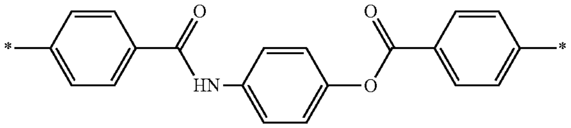
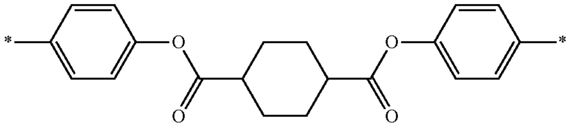
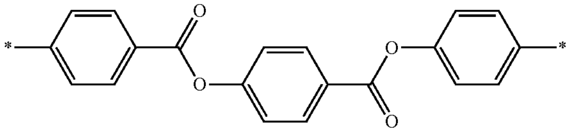
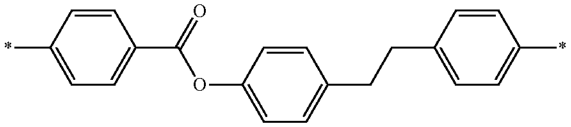
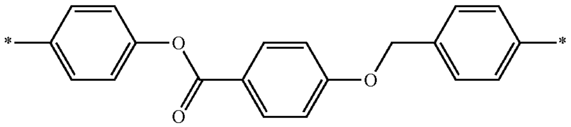

-continued
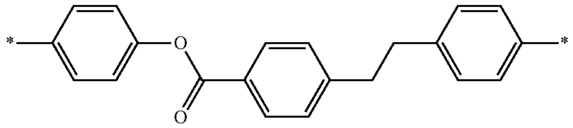
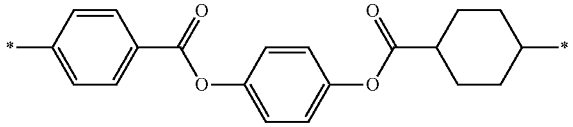
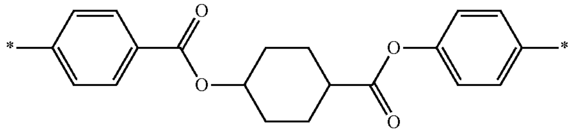
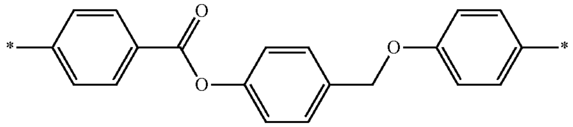
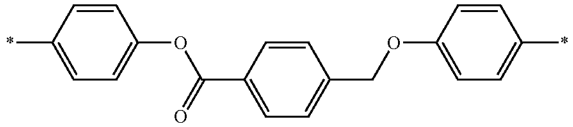
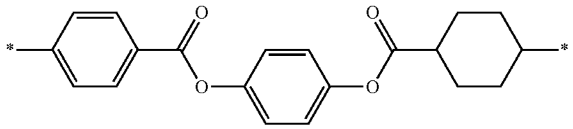
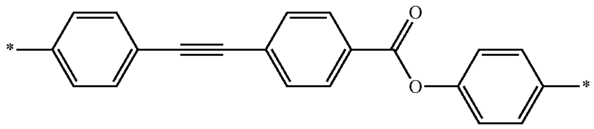
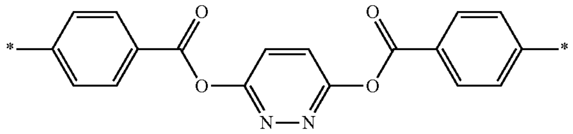
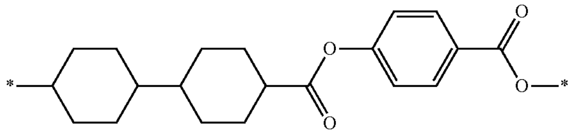
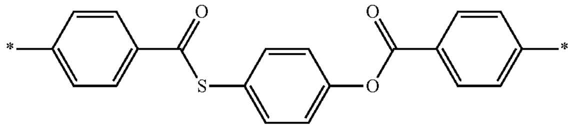
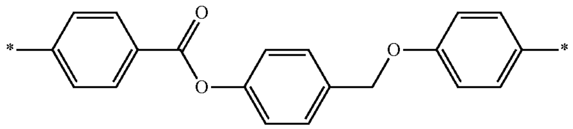
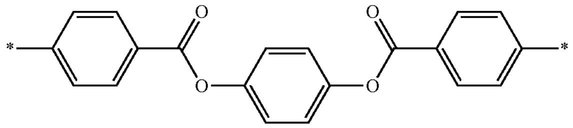
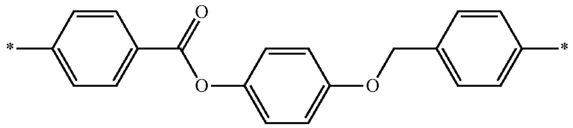

-continued
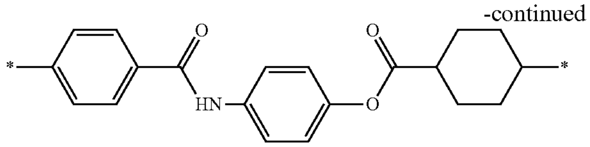
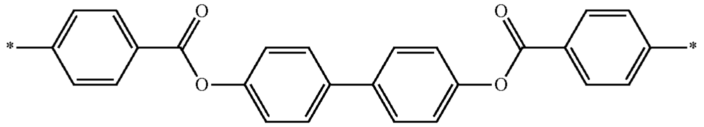
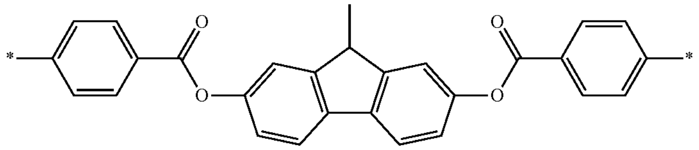
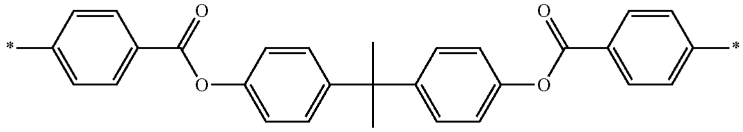
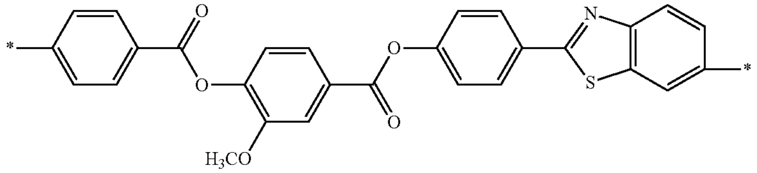
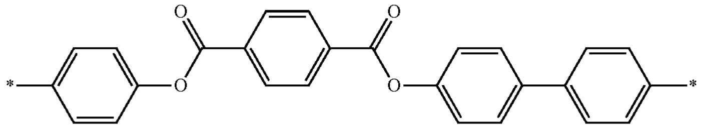
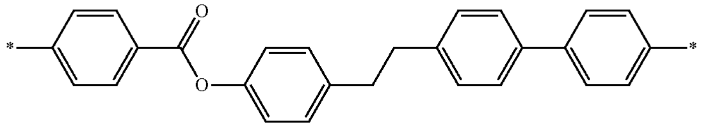
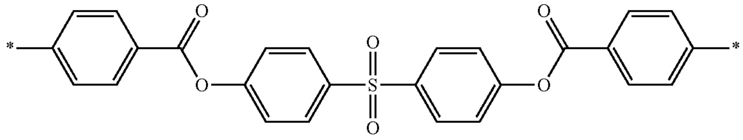
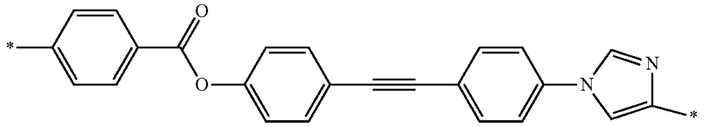
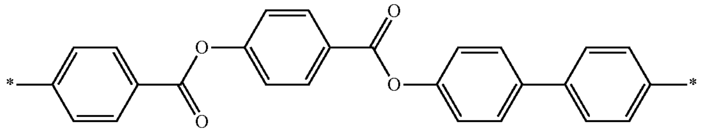
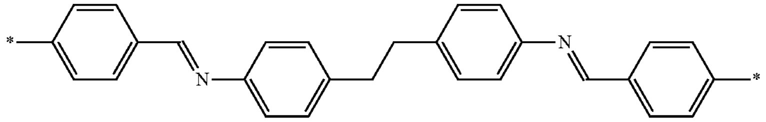
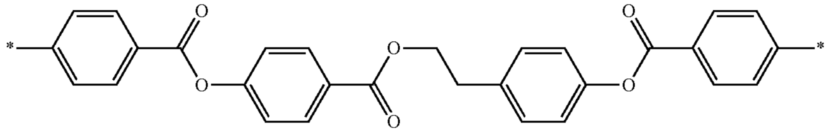
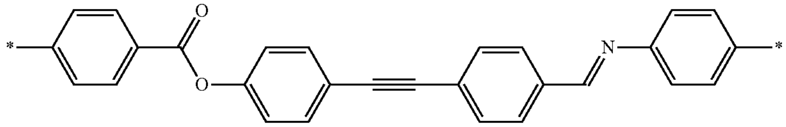

-continued

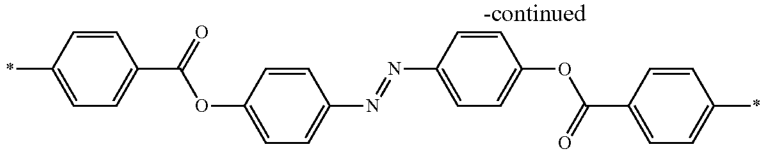

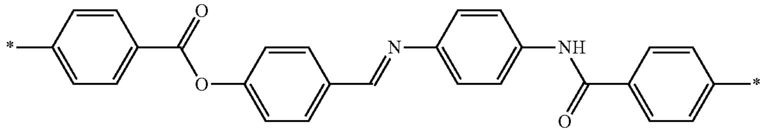

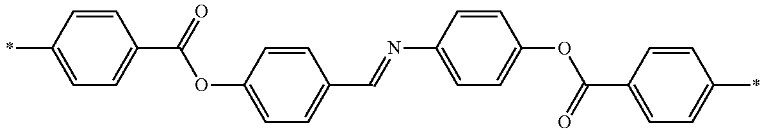

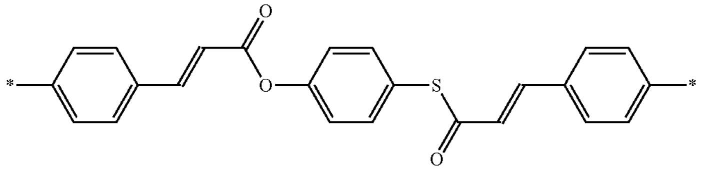

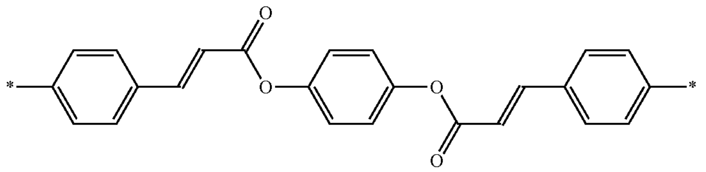

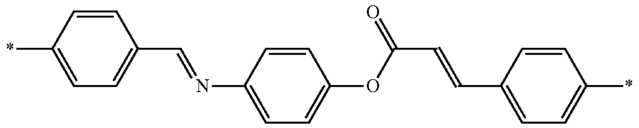

(Low-Molecular-Weight Liquid Crystal Compound)

In a case where the liquid crystal compound represented by Formula (LC) is a low-molecular-weight liquid crystal compound, examples of preferred embodiments of the cyclic structure of the mesogen group MG include a cyclohexylene group, a cyclopentylene group, a phenylene group, a naphthylene group, a fluorene-diyl group, a pyridine-diyl group, a pyridazine-diyl group, a thiophene-diyl group, an oxazole-diyl group, a thiazole-diyl group, and a thienothiophene-diyl group, and the number of cyclic structures is preferably in a range of 2 to 10 and more preferably in a range of 3 to 7.

Examples of preferred embodiments of the substituent W having a mesogen structure include a halogen atom, a halogenated alkyl group, a cyano group, a hydroxy group, a nitro group, a carboxy group, an alkoxy group having 1 to 10 carbon atoms, an alkylcarbonyl group having 1 to 10 carbon atoms, an alkyloxycarbonyl group having 1 to 10 carbon atoms, an alkylcarbonyloxy group having 1 to 10 carbon atoms, an amino group, an alkylamino group having 1 to 10 carbon atoms, an alkylaminocarbonyl group, and a group in which LW in the Formula (W1) represents a single bond, SPW represents a divalent spacer group, and Q represents a crosslinkable group represented by any of Formulae (P-1) to (P-30), and preferred examples of the crosslinkable group include a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, and an oxetanyl group.

Since the preferred embodiments of the divalent spacer groups S1 and S2 are the same as those of the SPW, the description thereof will not be repeated. In a case where a low-molecular-weight liquid crystal compound exhibiting smectic properties is used, the number of carbon atoms of the spacer group (the number of atoms in a case where the carbon atoms are substituted "SP-C") is preferably 6 or more and more preferably 8 or more.

In a case where the liquid crystal compound represented by Formula (LC) is a low-molecular-weight liquid crystal compound, a plurality of low-molecular-weight liquid crystal compounds may be used in combination, preferably 2 to 6 kinds of low-molecular-weight liquid crystal compounds are used in combination, and more preferably 2 to 4 kinds of low-molecular-weight liquid crystal compounds are used in combination. By using low-molecular-weight liquid crystal compounds in combination, the solubility can be improved and the phase transition temperature of the composition for forming a light absorption anisotropic layer can be adjusted.

Specific examples of the low-molecular-weight liquid crystal compound include compounds represented by Formulae (LC-1) to (LC-77), but the low-molecular-weight liquid crystal compound is not limited thereto.

(LC-1)
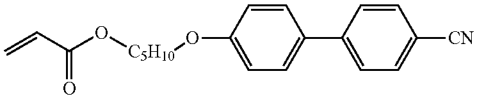
(LC-2)
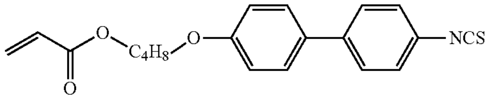
(LC-3)
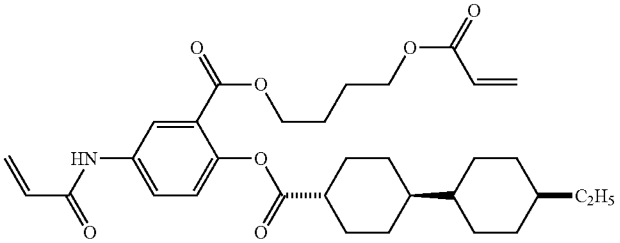
(LC-4)
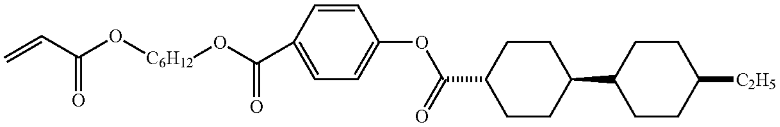
(LC-5)
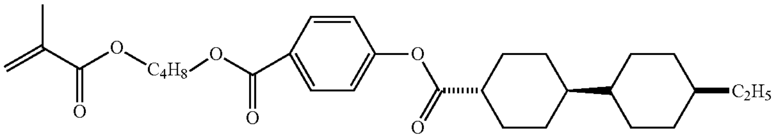
(LC-6)
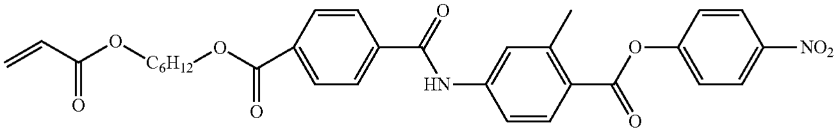
(LC-7)
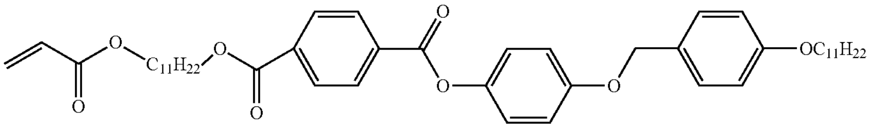
(LC-8)
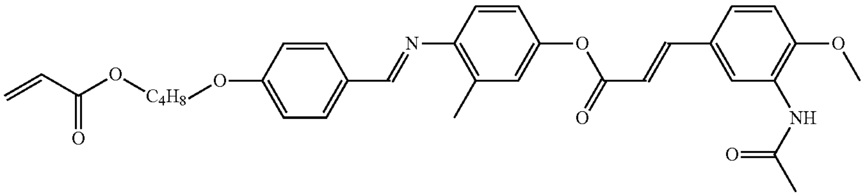
(LC-9)
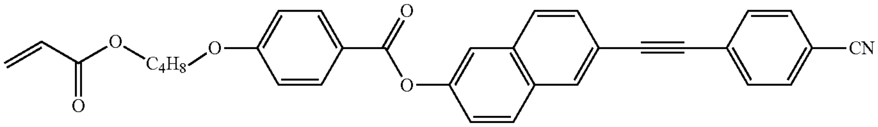
(LC-10)
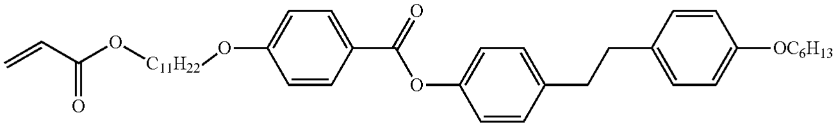
(LC-11)
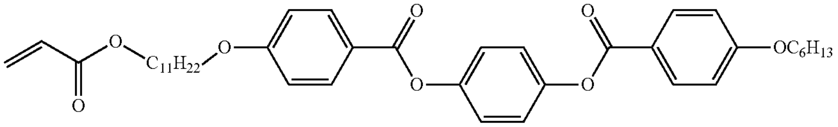

-continued
(LC-12)
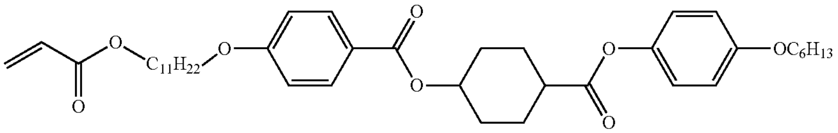
(LC-13)
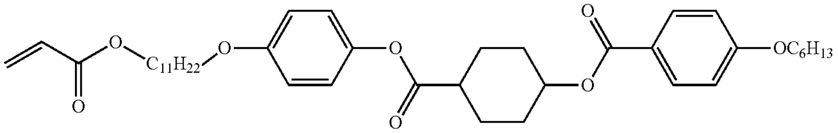
(LC-14)
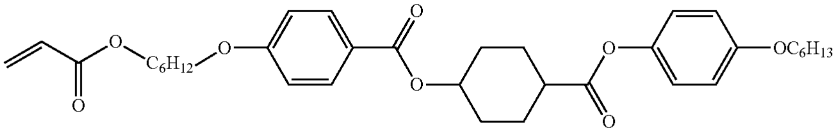
(LC-15)
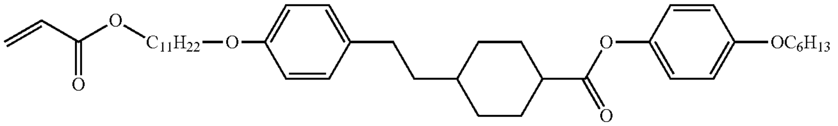
(LC-16)
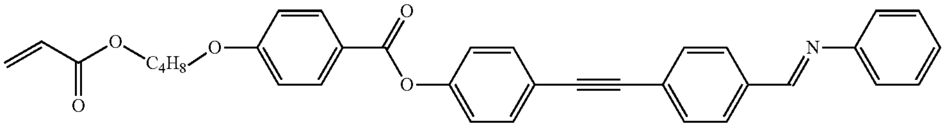
(LC-17)
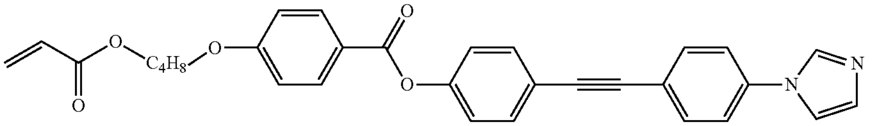
(LC-18)
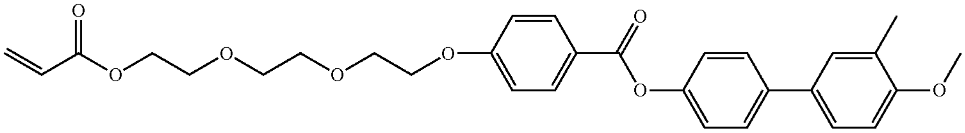
(LC-19)
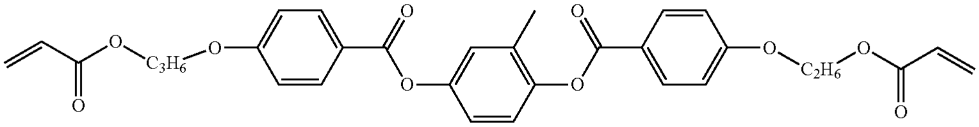
(LC-20)
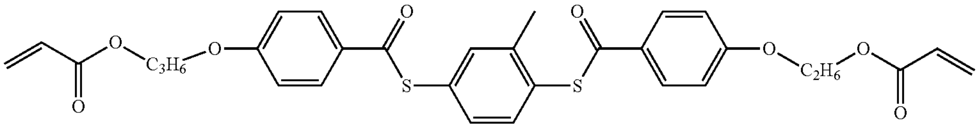
(LC-21)
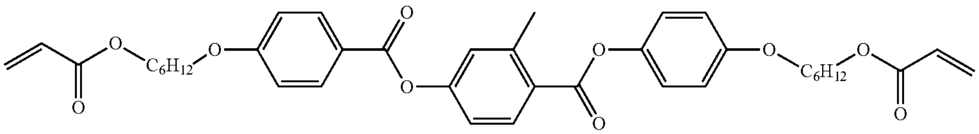
(LC-22)
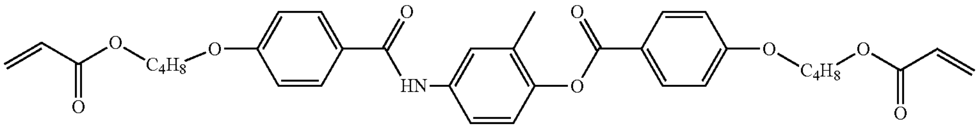

-continued
(LC-23)
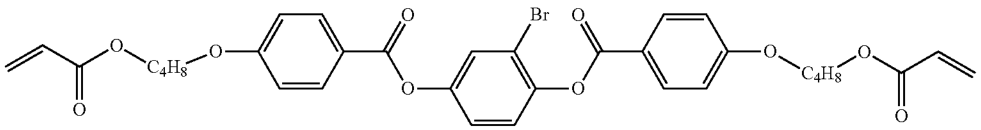
(LC-24)
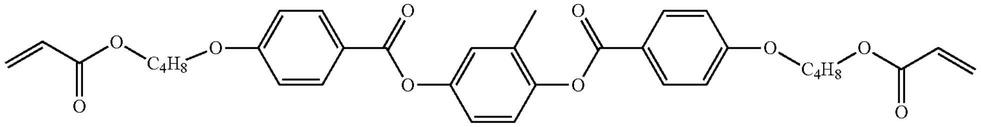
(LC-25)
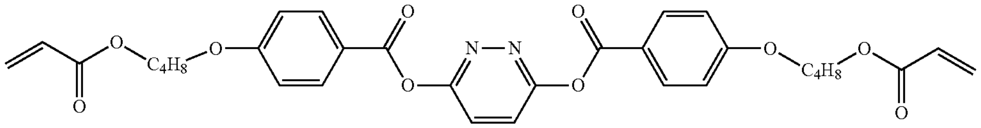
(LC-26)
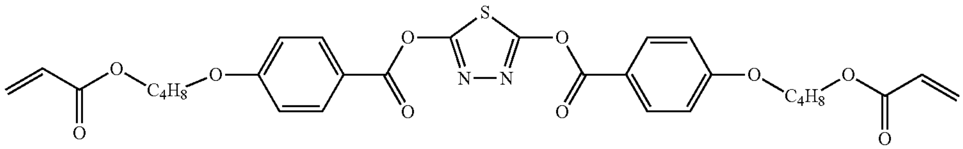
(LC-27)
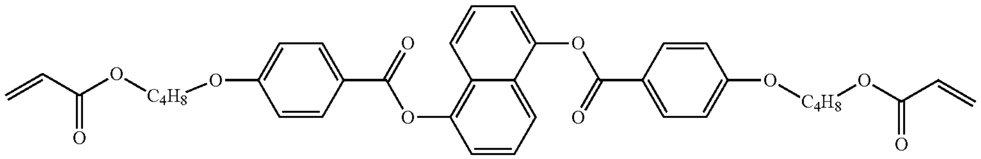
(LC-28)
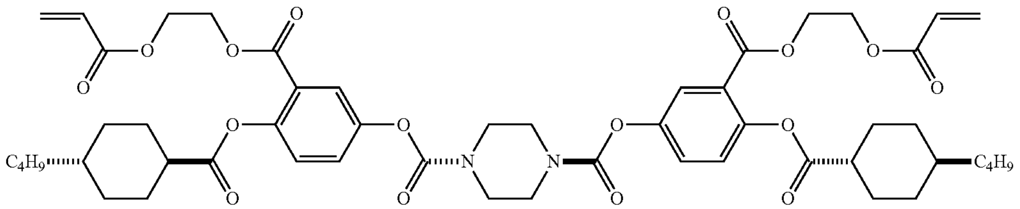
(LC-29)
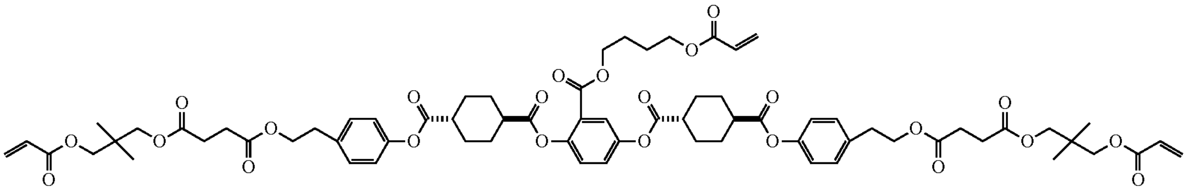
(LC-30)
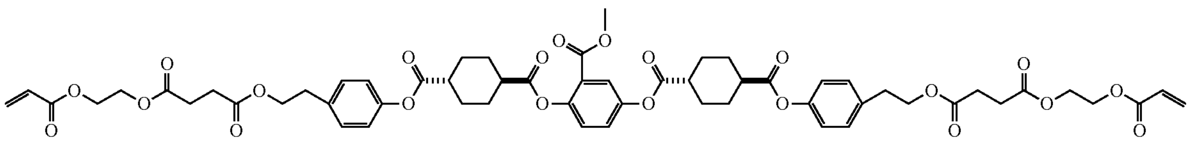
(LC-31)
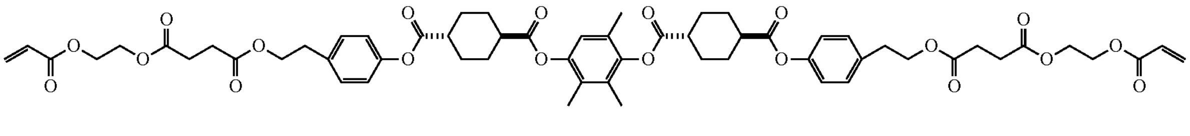

-continued
(LC-32)
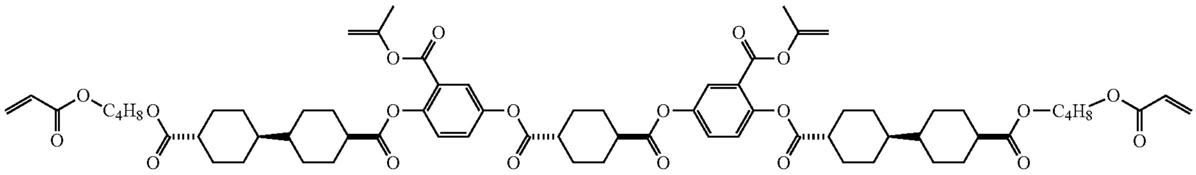
(LC-33)
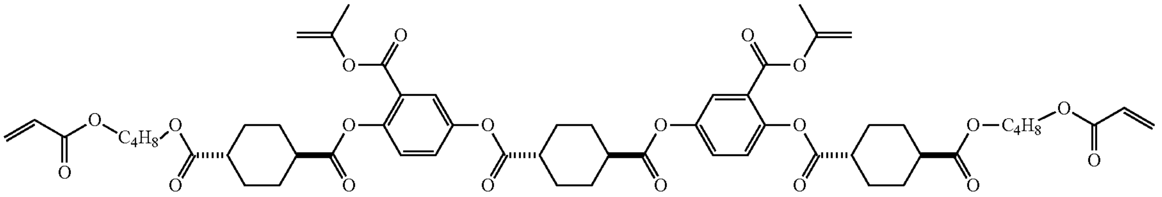
(LC-34)
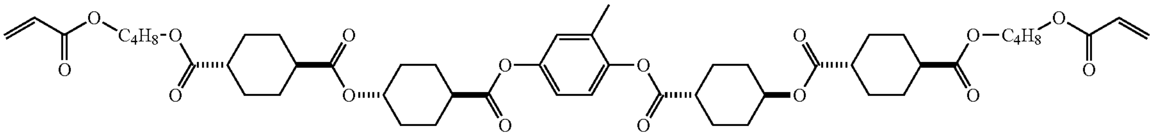
(LC-35)
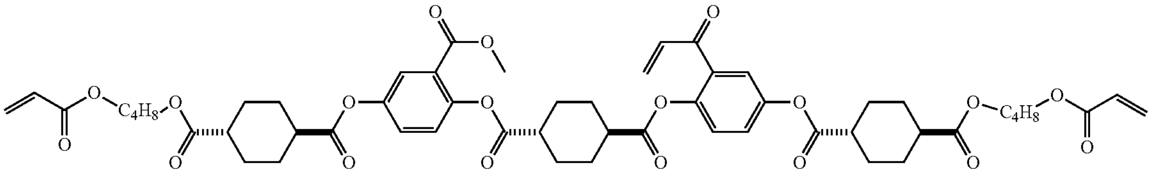
(LC-36)
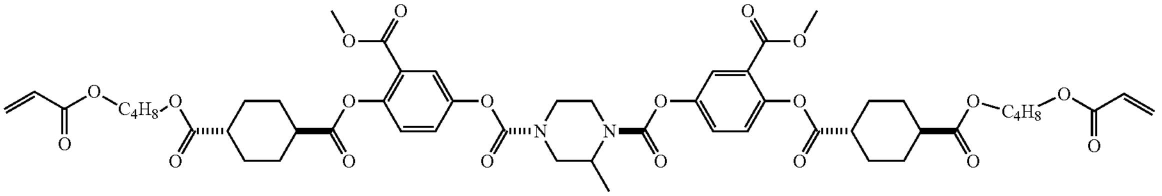
(LC-37)
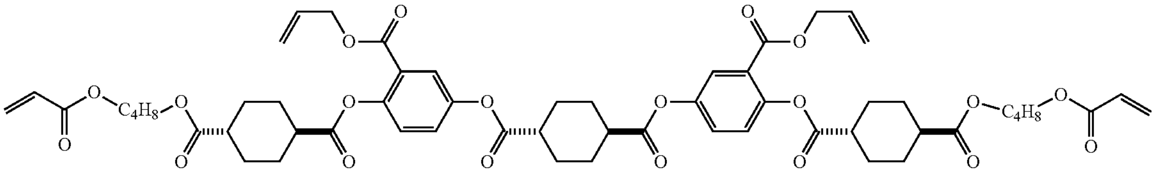
(LC-38)
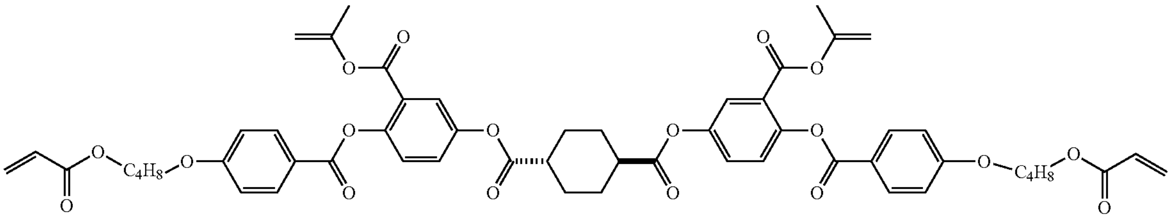
(LC-39)
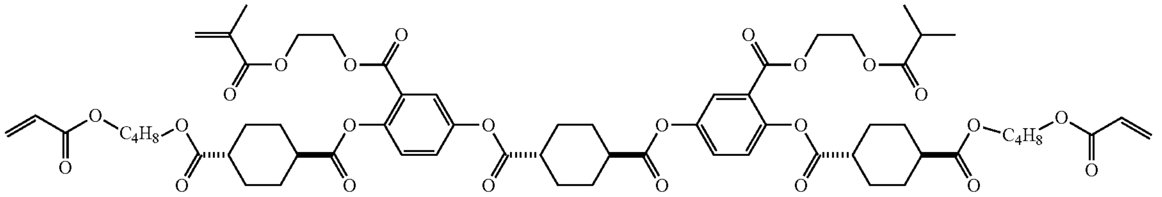

-continued
(LC-40)
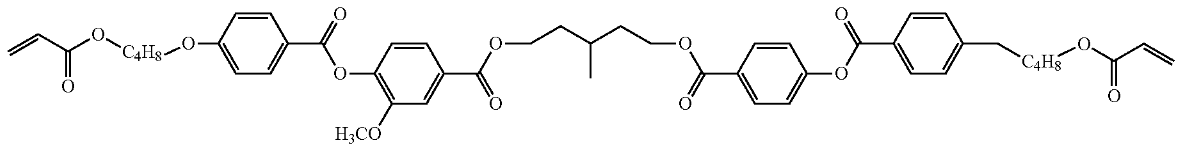
(LC-41)
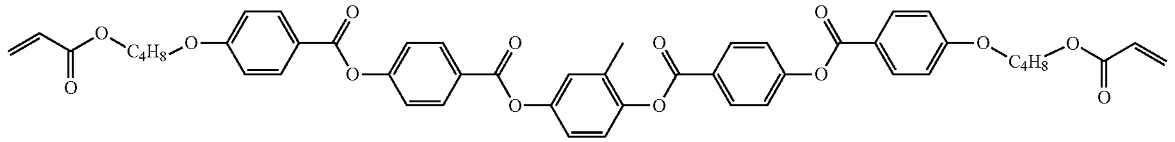
(LC-42)
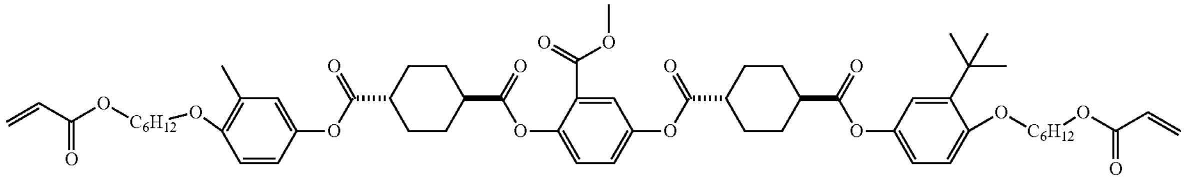
(LC-43)
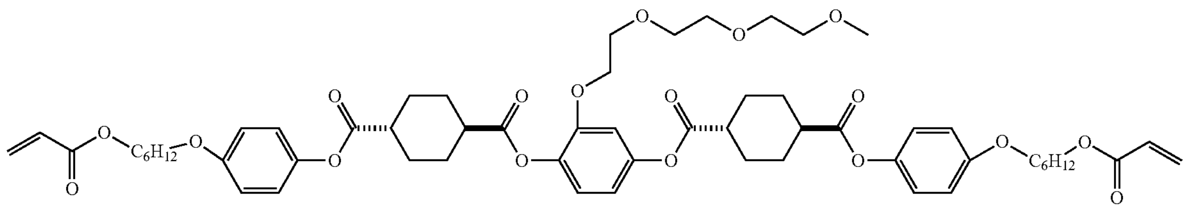
(LC-44)
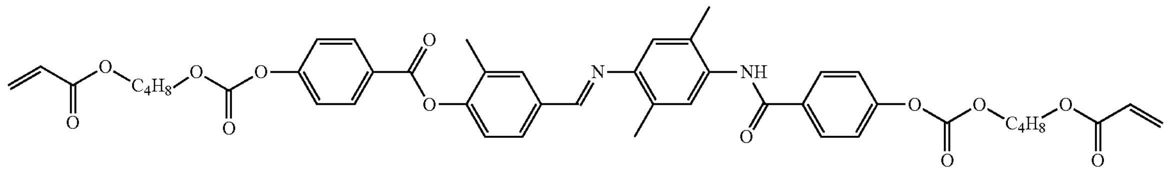
(LC-45)
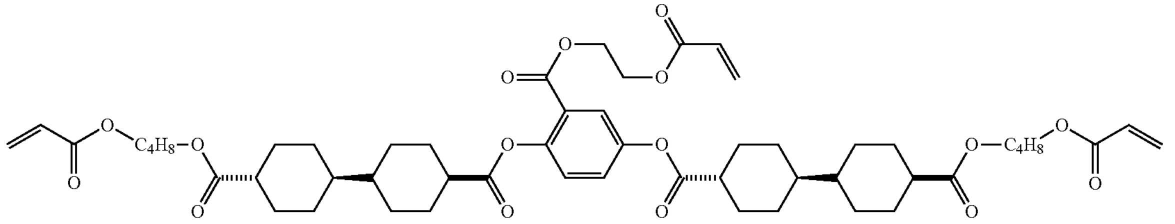
(LC-46)
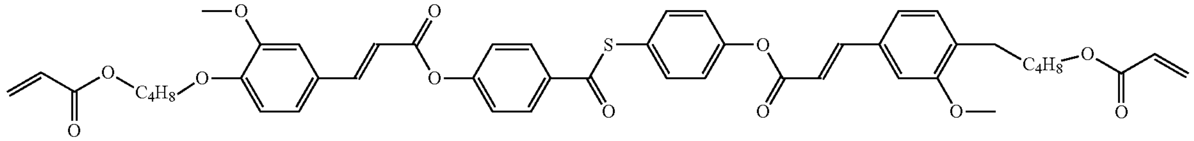
(LC-47)
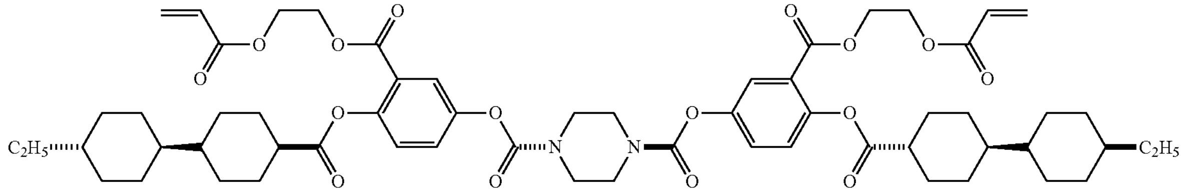

-continued
(LC-48)
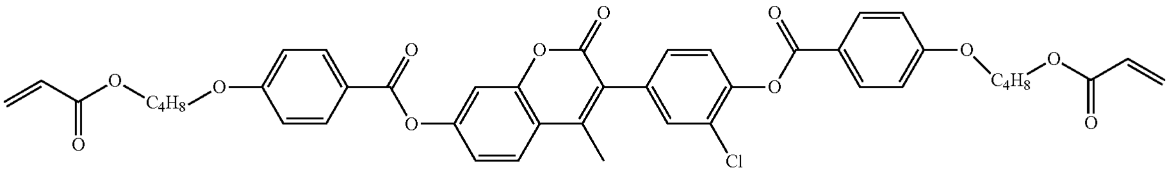
(LC-49)
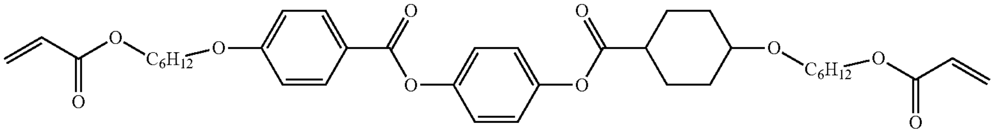
(LC-50)
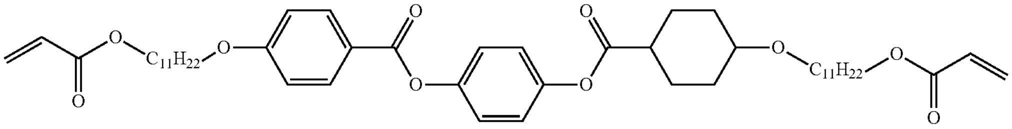
(LC-51)
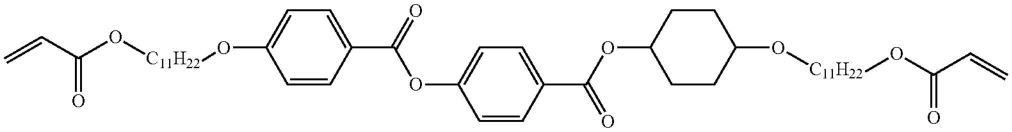
(LC-52)
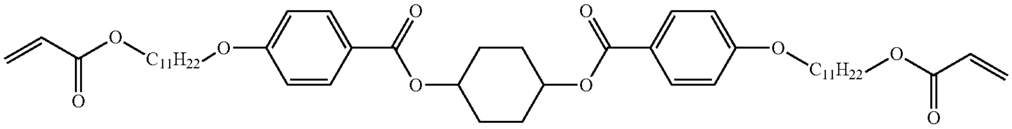
(LC-53)
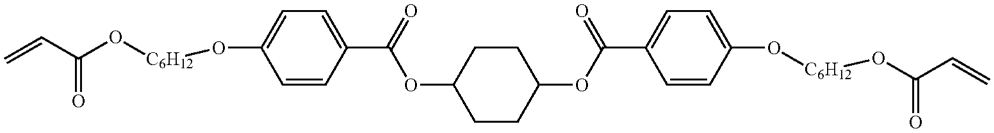
(LC-54)
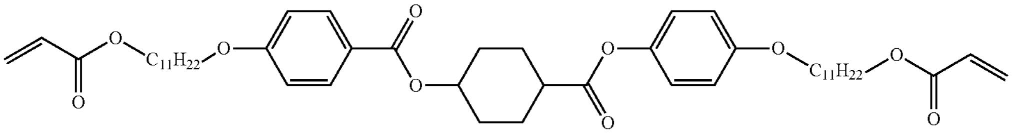
(LC-55)
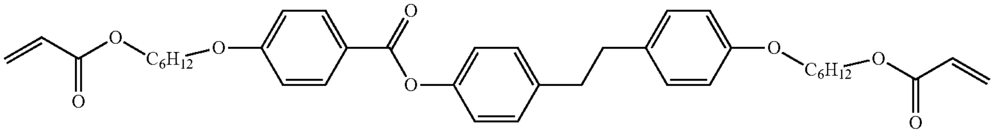
(LC-56)
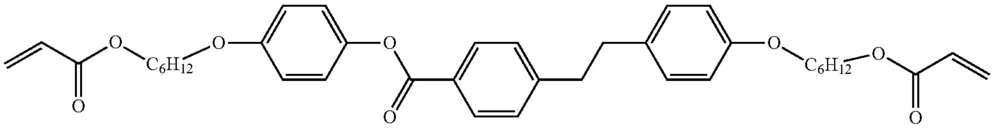
(LC-57)
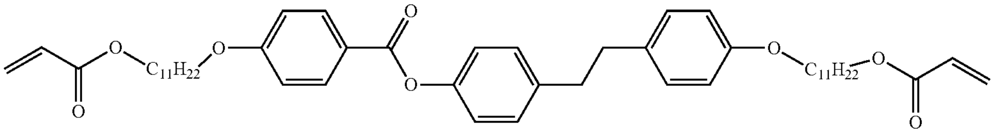
(LC-58)
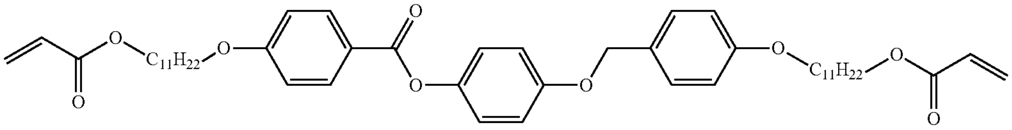

-continued
(LC-59)
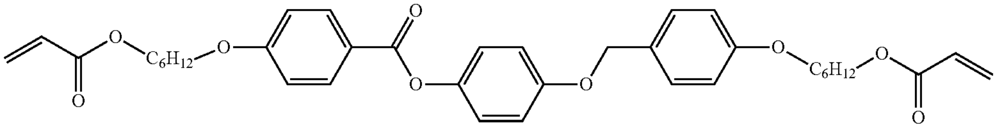
(LC-60)
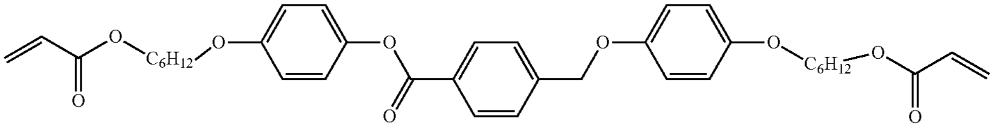
(LC-61)
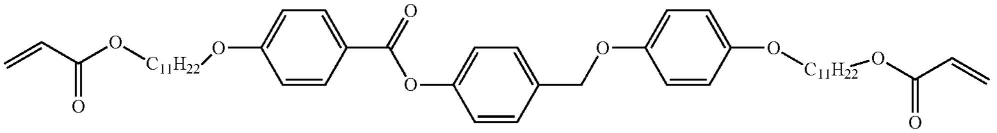
(LC-62)
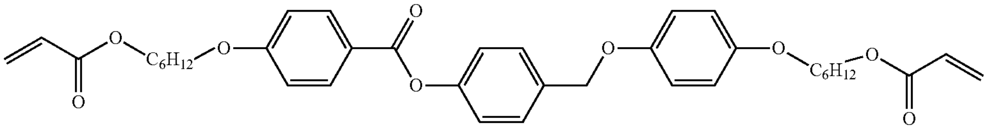
(LC-63)
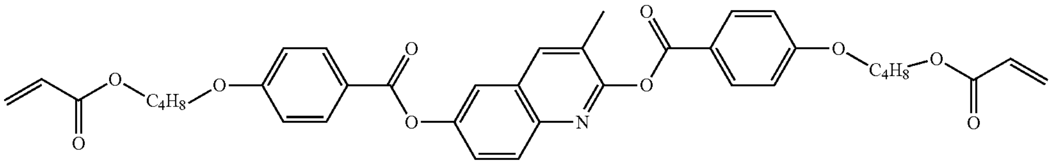
(LC-64)
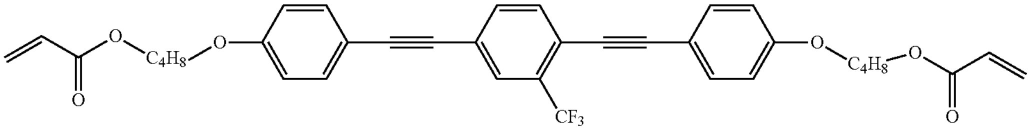
(LC-65)
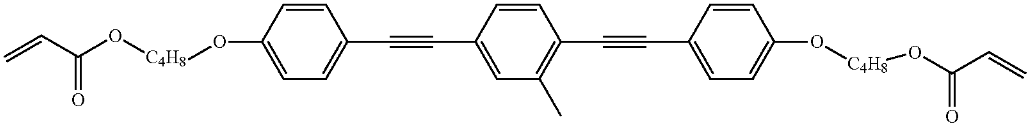
(LC-65)
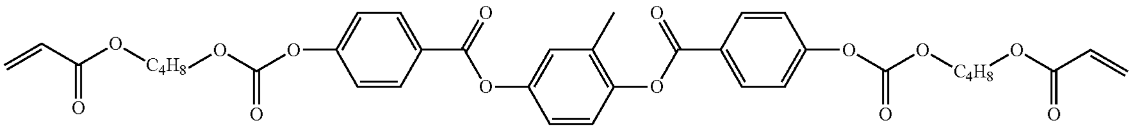
(LC-66)
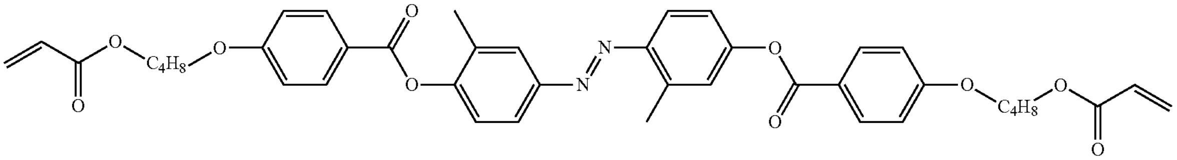
(LC-67)
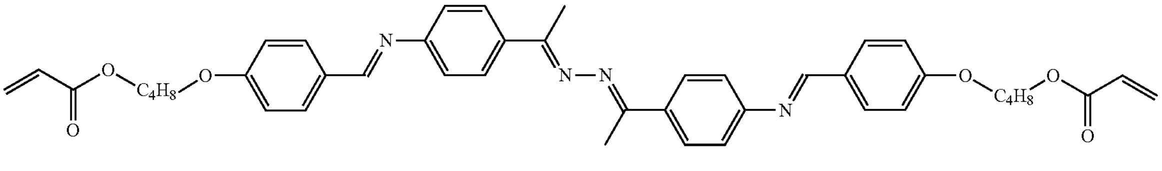

-continued
(LC-68)
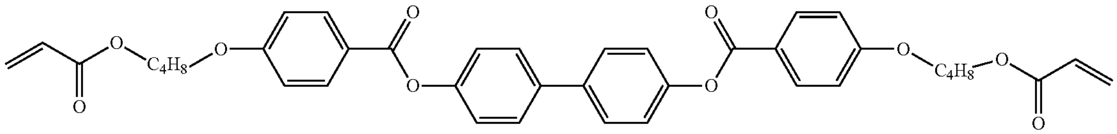
(LC-69)
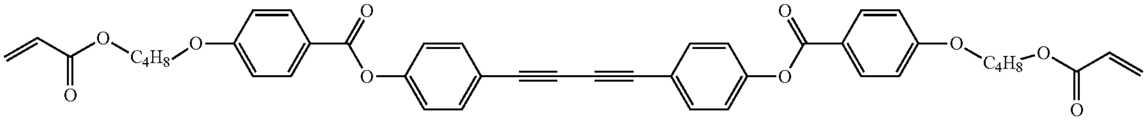
(LC-70)
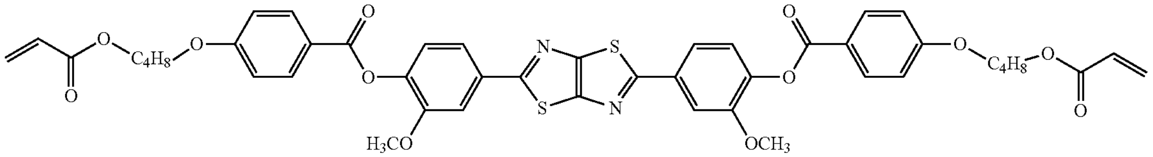
(LC-71)
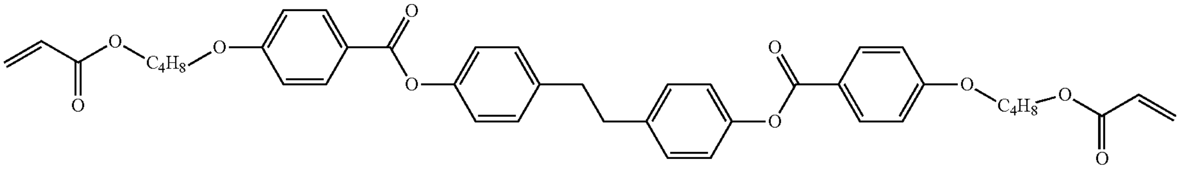
(LC-72)
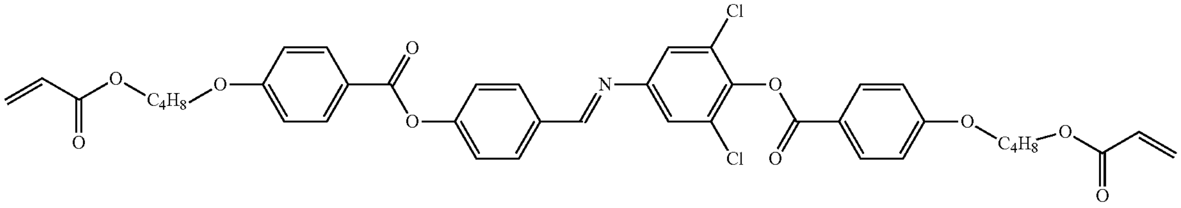
(LC-73)
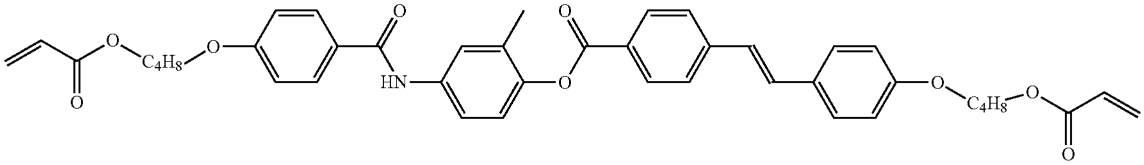
(LC-74)
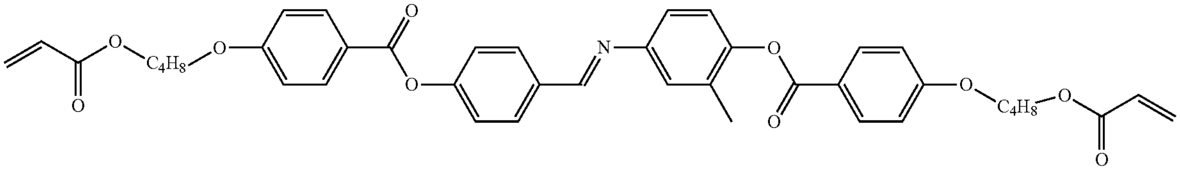
(LC-75)
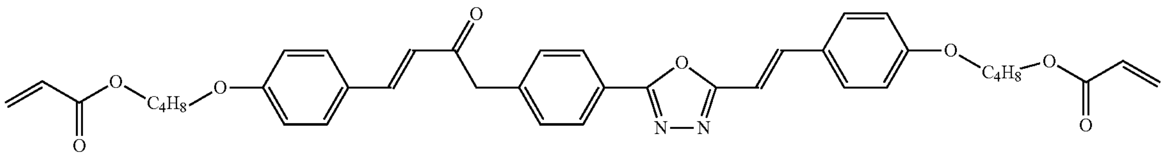
(LC-76)
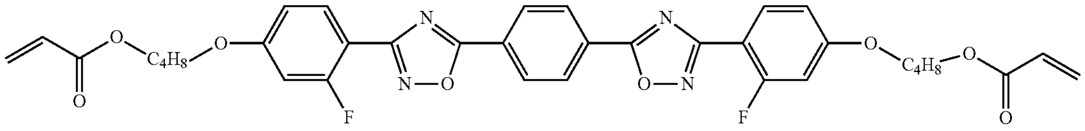

-continued (LC-77)

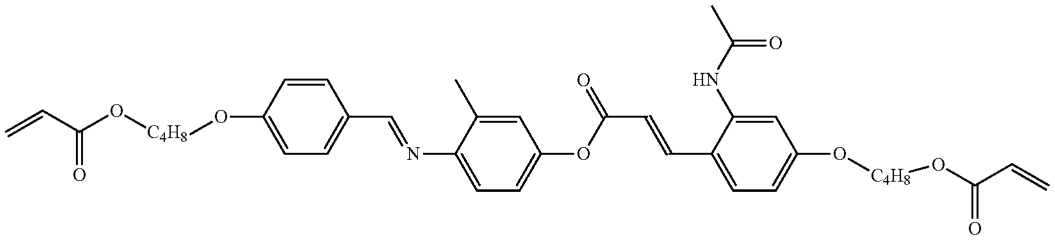

(Polymer Liquid Crystal Compound)

The polymer liquid crystal compound is preferably a homopolymer or a copolymer having a repeating unit described below, and may be any of a random polymer, a block polymer, a graft polymer, or a star polymer.

(Repeating Unit (1))

It is preferable that the polymer liquid crystal compound has a repeating unit represented by Formula (1) (hereinafter, also referred to as "repeating unit (1)").

(1)

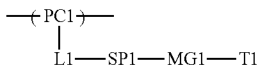

In Formula (1), PC1 represents a main chain of the repeating unit, L1 represents a single bond or a divalent linking group, SP1 represents a spacer group, MG1 represents a mesogen group MG in Formula (LC), and T1 represents a terminal group.

Examples of the main chain of the repeating unit represented by PC1 include groups represented by Formulae (P1-A) to (P1-D). Among these, from the viewpoints of diversity and handleability of a monomer serving as a raw material, a group represented by Formula (P1-A) is preferable.

(P1-A)

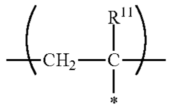

(P1-B)

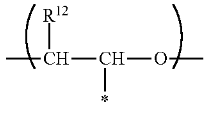

(P1-C)

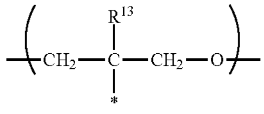

(P1-D)

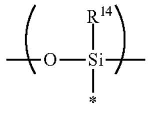

In Formulae (P1-A) to (P1-D), "*" represents a bonding position with respect to L1 in Formula (1). In Formulae (P1-A) to (P1-D), $R^{11}$, $R^{12}$, $R^{13}$, and $R^{14}$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5. It is preferable that the group represented by Formula (P1-A) is a unit of a partial structure of poly(meth)acrylic acid ester obtained by polymerization of (meth)acrylic acid ester. It is preferable that the group represented by Formula (P1-B) is an ethylene glycol unit formed by ring-opening polymerization of an epoxy group of a compound containing the epoxy group. It is preferable that the group represented by Formula (P1-C) is a propylene glycol unit formed by ring-opening polymerization of an oxetane group of a compound containing the oxetane group. It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^{14}(OR^{15})_2$—. In the formula, $R^{14}$ has the same definition as that for $R^{14}$ in Formula (P1-D), and a plurality of $R^{15}$'s each independently represent a hydrogen atom or an alkyl group having 1 to 10 carbon atoms.

The divalent linking group represented by L1 is the same divalent linking group represented by LW in Formula (W1), and preferred embodiments thereof include —C(O)O—, —OC(O)—, —O—, —S—, —C(O)$NR^{16}$—, —$NR^{16}$C(O)—, —$S(O)_2$—, and —$NR^{16}R^{17}$—. In the formulae, $R^{16}$ and $R^{17}$ each independently represent a hydrogen atom or an alkyl group having 1 to 6 carbon atoms which may have a substituent (for example, the substituent W described above). In the specific examples of the divalent linking group described above, the bonding site on the left side is bonded to PC1 and the bonding site on the right side is bonded to SP1. In a case where PC1 represents a group represented by Formula (P1-A), it is preferable that L1 represents a group represented by —C(O)O— or —C(O)$NR^{16}$—. In a case where PC1 represents a group represented by any of Formulae (P1-B) to (P1-D), it is preferable that L1 represents a single bond.

Examples of the spacer group represented by SP1 are the same groups represented by S1 and S2 in Formula (LC), and from the viewpoint of the alignment degree, a group having at least one structure selected from the group consisting of an oxyethylene structure, an oxypropylene structure, a polysiloxane structure, and an alkylene fluoride structure or a linear or branched alkylene group having 2 to 20 carbon atoms is preferable. However, the alkylene group may contain —O—, —S—, —O—CO—, —CO—O—, —O—CO—O—, —O—CNR— (R represents an alkyl group having 1 to 10 carbon atoms), or —$S(O)_2$—. From the viewpoints of easily exhibiting liquid crystallinity and the availability of raw materials, it is more preferable that the spacer group represented by SP1 is a group having at least one structure selected from the group consisting of an oxyethylene structure, an oxypropylene structure, a polysiloxane structure, and an alkylene fluoride structure. Here, as the oxyethylene structure represented by SP1, a group represented by *—$(CH_2—CH_2O)_{n1}$—* is preferable. In the formula, n1 represents an integer of 1 to 20, and * represents a bonding position with respect to L1 or MG1. From the viewpoint that the effects of the present invention are more excellent, n1 represents preferably an integer of 2 to 10, more preferably an integer of 2 to 6, and most preferably an integer of 2 to 4.

Here, a group represented by *—$(CH(CH_3)—CH_2O)_{n2}$—* is preferable as the oxypropylene structure represented by SP1. In the formula, n2 represents an integer of 1 to 3, and * represents a bonding position with respect to L1 or MG1. Further, a group represented by *—$(Si(CH_3)_2—O)_{n3}$—* is preferable as the polysiloxane structure represented by SP1. In the formula, n3 represents an integer of 6 to 10, and * represents a bonding position with respect to L1 or MG1. Further, a group represented by *—$(CF_2—CF_2)_{n4}$—* is preferable as the alkylene fluoride structure represented by SP1. In the formula, n4 represents an integer of 6 to 10, and * represents a bonding position with respect to L1 or MG1.

Examples of the terminal group represented by T1 include a hydrogen atom, a halogen atom, a cyano group, a nitro group, a hydroxy group, —SH, a carboxyl group, a boronic acid group, —$SO_3H$—, —$PO_3H_2$—, —$NR^{11}R^{12}$ (here, $R^{11}$ and $R^{12}$ each independently represent a hydrogen atom, a substituted or unsubstituted alkyl group having 1 to 10 carbon atoms, a cycloalkyl group, or an aryl group), an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an acyloxy group having 1 to 10 carbon atoms, an acylamino group having 1 to 10 carbon atoms, an alkoxycarbonyl group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a crosslinkable group-containing group.

Examples of the crosslinkable group-containing group include -L-CL. L represents a single bond or a linking group. Specific examples of the linking group are the same groups represented by LW and SPW described above. CL represents a crosslinkable group, and examples thereof include a group represented by Q1 or Q2, and a group represented by Formulae (P-1) to (P-30) is preferable. Further, T1 may represent a group obtained by combining two or more of these groups.

From the viewpoint that the effects of the present invention are more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the polymerizable groups described in JP2010-244038A.

From the viewpoint that the effects of the present invention are more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the alignment degree of the optically anisotropic layer is further improved. Here, "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

The content of the repeating unit (1) is preferably in a range of 40% to 100% by mass and more preferably in a range of 50% to 95% by mass with respect to all the repeating units (100% by mass) of the polymer liquid crystal compound. In a case where the content of the repeating unit (1) is 40% by mass or greater, an excellent optically anisotropic layer with enhanced aligning properties can be obtained. Further, in a case where the content of the repeating unit (1) is 100% by mass or less, an excellent optically anisotropic layer with enhanced aligning properties can be obtained. The polymer liquid crystal compound may have only one or two or more kinds of the repeating units (1). In a case where the polymer liquid crystal compound has two or more kinds of repeating units (1), the content of the repeating unit (1) indicates the total content of the repeating units (1).

(Log P Value)

In Formula (1), a difference ($|\log P_1 - \log P_2|$) between the log P value of PC1, L1, and SP1 (hereinafter, also referred to as "log $P_1$") and the log P value of MG1 (hereinafter, also referred to as "log $P_2$") is 4 or greater. Further, from the viewpoint of further improving the alignment degree of the optically anisotropic layer, the difference thereof is preferably 4.25 or greater and more preferably 4.5 or greater. Further, from the viewpoints of adjusting the liquid crystal phase transition temperature and the synthetic suitability, the upper limit of the difference is preferably 15 or less, more preferably 12 or less, and still more preferably 10 or less. Here, the log P value is an index for expressing the properties of the hydrophilicity and hydrophobicity of a chemical structure and is also referred to as a hydrophilic-hydrophobic parameter. The log P value can be calculated using software such as ChemBioDraw Ultra or HSPiP (Ver. 4.1.07). Further, the log P value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

The log $P_1$ indicates the log P value of PC1, L1, and SP1 as described above. The expression "log P value of PC1, L1, and SP1" indicates the log P value of a structure in which PC1, L1, and SP1 are integrated and is not the sum of the log P values of PC1, L1, and SP1. Specifically, the log $P_1$ is calculated by inputting a series of structural formulae of PC1 to SP1 in Formula (1) into the above-described software. Here, in the calculation of the log $P_1$, in regard to the part of the group represented by PC1 in the series of structural formulae of PC1 to SP1, the structure of the group itself represented by PC1 (for example, Formulae (P1-A) to (P1-D) described above) may be used or a structure of a group that can be PC1 after polymerization of a monomer used to obtain the repeating unit represented by Formula (1) may be used. Here, specific examples of the latter (the group that can be PC1) are as follows. In a case where PC1 is obtained by polymerization of (meth)acrylic acid ester, PC1 represents a group represented by $CH_2{=}C(R^1)$— ($R^1$ represents a hydrogen atom or a methyl group). Further, PC1 represents ethylene glycol in a case where PC1 is obtained by polymerization of ethylene glycol, and PC1 represents propylene glycol in a case where PC1 is obtained by polymerization of propylene glycol. Further, in a case where PC1 is obtained by polycondensation of silanol, PC1 represents silanol (a compound represented by Formula $Si(R^2)_3(OH)$, and a plurality of $R^2$'s each independently represent a hydrogen atom or an alkyl group, where at least one of the plurality of $R^2$'s represents an alkyl group).

The log $P_1$ may be smaller than the log $P_2$ or greater than the log $P_2$ in a case where the difference between log $P_1$ and log $P_2$ described above is 4 or greater. Here, the log P value of a general mesogen group (the log $P_2$ described above) tends to be in a range of 4 to 6. In a case where the log $P_1$ is smaller than the log $P_2$, the value of log $P_1$ is preferably 1 or less and more preferably 0 or less. Further, in a case where the log $P_1$ is greater than the log $P_2$, the value of log $P_1$ is preferably 8 or greater and more preferably 9 or greater. In a case where PC1 in Formula (1) is obtained by polymerization of (meth)acrylic acid ester and the log $P_1$ is smaller than the log $P_2$, the log P value of SP1 in Formula (1) is preferably 0.7 or less and more preferably 0.5 or less. Further, in a case where PC1 in Formula (1) is obtained by polymerization of (meth)acrylic acid ester and the log $P_1$ is greater than the log $P_2$, the log P value of SP1 in Formula (1) is preferably 3.7 or greater and more preferably 4.2 or greater. Further, examples of the structure having a log P value of 1 or less include an oxyethylene structure and an oxypropylene structure. Examples of the structure having a log P value of 6 or greater include a polysiloxane structure and an alkylene fluoride structure.

(Repeating Units (21) and (22))

From the viewpoint of improving the alignment degree, it is preferable that the polymer liquid crystal compound has a repeating unit having an electron-donating property and/or an electron-withdrawing property at the terminal. More specifically, it is more preferable that the polymer liquid crystal compound has a repeating unit (21) containing a mesogen group and an electron-withdrawing group present at the terminal of the mesogen group and having a σp value of greater than 0 and a repeating unit (22) containing a mesogen group and a group present at the terminal of the mesogen group and having a σp value of 0 or less. As described above, in a case where the polymer liquid crystal compound has the repeating unit (21) and the repeating unit (22), the alignment degree of the optically anisotropic layer to be formed using the polymer liquid crystal compound is further improved as compared with a case where the polymer liquid crystal compound has only any one of the repeating unit (21) or the repeating unit (22). The details of the reason for this are not clear, but it is assumed as follows. That is, it is assumed that since the opposite dipole moments generated in the repeating unit (21) and the repeating unit (22) interact between molecules, the interaction between the mesogen groups in the minor axis direction is strengthened, and the orientation in which the liquid crystals are aligned is more uniform, and as a result, the degree of order of the liquid crystals is considered to be increased. In this manner, it is assumed that the aligning properties of the dichroic substance are enhanced, and thus the alignment degree of the optically anisotropic layer to be formed increases. Further, the repeating units (21) and (22) may be the repeating units represented by Formula (1).

The repeating unit (21) contains a mesogen group and an electron-withdrawing group present at the terminal of the mesogen group and having a σp value of greater than 0. The electron-withdrawing group is a group that is positioned at the terminal of the mesogen group and has a σp value of greater than 0. Examples of the electron-withdrawing group (a group having a σp value of greater than 0) include a group represented by EWG in Formula (LCP-21) described below, and specific examples thereof are also the same as those described below. The σp value of the electron-withdrawing group described above is greater than 0. From the viewpoint of further increasing the alignment degree of the optically anisotropic layer, the σp value is preferably 0.3 or greater and more preferably 0.4 or greater. From the viewpoint that the uniformity of alignment is excellent, the upper limit of the σp value of the electron-withdrawing group is preferably 1.2 or less and more preferably 1.0 or less.

The σp value is a Hammett's substituent constant σp value (also simply referred to as "σp value") and is a parameter showing the intensity of the electron-donating property and the electron-withdrawing property of a substituent, which numerically expresses the effect of the substituent on the acid dissociation equilibrium constant of substituted benzoic acid. The Hammett's substituent constant σp value in the present specification indicates the substituent constant σ in a case where the substituent is positioned at the para position of benzoic acid. As the Hammett's substituent constant σp value of each group in the present specification, the values described in the document "Hansch et al., Chemical Reviews, 1991, Vol, 91, No. 2, pp. 165 to 195" are employed. Further, the Hammett's substituent constant σp values can be calculated for groups whose Hammett's substituent constant σp values are not described in the document described above using software "ACD/ChemSketch (ACD/Labs 8.00 Release Product Version: 8.08)" based on a difference between the pKa of benzoic acid and the pKa of a benzoic acid derivative having a substituent at the para position.

The repeating unit (21) is not particularly limited as long as the repeating unit (21) contains, at a side chain thereof, a mesogen group and an electron-withdrawing group present at the terminal of the mesogen group and having a σp value of greater than 0, and from the viewpoint of further increasing the alignment degree of the optically anisotropic layer, it is preferable that the repeating unit (21) is a repeating unit represented by Formula (LCP-21).

(LCP-21)

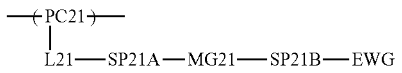

In Formula (LCP-21), PC21 represents the main chain of the repeating unit and more specifically the same structure as that for PC1 in Formula (1), L21 represents a single bond or a divalent linking group and more specifically the same structure as that for L1 in Formula (1), SP21A and SP21B each independently represent a single bond or a spacer group and more specifically the same structure as that for SP1 in Formula (1), MG21 represents a mesogen structure and more specifically a mesogen group MG in Formula (LC), and EWG represents an electron-withdrawing group having a σp value of greater than 0.

Examples of the spacer group represented by SP21A and SP21B are those represented by Formulae S1 and S2, and a group having at least one structure selected from the group consisting of an oxyethylene structure, an oxypropylene structure, a polysiloxane structure, and an alkylene fluoride structure or a linear or branched alkylene group having 2 to 20 carbon atoms is preferable. Here, the alkylene group may contain —O—, —O—CO—, —CO—O—, or —O—CO—O—. From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

It is preferable that SP21B represents a single bond or a linear or branched alkylene group having 2 to 20 carbon atoms. Here, the alkylene group may contain —O—, —O—CO—, —CO—O—, or —O—CO—O—. Among these, from the viewpoint of further increasing the alignment degree of the optically anisotropic layer, a single bond is preferable as the spacer group represented by SP21B. In other words, it is preferable that the repeating unit (21) has a structure in which EWG that represents an electron-withdrawing group in Formula (LCP-21) is directly linked to MG21 that represents a mesogen group in Formula (LCP-21). In this manner, it is assumed that in a case where the electron-withdrawing group is directly linked to the mesogen group, the intermolecular interaction due to an appropriate dipole moment works more effectively in the polymer liquid crystal compound, and the orientation in which the liquid crystals are aligned is more uniform, and as a result, the degree of order of the liquid crystals and the alignment degree are considered to be increased.

EWG represents an electron-withdrawing group having a σp value of greater than 0. Examples of the electron-withdrawing group having a σp value of greater than 0 includes an ester group (specifically, a group represented by *—C(O)O—$R^E$), a (meth)acryloyl group, a (meth)acryloyloxy group, a carboxy group, a cyano group, a nitro group, a sulfo group, —S(O)(O)—O$R^E$, —S(O)(O)—$R^E$, —O—S(O)(O)—$R^E$, an acyl group (specifically, a group represented by *—C(O)$R^E$), an acyloxy group (specifically, a group represented by *—OC(O)$R^E$), an isocyanate group (—N═C(O)), *—C(O)N($R^F$)$_2$, a halogen atom, and an alkyl group substituted with any of these groups (preferably having 1 to 20 carbon atoms). In each of the above-described groups, * represents a bonding position with respect to SP21B. $R^E$ represents an alkyl group having 1 to 20 carbon atoms (preferably 1 to 4 carbon atoms and more preferably 1 or 2 carbon atoms). $R^F$'s each independently represents a hydrogen atom or an alkyl group having 1 to 20 carbon atoms (preferably 1 to 4 carbon atoms and more preferably 1 or 2 carbon atoms). Among the above-described groups, from the viewpoint of further exhibiting the effects of the present invention, it is preferable that EWG represents a group represented by *—C(O)O—$R^E$ a (meth)acryloyloxy group, a cyano group, or a nitro group.

From the viewpoint that the polymer liquid crystal compound and the dichroic substance can be uniformly aligned while a high alignment degree of the optically anisotropic layer is maintained, the content of the repeating unit (21) is preferably 60% by mass or less, more preferably 50% by mass or less, and particularly preferably 45% by mass or less with respect to all the repeating units (100% by mass) of the polymer liquid crystal compound. From the viewpoint of further exhibiting the effects of the present invention, the lower limit of the content of the repeating unit (21) is preferably 1% by mass or greater and more preferably 3% by mass or greater with respect to all the repeating units (100% by mass) of the polymer liquid crystal compound.

In the present invention, the content of each repeating unit contained in the polymer liquid crystal compound is calculated based on the charged amount (mass) of each monomer used for obtaining each repeating unit. The polymer liquid crystal compound may have only one or two or more kinds of repeating units (21). In a case where the polymer liquid crystal compound has two or more kinds of repeating units (21), there is an advantage in that the solubility of the polymer liquid crystal compound in a solvent is improved and the liquid crystal phase transition temperature is easily adjusted. In the case where the polymer liquid crystal compound has two or more kinds of repeating units (21), it is preferable that the total amount thereof is in the above-described range.

In the case where the polymer liquid crystal compound has two or more kinds of repeating units (21), a repeating unit (21) that does not contain a crosslinkable group in EWG and a repeating unit (21) that contains a polymerizable group in EWG may be used in combination. In this manner, the curing properties of the optically anisotropic layer are further improved. Further, preferred examples of the crosslinkable group include a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, and an oxetanyl group. In this case, from the viewpoint of the balance between the curing properties and the alignment degree of the optically anisotropic layer, the content of the repeating unit (21) containing a polymerizable group in EWG is preferably in a range of 1% to 30% by mass with respect to all the repeating units (100% by mass) of the polymer liquid crystal compound.

Hereinafter, examples of the repeating unit (21) will be described, but the repeating unit (21) is not limited to the following repeating units.

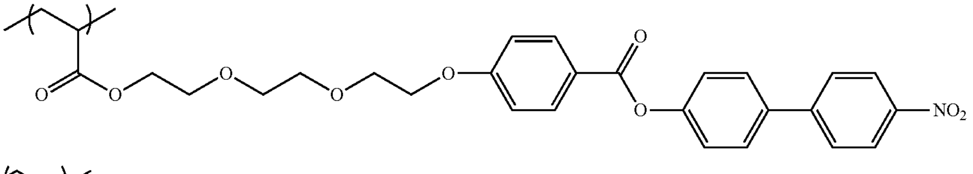

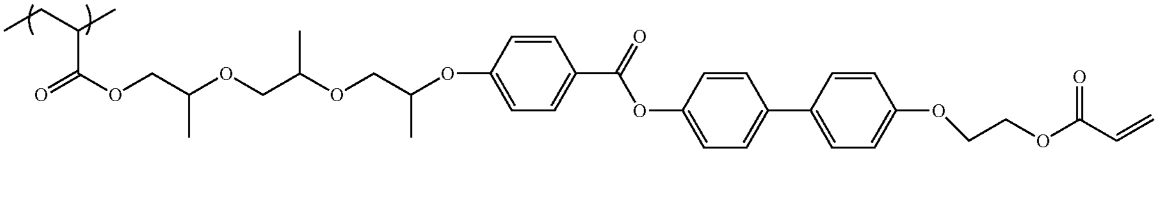

-continued
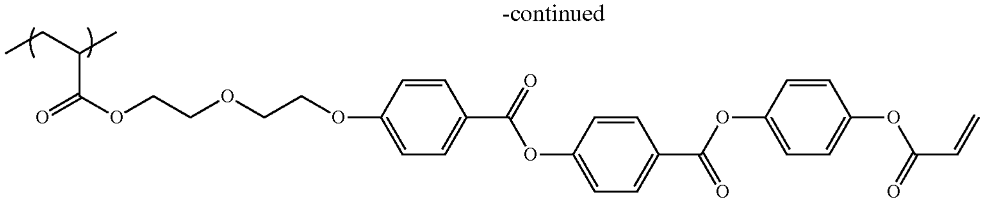
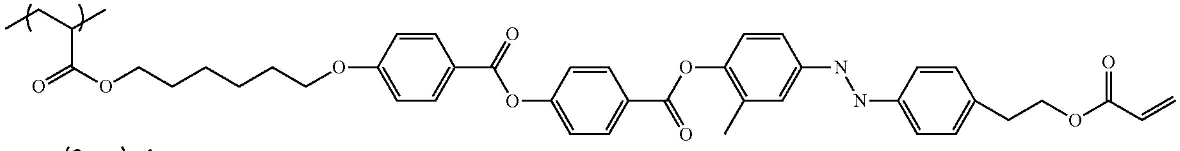
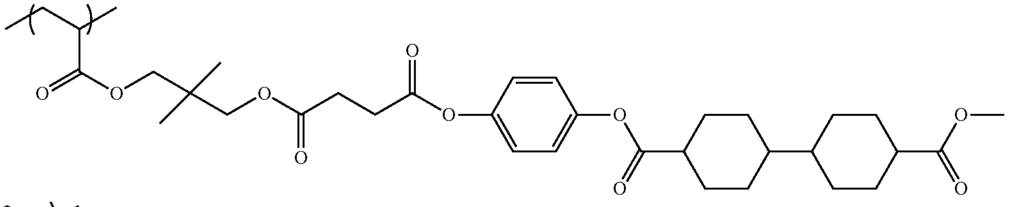
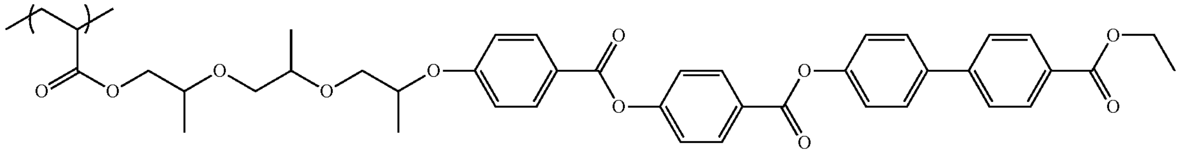
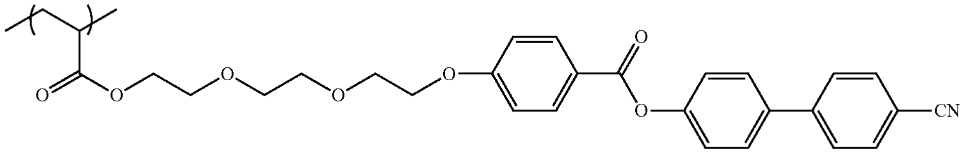
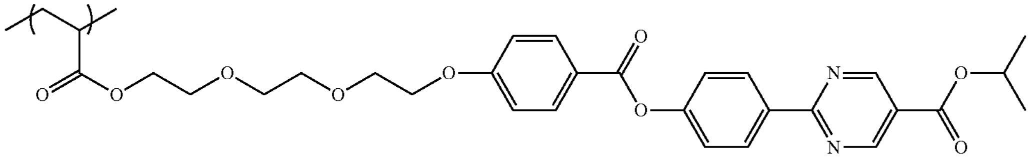
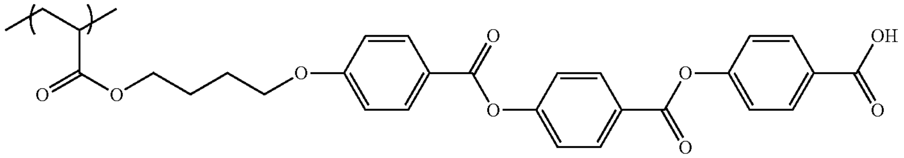
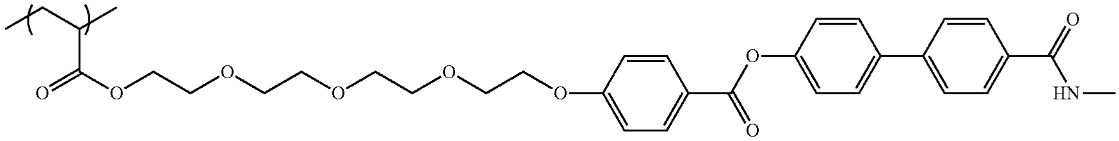
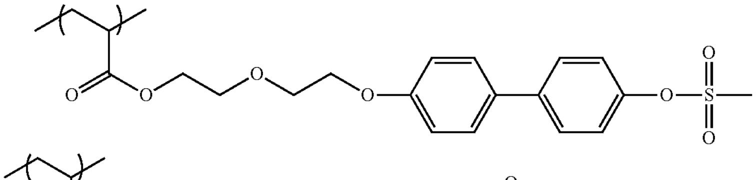
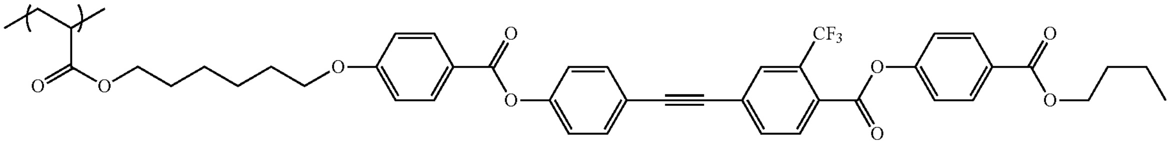
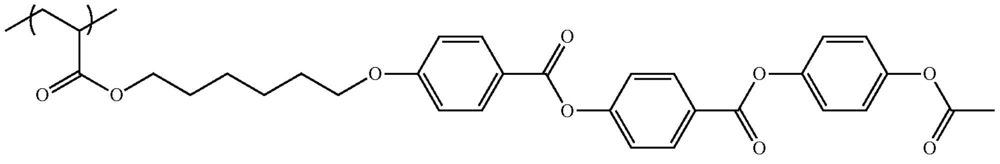

-continued

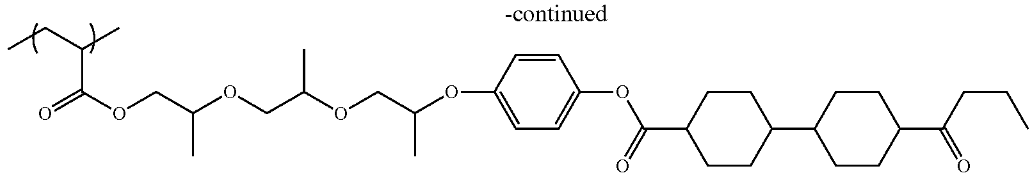

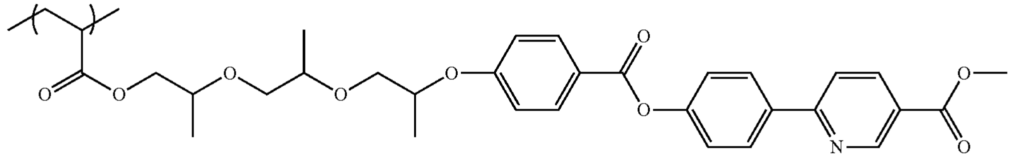

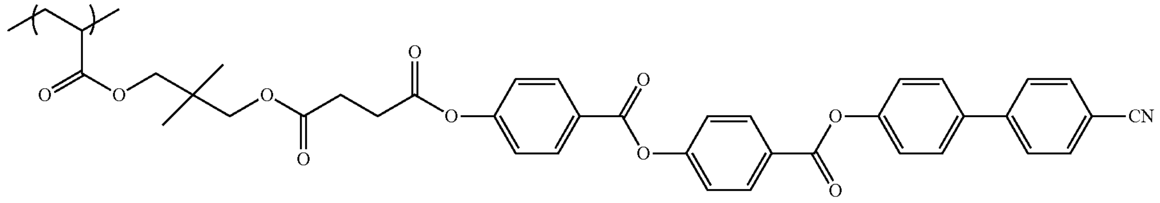

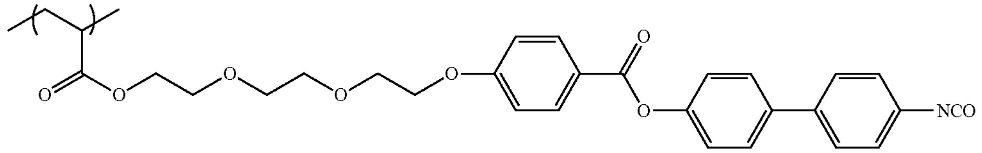

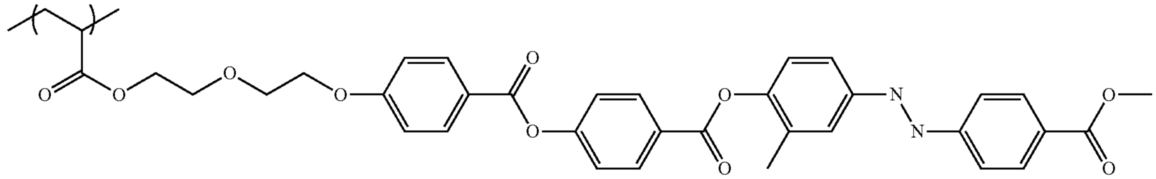

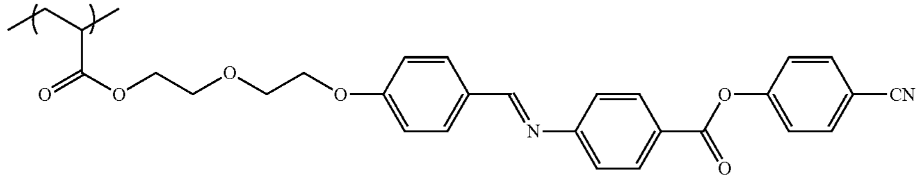

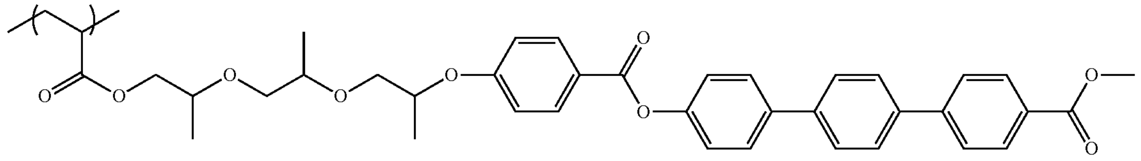

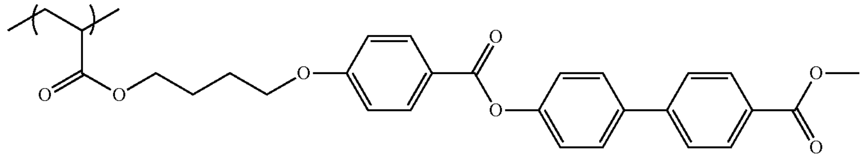

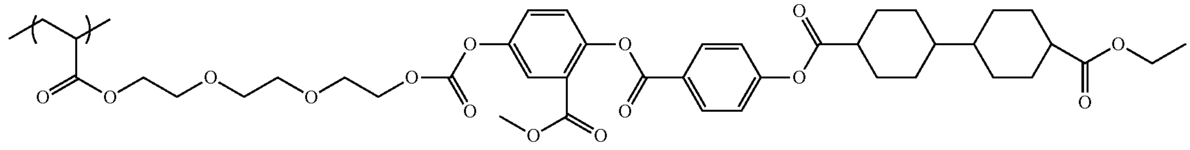

As a result of intensive examination on the composition (content ratio) and the electron-donating property and the electron-withdrawing property of the terminal groups of the repeating unit (21) and the repeating unit (22), the present inventors found that the alignment degree of the optically anisotropic layer is further increased by decreasing the content ratio of the repeating unit (21) in a case where the electron-withdrawing property of the electron-withdrawing group of the repeating unit (21) is high (that is, in a case where the σp value is large), and the alignment degree of the optically anisotropic layer is further increased by increasing the content ratio of the repeating unit (21) in a case where the electron-withdrawing property of the electron-withdrawing group of the repeating unit (21) is low (that is, in a case where the σp value is close to 0).

The details of the reason for this are not clear, but it is assumed as follows. That is, it is assumed that since the intermolecular interaction due to an appropriate dipole moment works in the polymer liquid crystal compound, the orientation in which the liquid crystals are aligned is more uniform, and as a result, the degree of order of the liquid crystals and the alignment degree of the optically anisotropic layer are considered to be increased. Specifically, the product of the σp value of the electron-withdrawing group (EWG in Formula (LCP-21)) in the repeating unit (21) and the content ratio (on a mass basis) of the repeating unit (21) in the polymer liquid crystal compound is preferably in a range of 0.020 to 0.150, more preferably in a range of 0.050 to 0.130, and particularly preferably in a range of 0.055 to 0.125. In a case where the product is in the above-described ranges, the alignment degree of the optically anisotropic layer is further increased.

The repeating unit (22) contains a mesogen group and a group present at the terminal of the mesogen group and having a σp value of 0 or less. In a case where the polymer liquid crystal compound has the repeating unit (22), the polymer liquid crystal compound and the dichroic substance can be uniformly aligned. The mesogen group is a group showing the main skeleton of a liquid crystal molecule that contributes to liquid crystal formation, and the details thereof are as described in the section of MG in Formula (LCP-22) described below, and specific examples thereof are also the same as described below. The above-described group is positioned at the terminal of the mesogen group and has a σp value of 0 or less. Examples of the above-described group (a group having a σp value of 0 or less) includes a hydrogen atom having a σp value of 0 and a group (electron-donating group) having a σp value of less than 0 and represented by T22 in Formula (LCP-22). Among the above-described groups, specific example of the group having a σp value of less than 0 (electron-donating group) are the same as those for T22 in Formula (LCP-22) described below. The σp value of the above-described group is 0 or less, and from the viewpoint that the uniformity of alignment is more excellent, the σp value is preferably less than 0, more preferably −0.1 or less, and particularly preferably −0.2 or less. The lower limit of the σp value of the above-described group is preferably −0.9 or greater and more preferably −0.7 or greater.

The repeating unit (22) is not particularly limited as long as the repeating unit (22) contains, at a side chain thereof, a mesogen group and a group present at the terminal of the mesogen group and having a σp value of 0 or less, and from the viewpoint of further increasing the uniformity of alignment of liquid crystals, it is preferable that the repeating unit (22) is a repeating unit represented by Formula (PCP-22) which does not correspond to a repeating unit represented by Formula (LCP-21).

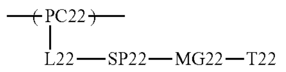

(LCP-22)

In Formula (LCP-22), PC22 represents the main chain of the repeating unit and more specifically the same structure as that for PC1 in Formula (1), L22 represents a single bond or a divalent linking group and more specifically the same structure as that for L1 in Formula (1), SP22 represents a spacer group and more specifically the same structure as that for SP1 in Formula (1), MG22 represents a mesogen structure and more specifically the same structure as the mesogen group MG in Formula (LC), and T22 represents an electron-donating group having a Hammett's substituent constant σp value of less than 0.

T22 represents an electron-donating group having a σp value of less than 0. Examples of the electron-donating group having a σp value of less than 0 include a hydroxy group, an alkyl group having 1 to 10 carbon atoms, an alkoxy group having 1 to 10 carbon atoms, and an alkylamino group having 1 to 10 carbon atoms. In a case where the number of atoms in the main chain of T22 is 20 or less, the alignment degree of the optically anisotropic layer is further improved. Here, "main chain" in T22 indicates the longest molecular chain bonded to MG22, and the number of hydrogen atoms is not included in the number of atoms in the main chain of T22. For example, the number of atoms in the main chain is 4 in a case where T22 represents an n-butyl group, and the number of atoms in the main chain is 3 in a case where T22 represents a sec-butyl group.

Hereinafter, examples of the repeating unit (22) will be described, but the repeating unit (22) is not limited to the following repeating units.

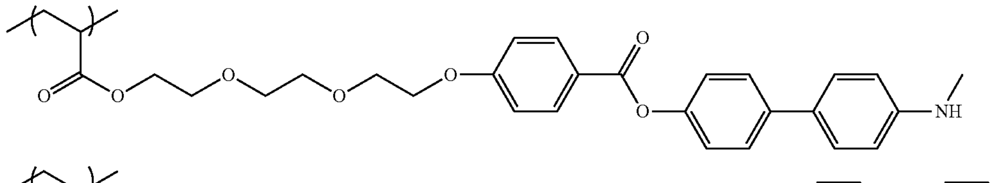

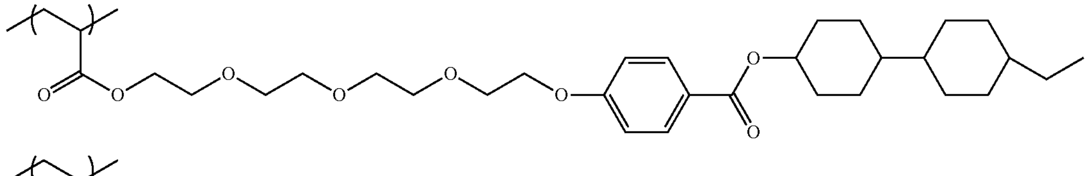

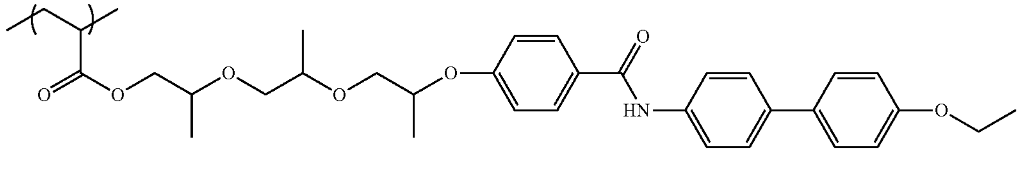

-continued
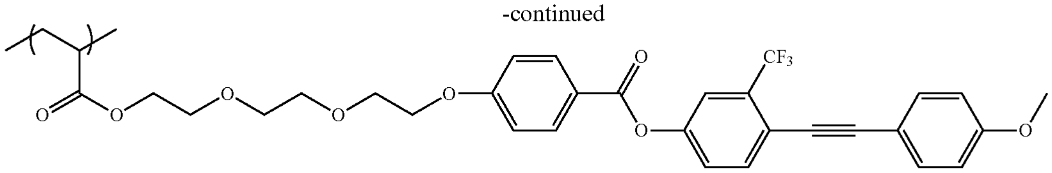
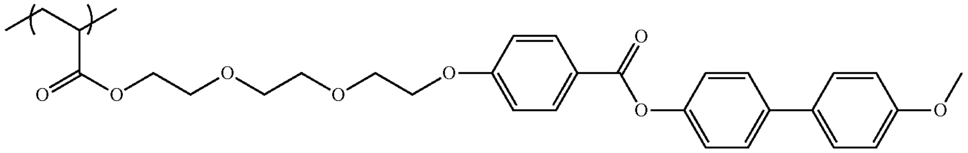
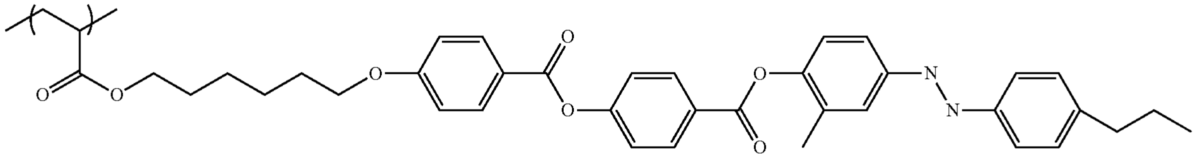
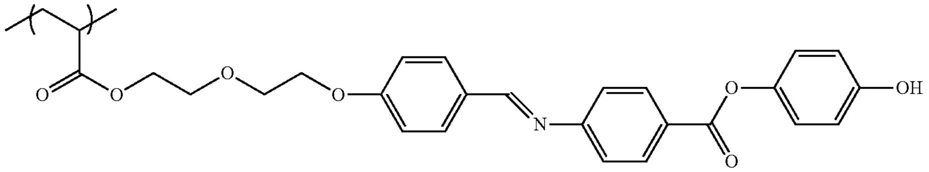
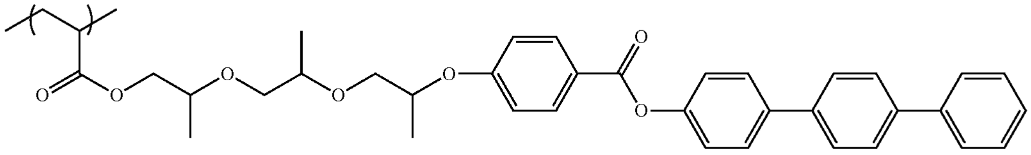
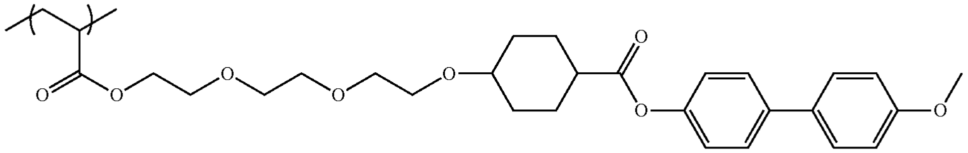
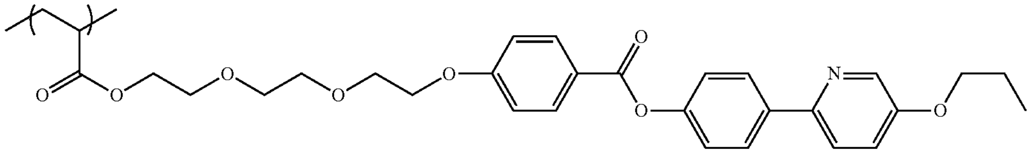
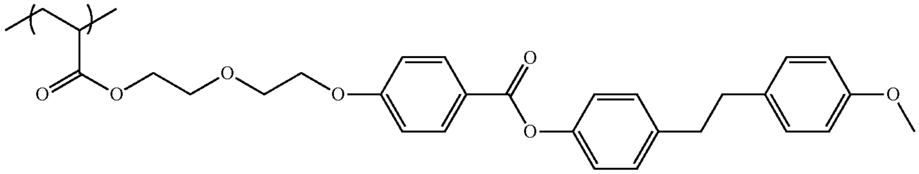
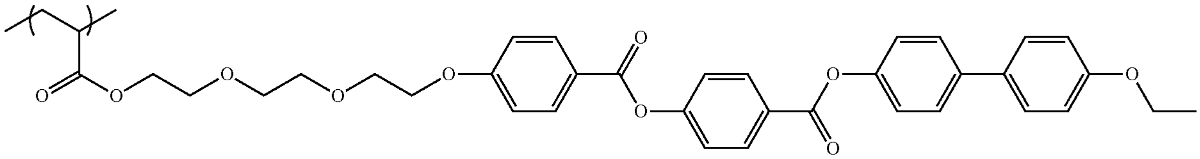
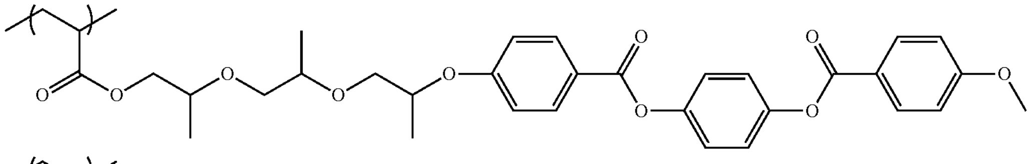
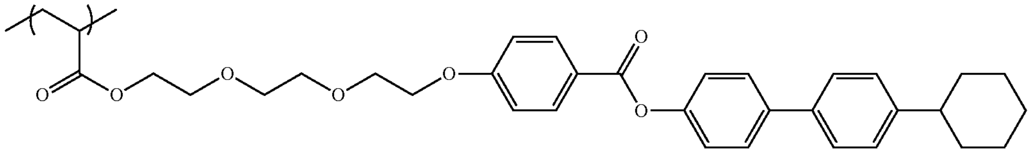

-continued

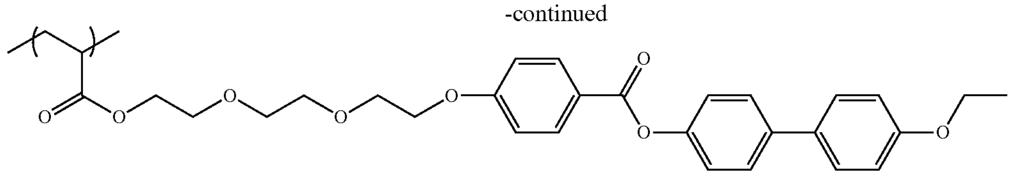

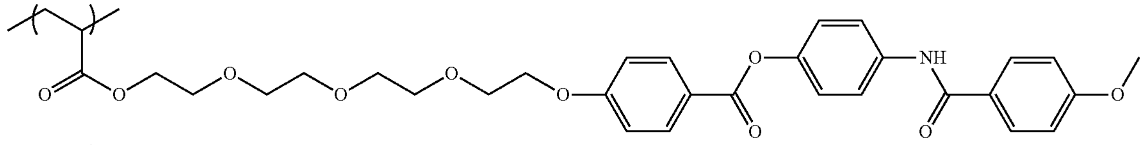

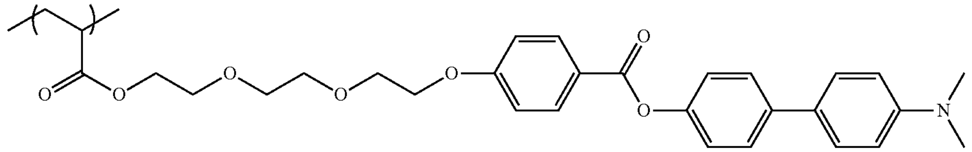

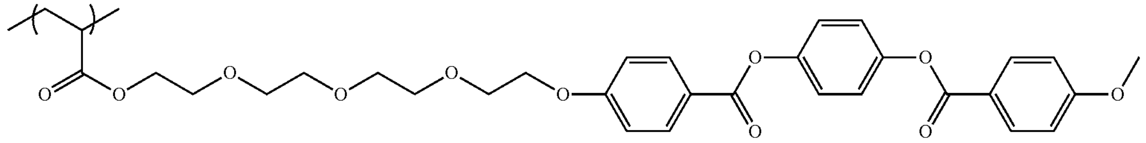

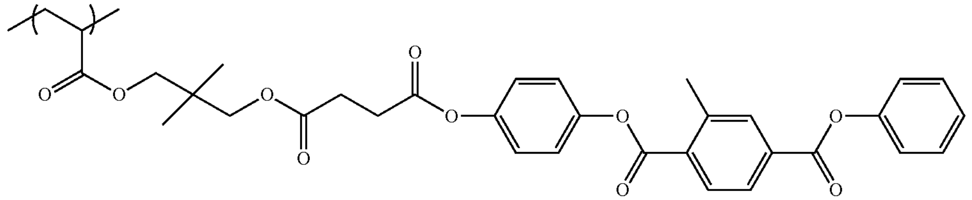

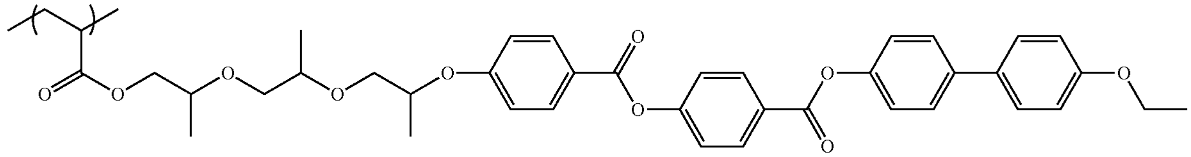

It is preferable that the structures of the repeating unit (21) and the repeating unit (22) have a part in common. It is assumed that the liquid crystals are uniformly aligned as the structures of repeating units are more similar to each other. In this manner, the alignment degree of the optically anisotropic layer is further increased. Specifically, from the viewpoint of further increasing the alignment degree of the optically anisotropic layer, it is preferable to satisfy at least one of a condition that SP21A of Formula (LCP-21) has the same structure as that for SP22 of Formula (LCP-22), a condition that MG21 of Formula (LCP-21) has the same structure as that for MG22 of Formula (LCP-22), or a condition that L21 of Formula (LCP-21) has the same structure as that for L22 of Formula (LCP-22), more preferable to satisfy two or more of the conditions, and particularly preferable to satisfy all the conditions.

From the viewpoint that the uniformity of alignment is excellent, the content of the repeating unit (22) is preferably 50% by mass or greater, more preferably 55% by mass or greater, and particularly preferably 60% by mass or greater with respect to all the repeating units (100% by mass) of the polymer liquid crystal compound. From the viewpoint of improving the alignment degree, the upper limit of the content of the repeating unit (22) is preferably 99% by mass or less and more preferably 97% by mass with respect to all the repeating units (100% by mass) of the polymer liquid crystal compound. The polymer liquid crystal compound may have only one or two or more kinds of repeating units (22). In a case where the polymer liquid crystal compound has two or more kinds of repeating units (22), there is an advantage in that the solubility of the polymer liquid crystal compound in a solvent is improved and the liquid crystal phase transition temperature is easily adjusted. In a case where the polymer liquid crystal compound has two or more kinds of repeating units (22), it is preferable that the total amount thereof is in the above-described range.

(Repeating Unit (3))

From the viewpoint of improving the solubility in a general-purpose solvent, the polymer liquid crystal compound may have a repeating unit (3) that does not contain a mesogen group. Particularly in order to improve the solubility while suppressing a decrease in the alignment degree, it is preferable that the polymer liquid crystal compound has a repeating unit having a molecular weight of 280 or less as the repeating unit (3) that does not contain a mesogen group. As described above, the reason why the solubility is improved while a decrease in the alignment degree is suppressed by allowing the polymer liquid crystal compound to have a repeating unit having a molecular weight of 280 or less which does not contain a mesogen group is assumed as follows. That is, it is considered that in a case where the polymer liquid crystal compound has a repeating unit (3) that does not contain a mesogen group in a molecular chain thereof, since a solvent is likely to enter the polymer liquid crystal compound, the solubility is improved, but the alignment degree is decreased in the case of the non-mesogenic repeating unit (3). However, it is assumed that since the molecular weight of the repeating unit is small, the alignment of the repeating unit (1), the repeating unit (21), or the repeating unit (22) containing a mesogen group is unlikely to be disturbed, and thus a decrease in the alignment degree can be suppressed.

It is preferable that the repeating unit (3) is a repeating unit having a molecular weight of 280 or less. The molecular weight of the repeating unit (3) does not indicate the molecular weight of the monomer used to obtain the repeating unit (3), but indicates the molecular weight of the repeating unit (3) in a state of being incorporated into the polymer liquid crystal compound by polymerization of the monomer. The molecular weight of the repeating unit (3) is 280 or less, preferably 180 or less, and more preferably 100 or less. The lower limit of the molecular weight of the repeating unit (3) is commonly 40 or greater and more preferably 50 or greater. In a case where the molecular weight of the repeating unit (3) is 280 or less, an optically anisotropic layer having excellent solubility of the polymer liquid crystal compound and a high alignment degree can be obtained. Further, in a case where the molecular weight of the repeating unit (3) is greater than 280, the alignment of the liquid crystals in the portion of the repeating unit (1), the repeating unit (21), or the repeating unit (22) is disturbed, and thus the alignment degree is decreased. Further, since the solvent is unlikely to enter the polymer liquid crystal compound, the solubility of the polymer liquid crystal compound is decreased.

Specific examples of the repeating unit (3) include a repeating unit (hereinafter, also referred to as "repeating unit (3-1)") that does not contain a crosslinkable group (for example, an ethylenically unsaturated group) and a repeating unit (hereinafter, also referred to as "repeating unit (3-2)") that contains a crosslinkable group.

Repeating Unit (3-1)

Specific examples of the monomer used for polymerization of the repeating unit (3-1) include acrylic acid [72.1], α-alkylacrylic acids (such as methacrylic acid [86.1] and itaconic acid [130.1]), esters and amides derived therefrom (such as N-i-propylacrylamide [113.2], N-n-butylacrylamide [127.2], N-t-butylacrylamide [127.2], N,N-dimethylacrylamide [99.1], N-methylmethacrylamide [99.1], acrylamide [71.1], methacrylamide [85.1], diacetoneacrylamide [169.2], acryloylmorpholine [141.2], N-methylol acrylamide [101.1], N-methylol methacrylamide [115.1], methyl acrylate [86.0], ethyl acrylate [100.1], hydroxyethyl acrylate [116.1], n-propyl acrylate [114.1], i-propyl acrylate [114.2], 2-hydroxypropyl acrylate [130.1], 2-methyl-2-nitropropyl acrylate [173.2], n-butyl acrylate [128.2], i-butyl acrylate [128.2], t-butyl acrylate [128.2], t-pentyl acrylate [142.2], 2-methoxyethyl acrylate [130.1], 2-ethoxyethyl acrylate [144.2], 2-ethoxyethoxyethyl acrylate [188.2], 2,2,2-trifluoroethyl acrylate [154.1], 2,2-dimethylbutyl acrylate [156.2], 3-methoxybutyl acrylate [158.2], ethyl carbitol acrylate [188.2], phenoxyethyl acrylate [192.2], n-pentyl acrylate [142.2], n-hexyl acrylate [156.2], cyclohexyl acrylate [154.2], cyclopentyl acrylate [140.2], benzyl acrylate [162.2], n-octyl acrylate [184.3], 2-ethylhexyl acrylate [184.3], 4-methyl-2-propylpentyl acrylate [198.3], methyl methacrylate [100.1], 2,2,2-trifluoroethyl methacrylate [168.1], hydroxyethyl methacrylate [130.1], 2-hydroxypropyl methacrylate [144.2], n-butyl methacrylate [142.2], i-butyl methacrylate [142.2], sec-butyl methacrylate [142.2], n-octyl methacrylate [198.3], 2-ethylhexyl methacrylate [198.3], 2-methoxyethyl methacrylate [144.2], 2-ethoxyethyl methacrylate [158.2], benzyl methacrylate [176.2], 2-norbornyl methyl methacrylate [194.3], 5-norbornen-2-ylmethyl methacrylate [194.3], and dimethylaminoethyl methacrylate [157.2]), vinyl esters (such as vinyl acetate [86.1]), esters derived from maleic acid or fumaric acid (such as dimethyl maleate [144.1] and diethyl fumarate [172.2]), maleimides (such as N-phenylmaleimide [173.2]), maleic acid [116.1], fumaric acid [116.1], p-styrenesulfonic acid [184.1], acrylonitrile [53.1], methacrylonitrile [67.1], dienes (such as butadiene [54.1], cyclopentadiene [66.1], and isoprene [68.1]), aromatic vinyl compounds (such as styrene [104.2], p-chlorostyrene [138.6], t-butylstyrene [160.3], and α-methylstyrene [118.2]), N-vinylpyrrolidone [111.1], N-vinyloxazolidone [113.1], N-vinyl succinimide [125.1], N-vinylformamide [71.1], N-vinyl-N-methylformamide [85.1], N-vinylacetamide [85.1], N-vinyl-N-methylacetamide [99.1], 1-vinylimidazole [94.1], 4-vinylpyridine [105.2], vinylsulfonic acid [108.1], sodium vinyl sulfonate [130.2], sodium allyl sulfonate [144.1], sodium methallyl sulfonate [158.2], vinylidene chloride [96.9], vinyl alkyl ethers (such as methyl vinyl ether [58.1]), ethylene [28.0], propylene [42.1], 1-butene [56.1], and isobutene [56.1]. Further, the numerical values in the parentheses indicate the molecular weights of the monomers. The above-described monomers may be used alone or in combination of two or more kinds thereof. Among the above-described monomers, acrylic acid, α-alkylacrylic acids, esters and amides derived therefrom, acrylonitrile, methacrylonitrile, and aromatic vinyl compounds are preferable. As monomers other than the above-described monomers, the compounds described in Research Disclosure No. 1955 (July, 1980) can be used.

Hereinafter, specific examples of the repeating unit (3-1) and the molecular weights thereof will be described, but the present invention is not limited to these specific examples.

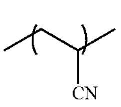

Mw:53

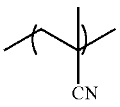

Mw:67

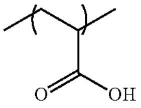

Mw:72

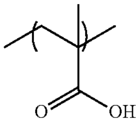

Mw:86

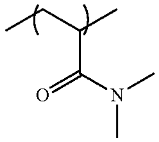

Mw:93

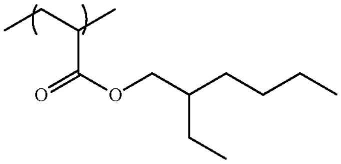

Mw:184

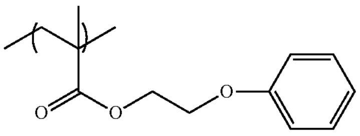

Mw:192

Repeating Unit (3-2)

Specific examples of the crosslinkable group in the repeating unit (3-2) include the groups represented by Formulae (P-1) to (P-30). Among these, a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, and an oxetanyl group are more preferable. From the viewpoint of easily performing polymerization, it is preferable that the repeating unit (3-2) is a repeating unit represented by Formula (3).

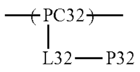

(3)

In Formula (3), PC32 represents the main chain of the repeating unit and more specifically the same structure as that for PC1 in Formula (1), L32 represents a single bond or a divalent linking group and more specifically the same structure as that for L1 in Formula (1), and P32 represents a crosslinkable group represented by any of Formulae (P-1) to (P-30).

Hereinafter, specific examples of the repeating unit (3-2) and the weight-average molecular weights (Mw) thereof will be described, but the present invention is not limited to these specific examples.

Mw: 170.16

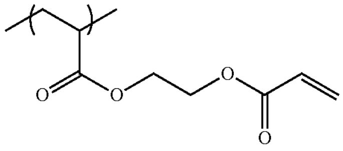

Mw: 214.22

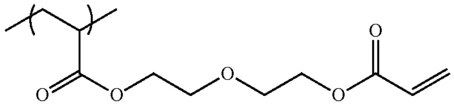

Mw: 252.31

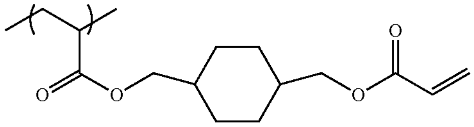

Mw: 257.24

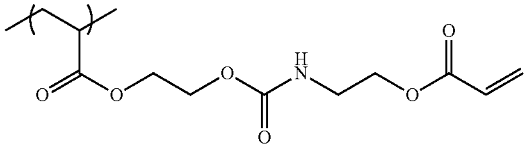

Mw: 112.13

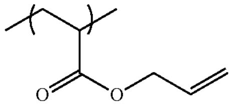

Mw: 182.22

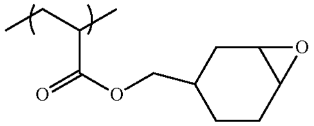

-continued

Mw: 169.18

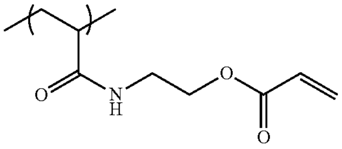

Mw: 184.19

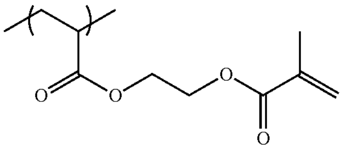

Mw: 228.24

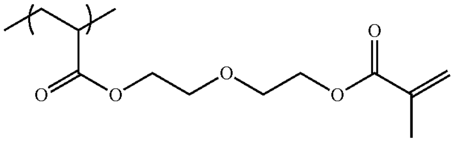

Mw: 226.34

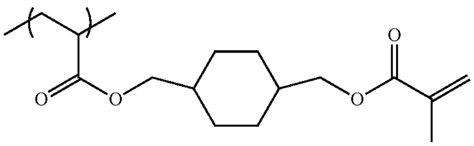

Mw: 271.27

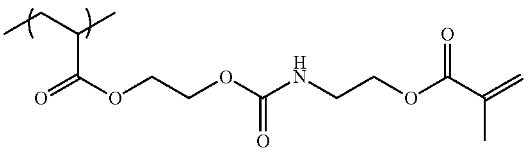

Mw: 151.15

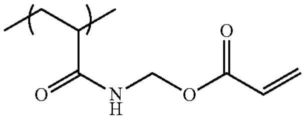

Mw: 126.16

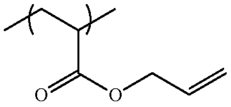

Mw: 184.19

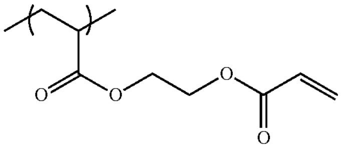

Mw: 159.18

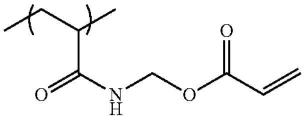

Mw: 183.21

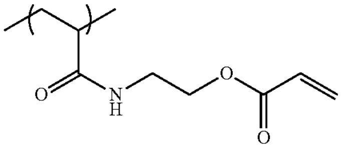

-continued 142.15

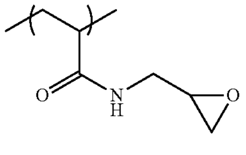

Mw: 228.24

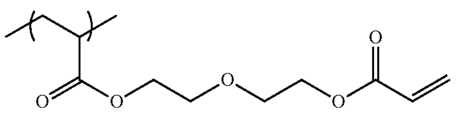

Mw: 196.25

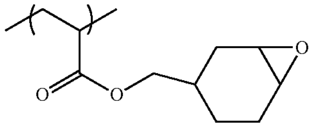

Mw: 271.27

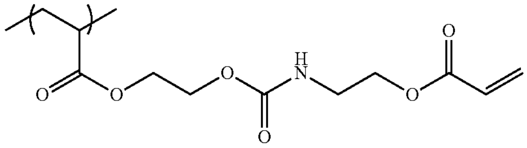

Mw: 266.34

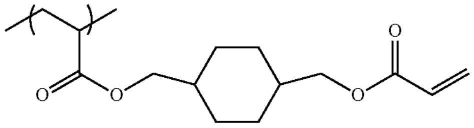

The content of the repeating unit (3) is less than 14% by mass, preferably 7% by mass or less, and more preferably 5% by mass or less with respect to all the repeating units (100% by mass) of the polymer liquid crystal compound. The lower limit of the content of the repeating unit (3) is preferably 2% by mass or greater and more preferably 3% by mass or greater with respect to all the repeating units (100% by mass) of the polymer liquid crystal compound. In a case where the content of the repeating unit (3) is less than 14% by mass, the alignment degree of the optically anisotropic layer is further improved. In a case where the content of the repeating unit (3) is 2% by mass or greater, the solubility of the polymer liquid crystal compound is further improved. The polymer liquid crystal compound may have only one or two or more kinds of repeating units (3). In a case where the polymer liquid crystal compound has two or more kinds of repeating units (3), it is preferable that the total amount thereof is in the above-described range.

(Repeating Unit (4))

From the viewpoint of improving the adhesiveness and planar uniformity, the polymer liquid crystal compound may have a repeating unit (4) having a flexible structure with a long molecular chain (SP4 in Formula (4) described below). The reason for this is assumed as follows. That is, in a case where the polymer liquid crystal compound has such a flexible structure having a long molecular chain, entanglement of the molecular chains constituting the polymer liquid crystal compound is likely to occur, and aggregation destruction of the optically anisotropic layer (specifically, destruction of the optically anisotropic layer) is suppressed. As a result, the adhesiveness between the optically anisotropic layer and the underlayer (for example, the base material or the alignment film) is assumed to be improved. Further, it is considered that a decrease in planar uniformity occurs due to the low compatibility between the dichroic substance and the polymer liquid crystal compound. That is, it is considered that in a case where the compatibility between the dichroic substance and the polymer liquid crystal compound is not sufficient, a planar defect (alignment defect) having the dichroic substance to be precipitated as a nucleus occurs. Meanwhile, it is assumed that in the case where the polymer liquid crystal compound has such a flexible structure having a long molecular chain, an optically anisotropic layer in which precipitation of the dichroic substance is suppressed and the planar uniformity is excellent is obtained. Here, the expression "planar uniformity is excellent" denotes that the alignment defect occurring in a case where the composition for forming a light absorption anisotropic layer which contains the polymer liquid crystal compound is repelled on the underlayer (for example, the base material or the alignment film) is less likely to occur.

The repeating unit (4) is a repeating unit represented by Formula (4).

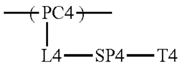

(4)

In Formula (4), PC4 represents the main chain of the repeating unit and more specifically the same structure as that for PC1 in Formula (1), L4 represents a single bond or a divalent linking group and more specifically the same structure as that for L1 in Formula (1) (preferably a single bond), SP4 represents an alkylene group having 10 or more atoms in the main chain, and T4 represents a terminal group and more specifically the same structure as that for T1 in Formula (1).

Specific examples and preferred embodiments of PC4 are the same as those for PC1 in Formula (1), and thus description thereof will not be repeated.

From the viewpoint of further exhibiting the effects of the present invention, it is preferable that L4 represents a single bond.

In Formula (4), SP4 represents an alkylene group having 10 or more atoms in the main chain. Here, one or more of —$CH_2$-'s constituting the alkylene group represented by SP4 may be substituted with "SP-C" described above and particularly preferably at least one group selected from the group consisting of —O—, —S—, —$N(R^{21})$—, —C(=O)—, —C(=S)—, —$C(R^{22})$=$C(R^{23})$—, an alkynylene group, —$Si(R^{24})(R^{25})$—, —N=N—, —$C(R^{26})$=N—N=$C(R^{27})$—, —$C(R^{28})$=N—, and $S(=O)_2$—. In addition, $R^{21}$ to $R^{28}$ each independently represent a hydrogen atom, a halogen atom, a cyano group, a nitro group, or a linear or branched alkyl group having 1 to 10 carbon atoms. Further, the hydrogen atoms contained in one or more of —$CH_2$-'s constituting the alkylene group represented by SP4 may be substituted with "SP-H" described above.

The number of atoms in the main chain of SP4 is 10 or greater, and from the viewpoint of obtaining an optically anisotropic layer in which at least one of the adhesiveness or the planar uniformity is more excellent, the number of atoms thereof is preferably 15 or greater and more preferably 19 or greater. Further, from the viewpoint of obtaining an optically anisotropic layer with a more excellent alignment degree, the upper limit of the number of atoms in the main chain of SP2 is preferably 70 or less, more preferably 60 or less, and particularly preferably 50 or less. Here, "main chain" in SP4 indicates a partial structure required for directly linking L4 and T4 to each other, and "number of atoms in the main chain" indicates the number of atoms constituting the partial structure. In other words, "main chain" in SP4 is a partial structure in which the number of atoms linking L4 and T4 to each other is the smallest. For example, the number of atoms in the main chain in a case where SP4 represents a 3,7-dimethyldecanyl group is 10, and the number of atoms in the main chain in a case where SP4 represents a 4,6-dimethyldodecanyl group is 12. Further, in Formula (4-1), the inside of the frame shown by the dotted quadrangle corresponds to SP4, and the number of atoms in the main chain of SP4 (corresponding to the total number of atoms circled by the dotted line) is 11.

substituted with "SP-H". That is, only one hydrogen atom contained in $—CH_2—$ may be substituted with "SP-H" or all (two) hydrogen atoms contained in $—CH_2—$ may be substituted with "SP-H".

Among the examples of "SP-H", at least one group selected from the group consisting of a halogen atom, a cyano group, a nitro group, a hydroxy group, a linear alkyl group having 1 to 10 carbon atoms, a branched alkyl group having 1 to 10 carbon atoms, and a halogenated alkyl group having 1 to 10 carbon atoms is preferable, and at least one group selected from the group consisting of a hydroxy group, a linear alkyl group having 1 to 10 carbon atoms, and a branched alkyl group having 1 to 10 carbon atoms is more preferable.

(4-1)

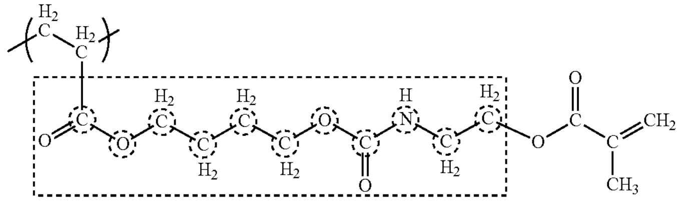

The alkylene group represented by SP4 may be linear or branched. From the viewpoint of obtaining an optically anisotropic layer with a more excellent alignment degree, the number of carbon atoms of the alkylene group represented by SP4 is preferably in a range of 8 to 80, more preferably in a range of 15 to 80, still more preferably in a range of 25 to 70, and particularly preferably in a range of 25 to 60.

From the viewpoint of obtaining an optically anisotropic layer with more excellent adhesiveness and planar uniformity, it is preferable that one or more of $—CH_2$-'s constituting the alkylene group represented by SP4 are substituted with "SP-C" described above. Further, in a case where a plurality of $—CH_2$-'s constituting the alkylene group represented by SP4 are present, it is more preferable that only some of the plurality of $—CH_2$-'s are substituted with "SP-C" described above from the viewpoint of obtaining an optically anisotropic layer with more excellent adhesiveness and planar uniformity.

Among examples of "SP-C", at least one group selected from the group consisting of —O—, —S—, $—N(R^{21})—$, —C(═O)—, —C(═S)—, $—C(R^{22})═C(R^{23})—$, an alkynylene group, $—Si(R^{24})(R^{25})—$, —N═N—, $—C(R^{26})═N—N═C(R^{27})—$, $—C(R^{28})═N—$, and $S(═O)_2—$ is preferable, and from the viewpoint of obtaining an optically anisotropic layer with more excellent adhesiveness and planar uniformity, at least one group selected from the group consisting of —O—, $—N(R^{21})—$, —C(═O)—, and $S(═O)_2—$ is more preferable, and at least one group selected from the group consisting of —O—, $—N(R^{21})—$, and C(═O)— is particularly preferable.

Particularly, it is preferable that SP4 represents a group having at least one selected from the group consisting of an oxyalkylene structure in which one or more of $—CH_2$-'s constituting an alkylene group are substituted with —O—, an ester structure in which one or more of $—CH_2—CH_2$-'s constituting an alkylene group are substituted with —O— and C(═O)—, and a urethane bond in which one or more of $—CH_2—CH_2—CH_2$-'s constituting an alkylene group are substituted with —O—, —C(═O)—, and NH—.

The hydrogen atoms contained in one or more of $—CH_2$-'s constituting the alkylene group represented by SP4 may be substituted with "SP-H" described above. In this case, one or more hydrogen atoms contained in $—CH_2—$ may be As described above, T4 represents the same terminal group as that for T1 and preferably a hydrogen atom, a methyl group, a hydroxy group, a carboxy group, a sulfonic acid group, a phosphoric acid group, a boronic acid group, an amino group, a cyano group, a nitro group, a phenyl group which may have a substituent, or -L-CL (L represents a single bond or a divalent linking group, specific examples of the divalent linking group are the same as those for LW and SPW described above, and CL represents a crosslinkable group, and examples thereof include a group represented by Q1 or Q2, among these, a crosslinkable group represented by any of Formulae (P-1) to (P-30) is preferable), and it is more preferable that CL represents a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, or an oxetanyl group.

The epoxy group may be an epoxycycloalkyl group, and the number of carbon atoms of the cycloalkyl group moiety in the epoxycycloalkyl group is preferably in a range of 3 to 15, more preferably in a range of 5 to 12, and particularly preferably 6 (that is, in a case where the epoxycycloalkyl group is an epoxycyclohexyl group) from the viewpoint that the effects of the present invention are more excellent.

Examples of the substituent of the oxetanyl group include an alkyl group having 1 to 10 carbon atoms. Among the examples, an alkyl group having 1 to 5 carbon atoms is preferable from the viewpoint that the effects of the present invention are more excellent. The alkyl group as a substituent of the oxetanyl group may be linear or branched, but is preferably linear from the viewpoint that the effects of the present invention are more excellent.

Examples of the substituent of the phenyl group include a boronic acid group, a sulfonic acid group, a vinyl group and an amino group. Among these, from the viewpoint that the effects of the present invention are more excellent, a boronic acid group is preferable.

Specific examples of the repeating unit (4) include the following structures, but the present invention is not limited thereto. Further, in the following specific examples, n1 represents an integer of 2 or greater, and n2 represents an integer of 1 or greater.

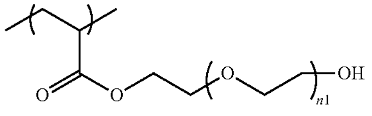
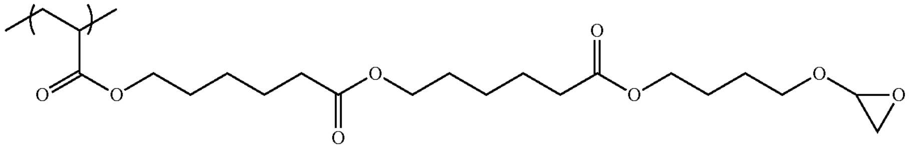
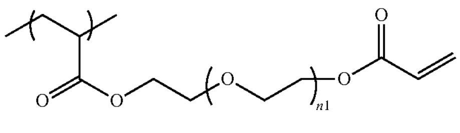
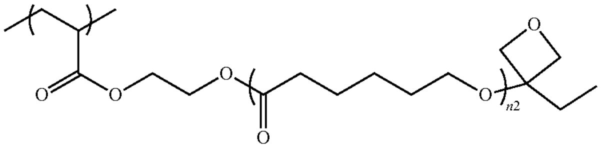
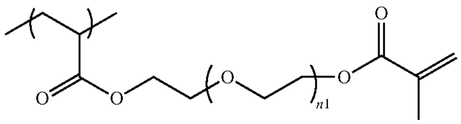
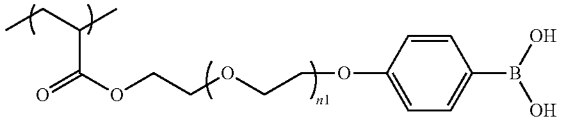
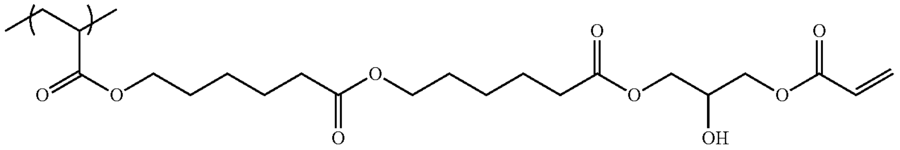
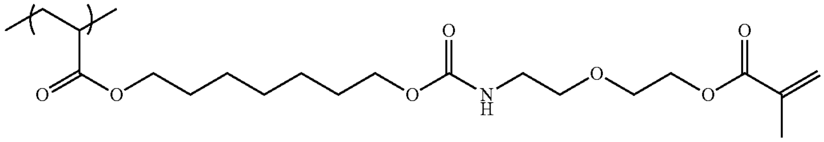
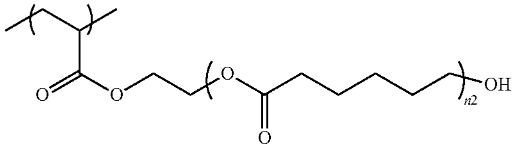
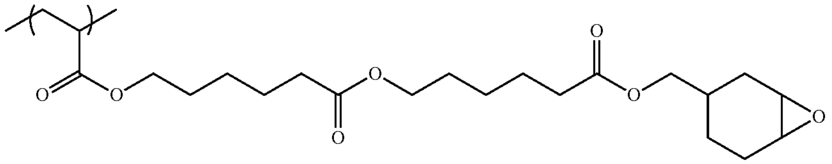
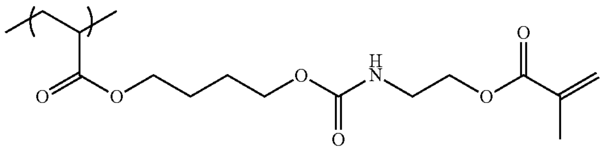
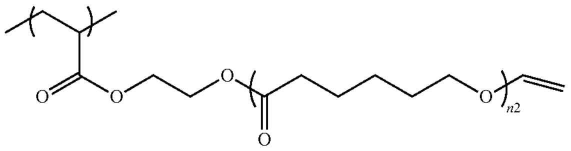
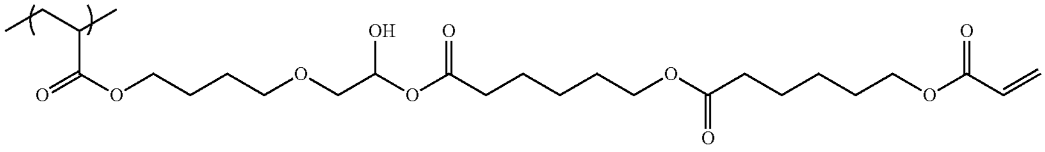

-continued

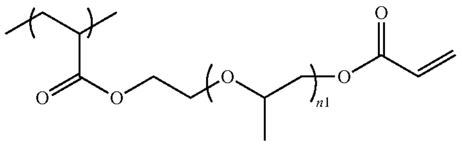

The content of the repeating unit (4) is preferably in a range of 2% to 20% by mass and more preferably in a range of 3% to 18% by mass with respect to all the repeating units (100% by mass) of the polymer liquid crystal compound. In a case where the content of the repeating unit (4) is 2% by mass or greater, an optically anisotropic layer having more excellent adhesiveness can be obtained. Further, in a case where the content of the repeating unit (4) is 20% by mass or less, an optically anisotropic layer having more excellent planar uniformity can be obtained. The polymer liquid crystal compound may have only one or two or more kinds of repeating units (4). In a case where the polymer liquid crystal compound has two or more kinds of repeating units (4), the content of the repeating unit (4) indicates the total content of the repeating units (4).

(Repeating Unit (5))

From the viewpoint of the planar uniformity, the polymer liquid crystal compound may have a repeating unit (5) to be introduced by polymerizing a polyfunctional monomer. Particularly in order to improve the planar uniformity while suppressing a decrease in the alignment degree, it is preferable that the polymer liquid crystal compound has 10% by mass or less of the repeating unit (5) to be introduced by polymerizing a polyfunctional monomer. As described above, the reason why the planar uniformity can be improved while a decrease in the alignment degree is suppressed by allowing the polymer liquid crystal compound to have 10% by mass or less of the repeating unit (5) is assumed as follows. The repeating unit (5) is a unit to be introduced to the polymer liquid crystal compound by polymerizing a polyfunctional monomer. Therefore, it is considered that the polymer liquid crystal compound contains a high-molecular-weight body in which a three-dimensional crosslinked structure is formed by the repeating unit (5). Here, since the content of the repeating unit (5) is small, the content of the high-molecular-weight body having the repeating unit (5) is considered to be small.

It is assumed that an optically anisotropic layer in which cissing of the composition for forming a light absorption anisotropic layer is suppressed and the planar uniformity is excellent is obtained due to the presence of a trace amount of the high-molecular-weight body with the three-dimensional crosslinked structure that has been formed as described above. Further, it is assumed that the effect of suppressing a decrease in the alignment degree can be maintained because the content of the high-molecular-weight body is small.

It is preferable that the repeating unit (5) to be introduced by polymerizing a polyfunctional monomer is a repeating unit represented by Formula (5).

(5)

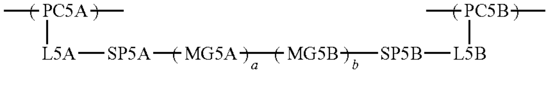

In Formula (5), PC5A and PC5B represent the main chain of the repeating unit and more specifically the same structure as that for PC1 in Formula (1), L5A and L5B represent a single bond or a divalent linking group and more specifically the same structure as that for L1 in Formula (1), SP5A and SP5B represent a spacer group and more specifically the same structure as that for SP1 in Formula (1), MG5A and MG5B represent a mesogen structure and more specifically the same structure as that for the mesogen group MG in Formula (LC), and a and b represent an integer of 0 or 1.

PC5A and PC5B may represent the same group or different groups, but it is preferable that PC5A and PC5B represent the same group from the viewpoint of further improving the alignment degree of the optically anisotropic layer. L5A and L5B may represent a single bond, the same group, or different groups, but L5A and L5B represent preferably a single bond or the same group and more preferably the same group from the viewpoint of further improving the alignment degree of the optically anisotropic layer. SP5A and SP5B may represent a single bond, the same group, or different groups, but SP5A and SP5B represent preferably a single bond or the same group and more preferably the same group from the viewpoint of further improving the alignment degree of the optically anisotropic layer. Here, the same group in Formula (5) indicates that the chemical structures are the same as each other regardless of the orientation in which each group is bonded. For example, even in a case where SP5A represents $*—CH_2—CH_2—O—**$ (* represents a bonding position with respect to L5A, and ** represents a bonding position with respect to MG5A) and SP5B represents $*—O—CH_2—CH_2—**$ (* represents a bonding position with respect to MG5B, and ** represents a bonding position with respect to L5B), SP5A and SP5B represent the same group.

From the viewpoint of further improving the alignment degree of the optically anisotropic layer, a and b each independently represent an integer of 0 or 1 and preferably 1. a and b may be the same as or different from each other, but from the viewpoint of further improving the alignment degree of the optically anisotropic layer, it is preferable that both a and b represent 1. From the viewpoint of further improving the alignment degree of the optically anisotropic layer, the sum of a and b is preferably 1 or 2 (that is, the repeating unit represented by Formula (5) contains a mesogen group) and more preferably 2.

From the viewpoint of further improving the alignment degree of the optically anisotropic layer, it is preferable that the partial structure represented by $-(MG5A)_a-(MG5B)_b-$ has a cyclic structure. In this case, from the viewpoint of further improving the alignment degree of the optically anisotropic layer, the number of cyclic structures in the partial structure represented by $-(MG5A2)_a-(MG5B)_b-$ is preferably 2 or greater, more preferably in a range of 2 to 8, still more preferably in a range of 2 to 6, and particularly preferably in a range of 2 to 4. From the viewpoint of further improving the alignment degree of the optically anisotropic layer, the mesogen groups represented by MG5A and MG5B each independently have preferably one or more cyclic structures, more preferably 2 to 4 cyclic structures, still more preferably 2 or 3 cyclic structures, and particularly preferably 2 cyclic structures. Specific examples of the cyclic structure include an aromatic hydrocarbon group, a heterocyclic group, and an alicyclic group. Among these, an aromatic hydrocarbon group and an alicyclic group are preferable. MG5A and MG5B may represent the same group or different groups, but from the viewpoint of further improving the alignment degree of the optically anisotropic layer, it is preferable that MG5A and MG5B represent the same group.

From the viewpoints of exhibiting the liquid crystallinity, adjusting the liquid crystal phase transition temperature, and the availability of raw materials and synthetic suitability and from the viewpoint that the effects of the present invention are more excellent, it is preferable that the mesogen group represented by MG5A and MG5B is the mesogen group MG in Formula (LC).

Particularly in the repeating unit (5), it is preferable that PC5A and PC5B represent the same group, both L5A and L5B represent a single bond or the same group, both SP5A and SP5B represent a single bond or the same group, and MG5A and MG5B represent the same group. In this manner, the alignment degree of the optically anisotropic layer is further improved.

The content of the repeating unit (5) is preferably 10% by mass or less, more preferably in a range of 0.001% to 5% by mass, and still more preferably in a range of 0.05% to 3% by mass with respect to the content (100% by mass) of all the repeating units of the polymer liquid crystal compound. The polymer liquid crystal compound may have only one or two or more kinds of repeating units (5). In a case where the polymer liquid crystal compound has two or more kinds of repeating units (5), it is preferable that the total amount thereof is in the above-described range.

(Star-Shaped Polymer)

The polymer liquid crystal compound may be a star-shaped polymer. The star-shaped polymer in the present invention indicates a polymer having three or more polymer chains extending from the nucleus which is the starting point and is specifically represented by Formula (6). The star-shaped polymer represented by Formula (6) as the polymer liquid crystal compound can form an optically anisotropic layer having a high alignment degree while having high solubility (excellent solubility in a solvent).

$$A\left(PI\right)_{n_A} \quad (6)$$

In Formula (6), $n_A$ represents an integer of 3 or greater and preferably an integer of 4 or greater. The upper limit of $n_A$ is not limited thereto, but is commonly 12 or less and preferably 6 or less. A plurality of PI's each independently represent a polymer chain having any of repeating units represented by Formulae (1), (21), (22), (3), (4), and (5). Here, at least one of the plurality of PI's represents a polymer chain having a repeating unit represented by Formula (1). A represents an atomic group that is the nucleus of the star-shaped polymer. Specific examples of A include structures obtained by removing hydrogen atoms from thiol groups of the polyfunctional thiol compound, described in paragraphs [0052] to [0058] of JP2011-074280A, paragraphs [0017] to [0021] of JP2012-189847A, paragraphs [0012] to [0024] of JP2013-031986A, and paragraphs [0118] to [0142] of JP2014-104631A. In this case, A and PI are bonded to each other through a sulfide bond.

The number of thiol groups of the polyfunctional thiol compound from which A is derived is preferably 3 or greater and more preferably 4 or greater. The upper limit of the number of thiol groups of the polyfunctional thiol compound is commonly 12 or less and preferably 6 or less. Specific examples of the polyfunctional thiol compound are shown below.

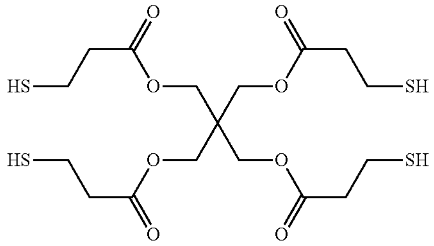

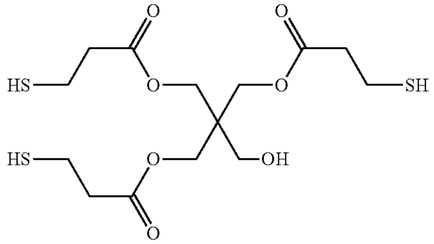

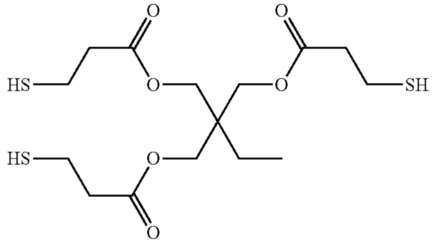

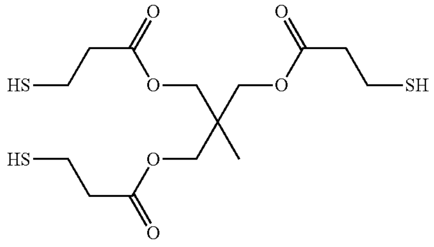

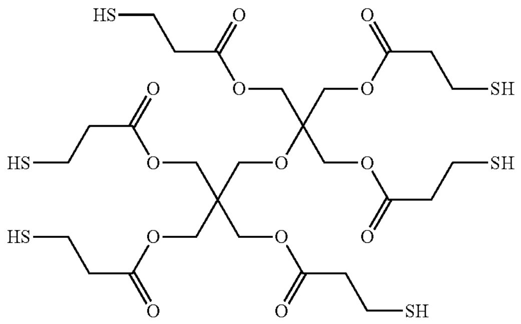

-continued

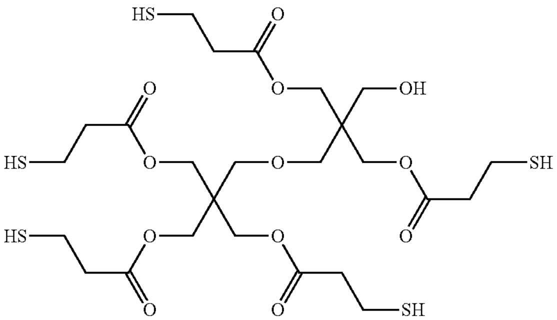

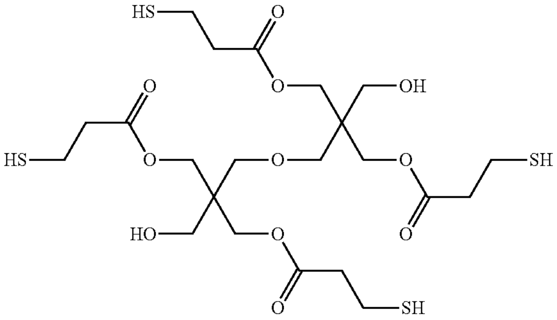

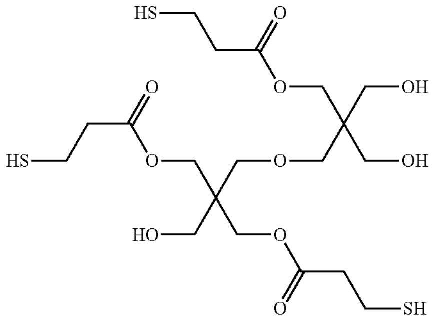

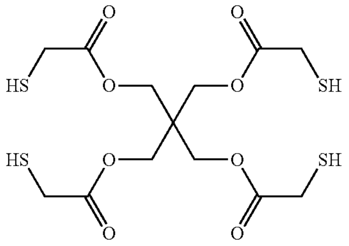

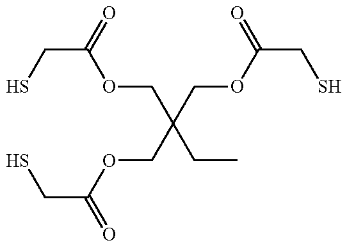

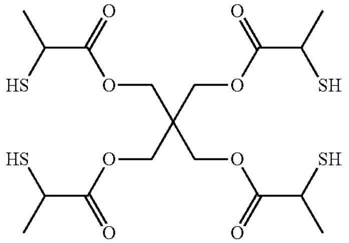

-continued

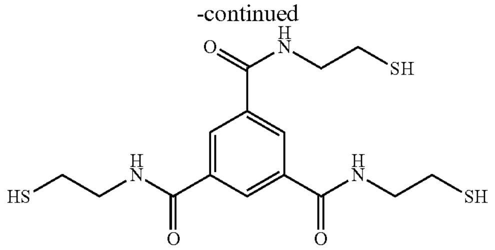

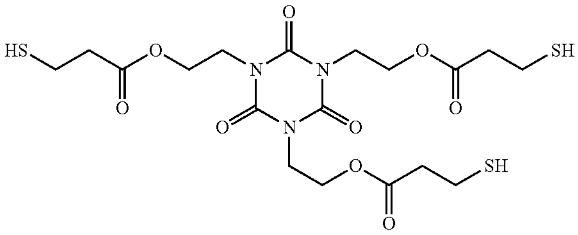

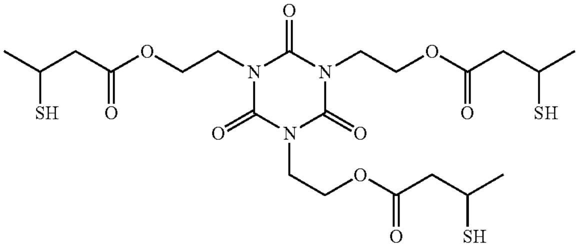

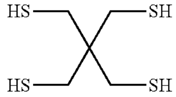

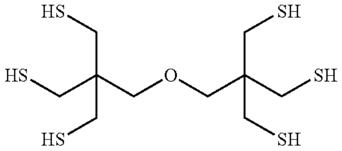

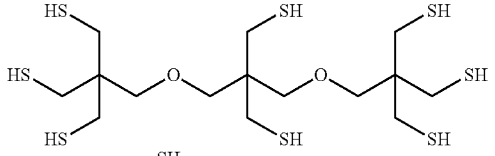

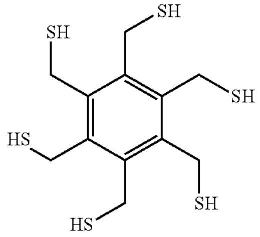

From the viewpoint of further improving the alignment degree, the polymer liquid crystal compound may be a thermotropic liquid crystal and a crystalline polymer.

(Thermotropic Liquid Crystal)

A thermotropic liquid crystal is a liquid crystal that shows transition to a liquid crystal phase due to a change in temperature. The specific compound is a thermotropic liquid crystal and may exhibit any of a nematic phase or a smectic phase, but it is preferable that the specific compound exhibits at least the nematic phase from the viewpoint that the alignment degree of the optically anisotropic layer is further increased, and haze is unlikely to be observed (haze is further enhanced). The temperature range in which the nematic phase is exhibited is preferably room temperature (23° C.) to 450° C. from the viewpoint that the alignment degree of the optically anisotropic layer is further increased and haze is unlikely to be observed and more preferably 40° C. to 400° C. from the viewpoints of the handleability and the manufacturing suitability.

(Crystalline Polymer)

A crystalline polymer is a polymer showing a transition to a crystal layer due to a change in temperature. The crystalline polymer may show a glass transition other than the transition to the crystal layer. It is preferable that the crystalline polymer is a polymer liquid crystal compound that has a transition from a crystal phase to a liquid crystal phase in a case of being heated (glass transition may be present in the middle of the transition) from the viewpoint that the alignment degree of the optically anisotropic layer is further increased and haze is unlikely to be observed or a polymer liquid crystal compound that has a transition to a crystal phase in a case where the temperature is lowered after the compound enters a liquid crystal state by heating the compound (glass transition may be present in the middle of the transition).

The presence or absence of crystallinity of the polymer liquid crystal compound is evaluated as follows. Two optically anisotropic layers of an optical microscope (ECLIPSE E600 POL, manufactured by Nikon Corporation) are disposed so as to be orthogonal to each other, and a sample table is set between the two optically anisotropic layers. Further, a small amount of the polymer liquid crystal compound is placed on slide glass, and the slide glass is set on a hot stage placed on the sample table. While the state of the sample is observed, the temperature of the hot stage is increased to a temperature at which the polymer liquid crystal compound exhibits liquid crystallinity, and the polymer liquid crystal compound is allowed to enter a liquid crystal state. After the polymer liquid crystal compound enters the liquid crystal state, the behavior of the liquid crystal phase transition is observed while the temperature of the hot stage is gradually lowered, and the temperature of the liquid crystal phase transition is recorded. In a case where the polymer liquid crystal compound exhibits a plurality of liquid crystal phases (for example, a nematic phase and a smectic phase), all the transition temperatures are also recorded.

Next, approximately 5 mg of a sample of the polymer liquid crystal compound is put into an aluminum pan, and the pan is covered and set on a differential scanning calorimeter (DSC) (an empty aluminum pan is used as a reference). The polymer liquid crystal compound measured in the above-described manner is heated to a temperature at which the compound exhibits a liquid crystal phase, and the temperature is maintained for 1 minute. Thereafter, the calorific value is measured while the temperature is lowered at a rate of 10° C./min. An exothermic peak is confirmed from the obtained calorific value spectrum. As a result, in a case where an exothermic peak is observed at a temperature other than the liquid crystal phase transition temperature, it can be said that the exothermic peak is a peak due to crystallization and the polymer liquid crystal compound has crystallinity. Meanwhile, in a case where an exothermic peak is not observed at a temperature other than the liquid crystal phase transition temperature, it can be said that the polymer liquid crystal compound does not have crystallinity.

The method of obtaining a crystalline polymer is not particularly limited, but as a specific example, a method of using a polymer liquid crystal compound having the repeating unit (1) described above is preferable, and a method of using a suitable form among polymer liquid crystal compounds having the repeating unit (1) described above is more preferable.

Crystallization Temperature

From the viewpoint that the alignment degree of the optically anisotropic layer is further increased and haze is unlikely to be observed, the crystallization temperature of the polymer liquid crystal compound is preferably −50° C. or higher and lower than 150° C., more preferably 120° C. or lower, still more preferably −20° C. or higher and lower than 120° C., and particularly preferably 95° C. or lower. The crystallization temperature of the polymer liquid crystal compound is preferably lower than 150° C. from the viewpoint of reducing haze. Further, the crystallization temperature is a temperature of an exothermic peak due to crystallization in the above-described DSC.

(Molecular Weight)

From the viewpoint that the effects of the present invention are more excellent, the weight-average molecular weight (Mw) of the polymer liquid crystal compound is preferably in a range of 1000 to 500000 and more preferably in a range of 2000 to 300000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10000 to 300000.

In addition, from the viewpoint of the temperature latitude of the alignment degree, the weight-average molecular weight (Mw) of the polymer liquid crystal compound is preferably less than 10000 and more preferably 2000 or greater and less than 10000.

Here, the weight-average molecular weight and the number average molecular weight in the present invention are values measured by the gel permeation chromatography (GPC) method.

Solvent (eluent): N-methylpyrrolidone

Device name: TOSOH HLC-8220GPC

Column: Connect and use three of TOSOH TSKgel Super AWM-H (6 mm×15 cm)

Column temperature: 25° C.

Sample concentration: 0.1% by mass

Flow rate: 0.35 mL/min

Calibration curve: TSK standard polystyrene (manufactured by TOSOH Corporation), calibration curves of 7 samples with Mw of 2800000 to 1050 (Mw/Mn=1.03 to 1.06) are used.

The polymer liquid crystal compound may exhibit nematic or smectic liquid crystallinity, but it is preferable that the polymer liquid crystal compound exhibits at least the nematic liquid crystallinity. The temperature at which the nematic phase is exhibited is preferably in a range of 0° C. to 450° C. and more preferably in a range of 30° C. to 400° C. from the viewpoints of handleability and manufacturing suitability.

The content of the liquid crystal compound is preferably in a range of 25 to 2000 parts by mass, more preferably in a range of 100 to 1300 parts by mass, and still more preferably in a range of 200 to 900 parts by mass with respect to 100 parts by mass of the content of the dichroic substance in the composition for forming a light absorption anisotropic layer. In a case where the content of the liquid crystal compound is in the above-described range, the alignment degree of the polarizer is further improved. The liquid crystal composition may contain only one or two or more kinds of liquid crystal compounds. In a case where the light absorption anisotropic layer contains two or more kinds of liquid crystal compounds, the content of the liquid crystal compounds denotes the total content of the liquid crystal compounds.

<Dichroic Substance>

The composition for forming a light absorption anisotropic layer further contains a dichroic substance.

In the present invention, the dichroic substance indicates a coloring agent having different absorbances depending on the direction. The dichroic substance may or may not exhibit liquid crystallinity.

The dichroic substance is not particularly limited, and examples thereof include a visible light absorbing material (such as a dichroic coloring agent or a dichroic azo compound), a light emitting material (such as a fluorescent material or a phosphorescent material), an ultraviolet absorbing material, an infrared absorbing material, a nonlinear optical material, a carbon nanotube, and an inorganic substance (for example, a quantum rod). Further, known dichroic substances (dichroic coloring agents) of the related art can be used.

As the dichroic substance to be used, an organic dichroic coloring agent compound is preferable, and a dichroic azo coloring agent compound is more particularly preferable. The dichroic azo coloring agent compound is not particularly limited, and known dichroic azo coloring agents of the related art can be used, but the compounds described below are preferably used.

In the present invention, the dichroic azo coloring agent compound denotes a coloring agent having different absorbances depending on the direction. The dichroic azo coloring agent compound may or may not exhibit liquid crystallinity. In a case where the dichroic azo coloring agent compound exhibits liquid crystallinity, the dichroic azo coloring agent compound may exhibit any of nematic liquid crystallinity or smectic liquid crystallinity. The temperature at which the liquid crystal phase is exhibited is preferably in a range of room temperature (approximately 20° C. to 28° C.) to 300° C. and from the viewpoints of handleability and manufacturing suitability, more preferably in a range of 50° C. to 200° C.

In the present invention, from the viewpoint of adjusting the tint, the light absorption anisotropic layer contains preferably at least one coloring agent compound having a maximal absorption wavelength in a wavelength range of 560 to 700 nm (hereinafter, also referred to as "first dichroic azo coloring agent compound") and at least one coloring agent compound having a maximal absorption wavelength in a wavelength range of 455 nm or greater and less than 560 nm (hereinafter, also referred to as "second dichroic azo coloring agent compound") and specifically more preferably at least a dichroic azo coloring agent compound represented by Formula (1) and a dichroic azo coloring agent compound represented by Formula (2).

In the present invention, three or more kinds of dichroic azo coloring agent compounds may be used in combination. For example, from the viewpoint of making the color of the light absorption anisotropic layer close to black, it is preferable to use a first dichroic azo coloring agent compound, a second dichroic azo coloring agent compound, and at least one coloring agent compound having a maximal absorption wavelength in a wavelength range of 380 nm or greater and less than 455 nm (hereinafter, also referred to as "third dichroic azo coloring agent compound") in combination.

In the present invention, from the viewpoint of further enhancing pressing resistance, it is preferable that the dichroic azo coloring agent compound contains a crosslinkable group. Specific examples of the crosslinkable group include a (meth)acryloyl group, an epoxy group, an oxetanyl group, and a styryl group. Among these, a (meth)acryloyl group is preferable.

(First Dichroic Azo Coloring Agent Compound)

It is preferable that the first dichroic azo coloring agent compound is a compound having a chromophore which is a nucleus and a side chain bonded to a terminal of the chromophore. Specific examples of the chromophore include an aromatic ring group (such as an aromatic hydrocarbon group or an aromatic heterocyclic group) and an azo group. In addition, a structure containing both an aromatic ring group and an azo group is preferable, and a bisazo structure containing an aromatic heterocyclic group (preferably a thienothiazole group) and two azo groups is more preferable. The side chain is not particularly limited, and examples thereof include a group represented by L3, R2, or L4 in Formula (1).

The first dichroic azo coloring agent compound is a dichroic azo coloring agent compound having a maximum absorption wavelength in a wavelength range of 560 nm or greater and 700 nm or less, and from the viewpoint of adjusting the tint of the polarizer, preferably a dichroic azo coloring agent compound having a maximum absorption wavelength in a wavelength range of 560 to 650 nm and more preferably a dichroic azo coloring agent compound having a maximum absorption wavelength in a wavelength range of 560 to 640 nm. The maximum absorption wavelength (nm) of the dichroic azo coloring agent compound in the present specification is acquired from an ultraviolet visible spectrum in a wavelength range of 380 to 800 nm measured by a spectrophotometer using a solution prepared by dissolving the dichroic azo coloring agent compound in a good solvent.

In the present invention, from the viewpoint of further improving the alignment degree of the light absorption anisotropic layer to be formed, it is preferable that the first dichroic azo coloring agent compound is a compound represented by Formula (1).

(1)

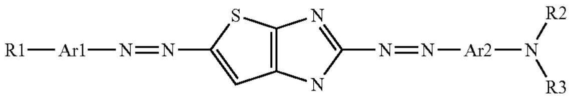

In Formula (1), Ar1 and Ar2 each independently represent a phenylene group which may have a substituent or a naphthylene group which may have a substituent. Among these, a phenylene group is preferable.

In Formula (1), R1 represents a hydrogen atom, a linear or branched alkyl group having 1 to 20 carbon atoms which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group. Further, $—CH_2—$ constituting the alkyl group may be substituted with —O—, —CO—, —C(O)—O—, —O—C(O)—, $—Si(CH_3)_2—O—Si(CH_3)_2—$, —N(R1')—, —N(R1')—CO—, —CO—N(R1')—, —N(R1')—C(O)—O—, —O—C(O)—N(R1')—, —N(R1')—C(O)—N(R1')—, —CH═CH—, —C≡C—, —N═N—, —C(R1')═CH—C(O)—, or —O—C(O)—O—. In a case where R1 represents a group other than a hydrogen atom, the hydrogen atom in each group may be substituted with a halogen atom, a nitro group, a cyano group, —N(R1')$_2$, an amino group, —C(R1')═C(R1')—NO$_2$, —C(R1')═C(R1')—CN, or —C(R1')═C(CN)$_2$. R1' represents a hydrogen atom or a linear or branched alkyl group having 1 to 6 carbon atoms. In a case where a plurality of (R1')'s are present in each group, these may be the same as or different from one another.

In Formula (1), R2 and R3 each independently represent a hydrogen atom, a linear or branched alkyl group having 1 to 20 carbon atoms which may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group. Further, —CH$_2$— constituting the alkyl group may be substituted with —O—, —S—, —C(O)—, —C(O)—O—, —O—C(O)—, —C(O)—S—, —S—C(O)—, —Si(CH$_3$)$_2$—O—Si(CH$_3$)$_2$—, —NR2'-, —NR2'-CO—, —CO—NR2'-, —NR2'-C(O)—O—, —O—C(O)—NR2'-, —NR2'-C(O)—NR2'-, —CH═CH—, —C≡C—, —N═N—, —C(R2')═CH—C(O)—, or —O—C(O)—O—. In a case where R2 and R3 represent a group other than a hydrogen atom, the hydrogen atom of each group may be substituted with a halogen atom, a nitro group, a cyano group, a —OH group, —N(R2')$_2$, an amino group, —C(R2')═C(R2')—NO$_2$, —C(R2')═C(R2')—CN, or —C(R2')═C(CN)$_2$. R2' represents a hydrogen atom or a linear or branched alkyl group having 1 to 6 carbon atoms. In a case where a plurality of (R2')'s are present in each group, these may be the same as or different from one another. R2 and R3 may be bonded to each other to form a ring, or R2 or R3 may be bonded to Ar2 to form a ring.

From the viewpoint of the light fastness, it is preferable that R1 represents an electron-withdrawing group and R2 and R3 represent a group having a low electron-donating property. Specific examples of such a group as R1 include an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group, and examples of groups as R2 and R3 include groups having the following structures. Further, the groups having the following structures are shown in the form having a nitrogen atom to which R2 and R3 are bonded in Formula (1).

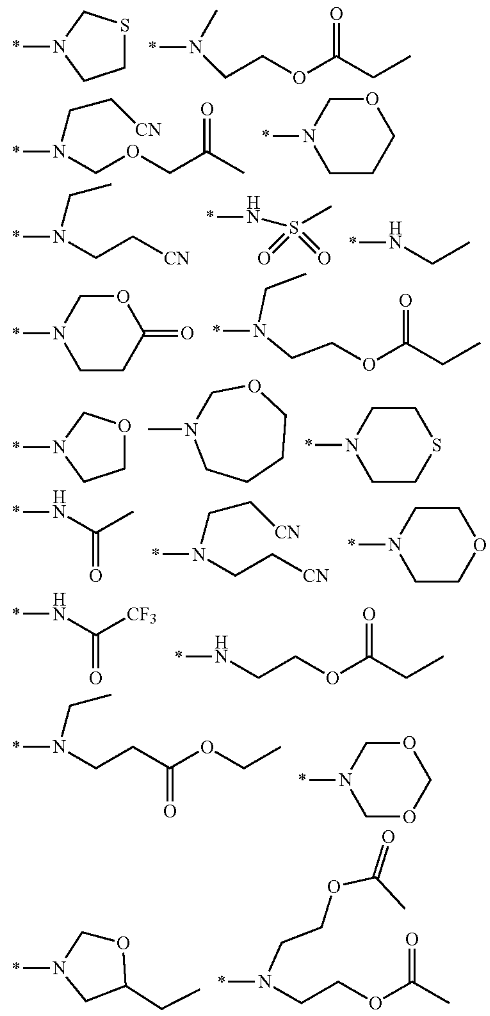

Specific examples of the first dichroic azo coloring agent compound are shown below, but the present invention is not limited thereto.

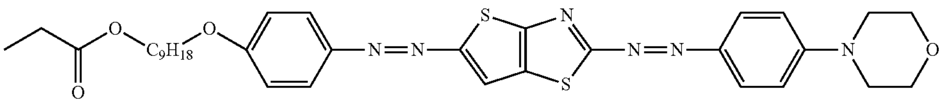

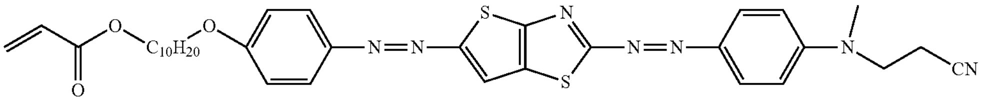

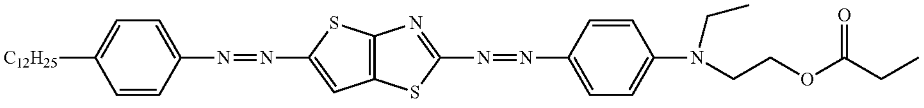

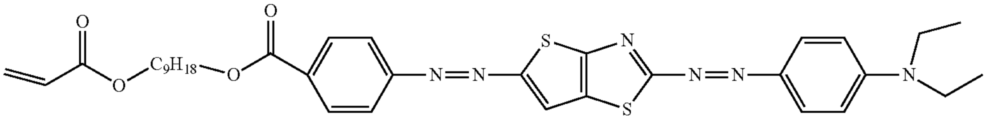

-continued
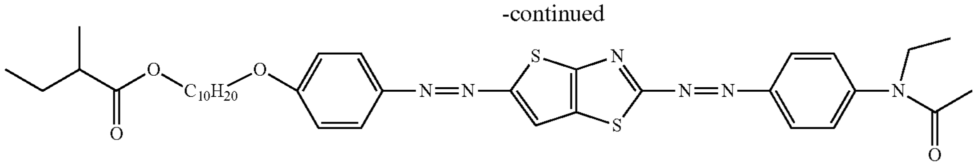
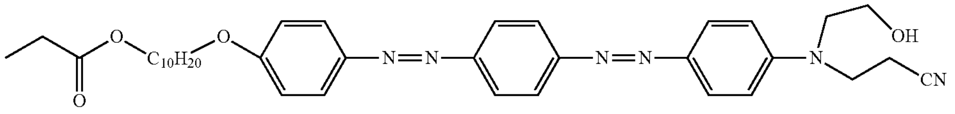
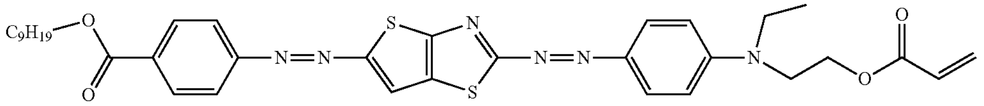
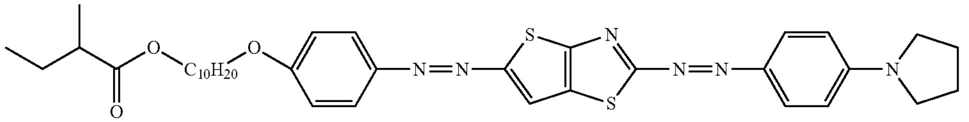
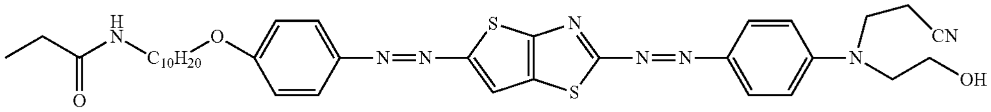
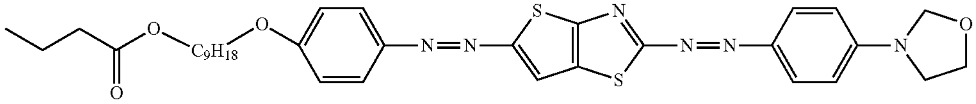
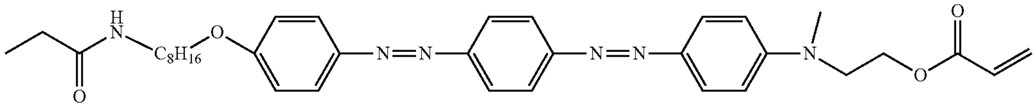
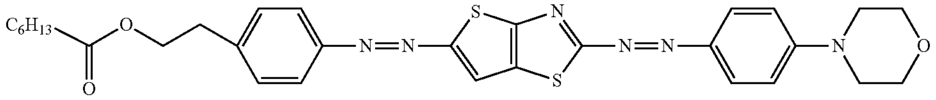
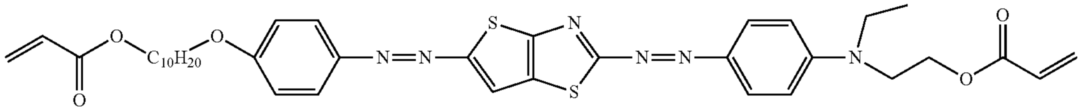
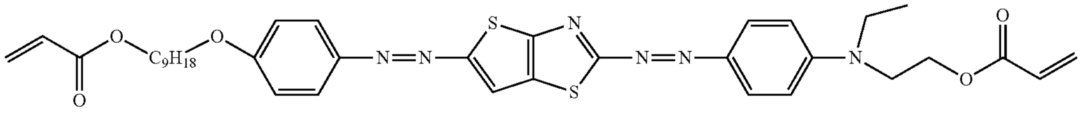
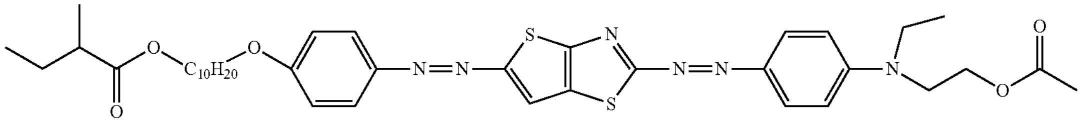
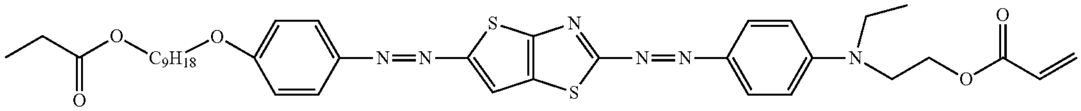
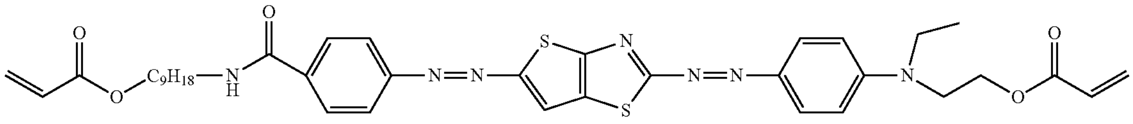
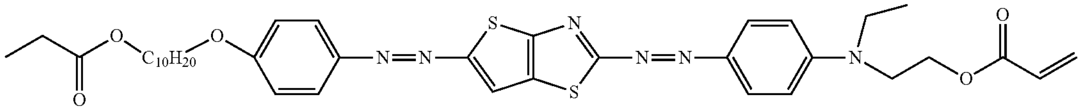
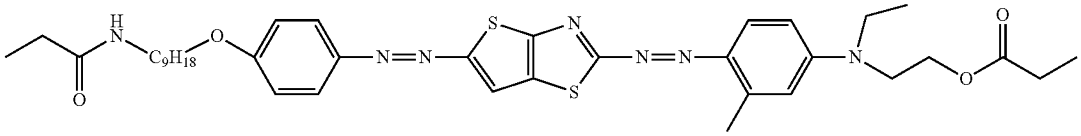

-continued

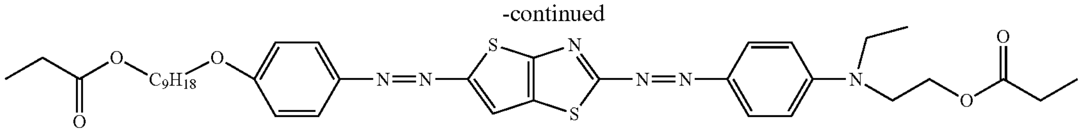

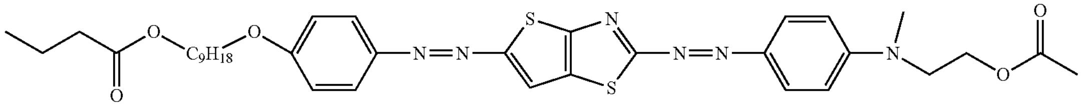

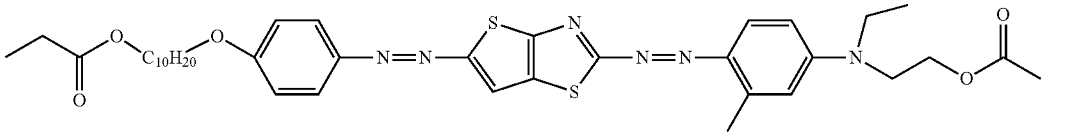

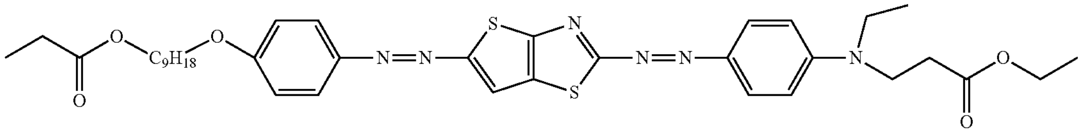

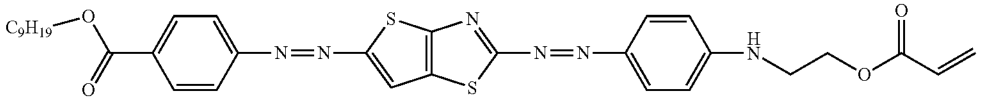

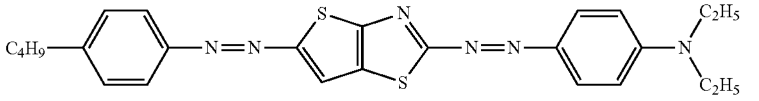

(Second Dichroic Azo Coloring Agent Compound)

The second dichroic azo coloring agent compound is a compound different from the first dichroic azo coloring agent compound, and specifically, the chemical structure thereof is different from that of the first dichroic azo coloring agent compound. It is preferable that the second dichroic azo coloring agent compound is a compound having a chromophore which is a nucleus of a dichroic azo coloring agent compound and a side chain bonded to a terminal of the chromophore. Specific examples of the chromophore include an aromatic ring group (such as an aromatic hydrocarbon group or an aromatic heterocyclic group) and an azo group. In addition, a structure containing both an aromatic hydrocarbon group and an azo group is preferable, and a bisazo or trisazo structure containing an aromatic hydrocarbon group and two or three azo groups is more preferable. The side chain is not particularly limited, and examples thereof include a group represented by R4, R5, or R6 in Formula (2).

The second dichroic azo coloring agent compound is a dichroic azo coloring agent compound having a maximum absorption wavelength in a wavelength range of 455 nm or greater and less than 560 nm. From the viewpoint of adjusting the tint of the polarizer, the second dichroic azo coloring agent compound is preferably a dichroic azo coloring agent compound having a maximum absorption wavelength in a wavelength range of 455 to 555 nm and more preferably a dichroic azo coloring agent compound having a maximum absorption wavelength in a wavelength range of 455 to 550 nm. In particular, the tint of the polarizer is easily adjusted by using a first dichroic azo coloring agent compound having a maximum absorption wavelength of 560 to 700 nm and a second dichroic azo coloring agent compound having a maximum absorption wavelength of 455 nm or greater and less than 560 nm.

From the viewpoint of further improving the alignment degree of the polarizer, it is preferable that the second dichroic azo coloring agent compound is a compound represented by Formula (2).

(2)

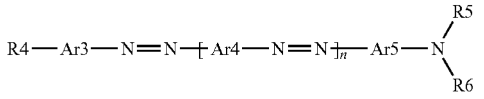

In Formula (2), n represents 1 or 2. In Formula (2), Ar3, Ar4, and Ar5 each independently represent a phenylene group which may have a substituent, a naphthylene group which may have a substituent, or a heterocyclic group which may have a substituent. The heterocyclic group may be aromatic or non-aromatic. The atoms other than carbon constituting the aromatic heterocyclic group include a nitrogen atom, a sulfur atom, and an oxygen atom. In a case where the aromatic heterocyclic group has a plurality of atoms constituting a ring other than carbon, these may be the same as or different from each other. Specific examples of the aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

In Formula (2), R4 has the same definition as that for R1 in Formula (1). In Formula (2), R5 and R6 each have the same definition as that for R2 and R3 in Formula (1).

From the viewpoint of the light fastness, it is preferable that R4 represents an electron-withdrawing group and R5 and R6 represent a group having a low electron-donating property. Among such groups, specific examples of a case where R4 represents an electron-withdrawing group are the same as the specific examples of a case where R1 represents an electron-withdrawing group, and specific examples of a case where R5 and R6 represent a group having a low electron-donating property are the same as the specific examples of a case where R2 and R3 represent a group having a low electron-donating property.
Specific examples of the second dichroic azo coloring agent compound are shown below, but the present invention is not limited thereto.
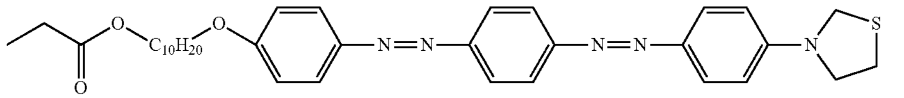
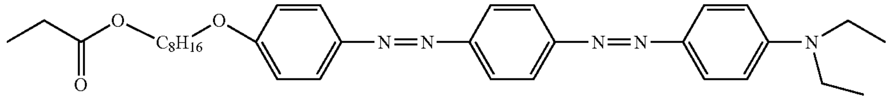
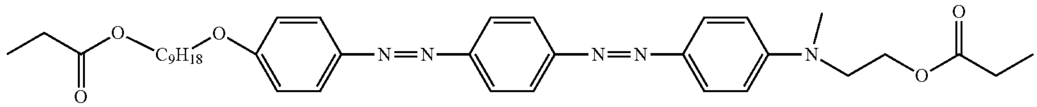
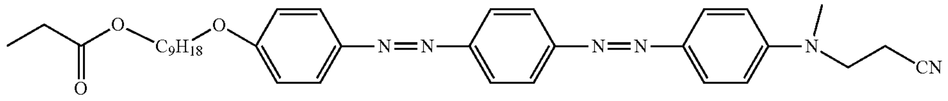
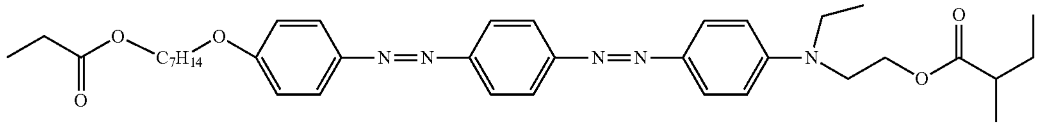
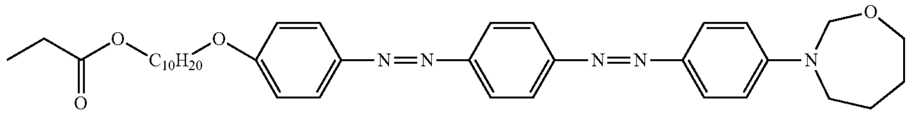
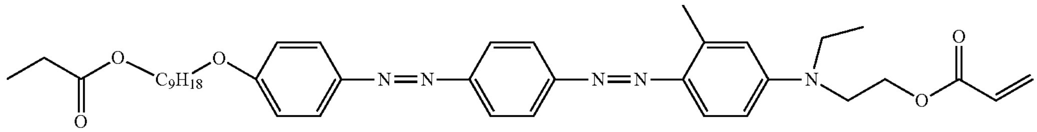
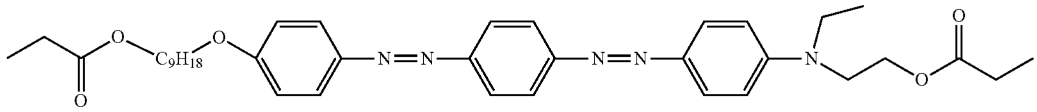
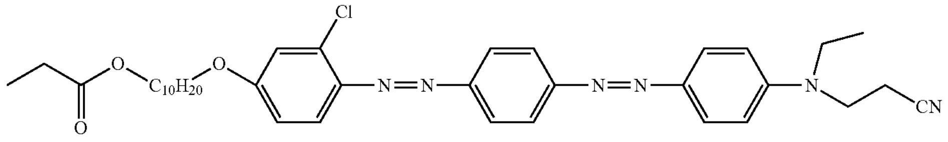
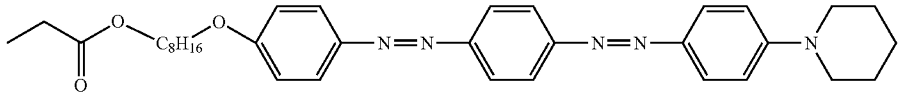
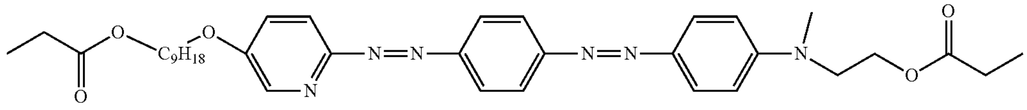
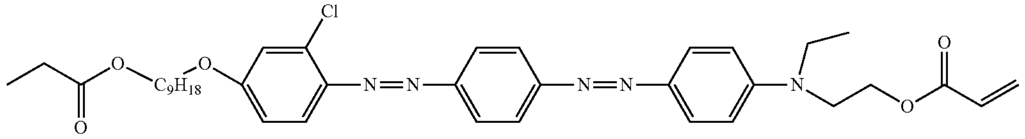
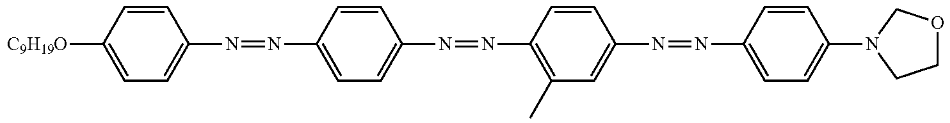
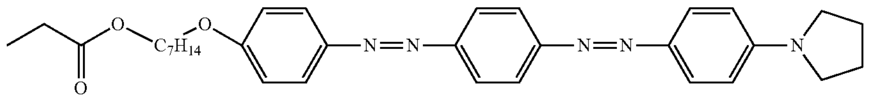

-continued
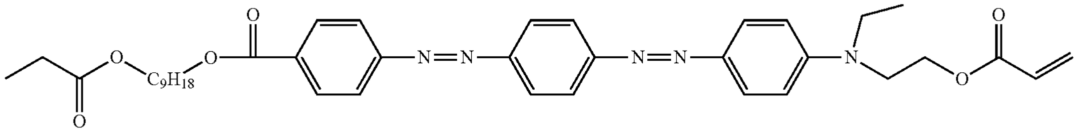
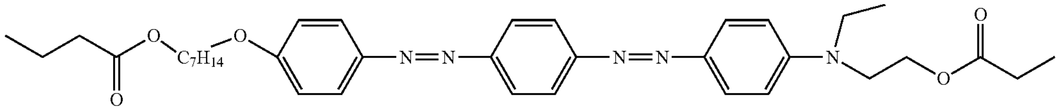
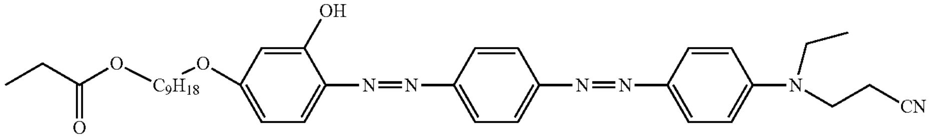
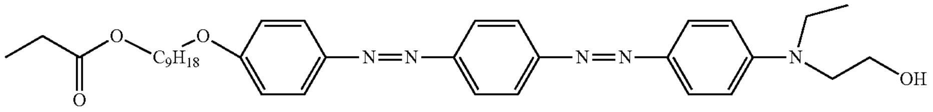
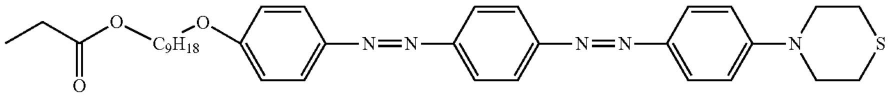
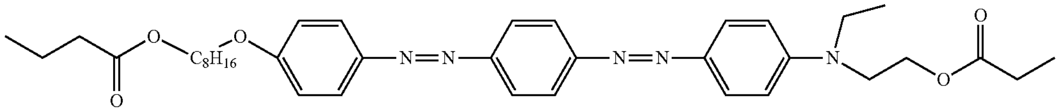
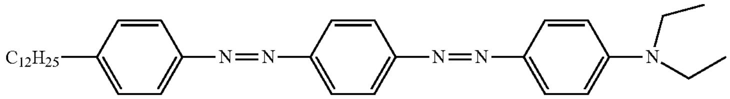
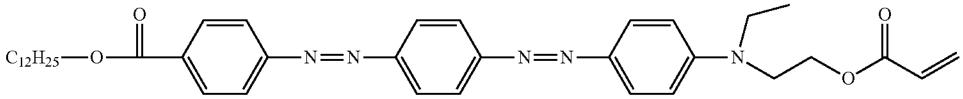
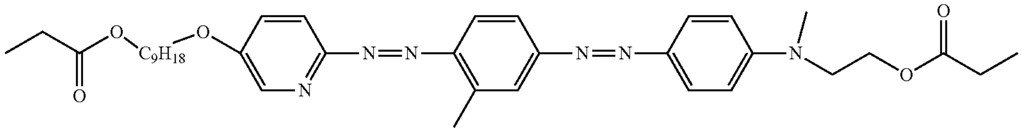
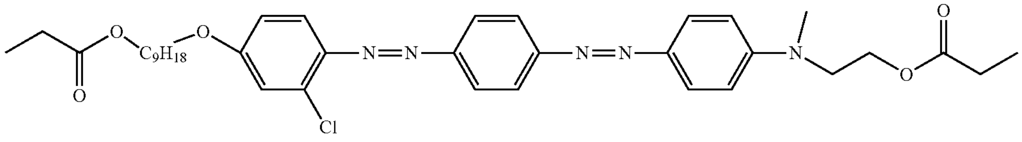
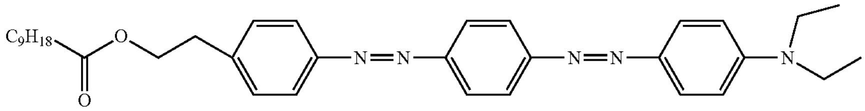
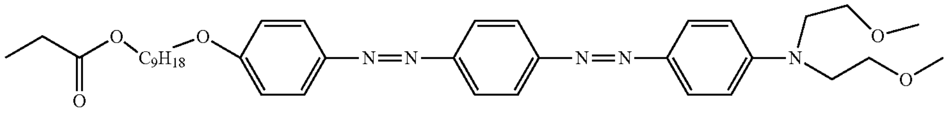
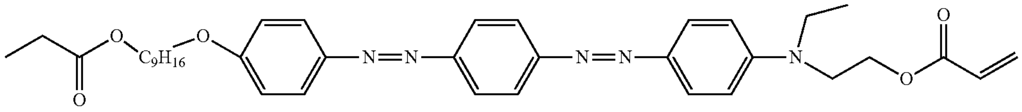
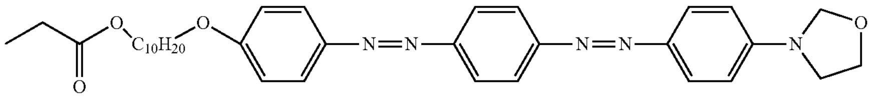
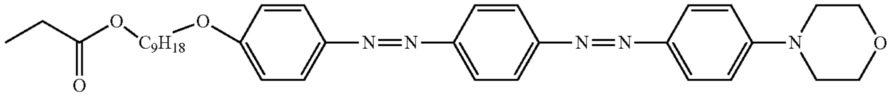

-continued
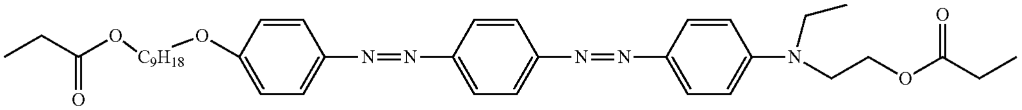
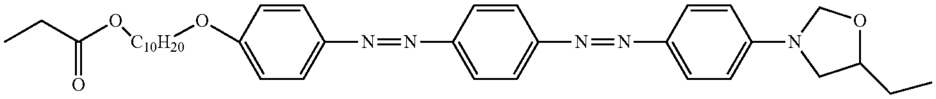
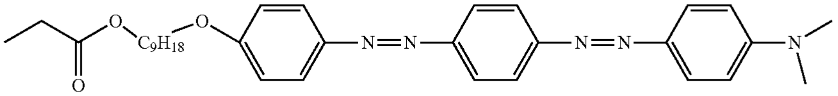
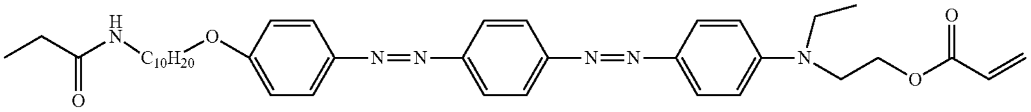
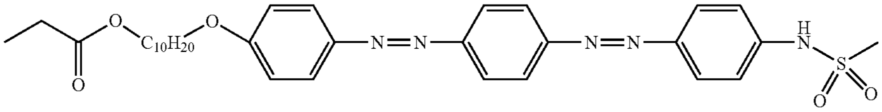
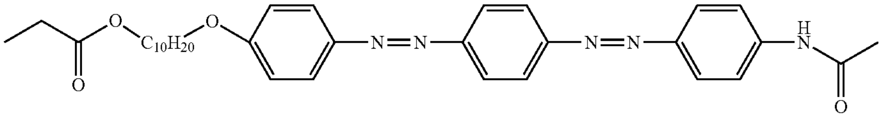
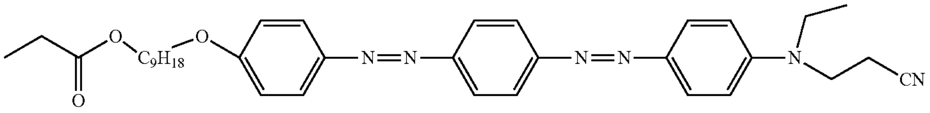
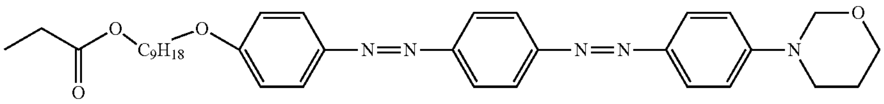
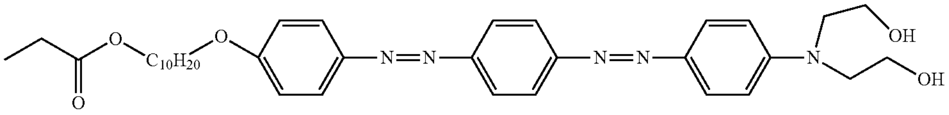
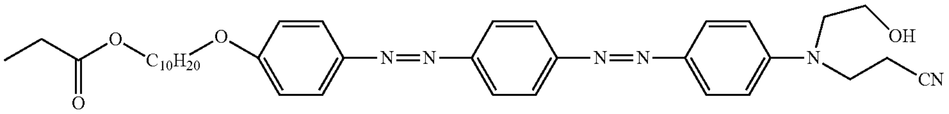
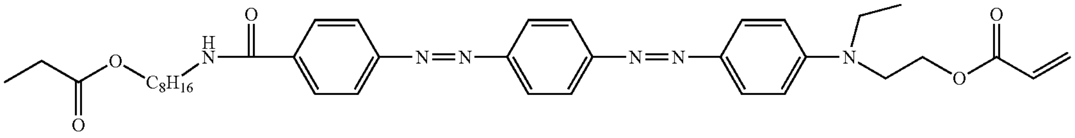
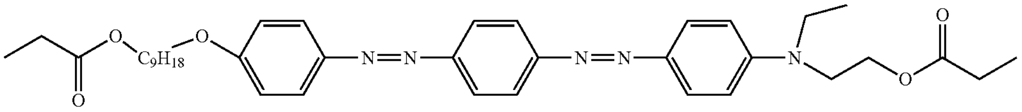
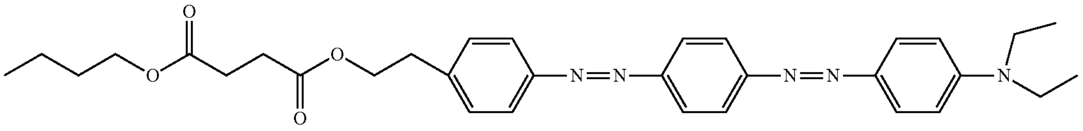
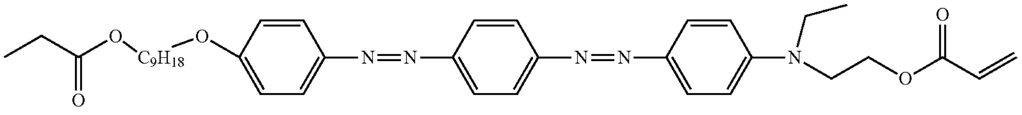
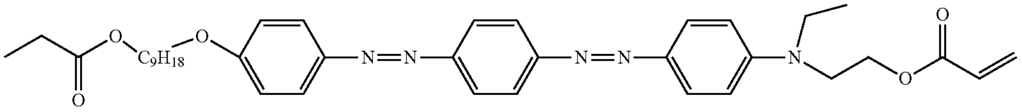

-continued

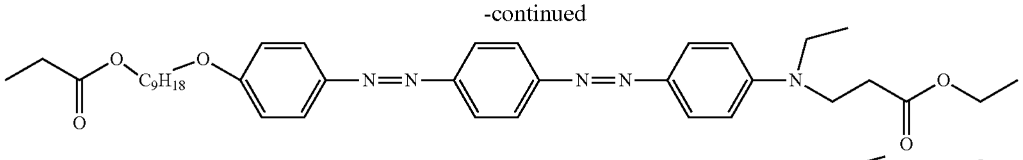

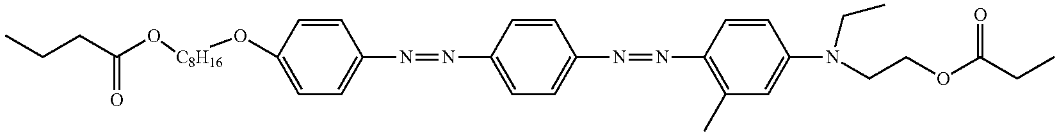

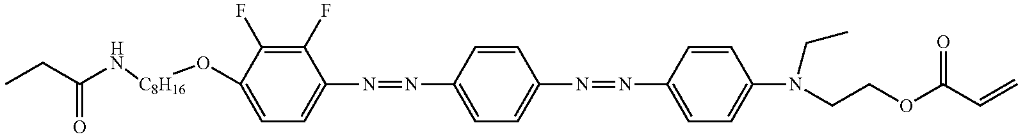

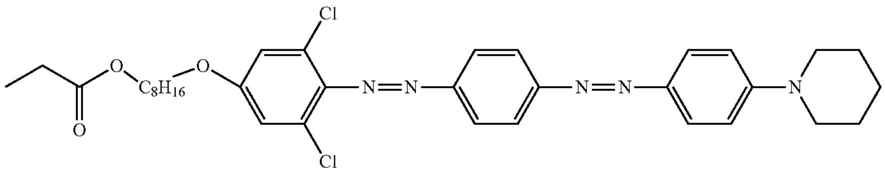

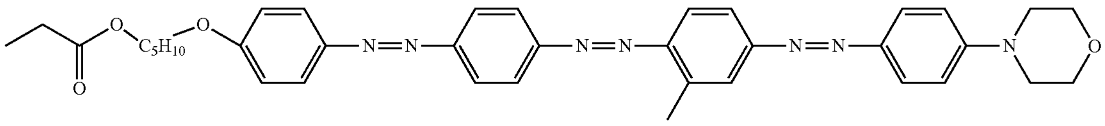

(Difference in Log P Value)

The log P value is an index expressing the hydrophilicity and the hydrophobicity of a chemical structure. An absolute value of a difference (hereinafter, also referred to as "difference in log P value") between the log P value of a side chain of the first dichroic azo coloring agent compound and the log P value of a side chain of the second dichroic azo coloring agent compound is preferably 2.30 or less, more preferably 2.0 or less, still more preferably 1.5 or less, and particularly preferably 1.0 or less. In a case where the difference in log P value is 2.30 or less, since the affinity between the first dichroic azo coloring agent compound and the second dichroic azo coloring agent compound is enhanced and an aligned structure is more easily formed, the alignment degree of the light absorption anisotropic layer is further improved.

Further, in a case where the first dichroic azo coloring agent compound or the second dichroic azo coloring agent compound has a plurality of side chains, it is preferable that at least one difference in log P value is in the above-described ranges. Here, the side chain of the first dichroic azo coloring agent compound and the side chain of the second dichroic azo coloring agent compound denote a group bonded to the terminal of the above-described chromophore. For example, R1, R2, and R3 in Formula (1) represent a side chain in a case where the first dichroic azo coloring agent compound is a compound represented by Formula (1), and R4, R5, and R6 in Formula (2) represent a side chain in a case where the second dichroic azo coloring agent compound is a compound represented by Formula (2). In particularly, in a case where the first dichroic azo coloring agent compound is a compound represented by Formula (1) and the second dichroic azo coloring agent compound is a compound represented by Formula (2), it is preferable that at least one difference in log P value among the difference in log P value between R1 and R4, the difference in log P value between R1 and R5, the difference in log P value between R2 and R4, and the difference in log P value between R2 and R5 is in the above-described ranges.

Here, the log P value is an index for expressing the properties of the hydrophilicity and hydrophobicity of a chemical structure and is also referred to as a hydrophilic-hydrophobic parameter. The log P value can be calculated using software such as ChemBioDraw Ultra or HSPiP (Ver. 4.1.07). Further, the log P value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

(Third Dichroic Azo Coloring Agent Compound)

The third dichroic azo coloring agent compound is a dichroic azo coloring agent compound other than the first dichroic azo coloring agent compound and the second dichroic azo coloring agent compound, and specifically, the chemical structure thereof is different from those of the first dichroic azo coloring agent compound and the second dichroic azo coloring agent compound. In a case where the composition for forming a light absorption anisotropic layer contains the third dichroic azo coloring agent compound, there is an advantage that the tint of the light absorption anisotropic layer is easily adjusted. The maximum absorption wavelength of the third dichroic azo coloring agent compound is 380 nm or greater and less than 455 nm and preferably in a range of 385 to 454 nm.

It is preferable that the third dichroic azo coloring agent compound contains a dichroic azo coloring agent represented by Formula (6).

(6)

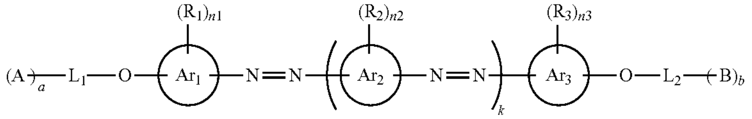

In Formula (6), A and B each independently represent a crosslinkable group. In Formula (6), a and b each independently represent 0 or 1. From the viewpoint that the alignment degree at 420 nm is excellent, it is preferable that both a and b represent 0. In Formula (6), $L_1$ represents a monovalent substituent in a case where a represents 0, and $L_1$ represents a single bond or a divalent linking group in a case where a represents 1. Further, $L_2$ represents a monovalent substituent in a case where b represents 0, and $L_2$ represents a single bond or a divalent linking group in a case where b represents 1. In Formula (6), $Ar_1$ represents a (n1+2)-valent aromatic hydrocarbon group or a heterocyclic group, $Ar_2$ represents a (n2+2)-valent aromatic hydrocarbon group or a heterocyclic group, and $Ar_3$ represents a (n3+2)-valent aromatic hydrocarbon group or a heterocyclic group. In Formula (6), R1, $R_2$, and $R_3$ each independently represent a monovalent substituent. A plurality of $R_1$'s may be the same as or different from each other in a case of "n1≥2", a plurality of R2's may be the same as or different from each other in a case of "n2≥2", and a plurality of $R_3$'s may be the same as or different from each other in a case of "n3≥2". In Formula (6), k represents an integer of 1 to 4. In a case of "k≥2", a plurality of $Ar_2$'s may be the same as or different from each other and a plurality of $R_2$'s may be the same as or different from each other. In Formula (6), n1, n2, and n3 each independently represent an integer of 0 to 4. Here, an expression of "n1+n2+n3≥0" is satisfied in a case of "k=1", and an expression of "n1+n2+n3≥1" is satisfied in a case of "k≥2".

In Formula (6), examples of the crosslinkable group represented by A and B include the polymerizable groups described in paragraphs [0040] to [0050] of JP2010-244038A. Among these, an acryloyl group, a methacryloyl group, an epoxy group, an oxetanyl group, and a styryl group are preferable from the viewpoint of improving the reactivity and the synthetic suitability, and an acryloyl group and a methacryloyl group are more preferable from the viewpoint of further improving the solubility.

In Formula (6), $L_1$ represents a monovalent substituent in a case where a represents 0, and $L_1$ represents a single bond or a divalent linking group in a case where a represents 1. Further, $L_2$ represents a monovalent substituent in a case where b represents 0, and $L_2$ represents a single bond or a divalent linking group in a case where b represents 1.

As the monovalent substituent represented by $L_1$ and $L_2$, a group to be introduced to increase the solubility of the dichroic substance or a group having an electron-donating property or an electron-withdrawing property which is to be introduced to adjust the color tone of the coloring agent is preferable. Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof include a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an aryl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group and a benzoyloxy group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an imidazolyl group, a pyridyl group, a quinolyl group, a furyl group, a piperidyl group, a morpholino group, a benzoxazolyl group, a benzimidazolyl group, and a benzothiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a halogen atom (such as a fluorine atom, a chlorine atom, a bromine atom, and an iodine atom), a hydroxy group, a mercapto group, a cyano group, a nitro group, a hydroxamic acid group, a sulfino group, a hydrazino group, an imino group, and an azo group.

These substituents may be further substituted with these substituents. Further, in a case where two or more substituents are present, these may be the same as or different from each other. Further, these may be bonded to each other to form a ring where possible. As the group in which the above-described substituent is further substituted with the above-described substituent, an $R_B$—(O—$R_A$)$_{na}$— group which is a group in which an alkoxy group is substituted with an alkyl group is exemplified. Here, in the formula, $R_A$ represents an alkylene group having 1 to 5 carbon atoms, $R_B$ represents an alkyl group having 1 to 5 carbon atoms, and na represents an integer of 1 to 10 (preferably an integer of 1 to 5 and more preferably an integer of 1 to 3). Among these, as the monovalent substituent represented by L1 and $L_2$, an alkyl group, an alkenyl group, an alkoxy group, and groups in which these groups are further substituted with these groups (for example, $R_B$—(O—$R_A$)$_{na}$— group) are preferable, an alkyl group, an alkoxy group, and groups in which these groups are further substituted with these groups (for example, an $R_B$—(O—$R_A$)$_{na}$— group) are more preferable.

Examples of the divalent linking group represented by $L_1$ and $L_2$ include —O—, —S—, —CO—, —COO—, —OCO—, —O—CO—O—, —CO—$NR_N$—, —O—CO—$NR_N$—, —$NR_N$—CO—$NR_N$—, —$SO_2$—, —SO—, an alkylene group, a cycloalkylene group, an alkenylene group, and a group obtained by combining two or more of these groups. Among these, a group obtained by combining an alkylene group with one or more groups selected from the group consisting of —O—, —COO—, —OCO— and —O—CO—O— is preferable. Here, $R_N$ represents a hydrogen atom or an alkyl group. In a case where a plurality of $R_N$'s are present, the plurality of $R_N$'s may be the same as or different from each other.

From the viewpoint of further improving the solubility of the dichroic substance, the number of atoms in the main chain of at least one of $L_1$ or $L_2$ is preferably 3 or greater, more preferably 5 or greater, still more preferably 7 or greater, and particularly preferably 10 or greater. Further, the upper limit value of the number of atoms in the main chain is preferably 20 or less and more preferably 12 or less.

In addition, from the viewpoint of further improving the alignment degree of the light absorption anisotropic layer, the number of atoms of the main chain of at least one of $L_1$ or $L_2$ is preferably in a range of 1 to 5. Here, in a case where A is present in Formula (6), "main chain" of $L_1$ denotes a portion required for directly linking "A" with the "O" atom linked to $L_1$, and "number of atoms in the main chain" denotes the number of atoms constituting the above-described portion. Similarly, in a case where B is present in Formula (6), "main chain" of $L_2$ denotes a portion required for directly linking "B" with the "O" atom linked to $L_2$, and "number of atoms in the main chain" denotes the number of atoms constituting the above-described portion. Further, "number of atoms in the main chain" does not include the number of atoms in a branched chain described below. Further, in a case where A is not present, "number of atoms in the main chain" in $L_1$ denotes the number of atoms in $L_1$ that does not have a branched chain. In a case where B is not present, "number of atoms in the main chain" in $L_2$ denotes the number of atoms in $L_2$ that does not have a branched chain.

Specifically, in Formula (D1), the number of atoms in the main chain of $L_1$ is 5 (the number of atoms in the dotted frame on the left side of Formula (D1)), and the number of atoms in the main chain of $L_2$ is 5 (the number of atoms in the dotted frame on the right side of Formula (D1)). Further, in Formula (D10), the number of atoms in the main chain of $L_1$ is 7 (the number of atoms in the dotted frame on the left side of Formula (D10)), and the number of atoms in the main chain of $L_2$ is 5 (the number of atoms in the dotted frame on the right side of Formula (D10)).

D1

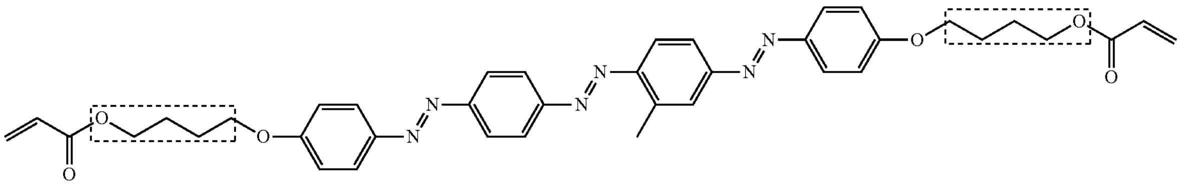

D10

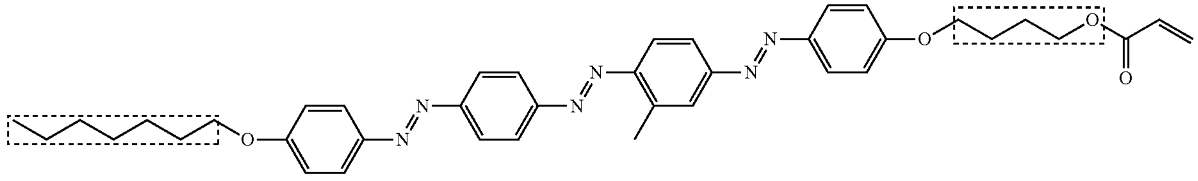

$L_1$ and $L_2$ may have a branched chain. Here, in a case where A is present in Formula (6), "branched chain" of $L_1$ denotes a portion other than a portion required for directly linking "A" with the "O" atom linked to $L_1$ in Formula (6). Similarly, in a case where B is present in Formula (6), "branched chain" of $L_2$ denotes a portion other than a portion required for directly linking "B" with the "O" atom linked to $L_2$ in Formula (6). Further, in a case where A is not present in Formula (6), "branched chain" of $L_1$ denotes a portion other than the longest atomic chain (that is, the main chain) extending from the "O" atom linked to $L_1$ in Formula (6) which is the starting point. Similarly, in a case where B is not present in Formula (6), "branched chain" of $L_2$ denotes a portion other than the longest atomic chain (that is, the main chain) extending from the "O" atom linked to $L_2$ in Formula (6) which is a starting point. The number of atoms in the branched chain is preferably 3 or less. In a case where the number of atoms in the branched chain is set to 3 or less, there is an advantage that the alignment degree of the light absorption anisotropic layer is further improved. Further, the number of atoms in the branched chain does not include the number of hydrogen atoms.

In Formula (6), $Ar_1$ represents an (n1+2)-valent (for example, trivalent in a case where n1 represents 1) aromatic hydrocarbon group or heterocyclic group, $Ar_2$ represents an (n2+2)-valent (for example, trivalent in a case where n2 represents 1) aromatic hydrocarbon group or heterocyclic group, and $Ar_3$ represents an (n3+2)-valent (for example, trivalent in a case where n3 represents 1) aromatic hydrocarbon group or heterocyclic group. Here, $Ar_1$ to $Ar_3$ can be respectively rephrased as a divalent aromatic hydrocarbon group or a divalent heterocyclic group substituted with n1 to n3 substituents ($R_1$ to $R_3$ described below). The divalent aromatic hydrocarbon group represented by $Ar_1$ to $Ar_3$ may be monocyclic or may have a bicyclic or higher cyclic fused ring structure. From the viewpoint of further improving the solubility, the number of rings of the divalent aromatic hydrocarbon group is preferably 1 to 4, more preferably 1 or 2, and still more preferably 1 (that is, a phenylene group).

Specific examples of the divalent aromatic hydrocarbon group include a phenylene group, an azulene-diyl group, a naphthylene group, a fluorene-diyl group, an anthracene-diyl group, and a tetracene-diyl group. From the viewpoints of further improving the solubility, a phenylene group or a naphthylene group is preferable, and a phenylene group is more preferable. Specific examples of the third dichroic azo coloring agent compound are shown below, but the present invention is not limited thereto. In the following specific examples, n represents an integer of 1 to 10.

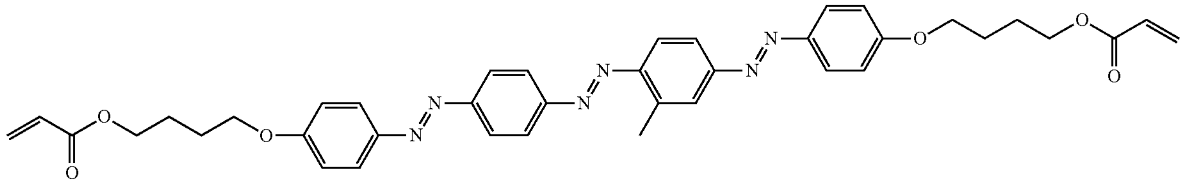

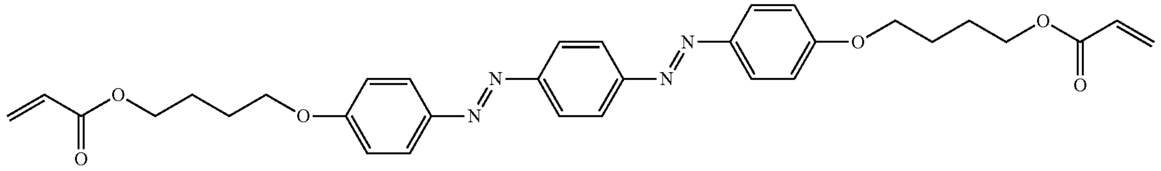

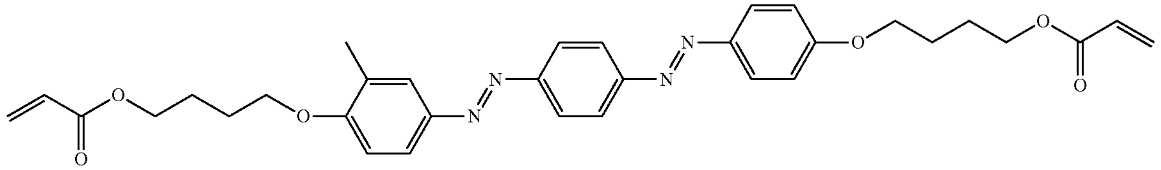

-continued
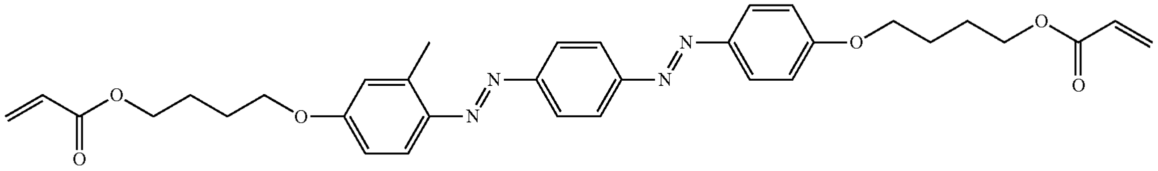
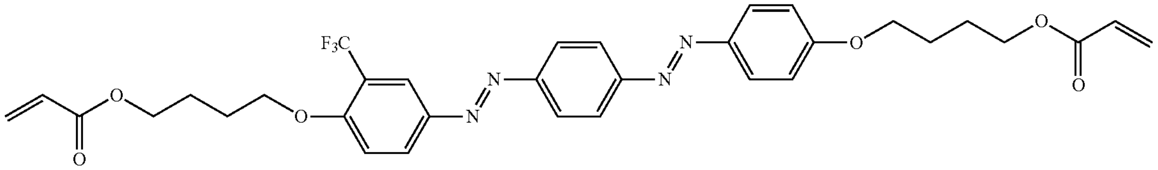
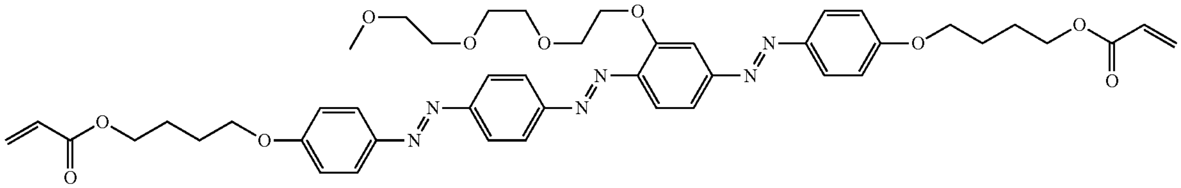
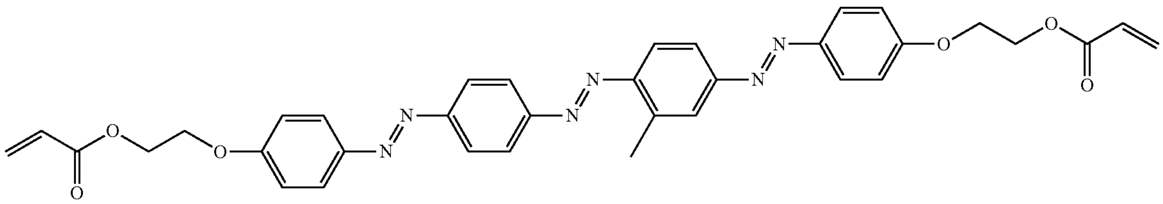
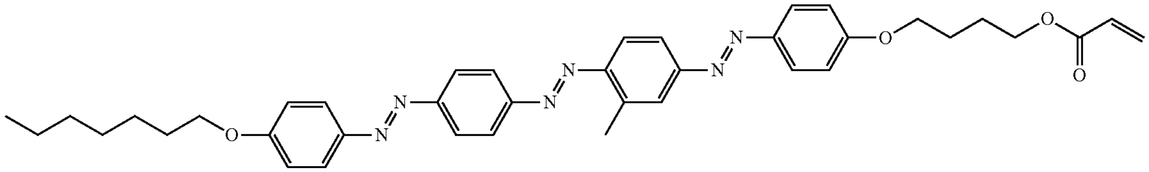
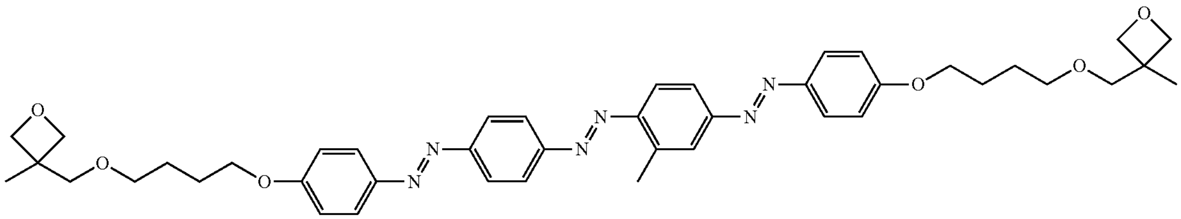
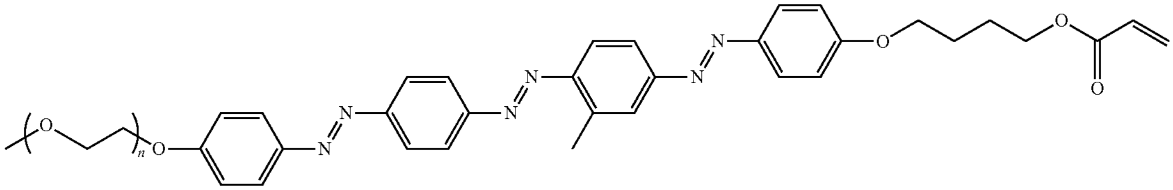
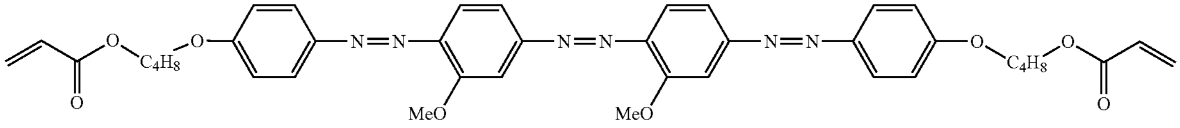
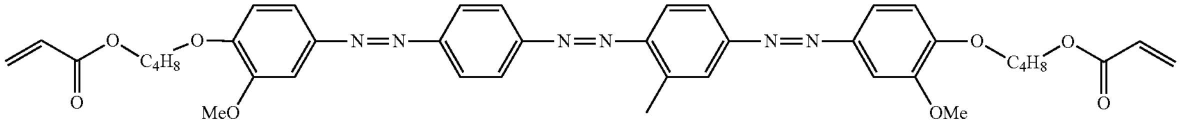
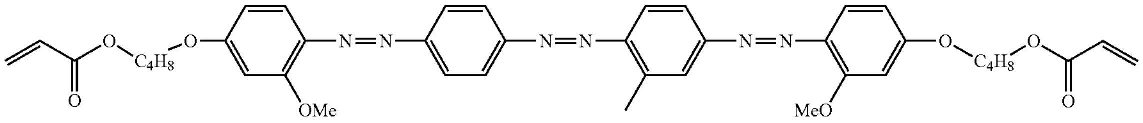

-continued

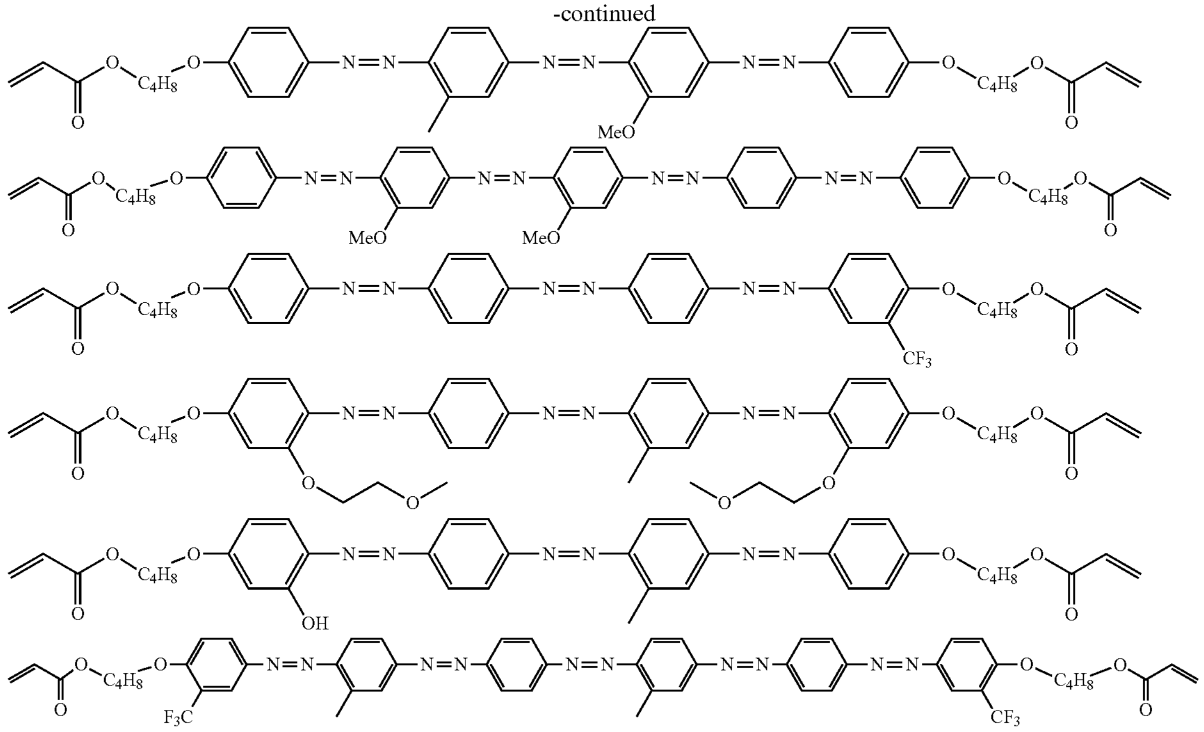

From the viewpoint that the alignment degree at 420 nm is excellent, a structure in which the third dichroic azo coloring agent compound does not contain a radically polymerizable group is preferable. Examples thereof include the following structures.

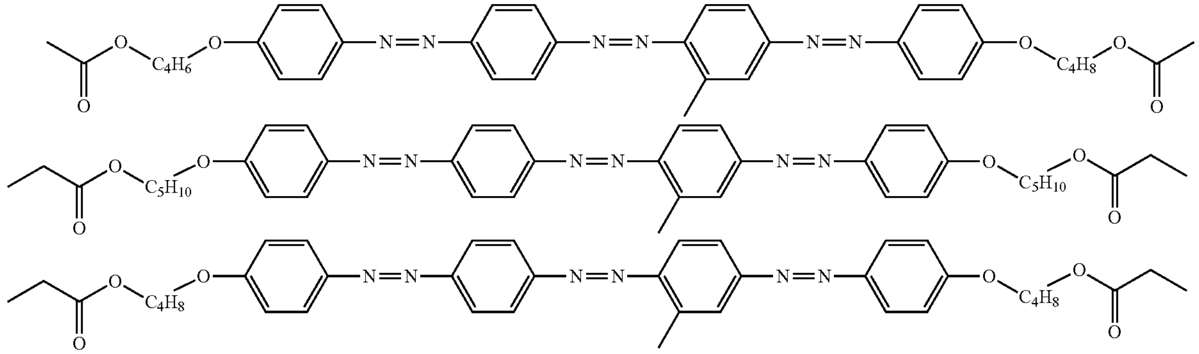

From the viewpoint that the alignment degree at a wavelength of 420 nm is particularly excellent, it is more preferable that the third dichroic azo coloring agent compound is a dichroic substance having a structure represented by Formula (1-1).

(1-1)

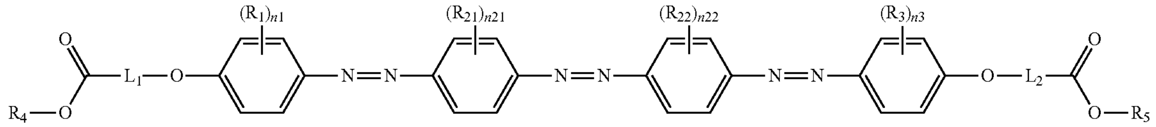

In Formula (1-1), $R_1$, $R_3$, $R_4$, $R_5$, n1, n3, $L_1$, and $L_2$ each have the same definition as that for $R_1$, $R_3$, $R_4$, $R_5$, n1, n3, $L_1$, and $L_2$ of Formula (1). In Formula (1-1), $R_{21}$ and $R_{22}$ each independently have the same definition as that for $R_2$ in Formula (1). In Formula (1-1), n21 and n22 each independently have the same definition as that for n2 in Formula (1). An expression of "n1+n21+n22+n3≥1" is satisfied, and "n1+n21+n22+n3" is preferably in a range of 1 to 9 and more preferably in a range of 1 to 5.

Specific examples of the specific dichroic substance will be described below, but the present invention is not limited thereto.

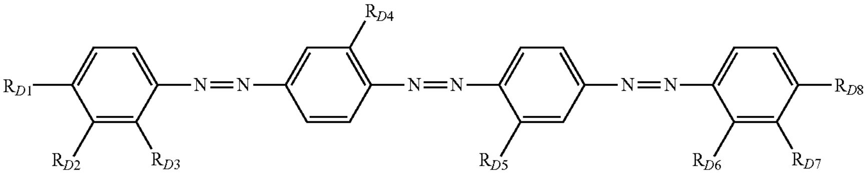

| No | $R_{D1}$ | $R_{D2}$ | $R_{D3}$ | $R_{D4}$ | $R_{D5}$ | $R_{D6}$ | $R_{D7}$ | $R_{D8}$ |
|---|---|---|---|---|---|---|---|---|
| D1 | $OC_4H_8C(O)OCH_2CH_3$ | H | H | H | $CH_3$ | H | H | $OC_4H_8C(O)OCH_2CH_3$ |
| D2 | $OC_4H_8C(O)OCH_3$ | H | H | H | $CH_3$ | H | H | $OC_4H_8C(O)OCH_3$ |
| D3 | $OC_4H_8C(O)OCH_2CH_3$ | H | H | H | $CH_3$ | H | H | $OC_{11}H_{23}$ |
| D4 | $OC_4H_8C(O)OCH_2CH_3$ | H | H | H | $CH_3$ | H | H | $OC_5H_{11}$ |
| D5 | $OC_4H_8C(O)OCH_2CH_3$ | H | H | H | $CH_3$ | H | H | $OCH_2CH_3$ |
| D6 | $OC_4H_8C(O)OCH_2CH_3$ | H | H | H | $CH_3$ | H | Cl | $OC_4H_8C(O)OCH_2CH_3$ |
| D7 | $OC_3H_6C(O)OCH_2CH_3$ | H | H | H | $CH_3$ | H | H | $OC_3H_6C(O)OCH_2CH_3$ |
| D8 | $OC_3H_6C(O)OCH_2CH_3$ | H | H | Cl | H | Cl | H | $OC_3H_6C(O)OCH_2CH_3$ |
| D9 | $OC_9H_{18}C(O)OCH_2CH_3$ | H | H | H | $CH_3$ | H | H | $OC_9H_{18}C(O)OCH_2CH_3$ |
| D10 | $OC_4H_8C(O)OCH_2CH{=}CH_2$ | H | H | H | $CH_3$ | H | H | $OC_4H_8C(O)OCH_2CH{=}CH_2$ |
| D11 | $OC_4H_8C(O)OCH_2CH_3$ | H | H | H | Cl | H | H | $OC_4H_8C(O)OCH_2CH_3$ |
| D12 | $OC_6H_4C(O)OCH_2CH_3$ | H | H | H | $CH_3$ | H | H | $OC_6H_4C(O)OCH_2CH_3$ |

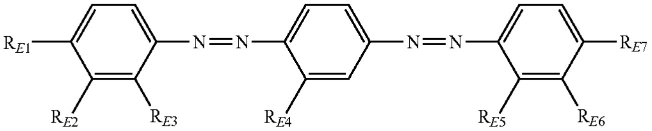

| No: | $R_{E1}$ | $R_{E2}$ | $R_{E3}$ | $R_{E4}$ | $R_{E5}$ | $R_{E6}$ | $R_{E7}$ |
|---|---|---|---|---|---|---|---|
| E1 | $OC_4H_8C(O)OCH_2CH_3$ | H | H | H | H | H | $OC_4H_8C(O)OCH_2CH_3$ |
| E2 | $OC_4H_8C(O)OCH_3$ | H | H | H | H | H | $OC_4H_8C(O)OCH_3$ |
| E3 | $OC_4H_8C(O)OCH_2CH_3$ | Cl | H | H | H | Cl | $OC_4H_8C(O)OCH_2CH_3$ |
| E4 | $OC_4H_8C(O)OCH_2CH_3$ | H | H | H | H | Cl | $OC_5H_{11}$ |
| E5 | $OC_4H_8C(O)OCH_2CH_3$ | H | H | $CH_3$ | H | H | $OCH_2CH_3$ |
| E6 | $OC_3H_6(O)OCH_2CH_3$ | H | H | H | H | H | $OC_3H_6C(O)OCH_2CH_3$ |
| E7 | $OC_9H_{18}C(O)OCH_2CH_3$ | H | H | H | H | H | $OC_9H_{18}C(O)OCH_2CH_3$ |
| E8 | $OC_4H_8C(O)OCH_2{=}CH_2$ | H | H | H | H | H | $OC_4H_8C(O)OCH_2{=}CH_2$ |

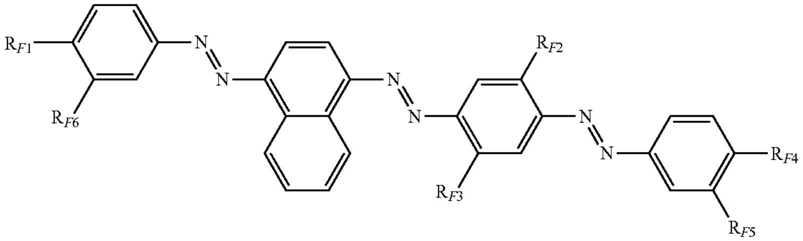

| No | $R_{F1}$ | $R_{F2}$ | $R_{F3}$ | $R_{F4}$ | $R_{F5}$ | $R_{F6}$ |
|---|---|---|---|---|---|---|
| F1 | $OC_4H_8C(O)OCH_2CH_3$ | H | H | $OC_4H_8C(O)OCH_2CH_3$ | H | H |
| F2 | $OC_4H_8C(O)OCH_3$ | H | $CH_3$ | $OC_4H_8C(O)OCH_3$ | H | H |
| F3 | $OC_3H5C(O)OCH_2CH_3$ | H | H | $OC_3H_6C(O)OCH_2CH_3$ | H | H |

(Content of Dichroic Substance)

The content of the dichroic substance is preferably 5% by mass, more preferably in a range of 5% to 30% by mass, still more preferably in a range of 15% to 28% by mass, and particularly preferably in a range of 20% to 30% by mass with respect to the total solid content mass of the light absorption anisotropic layer. In a case where the content of the dichroic substance (particularly, the organic dichroic coloring agent compound) is in the above-described ranges, a light absorption anisotropic layer having a high alignment degree can be obtained even in a case where the light absorption anisotropic layer is formed into a thin film. Therefore, a light absorption anisotropic layer having excellent flexibility is likely to be obtained.

From the viewpoint of increasing the contrast between the illuminance at the center of the viewing angle and the illuminance in a direction deviated from the center of the viewing angle, the content of the dichroic substance per unit area is preferably 0.2 $g/m^2$ or greater, more preferably 0.3 $g/m^2$ or greater, and still more preferably 0.5 $g/m^2$ or greater. The upper limit thereof is not particularly limited, but is typically 1.0 $g/m^2$ or less in many cases.

The content of the first dichroic azo coloring agent compound is preferably in a range of 40 to 90 parts by mass and more preferably in a range of 45 to 75 parts by mass with respect to 100 parts by mass of the total content of the dichroic substance in the composition for forming a light absorption anisotropic layer. The content of the second dichroic azo coloring agent compound is preferably in a range of 6 to 50 parts by mass and more preferably in a range of 8 to 35 parts by mass with respect to 100 parts by mass of the total content of the dichroic substance in the composition for forming a light absorption anisotropic layer. The content of the third dichroic azo coloring agent compound is preferably in a range of 3 to 35 parts by mass and more preferably in a range of 5 to 30 parts by mass with respect to 100 parts by mass of the content of the dichroic azo coloring agent compound in the composition for forming a light absorption anisotropic layer.

The content ratio between the first dichroic azo coloring agent compound, the second dichroic azo coloring agent compound, and the third dichroic azo coloring agent compound used as necessary can be optionally set in order to adjust the tint of the light absorption anisotropic layer. Here, the content ratio of the second dichroic azo coloring agent compound to the first dichroic azo coloring agent compound (second dichroic azo coloring agent compound/first dichroic azo coloring agent compound) is preferably in a range of 0.1 to 10, more preferably in a range of 0.2 to 5, and particularly preferably in a range of 0.3 to 0.8 in terms of moles. In a case where the content ratio of the second dichroic azo coloring agent compound to the first dichroic azo coloring agent compound is in the above-described ranges, the alignment degree is increased.

<Interface Improver>

The composition for forming a light absorption anisotropic layer may contain an interface improver.

As the interface improver, the interface improver described in the columns of the examples described below can be used. In a case where the composition for forming a light absorption anisotropic layer contains an interface improver, the content of the interface improver is preferably in a range of 0.001 to 5 parts by mass with respect to 100 parts by mass of the total amount of the dichroic substance and the liquid crystal compound in the composition for forming a light absorption anisotropic layer.

Polymerizable Compound

The composition for forming a light absorption anisotropic layer may contain a polymerizable compound.

Examples of the polymerizable compound include a compound containing an acrylate (such as an acrylate monomer). In this case, the light absorption anisotropic layer contains a polyacrylate obtained by polymerizing the compound containing an acrylate. Examples of the polymerizable compound include the compounds described in paragraph 0058 of JP2017-122776A. In a case where the composition for forming a light absorption anisotropic layer contains a polymerizable compound, the content of the polymerizable compound is preferably in a range of 3 to 20 parts by mass with respect to 100 parts by mass of the total amount of the dichroic substance and the liquid crystal compound in the composition for forming a light absorption anisotropic layer.

<Vertical Alignment Agent>

The composition for forming a light absorption anisotropic layer may contain a vertical alignment agent as necessary. Examples of the vertical alignment agent include a boronic acid compound and an onium salt.

As the boronic acid compound, a compound represented by Formula (30) is preferable.

Formula (30)

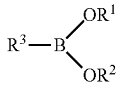

In Formula (30), $R^1$ and $R^2$ each independently represent a hydrogen atom, a substituted or unsubstituted aliphatic hydrocarbon group, a substituted or unsubstituted aryl group, or a substituted or unsubstituted heterocyclic group. $R^3$ represents a substituent containing a (meth)acryl group. Specific examples of the boronic acid compound include a boronic acid compound represented by General Formula (I) described in paragraphs [0023] to [0032] of JP2008-225281A.

As the boronic acid compound, compounds shown below are also preferable.

I-34)

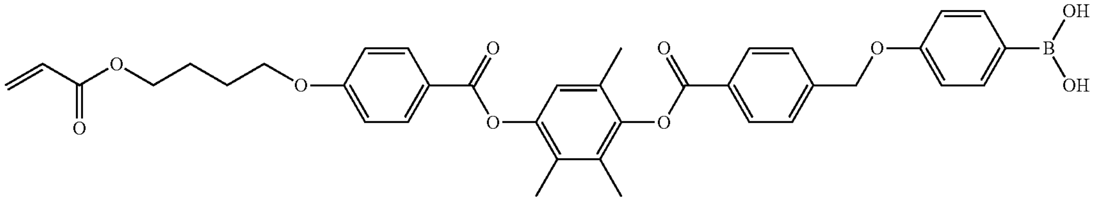

-continued

I-35)

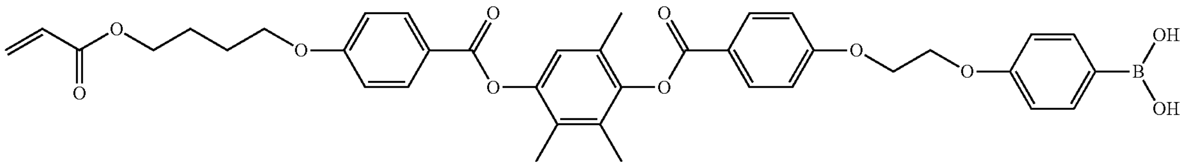

I-36)

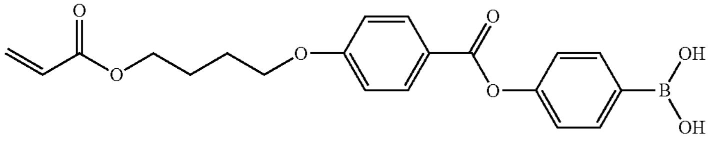

As the onium salt, a compound represented by Formula (31) is preferable.

Formula (31)

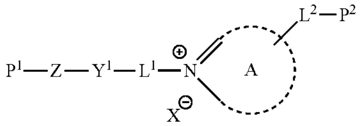

In Formula (31), the ring A represents a quaternary ammonium ion consisting of a nitrogen-containing heterocyclic ring. X represents an anion. $L^1$ represents a divalent linking group. $L^2$ represents a single bond or a divalent linking group. $Y^1$ represents a divalent linking group having a 5- or 6-membered ring as a partial structure. Further, Z represents a divalent linking group containing an alkylene group having 2 to 20 carbon atoms as a partial structure. $P^1$ and $P^2$ each independently represent a monovalent substituent having a polymerizable ethylenically unsaturated bond. Specific examples of the onium salt include the onium salts described in paragraphs 0052 to 0058 of JP2012-208397A, the onium salts described in paragraphs 0024 to 0055 of JP2008-026730A, and the onium salts described in JP2002-37777A.

The content of the vertical alignment agent in the composition is preferably in a range of 0.1% to 400% by mass and more preferably in a range of 0.5% to 350% by mass with respect to the total mass of the liquid crystal compound. The vertical alignment agent may be used alone or in combination of two or more kinds thereof. In a case where two or more kinds of vertical alignment agents are used, the total amount thereof is preferably in the above-described ranges.

<Leveling Agent>

It is preferable that the composition for forming a light absorption anisotropic layer contains a leveling agent described below. In a case where the composition for forming a light absorption anisotropic layer contains a leveling agent, surface roughness due to drying air applied to the surface of the light absorption anisotropic layer is suppressed, and the dichroic substance is more uniformly aligned in the light absorption anisotropic layer. The leveling agent is not particularly limited, and a leveling agent having a fluorine atom (fluorine-based leveling agent) or a leveling agent having a silicon atom (silicon-based leveling agent) is preferable, and a fluorine-based leveling agent is more preferable.

Examples of the fluorine-based leveling agent include fatty acid esters of polyvalent carboxylic acids in which a part of a fatty acid is substituted with a fluoroalkyl group and polyacrylates having a fluoro substituent. Particularly in a case where a rod-like compound is used as the dichroic substance and the liquid crystal compound, a leveling agent having a repeating unit derived from a compound represented by Formula (40) is preferable from the viewpoint of promoting the vertical alignment of the dichroic substance and the liquid crystal compound.

Formula (40)

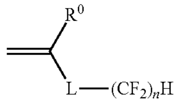

$R^0$ represents a hydrogen atom, a halogen atom, or a methyl group. L represents a divalent linking group. It is preferable that L represents an alkylene group having 2 to 16 carbon atoms, and optional $-CH_2-$ that is not adjacent to the alkylene group may be substituted with $-O-$, $-COO-$, $-CO-$, or $-CONH-$. n represents an integer of 1 to 18.

The leveling agent having a repeating unit derived from a compound represented by Formula (40) may further have other repeating units. Examples of the other repeating units include a repeating unit derived from a compound represented by Formula (41).

Formula (41)

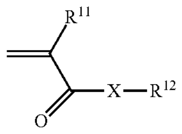

$R^{11}$ represents a hydrogen atom, a halogen atom, or a methyl group. X represents an oxygen atom, a sulfur atom, or $-N(R^{13})-$. $R^{13}$ represents a hydrogen atom or an alkyl group having 1 to 8 carbon atoms. $R^{12}$ represents a hydrogen atom, an alkyl group which may have a substituent, or an aromatic group which may have a substituent. Further, the number of carbon atoms of the alkyl group is preferably in a range of 1 to 20. The alkyl group may be linear, branched, or cyclic. Further, examples of the substituent that the alkyl group may have include a poly(alkyleneoxy) group and a polymerizable group. The definition of the polymerizable group is as described above.

In the case where the leveling agent has a repeating unit derived from a compound represented by Formula (40) and a repeating unit derived from a compound represented by Formula (41), the content of the repeating unit derived from the compound represented by Formula (40) is preferably in a range of 10% to 90% by mole and more preferably in a range of 15% to 95% by mole with respect to all the repeating units of the leveling agent. In the case where the leveling agent has a repeating unit derived from a compound represented by Formula (40) and a repeating unit derived from a compound represented by Formula (41), the content of the repeating unit derived from the compound represented by Formula (41) is preferably in a range of 10% to 90% by mole and more preferably in a range of 5% to 85% by mole with respect to all the repeating units of the leveling agent.

Further, examples of the leveling agent include a leveling agent having a repeating unit derived from a compound represented by Formula (42) in place of the repeating unit derived from a compound represented by Formula (40).

Formula (42)

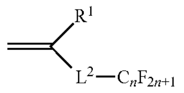

$R^2$ represents a hydrogen atom, a halogen atom, or a methyl group. $L^2$ represents a divalent linking group. n represents an integer of 1 to 18.

Specific examples of the leveling agent include the compounds described in paragraphs 0046 to 0052 of JP2004-331812A and the compounds described in paragraphs 0038 to 0052 of JP2008-257205A.

The content of the leveling agent in the composition is preferably in a range of 0.001% to 10% by mass and more preferably in a range of 0.01% to 5% by mass with respect to the total mass of the liquid crystal compound. The leveling agent may be used alone or in combination of two or more kinds thereof. In a case where two or more leveling agents are used, it is preferable that the total amount thereof is in the above-described ranges.

<Polymerization Initiator>

It is preferable that the composition for forming a light absorption anisotropic layer contains a polymerization initiator.

The polymerization initiator is not particularly limited, but a compound having photosensitivity, that is, a photopolymerization initiator is preferable. As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951, 758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), o-acyloxime compounds (paragraph [0065] of JP2016-27384A), and acylphosphine oxide compounds (JP1988-40799B (JP-S63-40799B), JP1993-29234B (JP-H5-29234B), JP1998-95788A (JP-H10-95788A), and JP1998-29997A (JP-H10-29997A)).

Commercially available products can also be used as such a photopolymerization initiator, and examples thereof include IRGACURE 184, IRGACURE 907, IRGACURE 369, IRGACURE 651, IRGACURE 819, IRGACURE OXE-01, and IRGACURE OXE-02 (all manufactured by BASF SE).

In a case where the composition for forming a light absorption anisotropic layer contains a polymerization initiator, the content of the polymerization initiator is preferably in a range of 0.01 to 30 parts by mass and more preferably in a range of 0.1 to 15 parts by mass with respect to 100 parts by mass of the total amount of the dichroic substance and the liquid crystal compound in the composition for forming a light absorption anisotropic layer. The durability of the light absorption anisotropic film is enhanced in a case where the content of the polymerization initiator is 0.01 parts by mass or greater, and the alignment degree of the light absorption anisotropic film is enhanced in a case where the content thereof is 30 parts by mass or less. The polymerization initiator may be used alone or in combination of two or more kinds thereof. In a case where the composition contains two or more kinds of polymerization initiators, it is preferable that the total amount of the polymerization initiators is in the above-described ranges.

<Solvent>

From the viewpoint of workability or the like, it is preferable that the composition for forming a light absorption anisotropic layer contains a solvent. Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofuran, cyclopentyl methyl ether, tetrahydropyran, and dioxolane), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, butanol, cyclohexanol, isopentyl alcohol, neopentyl alcohol, diacetone alcohol, and benzyl alcohol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, N-ethylpyrrolidone, and 1,3-dimethyl-2-imidazolidinone), and heterocyclic compounds (such as pyridine and N-methylimidazole), and water. These solvents may be used alone or in combination of two or more kinds thereof. Among these solvents, from the viewpoint of exhibiting the effect of the excellent solubility, ketones (particularly cyclopentanone and cyclohexanone), ethers (particularly tetrahydrofuran, cyclopentyl methyl ether, tetrahydropyran, and dioxolane), and amides (particularly dimethylformamide, dimethylacetamide, N-methylpyrrolidone, and N-ethylpyrrolidone) are preferable.

In a case where the composition for forming a light absorption anisotropic layer contains a solvent, the content of the solvent is preferably in a range of 80% to 99% by mass, more preferably in a range of 83% to 97% by mass, and particularly preferably in a range of 85% to 95% by mass with respect to the total mass of the composition for forming a light absorption anisotropic layer. These solvents may be used alone or in combination of two or more kinds thereof. In a case where the composition contains two or more kinds of solvents, it is preferable that the total amount of the solvents is in the above-described range.

<Method of Forming Light Absorption Anisotropic Layer>

A method of forming the light absorption anisotropic layer is not particularly limited, and examples thereof include a method of sequentially performing a step of applying a composition for forming a light absorption anisotropic layer to form a coating film (hereinafter, also referred to as "coating film forming step") and a step of aligning the liquid crystal component and the dichroic substance contained in the coating film (hereinafter, also referred to as "aligning step"). Further, the liquid crystal component is a component that also includes a dichroic substance having liquid crystallinity in a case where the above-described dichroic substance has liquid crystallinity, in addition to the above-described liquid crystal compound.

(Coating Film Forming Step)

The coating film forming step is a step of applying a composition for forming a light absorption anisotropic layer to form a coating film. The composition for forming a light absorption anisotropic layer can be easily applied by using the composition for forming a light absorption anisotropic layer which contains the above-described solvent or using a liquid such as a melt obtained by heating the composition for forming a light absorption anisotropic layer. Specific examples of the method of applying the composition for forming a light absorption anisotropic layer include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Aligning Step)

The aligning step is a step of aligning the liquid crystal component contained in the coating film. In this manner, a light absorption anisotropic layer is obtained. The aligning step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film. Here, the liquid crystal components contained in the composition for forming a light absorption anisotropic layer may be aligned by the coating film forming step or the drying treatment described above. For example, in an embodiment in which the composition for forming a light absorption anisotropic layer is prepared as a coating solution containing a solvent, a coating film having light absorption anisotropy (that is, a light absorption anisotropic film) is obtained by drying the coating film and removing the solvent from the coating film. In a case where the drying treatment is performed at a temperature higher than or equal to the transition temperature of the liquid crystal component contained in the coating film to the liquid crystal phase, the heat treatment described below may not be performed.

The transition temperature of the liquid crystal component contained in the coating film to the liquid crystal phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. In this manner, since the liquid crystal component contained in the coating film can be aligned, the coating film after being subjected to the heat treatment can be suitably used as the light absorption anisotropic film. From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal components contained in the coating film can be fixed. The cooling means is not particularly limited and can be performed according to a known method. The light absorption anisotropic film can be obtained by performing the above-described steps. In the present embodiment, examples of the method of aligning the liquid crystal components contained in the coating film include a drying treatment and a heat treatment, but the method is not limited thereto, and the liquid crystal components can be aligned by a known alignment treatment.

(Other Steps)

The method of forming the light absorption anisotropic layer may include a step of curing the light absorption anisotropic layer after the aligning step (hereinafter, also referred to as "curing step"). The curing step is performed by heating the light absorption anisotropic layer and/or irradiating the layer with light (exposing the layer to light), for example, in a case where the light absorption anisotropic layer contains a crosslinkable group (polymerizable group). Between these, it is preferable that the curing step is performed by irradiating the film with light. Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength. In a case where the exposure is performed while the layer is heated, the heating temperature during the exposure depends on the transition temperature of the liquid crystal components contained in the liquid crystal film to a liquid crystal phase, but is preferably in a range of 25° to 140° C. Further, the exposure may be performed under a nitrogen atmosphere. In a case where the curing of the liquid crystal film proceeds by radical polymerization, from the viewpoint of reducing inhibition of polymerization by oxygen, it is preferable that exposure is performed in a nitrogen atmosphere.

The thickness of the light absorption anisotropic layer is not particularly limited, but is preferably in a range of 100 to 8000 nm and more preferably in a range of 300 to 5000 nm from the viewpoint of reducing the size and the weight.

<Patterning of Light Absorption Anisotropic Layer>

The light absorption anisotropic layer used in the present invention can be a light absorption anisotropic layer which has a region A and a region B in the plane and has different transmittance central axes in each region. In a case where light emitting pixels are controlled by patterning each liquid crystal pixel, the center of the visual field in a narrow visual field can be switched.

Further, the light absorption anisotropic layer used in the present invention can be a light absorption anisotropic layer which has a region C and a region D in the plane and has different transmittances at an angle inclined by 30° with respect to the normal direction from the transmittance central axis in the plane provided with the transmittance central axis and the normal line of the surface of the light absorption anisotropic layer in the region C and the region D. In this case, it is preferable that the light absorption anisotropic layer is a light absorption anisotropic layer in which the transmittance at an angle inclined by 30° with respect to the normal direction from the transmittance central axis of the region C is 50% or less and the transmittance at an angle inclined by 30° with respect to the normal direction from the transmittance central axis of the region D is 80% or greater.

The viewing angle dependence in some regions can be strengthened or weakened by performing the patterning. In this manner, highly confidential information can also be displayed only in the region where the viewing angle dependence is strengthened. Further, design with excellent designability can be carried out by controlling the viewing angle dependence as a display device for each display position. Further, in a case where the light emitting pixels are controlled by performing patterning for each pixel of the liquid crystal, it is possible to switch between a narrow viewing angle and a wide viewing angle.

(Pattern Forming Method)

As described above, the method of forming the patterned light absorption anisotropic layer having two or more regions different in the plane is not limited, and various known methods as described in, for example, WO2019/176918A can be used. Examples thereof include a method of forming a pattern by changing the irradiation angle of ultraviolet light to be applied to a photo-alignment film, a method of controlling the thickness of a patterned light absorption anisotropic layer in the plane, a method of unevenly distributing a dichroic coloring agent compound in a patterned light absorption anisotropic layer, and a method of post-processing an optically uniform patterned light absorption anisotropic layer.

Examples of the method of controlling the thickness of the patterned light absorption anisotropic layer in a plane include a method of using lithography, a method of using imprinting, and a method of forming a patterned light absorption anisotropic layer on a base material having an uneven structure. Examples of the method of unevenly distributing a dichroic coloring agent compound in the patterned light absorption anisotropic layer include a method of extracting a dichroic coloring agent by solvent immersion (bleaching). Further, examples of the method of post-processing an optically uniform patterned light absorption anisotropic layer include a method of cutting a part of a flat light absorption anisotropic layer by laser processing or the like.

[Polarizer]

The polarizer of the laminate according to the embodiment of the present invention is a polarizer having an absorption axis in the in-plane direction.

Such a polarizer is not particularly limited as long as the polarizer is a member having a function of converting light into specific linearly polarized light, and a known polarizer of the related art can be used.

Further, in a case where the laminate according to the embodiment of the present invention is used in an image display device, the polarizer of the laminate according to the embodiment of the present invention may be a polarizer on a viewing side of a liquid crystal display device or a polarizer included in a circularly polarizing plate of an organic electroluminescence (hereinafter, abbreviated as "EL") display device.

As the polarizer, an iodine-based polarizer, a dye-based polarizer formed of a dichroic dye, a polyene-based polarizer, or the like is used. Examples of the iodine-based polarizer and the dye-based polarizer include a coating type polarizer and a stretching type polarizer, and both polarizers can be applied. A polarizer in which a dichroic organic coloring agent is aligned by using alignment of the liquid crystal compound is preferable as the coating type polarizer, and a polarizer prepared by adsorbing iodine or a dichroic dye on polyvinyl alcohol and stretching the polyvinyl alcohol is preferable as the stretching type polarizer. Further, examples of the method of obtaining a polarizer by stretching and dyeing a laminated film in which a polyvinyl alcohol layer is formed on a base material include methods described in JP5048120B, JP5143918B, JP4691205B, JP4751481B, and JP4751486B, and known techniques related to these polarizers can also be preferably used.

Among these, from the viewpoints of the availability and the excellent degree of polarization, a polymer containing a polyvinyl alcohol-based resin (a polymer having $—CH_2—CHOH—$ as a repeating unit, particularly at least one selected from the group consisting of polyvinyl alcohol and ethylene-vinyl alcohol copolymers) is preferable.

In the present invention, the thickness of the polarizer is not particularly limited, but is preferably in a range of 3 μm to 60 μm, more preferably in a range of 5 μm to 20 μm, and still more preferably in a range of 5 μm to 10 μm.

In the present invention, the light absorption anisotropic layer and the polarizer may be laminated via a pressure sensitive adhesive or an adhesive or may be laminated by forming an alignment film described below on the polarizer and directly coating the alignment film with the light absorption anisotropic layer.

Further, in the present invention, the angle φ between a plane having the transmittance central axis of the light absorption anisotropic layer and the normal line of the layer plane of the light absorption anisotropic layer and the absorption axis of the polarizer is preferably in a range of 45° to 90°, more preferably in a range of 80° to 90°, and still more preferably in a range of 88° to 90°. As the angle is closer to 90°, the illuminance contrast between a direction in which an image display device is easily seen and a direction in which the image display device is not easily seen can be provided.

[Retardation Layer]

The laminate according to the embodiment of the present invention may include a retardation layer different from the linear polarization conversion layer and the light absorption anisotropic layer described above.

Further, in a case where such a retardation layer is laminated, the transmission and light shielding performance can be controlled by controlling the retardation value and the optical axis direction.

As the retardation layer, a positive A-plate, a negative A-plate, a positive C-plate, a negative C-plate, a B-plate, an O-plate, or the like can be used.

From the viewpoint of reducing the thickness of the viewing angle control system, it is preferable that the thickness of the retardation layer is small as long as the optical characteristics, the mechanical properties, and the manufacturing suitability are not impaired, and specifically, the thickness thereof is preferably in a range of 1 to 150 μm, more preferably in a range of 1 to 70 μm, and still more preferably in a range of 1 to 30 μm.

In particular, it is preferable that the laminate according to the embodiment of the present invention includes a B-plate between the above-described polarizer (here, the polarizer serving as the linear polarization conversion layer is excluded) and the light absorption anisotropic layer.

[Alignment Film]

The laminate according to the embodiment of the present invention may be provided with an alignment film adjacent to the above-described light absorption anisotropic layer.

The alignment film is provided to control the alignment direction of the light absorption anisotropic layer.

Specific examples of the alignment film include a layer formed of polyvinyl alcohol, polyimide, or the like, which has been or has not been subjected to a rubbing treatment; and a photo-alignment film formed of polyvinyl cinnamate, an azo-based dye, or the like, which has been or has not been subjected to a polarized light exposure treatment.

Further, as the alignment film, for example, a hybrid-aligned liquid crystal layer can be coated with a coating solution and dried so that light absorption anisotropic layer is provided. In this case, since the transmittance central axis of the light absorption anisotropic layer is tilted according to the tilt angle of the liquid crystal molecules on the surface of the hybrid-aligned liquid crystal layer, the transmittance central axis of the light absorption anisotropic layer can be tilted in an oblique direction.

[Protective Layer]

From the viewpoint of improving the durability of the light absorption anisotropic layer, it is preferable that the laminate according to the embodiment of the present invention includes a protective layer as a layer adjacent to the light absorption anisotropic layer.

The protective layer may be a layer formed of a known material, and preferred examples thereof include a resin film. Examples of the resin film include an acrylic resin film, a cellulose ester resin film, a polyethylene terephthalate resin film, a polyvinyl alcohol resin film, a polycarbonate resin film, and modified resin films thereof.

Further, the protective layer may be subjected to a surface reforming treatment for the purpose of improving the adhesiveness or the like before the adhesive or the pressure sensitive adhesive is attached to the layer. Specific examples of the treatment include a corona treatment, a plasma treatment, a primer treatment, and a saponification treatment.

[Transparent Base Film]

The laminate according to the embodiment of the present invention may include a transparent base film.

It is preferable that the transparent base film is disposed on a surface of the light absorption anisotropic layer opposite to the surface on which the protective layer is provided.

As the transparent base film, a known transparent resin film such as a transparent resin plate, a transparent resin sheet, or the like can be used without particular limitation.

Examples of the transparent resin film include a cellulose acylate film (such as a cellulose triacetate film (refractive index of 1.48), a cellulose diacetate film, a cellulose acetate butyrate film, or a cellulose acetate propionate film), a polyethylene terephthalate film, a polyether sulfone film, a polyacrylic resin film, a polyurethane-based resin film, a polyester film, a polycarbonate film, a polysulfone film, a polyether film, a polymethylpentene film, a polyether ketone film, and a (meth)acrylonitrile film.

Among these, a cellulose acylate film which is highly transparent, has a small optical birefringence, is easily produced, and is typically used as a protective film of a polarizing plate is preferable, and a cellulose triacetate film is particularly preferable. The thickness of the transparent base film is usually 20 μm to 100 μm. In the present invention, it is particularly preferable that the transparent base film is a cellulose ester-based film having a film thickness 20 to 70 μm.

[Barrier Layer]

It is also preferable that the laminate according to the embodiment of the present invention includes a barrier layer together with the light absorption anisotropic layer.

Here, the barrier layer is also referred to as a gas-shielding layer (oxygen-shielding layer) and has a function of protecting the polarizer of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Refractive Index Adjusting Layer]

From the viewpoint of suppressing internal reflection caused by the dichroic substance contained in the light absorption anisotropic layer described above, it is preferable that the laminate according to the embodiment of the present invention includes a refractive index adjusting layer as necessary.

The refractive index adjusting layer is a layer disposed in contact with the light absorption anisotropic layer and has an in-plane average refractive index of 1.55 or greater and 1.70 or less at a wavelength of 550 nm. It is preferable that the refractive index adjusting layer is a refractive index adjusting layer for performing so-called index matching.

[Pressure Sensitive Adhesive Layer]

The laminate according to the embodiment of the present invention may be formed by bonding the respective layers described above via a pressure sensitive adhesive layer.

It is preferable that the pressure sensitive adhesive layer in the present invention is a transparent and optically isotropic pressure sensitive adhesive similar to that used in a typical image display device, and a pressure sensitive type pressure sensitive adhesive is typically used.

The pressure sensitive adhesive layer of the present invention may be blended with appropriate additives such as a crosslinking agent (such as an isocyanate-based crosslinking agent or an epoxy-based crosslinking agent), a viscosity imparting agent (such as a rosin derivative resin, a polyterpene resin, a petroleum resin, or an oil-soluble phenol resin), a plasticizer, a filler, an antiaging agent, a surfactant, an ultraviolet absorbing agent, a light stabilizer, and an antioxidant in addition to a parent material (pressure sensitive adhesive), conductive particles, and thermally expandable particles used as necessary.

The thickness of the pressure sensitive adhesive layer is typically in a range of 20 to 500 μm and preferably in a range of 20 to 250 μm. The required adhesive strength or rework suitability may not be obtained in a case where the thickness thereof is less than 20 μm, and the pressure sensitive adhesive may protrude or bleed out from the peripheral end portion of the image display device in a case where the thickness thereof is greater than 500 μm.

The pressure sensitive adhesive layer can be formed by an appropriate method such as a method of directly coating a support for a protective member with a coating solution containing a parent material, conductive particles, and as necessary, thermally expandable particles, an additive, a solvent, and the like and pressure-bonding the support via a release liner or a method of coating an appropriate release liner (release paper or the like) with a coating solution to form a thermally expandable pressure sensitive adhesive layer, and pressure-bonding and transferring (transporting) the layer onto the support for a protective member.

In addition, for example, a configuration in which conductive particles are added to a configuration of a thermally-releasable pressure sensitive adhesive sheet described in JP2003-292916A can be employed as the protective member. Further, a member in which conductive particles are sprayed on the surface of a pressure sensitive adhesive layer in commercially available products such as "REVALPHA" (manufactured by Nitto Denko Corporation) may be used as the protective member.

[Adhesive Layer]

The laminate according to the embodiment of the present invention may be formed by bonding the respective layers described above via an adhesive layer.

The adhesive layer of the present invention exhibits adhesiveness due to drying or a reaction after bonding. A polyvinyl alcohol-based adhesive (PVA-based adhesive) exhibits adhesiveness due to drying and is capable of bonding materials to each other. Specific examples of the curable adhesive that exhibits adhesiveness due to reaction include an active energy ray-curable adhesive such as a (meth) acrylate-based adhesive and a cationic polymerization curable adhesive. Further, the (meth)acrylate indicates acrylate and/or methacrylate. Examples of the curable component in the (meth)acrylate-based adhesive include a compound containing a (meth)acryloyl group and a compound containing a vinyl group. Further, as the cationic polymerization curable adhesive, a compound containing an epoxy group or an oxetanyl group can also be used. The compound containing an epoxy group is not particularly limited as long as the compound contains at least two epoxy groups in a molecule, and various generally known curable epoxy compounds can be used. Preferred examples of the epoxy compound include a compound (aromatic epoxy compound) containing at least two epoxy groups and at least one aromatic ring in a molecule and a compound (alicyclic epoxy compound) containing at least two epoxy groups in a molecule, in which at least one of the epoxy groups is formed between two adjacent carbon atoms constituting an alicyclic ring. Among these, an ultraviolet curable adhesive that is cured by irradiation with ultraviolet rays is preferably used from the viewpoint of heat deformation resistance.

Each of the pressure sensitive adhesive layer and the adhesive layer may be obtained by imparting the ultraviolet absorbing ability to the layer using a method of performing a treatment with an ultraviolet absorbing agent such as a salicylic acid ester-based compound, a benzophenol-based compound, a benzotriazole-based compound, a cyanoacrylate-based compound, or a nickel complex salt-based compound.

The pressure sensitive adhesive layer and the adhesive layer described above can be attached by an appropriate method. For example, the pressure sensitive adhesive layer or the adhesive layer may be attached to the film by a method of preparing 10% to 40% by weight of a pressure sensitive adhesive solution obtained by dissolving or dispersing a base polymer or a composition thereof in a solvent consisting of a single substance or a mixture of an appropriate solvent such as toluene or ethyl acetate and directly attaching the solution onto the film using an appropriate development method such as a casting method or a coating method; or a method of forming a pressure sensitive adhesive layer on a separator in conformity with the above-described method and transporting the layer.

The pressure sensitive adhesive layer or the adhesive layer can be provided on one or both surfaces of the film as a layer obtained by superimposing different kinds of layers with different compositions. In addition, in a case where the layer is provided on both surfaces of the film, different kinds of pressure sensitive adhesive layers with different compositions and different thicknesses can be provided on the front and rear surfaces of the film.

[Other Layers]

In the laminate according to the embodiment of the present invention, the light absorption anisotropic layer used in the present invention can be used by being combined with an optically anisotropic film or a polarizer in order to control the angle dependence of the viewing angle. For example, it is also preferable that a resin film having optical anisotropy which consists of polymers containing carbonate, cycloolefin, cellulose acylate, methyl methacrylate, styrene, a maleic acid anhydride, and the like is used as the transparent base film.

[Reflection Prevention System]

The reflection prevention system according to the embodiment of the present invention is a reflection prevention system including the laminate according to the embodiment of the present invention.

In the reflection prevention system according to the embodiment of the present invention, as described above, in a case where the transmittance central axis of the light absorption anisotropic layer is inclined with respect to the normal line of the layer plane of the light absorption anisotropic layer, the angle φ between the plane having the transmittance central axis and the normal line of the layer plane of the light absorption anisotropic layer and the absorption axis of the polarizer is preferably in a range of 45° to 90°, more preferably in a range of 80° to 90°, and still more preferably in a range of 88° to 90°. As the angle is closer to 90°, the illuminance contrast between a direction in which an image display device is easily seen and a direction in which the image display device is not easily seen can be provided.

Further, in a case where the transmittance central axis of the light absorption anisotropic layer is parallel to the normal line of the layer plane of the light absorption anisotropic layer, the preferred embodiment described above is not particularly limited.

[Image Display Device]

An image display device according to the embodiment of the present invention is an image display device including the above-described laminate according to the embodiment of the present invention.

A liquid crystal display device other than an organic EL display device or another display device can be used as the image display device according to the embodiment of the present invention. Here, an organic EL display device will be described as an example thereof. As illustrated in FIG. 1, an image display device 100 with a reflection prevention system according to the embodiment of the present invention is an image display device including at least a linear polarization conversion layer 101, a light absorption anisotropic layer 102, a polarizer 103, and an organic EL image display device 104 in this order from a viewing side.

[Image Display Element]

The display element used in the image display device according to the embodiment of the present invention is not particularly limited, and examples thereof include a liquid crystal cell, an organic EL display panel, and a plasma display panel.

Among these, a liquid crystal cell or an organic EL display panel is preferable. That is, as the image display device according to the embodiment of the present invention, a liquid crystal display device formed of a liquid crystal cell as a display element or an organic EL display device formed of an organic EL display panel as a display element is preferable.

Preferred examples of the liquid crystal display device which is an example of the image display device according to the embodiment of the present invention include an aspect of a device having the light absorption anisotropic layer, the polarizer, and the liquid crystal cell of the present invention. More suitable examples thereof include a liquid crystal display device including the laminate according to the embodiment of the present invention and the liquid crystal cell. In the present invention, between the polarizers provided on both sides of the liquid crystal cell, it is preferable that the laminate according to the embodiment of the present invention is used as a front-side or rear-side polarizer, and the laminate according to the embodiment of the present invention can be used as a front-side and rear-side polarizer.

Some image display devices are thin and can be molded into a curved surface. Since the optically anisotropic layer used in the present invention is thin and easily bent, the light absorption anisotropic layer can be suitably applied to an image display device having a curved display surface.

Further, some image display devices have a pixel density of greater than 250 ppi and are capable of high-definition display. The optically anisotropic layer used in the present invention can be suitably applied to such a high-definition image display device without causing moire.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto. In the liquid crystal cell in a TN mode, rod-like liquid crystal molecules are substantially horizontally aligned at the time of no voltage application and further twisted aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystalline molecules are substantially vertically aligned at the time of no voltage application. The concept of the liquid crystal cell in a VA mode includes (1) a liquid crystal cell in a VA mode in a narrow sense where rod-like liquid crystal molecules are aligned substantially vertically at the time of no voltage application and substantially horizontally at the time of voltage application (described in JP1990-176625A (JP-H2-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, pp. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, or a polymer-sustained alignment (PSA) type. The details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

EXAMPLES

Hereinafter, the present invention will be described in more detail based on the following examples. The materials, the reagents, the amounts of substances and the proportions of the substances, the operations, and the like shown in the following examples can be appropriately changed within a range not departing from the scope of the present invention. Therefore, the scope of the present invention is not limited to the following specific examples.

Example 1

[Preparation of Light Absorption Anisotropic Film P1]

A light absorption anisotropic film P1 including a light absorption anisotropic layer in which a coloring agent was aligned was prepared by the following procedures.

<Preparation of Transparent Support 1 with PVA Alignment Film Also Serving as Barrier Layer>

The surface of a cellulose acylate film 1 (TAC base material with a thickness of 40 μm; TG40, manufactured by FUJIFILM Corporation) as a support was saponified with an alkaline solution and coated with the following coating solution for forming a PVA film also serving as a barrier layer using a wire bar. The support on which the coating film had been formed was dried with hot air at 60° C. for 60 seconds and further dried with hot air at 100° C. for 120 seconds to form a PVA alignment film 1 also serving as a barrier layer, thereby obtaining a transparent support 1 with a PVA alignment film also serving as a barrier layer. The film thickness of the PVA alignment film 1 also serving as a barrier layer was 0.5 μm.

| (Coating solution for forming PVA alignment film also serving as barrier layer) |
|---|
| Modified polyvinyl alcohol shown below: 3.80 parts by mass |
| Initiator Irg2959: 0.20 parts by mass |
| Water: 70 parts by mass |

-continued

| (Coating solution for forming PVA alignment film also serving as barrier layer) |
|---|
| Methanol: 30 parts by mass<br>]Modified polyvinyl alcohol<br>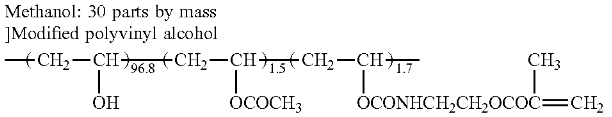 |

<Formation of Light Absorption Anisotropic Layer P1>

The obtained PVA alignment film 1 also serving as a barrier layer was coated with the following composition P1 for forming a light absorption anisotropic layer using a wire bar, thereby forming a coating film. Next, the coating film was heated at 120° C. for 60 seconds and subsequently cooled to room temperature (23° C.). Further, the coating film was reheated at 80° C. for 60 seconds and cooled to room temperature. Thereafter, the coating film was irradiated with an LED lamp (central wavelength of 365 nm) for 1 second under an irradiation condition of an illuminance of 200 mW/cm$^2$, thereby forming a light absorption anisotropic layer P1 on the PVA alignment film 1 also serving as a barrier layer.

| (Composition P1 for forming light absorption anisotropic layer) |
|---|

Dichroic substance D-1 shown below: 0.63 parts by mass
Dichroic substance D-2 shown below: 0.17 parts by mass
Dichroic substance D-3 shown below: 1.13 parts by mass
Polymer liquid crystal compound P-1 shown below: 8.18 parts by mass
Polymerization initiator IRGACURE OXE-02 (manufactured by BASF SE): 0.16 parts by mass
Compound E-1 shown below: 0.12 parts by mass
Compound E-2 shown below: 0.12 parts by mass
Surfactant F-1 shown below: 0.005 parts by mass
Cyclopentanone: 85.00 parts by mass
Benzyl alcohol: 4.50 parts by mass
[Dichroic substance D-1

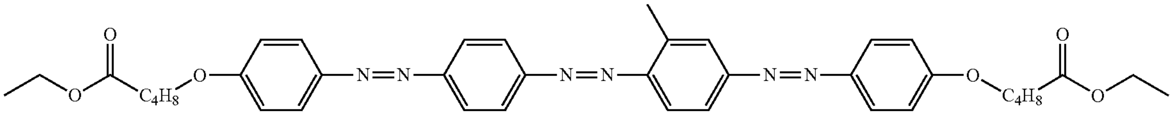

Dichroic substance D-2

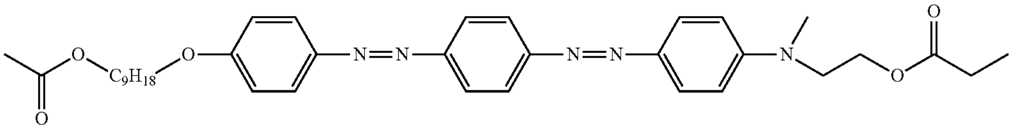

Dichroic substance D-3

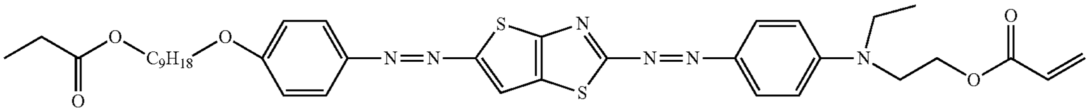

[]Polymer liquid crystal compound P-1

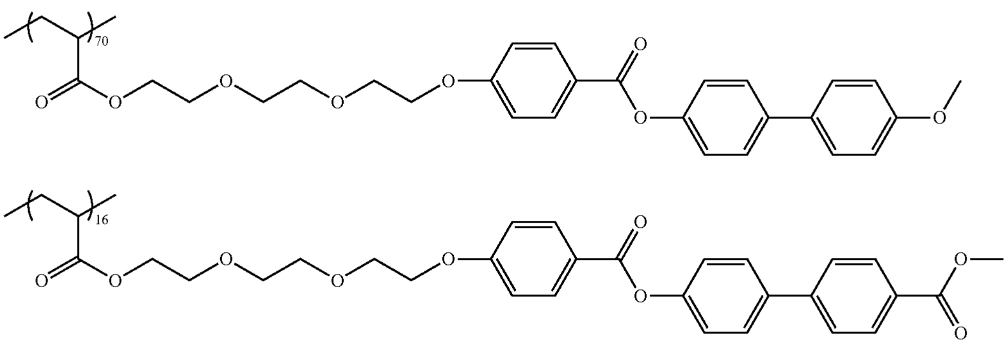

-continued (Composition P1 for forming light absorption anisotropic layer)

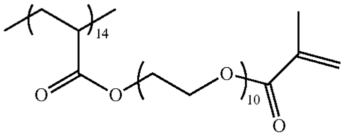

]Compound E-1

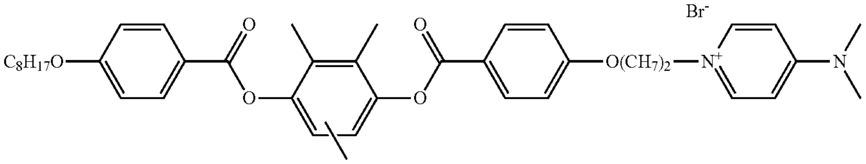

]Compound E-2

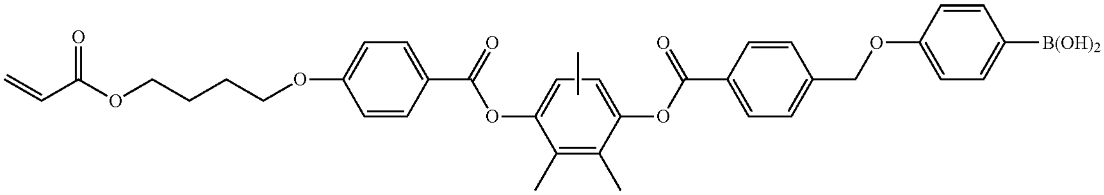

]Surfactant F-1

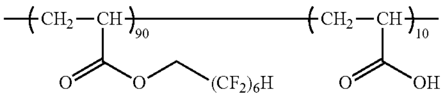

<Formation of Barrier Layer 1>

The prepared light absorption anisotropic layer P1 was coated with the following coating solution for forming a barrier layer using a wire bar and dried at 80° C. for 5 minutes. Next, the obtained coating film was irradiated with an LED lamp (central wavelength of 365 nm) for 2 seconds under an irradiation condition of an illuminance of 150 $mW/cm^2$ in an environment of an oxygen concentration of 100 ppm and a temperature of 60° C., thereby forming a barrier layer 1 on the light absorption anisotropic layer P1. The thickness of the barrier layer 1 was 1.0 μm.

A light absorption anisotropic film P1 was obtained in the above-described manner.

| (Coating solution for forming barrier layer) |
| --- |
| Modified polyvinyl alcohol shown above: 3.80 parts by mass |
| Initiator Irg2959: 0.20 parts by mass |
| Water: 70 parts by mass |
| Methanol: 30 parts by mass |

[Preparation of Linear Polarization Conversion Film Q1]

Figure 5:
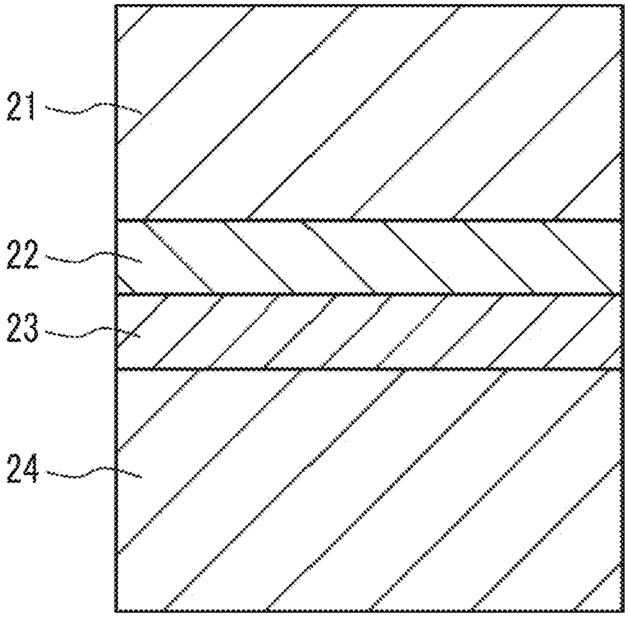
FIG. 5 is a cross-sectional view schematically illustrating a linear polarization conversion film that is a part of an embodiment of the present invention.

A linear polarization conversion film Q1 including a randomly aligned liquid crystal layer as a linear polarization conversion layer was prepared by the following procedures. Further, the layer configuration of the linear polarization conversion film Q1 is as illustrated in FIG. 5 (reference numeral 21: linear polarization conversion layer, reference numeral 22: alignment auxiliary layer, reference numeral 23: barrier layer, reference numeral 24: TAC support).

<Preparation of Transparent Support 2 with Barrier Layer>

The surface of a cellulose acylate film 1 (TAC base material with a thickness of 40 μm; TG40, manufactured by FUJIFILM Corporation) was saponified with an alkaline solution and coated with the following coating solution for forming a barrier layer using a wire bar. The support on which the coating film had been formed was dried with hot air at 60° C. for 60 seconds and further dried with hot air at 100° C. for 120 seconds to form a barrier layer 2, thereby obtaining a transparent support 2 with a barrier layer. The film thickness of the barrier layer 2 was 0.5 μm.

| (Coating solution for forming barrier layer) |
| --- |
| Modified polyvinyl alcohol shown above: 3.80 parts by mass |
| Initiator Irg2959: 0.20 parts by mass |
| Water: 70 parts by mass |
| Methanol: 30 parts by mass |

<Formation of Alignment Auxiliary Layer 1>

The barrier layer 2 was coated with the following composition 1 for forming an alignment auxiliary layer using a wire bar. The support on which the coating film had been formed was dried with hot air at 140° C. for 120 seconds, and the coating film was irradiated with ultraviolet rays in an unpolarized light (natural light) state at 1000 $mJ/cm^2$ (using an ultra-high pressure mercury lamp) at room temperature, thereby forming an alignment auxiliary layer 1. The film thickness of the alignment auxiliary layer 1 was 0.25 μm.

(Composition 1 for forming alignment auxiliary layer)
Polymer PA-1 shown below: 10.0 parts by mass
Acid generator PAG-1 shown below: 0.83 parts by mass
Stabilizer DIPEA shown below: 0.06 parts by mass
Xylene: 113 parts by mass
Methyl isobutyl ketone: 12 parts by mass
[]Polymer PA-1 (In the formulae, the numerical value described in each repeating unit represents the content (% by mass) of each repeating unit with respect to all repeating units)

[

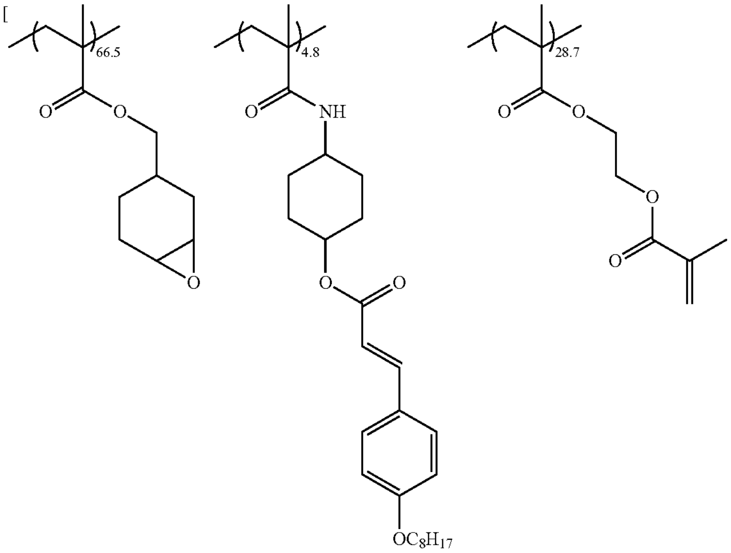

]

[]Acid generator PAG-1

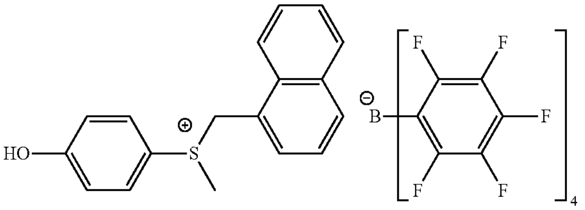

Stabilizer DIPEA

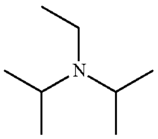

<Formation of Linear Polarization Conversion Layer 1>

The alignment auxiliary layer 1 was coated with the following composition 1 for forming a randomly aligned liquid crystal layer using a wire bar. The support on which the coating film had been formed was dried with hot air at 120° C. for 120 seconds, and the coating film was irradiated with ultraviolet rays at 200 mJ/$cm^2$ (using an ultra-high pressure mercury lamp) at a temperature of 60° C., thereby forming a randomly aligned liquid crystal layer 1. The obtained randomly aligned liquid crystal layer 1 was used as the linear polarization conversion layer 1 in the present example.

FIG. 2 shows an image of the obtained randomly aligned liquid crystal layer 1 in a case of observing the layer using a polarization microscope under a condition of crossed nicols. The thickness of the obtained randomly aligned liquid crystal layer 1 was approximately 2 μm. In addition, the randomly aligned liquid crystal layer 1 exhibiting a liquid crystal state of a nematic phase at 60° C. was confirmed in advance by observing the liquid crystal phase while changing the temperature using a hot stage for a microscope (manufactured by Mettler-Toledo International Inc.) and a polarization microscope.

| (Composition 1 for forming randomly aligned liquid crystal layer) |
| --- |
| Low-molecular-weight liquid crystal compound M-1 shown below: 10.0 parts by mass<br>Photopolymerization initiator IRGACURE Irg907: 0.60 parts by mass<br>Polymerizable compound M-2 shown below: 0.40 parts by mass<br>Surfactant F-2 shown below: 0.03 parts by mass<br>Methyl ethyl ketone: 39.0 parts by mass |

Low-molecular-weight liquid crystal compound M-1

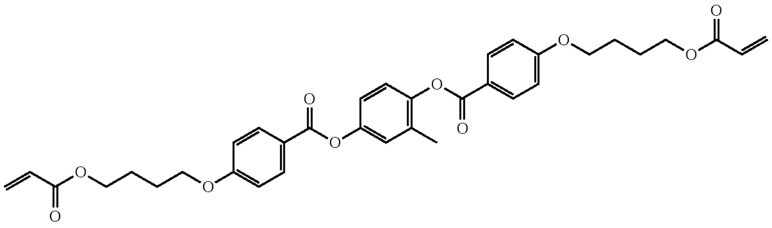 [SMILES: C=CC(=O)OCCCCOc1ccc(C(=O)Oc2ccc(OC(=O)c3ccc(OCCCCOC(=O)C=C)cc3)c(C)c2)cc1]

Polymerizable compound M-2

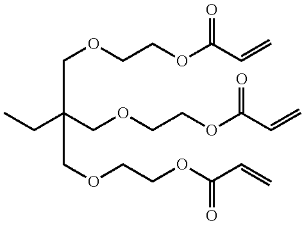 [SMILES: C=CC(=O)OCCOCC(CC)(COCCOC(=O)C=C)COCCOC(=O)C=C]

Surfactant F-2

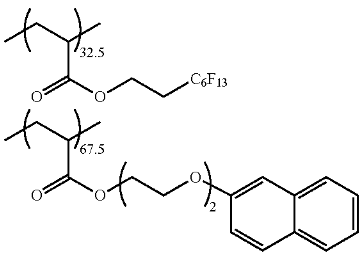

[Preparation of Laminate A1]

A polarizing plate 1 in which the thickness of the polarizer was 8 μm and one surface of the polarizer was exposed was prepared by the same method as that for a polarizing plate 02 with a one-surface protective film described in WO2015/166991A.

The surface of the polarizing plate 1 where the polarizer was exposed and the surface of the prepared light absorption anisotropic film P1 were subjected to a corona treatment, and the polarizer and the barrier layer 1 of the light absorption anisotropic film P1 were bonded to each other using the following PVA adhesive 1. At this time, the angle between the plane having the transmittance central axis of the light absorption anisotropic layer and the normal line of the film surface and the absorption axis of the polarizer was 90°.

Further, the surface of the support of the same light absorption anisotropic film P1 and the surface of the linear polarization conversion layer 1 surface of the linear polarization conversion film Q1 were also bonded to each other using the PVA adhesive 1 in the same manner as described above, thereby obtaining a laminate A1.

<Preparation of PVA Adhesive 1>

20 parts of methylol melamine with respect to 100 parts of a polyvinyl alcohol-based resin containing an acetoacetyl group (average degree of polymerization: 1200, degree of saponification: 98.5% by mole, degree of acetoacetylation: 5% by mole) was dissolved in pure water under a temperature condition of 30° C. to prepare an aqueous solution in which the concentration of solid contents was adjusted to 3.7%.

[Preparation of Image Display Device B1 with Reflection Prevention System]

A GALAXY S4 (manufactured by SAMSUNG Electronics Co., Ltd.) equipped with an organic EL panel (organic EL display element) was disassembled, a touch panel with a circularly polarizing plate was peeled off from an organic EL display device, the circularly polarizing plate was further peeled off from the touch panel, the organic EL display element, the touch panel, and the circularly polarizing plate were isolated from each other, and the isolated circularly polarizing plate was re-bonded to the organic EL display element. Further, the laminate A1 was laminated on the re-bonded circularly polarizing plate using the following pressure sensitive adhesive sheet. In this case, the lamination was made such that the transmission axis of the polarizer of the circularly polarizing plate and the transmission axis of the polarizer of the laminate A1 were parallel to each other. As described above, an image display device B1 with a reflection prevention system was prepared. The layer configuration of the obtained image display device B1 from the viewing side, excluding the pressure sensitive adhesive and the adhesive is listed in Tables 1A and 1B.

<Preparation of Pressure Sensitive Adhesive Sheet 1>

An acrylate-based polymer was prepared by the following procedures. 95 parts by weight of butyl acrylate and 5 parts by weight of acrylic acid were polymerized by a solution polymerization method in a reaction container equipped with a cooling pipe, a nitrogen introduction pipe, a thermometer, and a stirrer, thereby obtaining an acrylate-based polymer (A1) with an average molecular weight of 2000000 and a molecular weight distribution (Mw/Mn) of 3.0.

Next, the obtained acrylate-based polymer A1 (100 parts by mass), CORONATE L (75 mass % ethyl acetate solution of trimethylolpropane adduct of tolylene isocyanate, number of isocyanate groups in one molecule: 3, manufactured by Nippon Polyurethane Industry Co., Ltd.) (1.0 parts by mass), and a silane coupling agent KBM-403 (manufactured by Shin-Etsu Chemical Co., Ltd.) (0.2 parts by mass) were mixed with each other, and ethyl acetate was finally added to the mixture such that the concentration of total solid contents reached 10% by mass, thereby preparing a composition for forming a pressure sensitive adhesive. A separate film subjected to a surface treatment with a silicone-based release agent was coated with the composition using a die coater and dried in an environment of 90° C. for 1 minute, thereby obtaining an acrylate-based pressure sensitive adhesive sheet. The film thickness thereof was m, and the storage elastic modulus thereof was 0.1 MPa.

Example 2

An image display device B2 with a reflection prevention system was prepared in the same manner as in Example 1 except that a B-plate was prepared as follows and a laminate A2 was prepared in place of the laminate A1.

[Preparation of B-Plate]

Various retardation layers used in the examples of the present invention were prepared as follows.

<Extrusion Molding>

A cycloolefin resin ARTON G7810 (manufactured by JSR Corporation) was dried at 100° C. for 2 hours or longer and melt-extruded at 280° C. using a twin screw kneading extruder. Here, a screen filter, a gear pump, and a leaf disc filter were disposed in this order between the extruder and the die, these were connected by a melt pipe, and the resultant was extruded from a T die having a width of 1000 mm and a lip gap of 1 mm and was cast on a triple cast roll whose temperature was set to 180° C., 175° C., and 170° C., thereby obtaining an unstretched film 1 having a width of 900 mm and a thickness of 320 μm.

<Stretching and Thermal Fixing>

The unstretched film 1 being transported was subjected to a stretching step and a thermal fixing step by the following method.

(a) Machine-Directional Stretching

The unstretched film 1 was machine-directionally stretched under the following conditions while being transported using an inter-roll machine-direction stretching machine having an aspect ratio (L/W) of 0.2.

<Conditions>

Preheating temperature: 170° C., stretching temperature: 170° C., and stretching ratio: 155%

(b) Cross-Direction Stretching

The machine-directionally stretched film was cross-directionally stretched under the following conditions while being transported using a tenter.

<Conditions>

Preheating temperature: 170° C., stretching temperature: 170° C., stretching ratio: 80%

(c) Thermal Fixation

After the stretching step, the stretched film was subjected to a heat treatment under the following conditions while end portions of the stretched film were gripped with a tenter clip to hold both end portions of the stretched film such that the width thereof was constant (within 3% of expansion or contraction), and the stretched film was thermally fixed.

Thermal fixation temperature: 165° C., thermal fixation time: 30 seconds

Further, the preheating temperature, the stretching temperature, and the thermal fixation temperature are average values of values measured at five points in the width direction using a radiation thermometer.

<Winding>

After the thermal fixation, both ends of the stretched film were trimmed and wound at a tension of 25 kg/m, thereby obtaining a film roll having a width of 1340 mm and a winding length of 2000 m. The Re of the obtained stretched film was 160 nm, the Rth thereof was 390 nm, the Nz coefficient thereof was 2.9, the slow axis was in the MD direction, and the film thickness thereof was 80 μm. The obtained film was set as a B-plate.

[Preparation of Laminate A2]

A polarizing plate 1 in which the thickness of the polarizer was 8 μm and one surface of the polarizer was exposed was prepared by the same method as that for a polarizing plate 02 with a one-surface protective film described in WO2015/166991A.

The surface of the polarizing plate 1 where the polarizer was exposed and the surface of the B-plate prepared as described above were subjected to a corona treatment and adhered to each other using the PVA adhesive. At this time, the surfaces adhered to each other by determining a direction such that the machine-direction stretching direction of the B-plate and the absorption axis of the polarizer were parallel to each other.

Next, the surface of the B-plate and the surface of the prepared light absorption anisotropic film P1 were subjected to a corona treatment on the rear side of the B-plate adhered to the polarizer, and the B-plate and the barrier layer 1 of the light absorption anisotropic film P1 were bonded to each other using the above-described PVA adhesive 1. At this time, the angle between the plane having the transmittance central axis of the light absorption anisotropic layer and the normal line of the film surface and the absorption axis of the polarizer was 90°.

Further, the surface of the support of the same light absorption anisotropic film P1 and the surface of the linear polarization conversion layer 1 surface of the linear polarization conversion film Q1 were also bonded to each other using the PVA adhesive 1 in the same manner as described above, thereby obtaining a laminate A2.

Example 3

An image display device B3 with a reflection prevention system was prepared in the same manner as in Example 1 except that a linear polarization conversion film Q2 including a depolarization layer formed of a fine particle-containing layer prepared as described below was used in place of the linear polarization conversion film Q1.

[Preparation of Linear Polarization Conversion Film Q2]

The linear polarization conversion film Q2 was prepared in the same manner as in the preparation of the linear polarization conversion film Q1 except that a fine particle-containing layer 1 prepared in the following manner was used as the linear polarization conversion layer 2.

<Formation of Linear Polarization Conversion Layer 2> the alignment auxiliary layer 1 was coated with the following composition 1 for forming a fine particle-containing layer using a wire bar. The support on which the coating film had been formed was dried with hot air at 120° C. for 120 seconds, and the coating film was irradiated with ultraviolet rays at 200 mJ/cm$^2$ (using an ultra-high pressure mercury lamp) at a temperature of 60° C., thereby forming a fine particle-containing layer 1. The obtained fine particle-containing layer 1 was used as the linear polarization conversion layer 2 in the present example. The thickness of the obtained fine particle-containing layer was approximately 2 μm. It was confirmed that the prepared fine particle-containing layer had a slight haze and light scattering occurred.

| (Composition 1 for forming fine particle-containing layer) |
|---|
| Modified polyvinyl alcohol shown above: 3.80 parts by mass |
| Organosilica sol IPA-ST-ZL: 3.80 parts by mass |
| Initiator Irg2959: 0.20 parts by mass |
| Water: 70 parts by mass |
| Methanol: 30 parts by mass |

Example 4

An image display device B4 with a reflection prevention system was prepared in the same manner as in Example 1 except that a λ/4 plate (QWP) was used in place of the linear polarization conversion film Q1. Here, the λ/4 plate was used by being bonded such that the angle between the slow axis and the polarizer reached 45°.

Further, the λ/4 plate used here was prepared by the following procedures.

<Preparation of λ/4 Plate (QWP)>

(1) Preparation of Cellulose Acylate Film (Preparation of Cellulose Ester Solution A-1)

The following composition was put into a mixing tank and stirred while being heated to dissolve each component, thereby preparing a cellulose ester solution A-1.

| Composition of cellulose ester solution A-1 |
|---|
| Cellulose acetate (degree of acetylation: 2.86): 100 parts by mass |
| Methylene chloride (first solvent): 320 parts by mass |
| Methanol (second solvent): 83 parts by mass |
| 1-Butanol (third solvent): 3 parts by mass |
| Triphenyl phosphate: 7.6 parts by mass |
| Biphenyl diphenyl phosphate: 3.8 parts by mass |

(Preparation of Matting Agent Dispersion Liquid B-1)

The following composition was put into a disperser and stirred to dissolve each component, thereby preparing a matting agent dispersion liquid B-1.

| Composition of matting agent dispersion liquid B-1 |
|---|
| Silica particle dispersion liquid (average particle diameter of 16 nm) "AEROSIL R972" (manufactured by Nippon Aerosil Co., Ltd.): 10.0 parts by mass |
| Methylene chloride: 72.8 parts by mass |
| Methanol: 3.9 parts by mass |
| Butanol: 0.5 parts by mass |
| Cellulose ester solution A-1: 10.3 parts by mass |

(Preparation of Ultraviolet Absorbing Agent Solution C-1)

The following composition was put into a mixing tank and stirred while being heated to dissolve each component, thereby preparing an ultraviolet absorbing agent solution C-1.

| Composition of ultraviolet absorbing agent solution C-1 |
|---|
| Ultraviolet absorbing agent (UV-1 shown below): 10.0 parts by mass |
| Ultraviolet absorbing agent (UV-2 shown below): 10.0 parts by mass |
| Methylene chloride: 55.7 parts by mass |
| Methanol: 10 parts by mass |
| Cellulose ester solution A-1: 12.9 parts by mass |
| Butanol: 1.3 parts by mass |

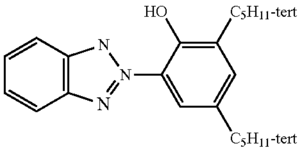

(UV-1)

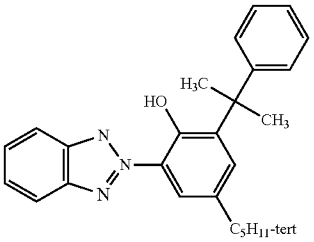

(UV-2)

(Preparation of Cellulose Ester Film)

The ultraviolet absorbing agent solution C-1 was added to a mixture of 94.6 parts by mass of the cellulose acylate solution A-1 and 1.3 parts by mass of the matting agent dispersion liquid B-1 such that the amount of the ultraviolet absorbing agent (UV-1) and the amount of the ultraviolet absorbing agent (UV-2) respectively reached 1.0 parts by mass with respect to 100 parts by mass of cellulose acylate, and the solution was sufficiently stirred while being heated to dissolve each component, thereby preparing a dope. The obtained dope was heated to 30° C. and cast on a mirror surface stainless steel support, serving as a drum having a diameter of 3 m, through a casting geeser. The surface temperature of the support was set to −5° C., and the coating width was set to 1470 mm. The cast dope film was dried by applying drying air at 34° C. on the drum at 150 m$^3$/min, and the dope film was peeled off from the drum in a state where the amount of the residual solvent was 150%. During the peeling, the film was stretched by 15% in the transport direction (longitudinal direction). Thereafter, both ends of the film in the width direction (direction orthogonal to the casting direction) were transported while being grasped by a pin tenter (pin tenter shown in FIG. 3 of JP1992-1009A (JP-H4-1009A), and the film was not subjected to a stretching treatment in the width direction. Further, the film was further dried by being transported between rolls of a heat treatment device, thereby producing a cellulose acylate film (T1). The prepared elongated cellulose acylate film (T1) had a residual solvent amount of 0.2% and a thickness of 60 μm, and the Re and the Rth at 550 nm were respectively 0.8 nm and 40 nm.

(2) Preparation of Retardation Plate (Alkali Saponification Treatment)

The cellulose acylate film (T1) described above was allowed to pass through a dielectric heating roll at a temperature of 60° C., the film surface temperature was increased to 40° C., the band surface of the film was coated with an alkaline solution having the following composition such that the coating amount reached 14 ml/m$^2$ using a bar coater, and the film was transported for 10 seconds under a steam-type far-infrared heater (manufactured by Noritake Co., Ltd.) heated to 110° C. Subsequently, the film was coated with 3 ml/$m^2$ of pure water similarly using a bar coater. Next, the process of washing the film with water using a fountain coater and draining the film using an air knife was repeated three times, and the film was transported to a drying zone at 70° C. for 10 seconds and dried, thereby preparing a cellulose acylate film which had been subjected to an alkali saponification treatment.

| Composition of alkaline solution |
| --- |
| Potassium hydroxide: 4.7 parts by mass |
| Water: 15.8 parts by mass |
| Isopropanol: 63.7 parts by mass |
| Surfactant SF-1: $C_{14}H_{29}O(CH_2CH_2O)_{20}H$: 1.0 parts by mass |
| Propylene glycol: 14.8 parts by mass |

(Formation of Alignment Film)

The surface of the cellulose acylate film (T1) on which the alkali saponification treatment had been performed was continuously coated with an alignment film coating solution (A) having the following composition using a #14 wire bar. The surface was dried with hot air at 60° C. for 60 seconds and further dried with hot air at 100° C. for 120 seconds. The degree of saponification of the used modified polyvinyl alcohol was 96.8%.

| Composition of alignment film coating solution (A) |
| --- |
| Modified polyvinyl alcohol shown below: 10 parts by mass |
| Water: 308 parts by mass |
| Methanol: 70 parts by mass |
| Isopropanol: 29 parts by mass |

-continued

| Composition of alignment film coating solution (A) |
| --- |
| Photopolymerization initiator (IRGACURE 2959, manufactured by BASF SE): 0.8 parts by mass |

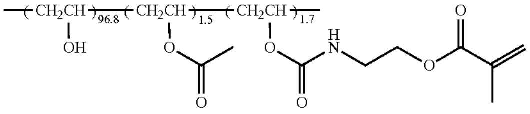

Modified polyvinyl alcohol (Formation of Optically Anisotropic Layer (Q))

The alignment film prepared above was continuously subjected to a rubbing treatment. At this time, the longitudinal direction and the transport direction of the elongated film were parallel to each other, and the angle formed by a rotation axis of a rubbing roller with respect to the longitudinal direction of the film was set to 45° (counterclockwise).

The prepared alignment film was continuously coated with an optically anisotropic layer coating solution (A) containing a rod-like liquid crystal compound with the following composition using a #2.2 wire bar. The transport speed (V) of the film was set to 26 m/min. In order to dry the solvent of the coating solution and to mature the alignment of the rod-like liquid crystal compound, the film was heated with hot air at 60° C. for 60 seconds and irradiated with UV rays at 60° C. to immobilize the alignment of the liquid crystal compound. The thickness of the optically anisotropic layer (Q) was 0.8 μm. It was confirmed that the average tilt angle of the major axis of the rod-like liquid crystal compound with respect to the film surface was 0° and the liquid crystal compound was horizontally aligned with respect to the film surface. Further, the angle of the slow axis was orthogonal to the rotation axis of the rubbing roller, and was 45° clockwise in a case where the film longitudinal direction was set to 0°. Further, the retardation Re (550) at a wavelength of 550 nm and the retardation Rth (550) at a wavelength of 550 nm, measured using AxoScan OPMF-1 (manufactured by Opto Science, Inc.) were respectively 120 nm (Re (550)) and 105 nm (Rth (550)).

| Composition of optically anisotropic layer coating solution (A) |
| --- |
| Rod-like liquid crystal compound (A) shown below: 80 parts by mass |
| Rod-like liquid crystal compound (B) shown below: 20 parts by mass |
| Photopolymerization initiator (IRGACURE 907, manufactured by BASF SE): 3 parts by mass |
| Sensitizer (KAYACURE DETX, manufactured by Nippon Kayaku Co., Ltd.): 1 part by mass |
| Fluorine-based polymer (FP1) shown below: 0.3 parts by mass |
| Methyl ethyl ketone: 193 parts by mass |
| Cyclohexanone: 50 parts by mass |

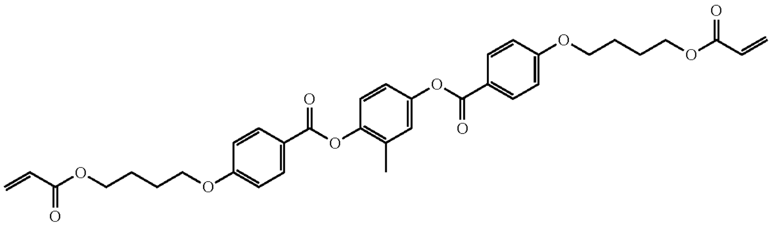

Rod-like liquid crystal compound (A)

-continued

Composition of optically anisotropic layer coating solution (A)

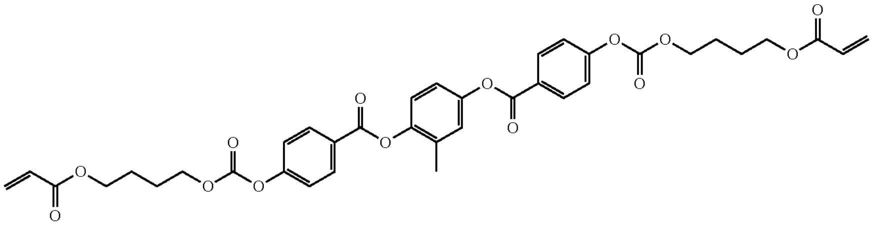

Rod-like liquid crystal compound (B)

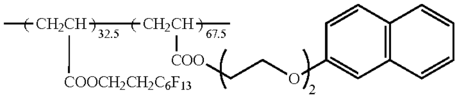

Fluorine-based polymer (FP1)

The prepared λ/4 plate was immersed in a 1.5 mol/liter sodium hydroxide aqueous solution at 55° C., and sodium hydroxide was sufficiently washed off with water. Thereafter, the plate was immersed in a 0.005 mol/liter dilute sulfuric acid aqueous solution at 35° C. for 1 minute and immersed in water, and the dilute sulfuric acid aqueous solution was sufficiently washed off. Finally, the sample was sufficiently dried at 120° C.

Example 5

An image display device B5 with a reflection prevention system was prepared in the same manner as in Example 1 except that a λ/2 plate (HWP) was used in place of the linear polarization conversion film Q1. Here, the λ/2 plate was used by being bonded such that the angle between the slow axis and the polarizer reached 45°.

Further, a λ/2 plate prepared by the following procedures was used as the λ/2 plate used here.

<Preparation of λ/2 Plate (HWP)>

(1) Preparation of Cellulose Acylate Film

A cellulose acylate film was prepared in the same manner as in the section of "(1) preparation of cellulose acylate film" of Example 4. The prepared elongated cellulose acylate film (T2) had a residual solvent amount of 0.2% and a thickness of 60 μm, and the Re and the Rth at 550 nm were respectively 0.8 nm and 40 nm.

(2) Preparation of Retardation Plate (Alkali Saponification Treatment)

The above-described cellulose acylate film (T2) was subjected to an alkali saponification treatment by the same procedures as in the (alkali saponification treatment) of Example 4.

(Formation of Alignment Film)

An alignment film was formed on the surface of the cellulose acylate film (T2) that had been subjected to the alkali saponification treatment by the same procedures as in the (formation of alignment film) of Example 4. The degree of saponification of the used modified polyvinyl alcohol was 96.8%.

(Formation of Optically Anisotropic Layer (H))

The alignment film prepared above was continuously subjected to a rubbing treatment. At this time, the longitudinal direction and the transport direction of the elongated film were parallel to each other, and the angle formed by the rotation axis of the rubbing roller with respect to the longitudinal direction of the film was set to 45° (clockwise).

The prepared alignment film was continuously coated with an optically anisotropic layer coating solution (B) containing a discotic liquid crystal compound with the following composition using a #5.0 wire bar. The transport speed (V) of the film was set to 26 m/min. In order to dry the solvent of the coating solution and to mature the alignment of the discotic liquid crystal compound, the film was heated with hot air at 115° C. for 90 seconds, further heated with hot air at 80° C. for 60 seconds, and irradiated with UV rays at 80° C. to immobilize the alignment of the liquid crystal compound. The thickness of the optically anisotropic layer (H) was 2.0 μm. It was confirmed that the average tilt angle of the disc plane of the DLC compound with respect to the film surface was 90° and the discotic liquid crystal compound was aligned perpendicularly to the film surface. Further, the angle of the slow axis was parallel to the rotation axis of the rubbing roller, and was 45° clockwise in a case where the film longitudinal direction was set to 0°. Further, the retardation Re (550) at a wavelength of 550 nm and the retardation Rth (550) at a wavelength of 550 nm, measured using AxoScan OPMF-1 (manufactured by Opto Science, Inc.) were respectively 250 nm (Re (550)) and −70 nm (Rth (550)).

| Composition of optically anisotropic layer coating solution (B) |
|---|
| Discotic liquid crystal compound (A) shown below: 80 parts by mass |
| Discotic liquid crystal compound (B) shown below: 20 parts by mass |
| Ethylene oxide-modified trimethylolpropane triacrylate (V#360, manufactured by Osaka Organic Chemical Industry Ltd.): 10 parts by mass |
| Photopolymerization initiator (IRGACURE 907, manufactured by BASF SE): 3 parts by mass |
| Pyridinium salt (A) shown below: 0.9 parts by mass |
| Boronic acid-containing compound shown below: 0.08 parts by mass |
| Polymer (A) shown below: 0.6 parts by mass |

-continued

| Composition of optically anisotropic layer coating solution (B) |
|---|
| Fluorine-based polymer (FP2) shown below: 0.3 parts by mass<br>Methyl ethyl ketone: 183 parts by mass<br>Cyclohexanone: 40 parts by mass |

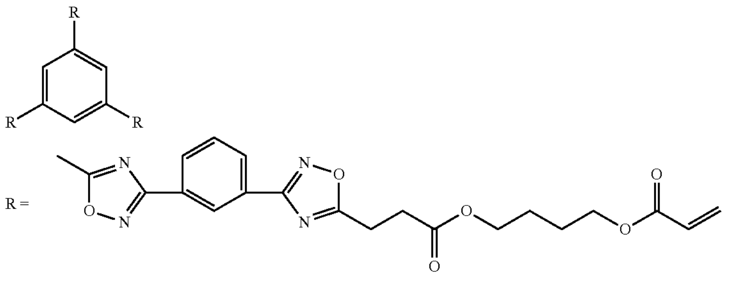

Discotic liquid crystal compound (A)

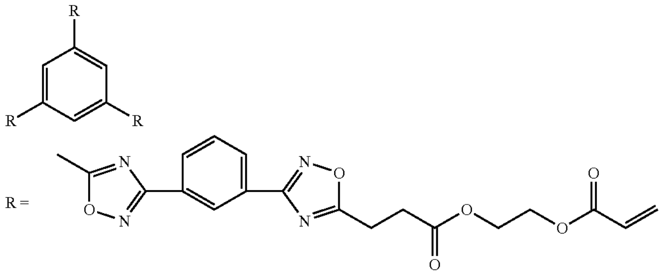

Discotic liquid crystal compound (B)

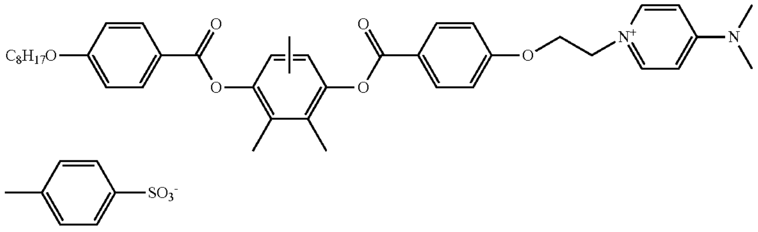

Pyridinium salt (A)

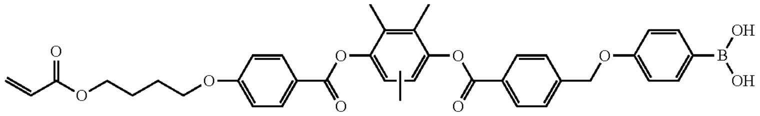

Boronic acid-containing compound

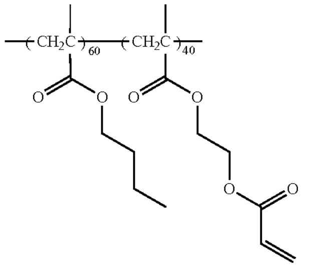

Polymer (A)

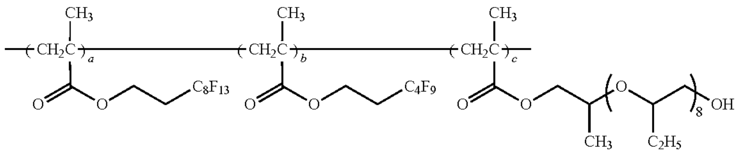

a/b/c = 20/20/60 wt %
Mw = 16000
Fluorine-based polymer (FP2)

The prepared λ/2 plate was immersed in a 1.5 mol/liter sodium hydroxide aqueous solution at 55° C., and sodium hydroxide was sufficiently washed off with water. Thereafter, the plate was immersed in a 0.005 mol/liter dilute sulfuric acid aqueous solution at 35° C. for 1 minute and immersed in water, and the dilute sulfuric acid aqueous solution was sufficiently washed off. Finally, the sample was sufficiently dried at 120° C.

Example 6

An image display device B6 with a reflection prevention system was prepared in the same manner as in Example 1 except that the polarizer (polarizer 2) prepared as described above was used in place of the linear polarization conversion film Q1. Here, the polarizer was used by being bonded such that the absorption axis thereof was parallel to the absorption axis of the polarizer 1 used in the laminate A6.

Example 7

An image display device B7 with a reflection prevention system was prepared in the same manner as in Example 1 except that the linear polarization conversion film Q1 was not used, a light absorption anisotropic film P2 including a linear polarization conversion layer and the light absorption anisotropic layer was prepared by the following procedures in place of the light absorption anisotropic film P1, and the light absorption anisotropic film P2 was laminated such that the support side thereof was oriented to the organic EL display device side.

[Preparation of Light Absorption Anisotropic Film P2]

The PVA alignment film 1 also serving as barrier layer, the light absorption anisotropic layer P1, and the barrier layer 1 were formed on the support in the same manner as that for the light absorption anisotropic film P1 of Example 1.

Further, the barrier layer 1 was coated with the composition 1 for forming an alignment auxiliary layer described above using a wire bar, the formed coating film was dried with hot air at 140° C. for 120 seconds, and the coating film was irradiated with ultraviolet rays in an unpolarized light (natural light) state at 1000 mJ/cm$^2$ (using an ultra-high pressure mercury lamp) at room temperature, thereby forming an alignment auxiliary layer 2. The film thickness of the alignment auxiliary layer 2 was 0.25 μm.

Further, the alignment auxiliary layer 2 was coated with the composition 1 for forming a randomly aligned liquid crystal layer described above using a wire bar, the formed coating film was dried with hot air at 120° C. for 120 seconds, and the coating film was irradiated with ultraviolet rays at 200 mJ/cm$^2$ (using an ultra-high pressure mercury lamp) at a temperature of 60° C., thereby forming a randomly aligned liquid crystal layer.

A light absorption anisotropic film P2 was prepared by performing the experiment described above.

Example 8

An image display device B8 with a reflection prevention system was prepared in the same manner as in Example 1 except that the light absorption anisotropic film P3 prepared by the following procedures was used in place of the light absorption anisotropic film P1 in Example 1.

[Preparation of Light Absorption Anisotropic Film P3]

A PVA alignment film 1 also serving as a barrier layer was formed on the support in the same manner as in Example 1. Further, the formed PVA alignment film also serving as a barrier layer was subjected to a rubbing treatment and coated with the following composition 1 for forming an inclined liquid crystal alignment film using a wire bar, and the coating film was heated with hot air at 120° C. for 30 seconds to form a dry film. Thereafter, the film was irradiated with a high-pressure mercury lamp for 1 second under an irradiation condition of an illuminance of 200 mW/cm$^2$, thereby preparing an inclined liquid crystal alignment film. The film thickness of the prepared inclined liquid crystal alignment film was 0.60 μm.

| (Composition 1 for forming inclined liquid crystal alignment film) |
| --- |
| Low-molecular-weight liquid crystal compound M-1 shown below: 9.57 parts by mass |
| Polymerization initiator IRGACURE OXE-02 (manufactured by BASF SE): 0.41 parts by mass |
| Surfactant F-1 shown above: 0.026 parts by mass |
| Cyclopentanone: 66 parts by mass |
| Tetrahydrofuran: 66 parts by mass |

Low-molecular-weight liquid crystal compound M-1

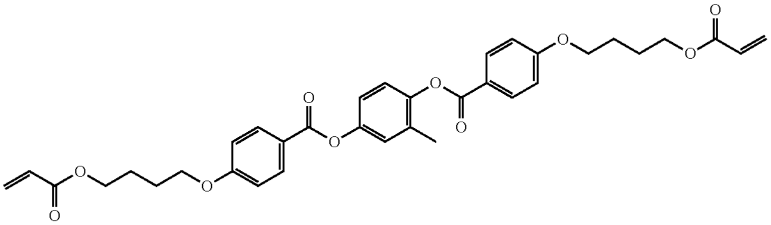 [SMILES: C=CC(=O)OCCCCOc1ccc(C(=O)Oc2ccc(OC(=O)c3ccc(OCCCCOC(=O)C=C)cc3)c(C)c2)cc1]

The prepared inclined liquid crystal alignment film was coated with the following composition P2 for forming a light absorption anisotropic layer using a wire bar, and the coating film was heated with hot air at 120° C. for 30 seconds and temporarily cooled to room temperature. Thereafter, the film was reheated at 80° C. for 60 seconds and cooled to room temperature again. Thereafter, the film was irradiated with an LED lamp (central wavelength of 365 nm) for 1 second under an irradiation condition of an illuminance of 200 mW/cm$^2$, thereby preparing a light absorption anisotropic layer P2. The film thickness of the prepared light absorption anisotropic layer P2 was 2.1 μm.

| (Composition P2 for forming light absorption anisotropic layer) |
|---|
| Dichroic substance D-1 shown above: 0.74 parts by mass<br>Dichroic substance D-2 shown above: 0.33 parts by mass<br>Dichroic substance D-3 shown above: 1.10 parts by mass<br>Polymer liquid crystal compound P-1 shown above: 4.32 parts by mass<br>Low-molecular-weight liquid crystal compound M-1 shown above: 3.17 parts by mass<br>Polymerization initiator IRGACURE OXE-02 (manufactured by BASF SE): 0.317 parts by mass<br>Surfactant F-2 shown above: 0.010 parts by mass<br>Cyclopentanone: 51.4 parts by mass<br>Tetrahydrofuran: 51.4 parts by mass |

<Formation of Barrier Layer 2>

The prepared light absorption anisotropic layer P2 was coated with the above-described coating solution for forming a barrier layer using a wire bar and dried at 80° C. for 5 minutes. Next, the obtained coating film was irradiated with an LED lamp (central wavelength of 365 nm) for 2 seconds under an irradiation condition of an illuminance of 150 $mW/cm^2$ in an environment of an oxygen concentration of 100 ppm and a temperature of 60° C., thereby forming a barrier layer 2 on the light absorption anisotropic layer P2. The thickness of the barrier layer 2 was 1.0 μm.

A light absorption anisotropic film P3 was prepared by performing the experiment described above.

Example 9

An image display device B9 with a reflection prevention system was prepared in the same manner as in Example 1 except that the linear polarization conversion film Q1 was not used and the light absorption anisotropic film P4 prepared by the following procedures was used in place of the light absorption anisotropic film P1.

[Preparation of Light Absorption Anisotropic Film P4]

A light absorption anisotropic film P4 was prepared in the same manner as that for the light absorption anisotropic film P1 of Example 1 except that a super birefringence polyester film (COSMOSHINE SRF, manufactured by Toyobo Co. Ltd., thickness of 80 μm) was used as a support also serving as a linear polarization conversion layer in place of the cellulose acylate film 1 as the support. Here, in a case of preparation of a laminate A9, the bonding was made such that the slow axis of COSMOSHINE SRF formed an angle of 45° with respect to the slow axis of the polarizer.

Example 10

An image display device B10 with a reflection prevention system was prepared in the same manner as in Example 1 except that a laminate A10 obtained by laminating two sheets of a linear polarization conversion film Q3-1 and a linear polarization conversion film Q3-2 corresponding to a negative C-plate, which were prepared by the following procedures, was used in place of the linear polarization conversion film Q1.

[Preparation of Linear Polarization Conversion Films Q3-1 and Q3-2]

<Composition for Forming Negative C-Plate>

The following composition for forming a negative C-plate was prepared, and a uniform solution was obtained.

| Composition for forming negative C-plate |
|---|
| Discotic liquid crystal compound CA-1 shown below: 80 parts by mass<br>Discotic liquid crystal compound CA-2 shown below: 20 parts by mass<br>Discotic liquid crystal compound DB-1 shown below: 5.6 parts by mass<br>Polymerizable monomer CS1 shown below: 5.6 parts by mass<br>Polymer CC-1 shown below: 0.2 parts by mass<br>Polymerization initiator (IRGACURE 907, manufactured by BASF SE): 3 parts by mass<br>Toluene: 170 parts by mass<br>Methyl ethyl ketone: 73 parts by mass |

Discotic liquid crystal compound CA-1 (1,3,5-substituted benzene type polymerizable discotic liquid crystal compound)

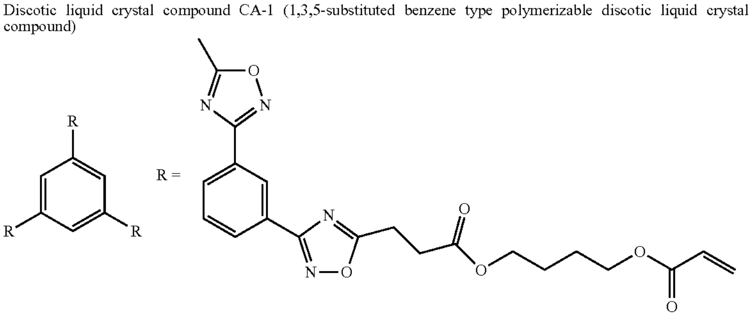

Discotic liquid crystal compound CA-2 (1,3,5-substituted benzene type polymerizable discotic liquid crystal compound)

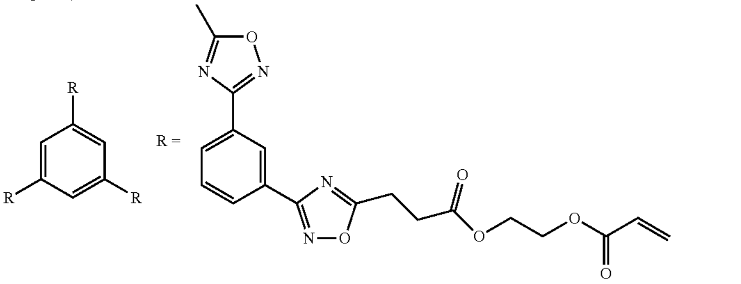

-continued

Composition for forming negative C-plate

Discotic liquid crystal compound CB-1 (polymerizable triphenylene type discotic liquid crystal compound)

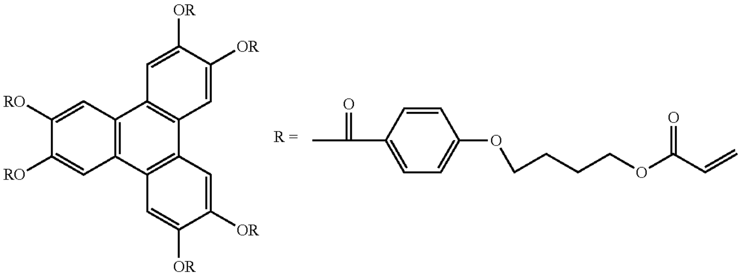

Polymerizable monomer CS1

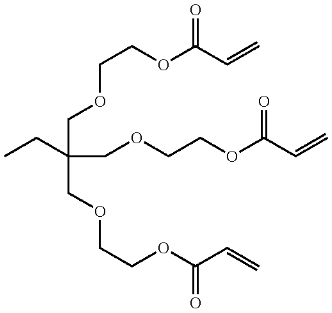 [SMILES: C=CC(=O)OCCOCC(CC)(COCCOC(=O)C=C)COCCOC(=O)C=C]

Polymer CC-1 (hereinafter, the copolymerization ratio of the chemical structural formula is in units of % by mass).

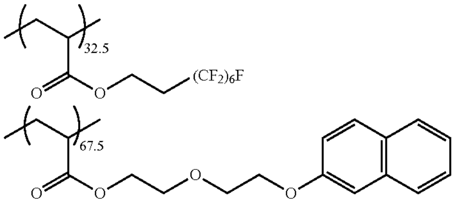

A commercially available cellulose triacetate film (FUJITAC ZRD40, manufactured by FUJIFILM Corporation) was used as a support without being subjected to a saponification treatment. The surface of the support was coated with the above-described composition for forming a negative C-plate, the solvent was dried in a step of continuously heating the coating layer from room temperature to 100° C., and the coating layer was further heated in a drying zone at 100° C. for approximately 90 seconds, cooled to 60° C., and exposed to UV rays at 300 $mJ/cm^2$ in the atmosphere, thereby obtaining a linear polarization conversion film Q3-1. In a case where the alignment state was observed after the coating film was allowed to be naturally cooled to room temperature, it was found that the discotic liquid crystal compound was horizontally aligned without any defects. Further, the Rth (550) was 327 nm, and the Re was 1 nm.

Further, the coating film thickness of the composition for forming a negative C-plate was adjusted in the same manner as described above to prepare a linear polarization conversion film Q3-2 in which the Rth (550) was 361 nm and the Re was 1 nm. As described above, the linear polarization conversion films Q3-1 and Q3-2 are used by laminating these two sheets, and thus can be considered as a linear polarization conversion film corresponding to a negative C-plate in which the Rth is 688 nm and the Re is 2 nm.

Example 11

An image display device B11 with a reflection prevention system was prepared in the same manner as in Example 2 except that two sheets of the same linear polarization conversion film Q3-1 and the same linear polarization conversion film Q3-2 as in Example 10 were used by being laminated in place of the linear polarization conversion film Q1 and a laminate A11 prepared by changing the retardation of the B-plate to Re (550)=160 nm and Rth (550)=390 nm was used.

Example 12

An image display device B12 with a reflection prevention system was prepared in the same manner as in Example 1 except that the linear polarization conversion film was not used, a composition P3 for forming a light absorption anisotropic layer was used in place of the composition P1 for forming a light absorption anisotropic layer of the light absorption anisotropic film, and the film thickness was adjusted to 4 μm.

| (Composition P3 for forming light absorption anisotropic layer) |
|---|
| Dichroic substance D-1 shown above: 0.63 parts by mass |
| Dichroic substance D-2 shown above: 0.17 parts by mass |
| Dichroic substance D-3 shown above: 1.13 parts by mass |
| Polymer liquid crystal compound P-1 shown above: 8.18 parts by mass |
| Polymerization initiator IRGACURE OXE-02 (manufactured by BASF SE): 0.16 parts by mass |
| Compound E-1 shown above: 0.12 parts by mass |
| Compound E-2 shown above: 0.12 parts by mass |
| Surfactant F-3 shown below: 0.01 parts by mass |
| Cyclopentanone: 85.00 parts by mass |
| Benzyl alcohol: 4.50 parts by mass |

Surfactant F-3

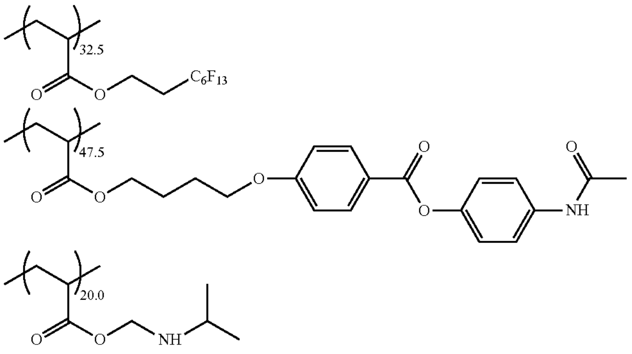

The prepared light absorption anisotropic layer was cut into sections having a thickness of 2 μm using a microtome, the sections were collected, the collected sections were placed on a polarization microscope and observed, and appearance of extinction positions was confirmed at the support-side interface.

Meanwhile, since the extinction positions did not appear at the air-side interface, a randomly aligned liquid crystal layer formed as a linear polarization conversion layer was confirmed at the air-side interface.

Example 13

An image display device B13 with a reflection prevention system was prepared in the same manner as in Example 1 except that a coating type polarizing plate prepared in the following manner was used in place of the polarizing plate 1.

[Preparation of Transparent Support]

The following composition was put into a mixing tank and stirred, thereby preparing a cellulose acetate solution used as a core layer cellulose acylate dope.

| Core layer cellulose acylate dope |
|---|
| Cellulose acetate having acetyl substitution degree of 2.88: 100 parts by mass |
| Polyester compound B described in preparation example of JP2015-227955A: 12 parts by mass |
| Compound G shown below: 2 parts by mass |
| Methylene chloride (first solvent): 430 parts by mass |
| Methanol (second solvent): 64 parts by mass |

-continued

Core layer cellulose acylate dope

Compound G

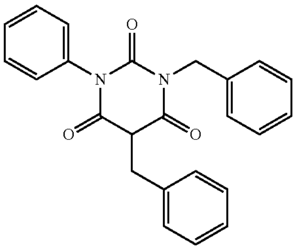 [SMILES: O=C1C(Cc2ccccc2)C(=O)N(c2ccccc2)C(=O)N1Cc1ccccc1]

10 parts by mass of the following matting agent solution was added to 90 parts by mass of the above-described core layer cellulose acylate dope, thereby preparing a cellulose acetate solution used as an outer layer cellulose acylate dope.

| Matting agent solution |
|---|
| Silica particles with average particle size of 20 nm (AEROSIL R972, manufactured by Nippon Aerosil Co., Ltd.): 2 parts by mass |
| Methylene chloride (first solvent): 76 parts by mass |
| Methanol (second solvent): 11 parts by mass |
| Core layer cellulose acylate dope described above: 1 parts by mass |

The core layer cellulose acylate dope and the outer layer cellulose acylate dope were filtered through filter paper having an average pore size of 34 μm and a sintered metal filter having an average pore size of 10 μm, and three layers which were the core layer cellulose acylate dope and the outer layer cellulose acylate dopes provided on both sides of the core layer cellulose acylate dope were simultaneously cast from a casting port onto a drum at 20° C. (band casting machine).

Next, the film was peeled off from the drum in a state where the solvent content in the film was approximately 20% by mass, both ends of the film in the width direction were fixed with tenter clips, and the film was dried while being stretched in the lateral direction at a stretching ratio of 1.1 times.

Thereafter, the obtained film was further dried by being transported between the rolls of the heat treatment device to prepare a transparent support having a thickness of 40 μm, and the transparent support was used as a cellulose acylate film A1.

[Formation of Photo-Alignment Film B1]

The cellulose acylate film A1 was continuously coated with the following composition for forming a photo-alignment film using a wire bar. The support on which a coating film was formed was dried with hot air at 140° C. for 120 seconds, and the coating film was irradiated with polarized ultraviolet rays (10 mJ/cm$^2$, using an ultra-high pressure mercury lamp) to form a photo-alignment film B1, thereby obtaining a triacetyl cellulose (TAC) film with a photo-alignment film. The film thickness of the photo-alignment film B1 was 0.25 μm.

| (Composition for forming photo-alignment film) |
| --- |
| Polymer PA-1 shown below: 100.00 parts by mass |
| Acid generator PAG-1 shown below: 8.25 parts by mass |
| Stabilizer DIPEA shown below: 0.6 parts by mass |
| Xylene: 1126.60 parts by mass |
| Methyl isobutyl ketone: 125.18 parts by mass |

Polymer PA-1 (In the formulae, the numerical value described in each repeating unit represents the content (% by mass) of each repeating unit with respect to all repeating units)

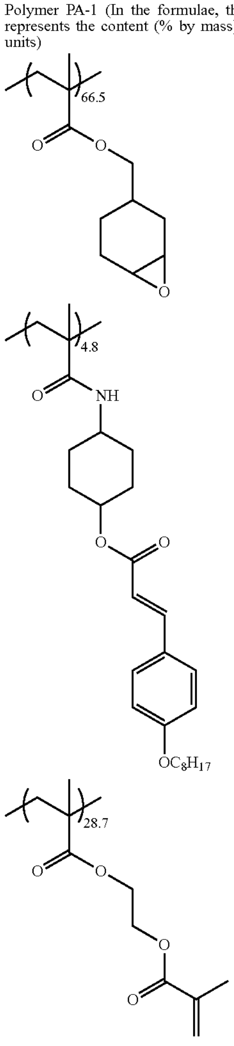

-continued (Composition for forming photo-alignment film)

Acid generator PAG-1

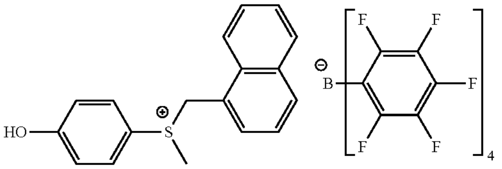

Stabilizer DIPEA

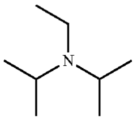

[Preparation of Light Absorption Anisotropic Layer C1]

The obtained photo-alignment film B1 was continuously coated with a composition C1 for forming a light absorption anisotropic layer with the following composition using a wire bar, to form a coating film.

Next, the coating film was heated at 140° C. for 15 seconds, subjected to a heat treatment at 80° C. for 5 seconds, and cooled to room temperature (23° C.). Next, the coating film was heated at 75° C. for 60 seconds and cooled to room temperature again.

Thereafter, a light absorption anisotropic layer C1 (polarizer) (thickness: 2.0 μm) was prepared on the photo-alignment film B1 by irradiating the coating film with a light emitting diode (LED) lamp (central wavelength of 365 nm, half-width of 10 nm) for 2 seconds under an irradiation condition of an illuminance of 200 mW/cm$^2$.

The transmittance of the light absorption anisotropic layer C1 in a wavelength range of 280 to 780 nm was measured with a spectrophotometer, and the average transmittance of visible light was 42%. The alignment degree was measured as follows, and the alignment degree at 650 nm was 0.97.

<Evaluation of Alignment Degree>

The light absorption anisotropic layer C1 was set on a sample table in a state where a linear polarizer was inserted on a light source side of an optical microscope (product name, "ECLIPSE E600 POL", manufactured by Nikon Corporation), the absorbance of the light absorption anisotropic layer C1 in a wavelength range of 400 nm to 700 nm was measured using a multi-channel spectroscope (product name, "QE65000", manufactured by Ocean Optics, Inc.), and the alignment degree was calculated according to the following equation.

$$\text{Alignment degree: } S=((Az0/Ay0)-1)/((Az0/Ay0)+2)$$

Az0: Absorbance of light absorption anisotropic layer C1 with respect to polarized light in absorption axis direction Ay0: Absorbance of light absorption anisotropic layer C1 with respect to polarized light in polarization axis direction The absorption axis of the light absorption anisotropic layer C1 was in the plane of the light absorption anisotropic layer C1 and was orthogonal to the width direction of the cellulose acylate film A1.

| Composition C1 for forming light absorption anisotropic layer |
|---|
| First dichroic substance Dye-C1 shown below: 0.59 parts by mass |
| Second dichroic substance Dye-M1 shown below: 0.14 parts by mass |
| Third dichroic substance Dye-Y1 shown below: 0.25 parts by mass |
| Liquid crystal compound L-1 shown below: 3.27 parts by mass |
| Liquid crystal compound L-2 shown below: 1.44 parts by mass |
| Adhesion improver A-1 shown below: 0.06 parts by mass |
| Polymerization initiator IRGACURE OXE-02 (manufactured by BASF SE): 0.18 parts by mass |
| Surfactant F-4 shown below: 0.030 parts by mass |
| Cyclopentanone: 91.70 parts by mass |
| Benzyl alcohol: 2.35 parts by mass |

Dichroic substance Dye-C1

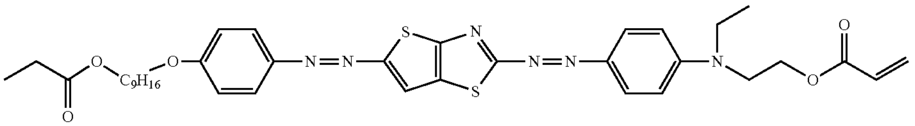

Dichroic substance Dye-M1

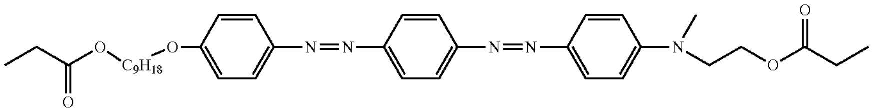

Dichroic substance Dye-Y1

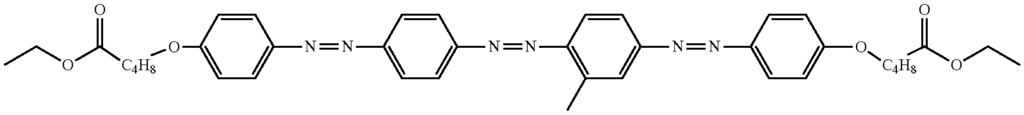

Liquid crystal compound L-1 (in the formulae, the numerical values ("59", "15", and "26") described in each repeating unit represent the content (% by mass) of each repeating unit with respect to all repeating units)

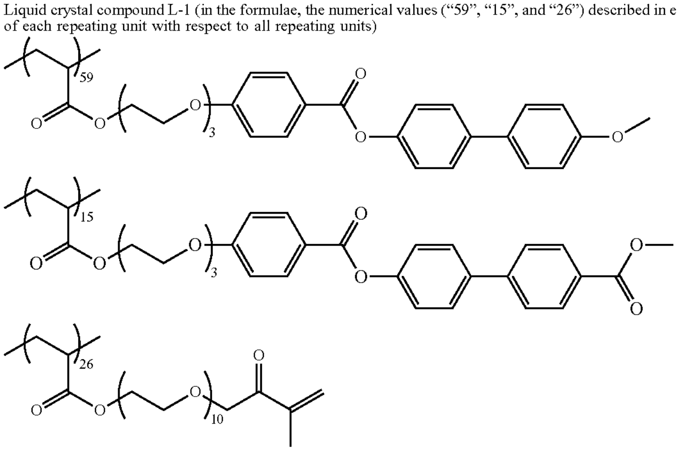

Liquid crystal compound L-2

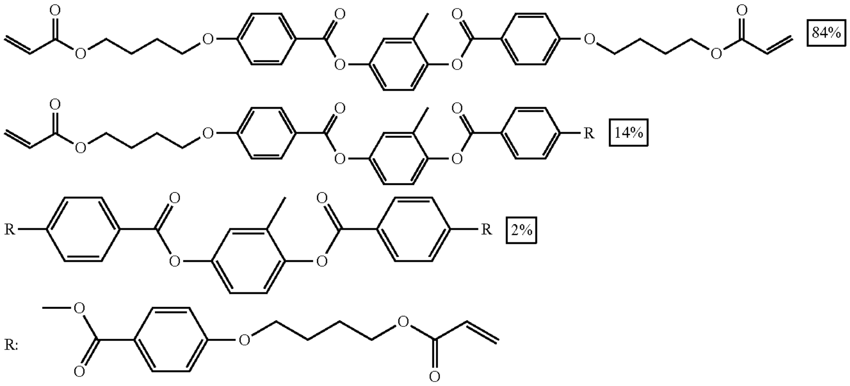

Adhesion improver A-1

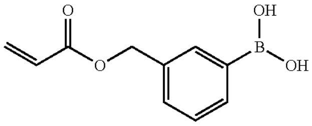

Surfactant F-4 (in the formulae, the numerical values described in each repeating unit represent the content (% by mass) of each repeating unit with respect to all repeating units)

-continued

| Composition C1 for forming light absorption anisotropic layer |
| --- |
| 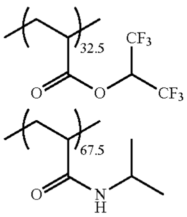 |

[Formation of Oxygen-Shielding Layer D1]

The light absorption anisotropic layer C1 was continuously coated with a coating solution D1 for forming an oxygen-shielding layer with the following composition using a wire bar. Thereafter, the coating layer was dried with hot air at 80° C. for 5 minutes and irradiated with ultraviolet rays (300 mJ/$cm^2$, using an ultra-high pressure mercury lamp), thereby obtaining a laminate on which an oxygen-shielding layer D1 consisting of polyvinyl alcohol (PVA) with a thickness of 1.0 μm was formed, that is, a coating type polarizing plate including the cellulose acylate film A1 (transparent support), the photo-alignment film B1, the light absorption anisotropic layer C1, and the oxygen-shielding layer D1 adjacent to each other in this order.

| Coating solution D1 for forming oxygen-shielding layer |
| --- |
| Modified polyvinyl alcohol shown below: 3.30 parts by mass |
| Initiator Irg2959: 0.20 parts by mass |
| Surfactant F-5 shown below: 0.0018 parts by mass |
| Water: 74.1 parts by mass |
| Methanol: 22.4 parts by mass |

Modified polyvinyl alcohol

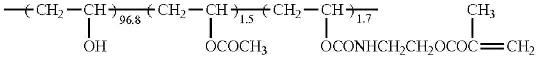

Surfactant F-5

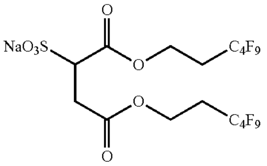

Example 14

A laminate of the polarizing plate 1, the B-plate, and the light absorption anisotropic film P1 was prepared by the same procedures as in Example 2.

Next, a λ/4 plate prepared by the same procedures as in Example 4 was bonded to the surface of the support of the prepared laminate by the same method as in Example 4, thereby preparing a laminate A14.

Next, an image display device B14 with a reflection prevention system was prepared by the same procedures as in Example 4.

The Re of the prepared B-plate was 160 nm, the Rth thereof was 390 nm, the Nz coefficient thereof was 2.9, the slow axis was in the MD direction, and the film thickness thereof was 80 μm.

Further, the retardation Re (550) of the prepared λ/4 plate at a wavelength of 550 nm and the retardation Rth (550) thereof at a wavelength of 550 nm were respectively 120 nm (Re (550)) and 105 nm (Rth (550)).

Example 15

A laminate of the polarizing plate 1, the B-plate, and the light absorption anisotropic film P1 was prepared by the same procedures as in Example 2.

Next, a λ/2 plate prepared by the same procedures as in Example 5 was bonded to the surface of the support of the prepared laminate by the same method as in Example 5, thereby preparing a laminate A15.

Next, an image display device B15 with a reflection prevention system was prepared by the same procedures as in Example 5.

The Re of the prepared B-plate was 160 nm, the Rth thereof was 390 nm, the Nz coefficient thereof was 2.9, the slow axis was in the MD direction, and the film thickness thereof was 80 μm.

Further, the retardation Re (550) of the prepared λ/2 plate at a wavelength of 550 nm and the retardation Rth (550) thereof at a wavelength of 550 nm were respectively 250 nm (Re (550)) and −70 nm (Rth (550)).

Comparative Example 1

An image display device with a reflection prevention system was prepared in the same manner as in Example 1 except that the linear polarization conversion film Q1 was not used in Example 1.

[Evaluation of Performance]

(1) Evaluation of Transmittance Central Axis

The angle θ of the transmittance central axis was measured by the above-described method using each of the prepared light absorption anisotropic films. Further, since none of the layer configurations of the light absorption anisotropic films other than the light absorption anisotropic layer has absorption anisotropy, the value of the light absorption anisotropic layer of each light absorption anisotropic film can be used as the angle θ of the transmittance central axis calculated above. The results are listed in Tables 1A and 1B.

(2) Evaluation of Image Evaluation Device with Reflection Prevention System

Figure 3:
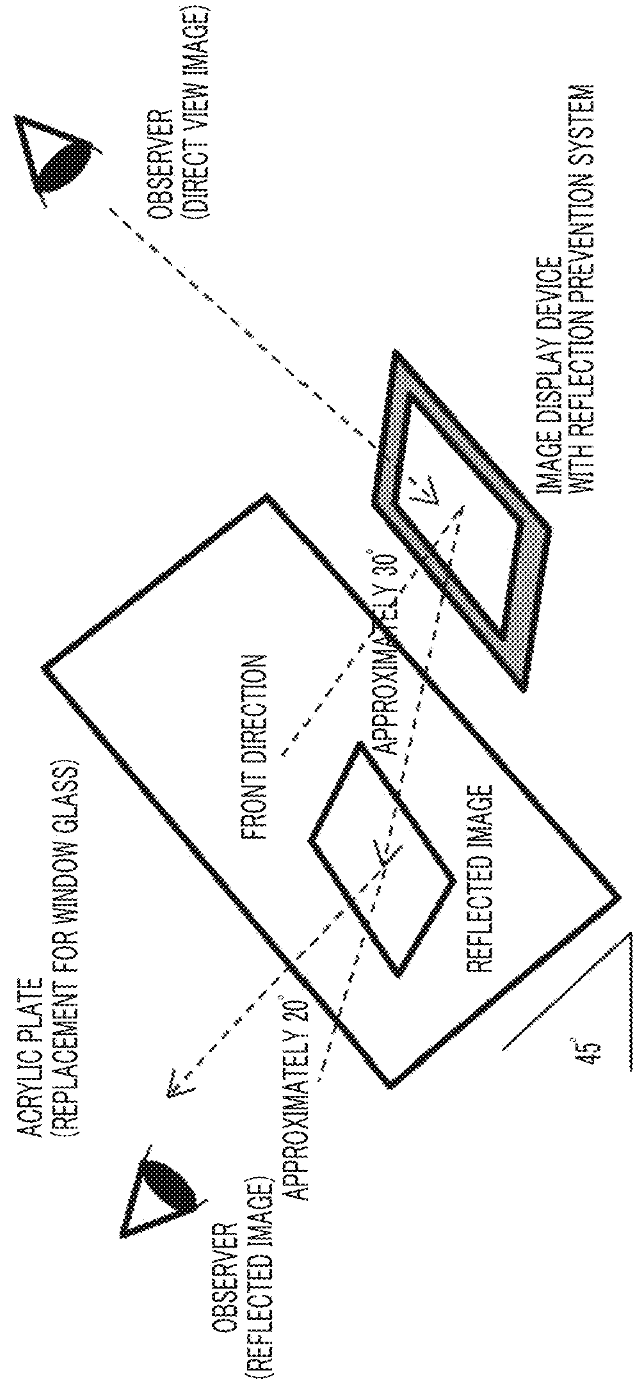
FIG. 3 is a schematic view illustrating an evaluation system of a reflected image on window glass.

In order to evaluate reflected images on window glass, a reflected image evaluation system illustrated in FIG. 3 was prepared, and the prepared image evaluation device with a reflection prevention system was installed in the evaluation system.

In a state where white images (R256, G256, and B256) were displayed on the entire surface of the image evaluation device, the hues of the images reflected on the surface of an acrylic plate installed in place of window glass were subjected to sensory evaluation, and the tints (redness, greenness, and blueness) were evaluated. Similarly, the tints in a case where the display was directly visually observed were also evaluated at the same time. At this time, the direction of observing the reflected images was set to an oblique direction at an angle of approximately 30° with respect to a straight line extending from the center of the image display device to the front direction of the acrylic plate as illustrated in FIG. 3, and the reflected images were observed from obliquely above at an angle of approximately 20° with respect to the plane of the acrylic plate. The results are listed in Tables 1A and 1B.

[Sensory Evaluation Standards]

The tint of the image reflected on the acrylic plate and the tint of the image in a case of observing the display without using the acrylic plate were subjected to sensory evaluation according to the following standards.

A: The tint of the image was a neutral gray color.

B: The tint of the image was slight redness, but was in an acceptable range.

C: The tint of the image was relatively strong blueness, but was not redness and was thus in an acceptable range.

D: The tint of the image was strong redness and was out of an acceptable range.

The comprehensive determination results in consideration of the tint of the image reflected on the acrylic plate, the tint of the image in a case where the display was directly observed without the reflection on the acrylic plate, and light leakage in an oblique direction were evaluated according to the following standards.

A+: The results were extremely preferable without problems in practical use.

A: The results were preferable without problems in practical use.

B: The results were sufficiently acceptable in practical use.

C: The results were slightly problematic, but were acceptable in practical use.

D: The results had problems unacceptable in practical use.

TABLE 1A

| Layer configuration (order of lamination from viewing side) | | Comparative Example 1 | Example 1 | Example 2 | Example 3 | Example 4 | Example 5 | Example 6 | Example 7 |
|---|---|---|---|---|---|---|---|---|---|
| Support | Linear polarization conversion film | Not available | TAC | TAC | TAC | TAC | TAC | TAC | |
| Barrier layer 2 | | Not available | PVA | PVA | PVA | PVA (also serving as alignment film) | PVA (also serving as alignment film) | PVA | |
| Alignment auxiliary layer 1 | | Not available | PVCi | PVCi | Not available | Not available | Not available | Not available | |
| Linear polarization conversion layer | | Not available | Randomly aligned liquid crystal layer | Randomly aligned liquid crystal layer | Fine particle-containing layer | 24 plate | 2/2 plate | Polarizer | |
| Support | Light absorption anisotropic film | TAC | TAC | TAC | TAC | TAC | TAC | TAC | |
| PVA alignment film 1 also serving as barrier layer | | PVA | PVA | PVA | PVA | PVA | PVA | PVA | |
| Light absorption anisotropic layer | | LCF | LCF | LCF | LCF | LCF | LCF | LCF | |
| Barrier layer 1/Barrier layer 2 | | PVA | PVA | PVA | PVA | PVA | PVA | PVA | |
| Linear polarization conversion layer | Light absorption anisotropic film | | | | | | | | Randomly aligned liquid crystal layer |
| Alignment auxiliary layer 2 | | | | | | | | | PVCi |
| Barrier layer 1 | | | | | | | | | PVA |
| Light absorption anisotropic layer | | | | | | | | | LCF |
| PVA alignment film 1 also serving as barrier layer | | | | | | | | | PVA |
| Support | | | | | | | | | TAC |
| B-plate | | Not available | Not available | Available | Not available | Not available | Not available | Not available | Not available |
| Polarizer | | Available | Available | Available | Available | Available | Available | Available | Available |
| Organic EL display | | Available | Available | Available | Available | Available | Available | Available | Available |
| Evaluation results | | | | | | | | | |
| Transmittance central axis direction (polar angle) | | 0° | 0° | 0° | 0° | 0° | 0° | 0° | 0° |
| Tint of display (direct view) | | A | A | A | A | A | A | C | A |
| Tint of reflected image | | D | A | A | A | A | C | B | A |

TABLE 1B

| Layer configuration (order of lamination from viewing side) | | Example 8 | Example 9 | Example 10 | Example 11 | Example 12 | Example 13 | Example 14 | Example 15 |
|---|---|---|---|---|---|---|---|---|---|
| Support | Linear polarization conversion film | TAC | Not available | TAC | TAC | Not available | TAC | TAC | TAC |
| Barrier layer 2 | | PVA | Not available | Not available | Not available | Not available | PVA | PVA (also serving as alignment film) | PVA (also serving as alignment film) |
| Alignment auxiliary layer 1 | | PVCi | Not available | Not available | Not available | Not available | PVCi | Not available | Not available |
| Linear polarization conversion layer | | Randomly aligned liquid crystal layer | Available (Super birefringence film shown below) | Negative C | Negative C | Randomly aligned liquid crystal layer (formed simultaneously with LCF shown below) | Randomly aligned liquid crystal layer | 24 plate | 2/2 plate |
| Support | Light absorption anisotropic film | TAC | Super birefringence film | TAC | TAC | TAC | TAC | TAC | TAC |
| PVA alignment film 1 also serving as barrier layer | | PVA | PVA | PVA | PVA | PVA | PVA | PVA | PVA |
| Light absorption anisotropic layer | | LCF | LCF | LCF | LCF | LCF | LCF | LCF | LCF |
| Barrier layer 1/Barrier layer 2 | | PVA | PVA | PVA | PVA | PVA | PVA | PVA | PVA |
| Linear polarization conversion layer | Light absorption anisotropic film | | | | | | | | |
| Alignment auxiliary layer 2 | | | | | | | | | |
| Barrier layer 1 | | | | | | | | | |
| Light absorption anisotropic layer | | | | | | | | | |
| PVA alignment film 1 also serving as barrier layer | | | | | | | | | |
| Support | | | | | | | | | |
| B-plate | | Not available | Not available | Not available | Available | Not available | Not available | Available | Available |
| Polarizer | | Available | Available | Available | Available | Available | Available (coating type) | Available | Available |
| Organic EL display | | Available | Available | Available | Available | Available | Available | Available | Available |
| Evaluation results | | | | | | | | | |
| Transmittance central axis direction (polar angle) | | 43° | 0° | 0° | 0° | 0° | 0° | 0° | 0° |
| Tint of display (direct view) | | A | A | A | A | A | A | A | A |
| Tint of reflected image | | A | A | C | C | A | A | A+ | A |

It was found that in the laminates including the linear polarization conversion layers of Examples 1 to 15 according to the present invention, the problem that the reflection on the window glass exhibited redness was solved.

In particular, in Example 2, Example 11, Example 14, and Example 15, the brightness of the reflected image was also suppressed at the same time by further using the B-plate in combination, and thus the results were particularly preferable.

EXPLANATION OF REFERENCES

1: barrier layer
2: light absorption anisotropic layer
3: PVA alignment film also serving as barrier layer
4: TAC support
11: liquid crystal molecule
12: dichroic dye D-1
13: dichroic dye D-2
14: dichroic dye D-3
21: linear polarization conversion layer
22: alignment auxiliary layer
23: barrier layer
24: TAC support
100: image display device with reflection prevention system
101: linear polarization conversion layer
102: light absorption anisotropic layer
103: polarizer
104: organic EL image display device
105: reflection prevention system

What is claimed is:

1. A laminate used in an image display device having a display element and provided on a viewing side of the display element, wherein the laminate comprises in this order from the viewing side:

a linear polarization conversion layer;

a light absorption anisotropic layer containing a liquid crystal compound and a dichroic substance; and a polarizer having an absorption axis in an in-plane direction, wherein an angle between a transmittance central axis of the light absorption anisotropic layer and a normal line of a layer plane of the light absorption anisotropic layer is 0° or greater and 45° or less, and wherein the linear polarization conversion layer is a C-plate.

2. The laminate according to claim 1, wherein the C-plate is a negative C-plate.

3. A laminate used in an image display device having a display element and provided on a viewing side of the display element, wherein the laminate comprises in this order from the viewing side:

a linear polarization conversion layer;

a light absorption anisotropic layer containing a liquid crystal compound and a dichroic substance; and a polarizer having an absorption axis in an in-plane direction, wherein the light absorption anisotropic layer is a cured layer, wherein an angle between a transmittance central axis of the light absorption anisotropic layer and a normal line of a layer plane of the light absorption anisotropic layer is 0° or greater and 45° or less, wherein the linear polarization conversion layer is a polarizer having an absorption axis in an in-plane direction, and wherein an angle φ between a direction in which the transmittance central axis of the light absorption anisotropic layer is orthographically projected onto the layer plane of the light absorption anisotropic layer and the absorption axis of the polarizer which is the linear polarization conversion layer is in a range of 85° to 95°.

4. A laminate used in an image display device having a display element and provided on a viewing side of the display element, wherein the laminate comprises in this order from the viewing side:

a linear polarization conversion layer;

a light absorption anisotropic layer containing a liquid crystal compound and a dichroic substance; and a polarizer having an absorption axis in an in-plane direction, wherein the light absorption anisotropic layer is a cured layer, wherein an angle between a transmittance central axis of the light absorption anisotropic layer and a normal line of a layer plane of the light absorption anisotropic layer is 0° or greater and 45° or less, and wherein the linear polarization conversion layer is a retardation layer having an in-plane retardation value of 6000 nm or greater, which is measured at a wavelength of 550 nm.

5. The laminate according to claim 4, wherein the retardation layer is a PET film.

6. A laminate used in an image display device having a display element and provided on a viewing side of the display element, wherein the laminate comprises in this order from the viewing side:

a linear polarization conversion layer;

a light absorption anisotropic layer containing a liquid crystal compound and a dichroic substance; and a polarizer having an absorption axis in an in-plane direction, wherein the light absorption anisotropic layer is a cured layer, wherein an angle between a transmittance central axis of the light absorption anisotropic layer and a normal line of a layer plane of the light absorption anisotropic layer is 0° or greater and 45° or less, and wherein the laminate further comprises:

a B-plate between the polarizer and the light absorption anisotropic layer.

* * * * *